US009103482B2

(12) United States Patent
Fujimori et al.

(10) Patent No.: US 9,103,482 B2
(45) Date of Patent: Aug. 11, 2015

(54) VACUUM HEAT INSULATING MATERIAL, HEAT INSULATING BOX, REFRIGERATOR, REFRIGERATING/AIR-CONDITIONING APPARATUS, WATER HEATER, APPLIANCE, AND MANUFACTURING METHOD OF VACUUM HEAT INSULATING MATERIAL

(75) Inventors: Yosuke Fujimori, Tokyo (JP); Kyoko Nomura, Tokyo (JP); Syuichi Iwata, Tokyo (JP); Hiroshi Nakashima, Tokyo (JP)

(73) Assignee: MITSUBISHI ELECTRIC CORPORATION, Chiyoda-Ku, Tokyo (JP)

(*) Notice: Subject to any disclaimer, the term of this patent is extended or adjusted under 35 U.S.C. 154(b) by 302 days.

(21) Appl. No.: 13/501,237

(22) PCT Filed: Feb. 16, 2010

(86) PCT No.: PCT/JP2010/052246
§ 371 (c)(1),
(2), (4) Date: Apr. 10, 2012

(87) PCT Pub. No.: WO2011/048824
PCT Pub. Date: Apr. 28, 2011

(65) Prior Publication Data
US 2012/0196059 A1 Aug. 2, 2012

(30) Foreign Application Priority Data
Oct. 19, 2009 (JP) .................................. 2009-240788

(51) Int. Cl.
*B32B 1/02* (2006.01)
*F16L 59/065* (2006.01)
(Continued)

(52) U.S. Cl.
CPC ............... *F16L 59/065* (2013.01); *F25D 23/06* (2013.01); *F24H 1/182* (2013.01); *H01L 35/26* (2013.01); *Y10T 428/13* (2015.01); *Y10T 428/23* (2015.01); *Y10T 428/231* (2015.01)

(58) Field of Classification Search
CPC .... H01L 35/26; Y10T 428/231; Y10T 428/23
USPC ....................................................... 428/69, 68
See application file for complete search history.

(56) References Cited

U.S. PATENT DOCUMENTS

| 1,641,288 A | 9/1927 | Neidich |
| 3,368,934 A | 2/1968 | Vosburgh, Sr. |

(Continued)

FOREIGN PATENT DOCUMENTS

| CN | 101023291 A | 8/2007 |
| CN | 101086315 A | 12/2007 |

(Continued)

OTHER PUBLICATIONS

Office Action issued by the U.S. Patent and Trademark Office in the U.S. Appl. No. 13/161,234, mailed Sep. 27, 2013, U.S. Patent and Trademark Office, Alexandria, VA. (9 pgs).

(Continued)

*Primary Examiner* — Brent O'Hern
(74) *Attorney, Agent, or Firm* — Buchanan Ingersoll & Rooney PC

(57) ABSTRACT

A highly reliable vacuum heat insulating material having excellent processability, handleability and heat insulating performance, and a heat insulating box using the vacuum heat insulating material are provided. In the vacuum heat insulating material with the inside in an approximately vacuum state by sealing a core material 5 having a structure wherein plural pieces of fiber assembly 1 are laminated by a gas-barrier outer cover material 4, by using long fiber for the core material, fiber dust or remaining fiber by cutting is prevented from protruding into a sealing portion of the outer cover material from a cut surface of a sheet or an opening portion, and sealing failure is reduced. Further, since the core material is structured so as to be wound continuously from an inner side toward an outer side, the vacuum heat insulating material is easily manufactured, and excellent in handleability.

23 Claims, 45 Drawing Sheets

(51) Int. Cl.
*F25D 23/06* (2006.01)
*H01L 35/26* (2006.01)
*F24H 1/18* (2006.01)

(56) References Cited

U.S. PATENT DOCUMENTS

| | | | |
|---|---|---|---|
| 3,537,226 A * | 11/1970 | Le Van et al. | 53/430 |
| 3,755,062 A | 8/1973 | Schirmer | |
| 3,979,245 A | 9/1976 | Bondra, Jr. et al. | |
| 4,055,268 A | 10/1977 | Barthel | |
| 5,731,248 A | 3/1998 | Phillips et al. | |
| 5,791,551 A | 8/1998 | Parks et al. | |
| 8,211,523 B2 | 7/2012 | Fujimori et al. | |
| 2003/0157284 A1 | 8/2003 | Tanimoto et al. | |
| 2003/0167789 A1 | 9/2003 | Tanimoto et al. | |
| 2003/0209002 A1 | 11/2003 | Lancaster | |
| 2004/0253406 A1 | 12/2004 | Hayashi et al. | |
| 2005/0023731 A1 | 2/2005 | Kondo et al. | |
| 2005/0175809 A1 | 8/2005 | Hirai et al. | |
| 2008/0095970 A1 | 4/2008 | Takashima et al. | |
| 2008/0279603 A1 | 11/2008 | Chen | |

FOREIGN PATENT DOCUMENTS

| | | |
|---|---|---|
| CN | 101363566 A | 2/2009 |
| CN | 100529504 C | 8/2009 |
| GB | 2 451 614 A | 2/2009 |
| JP | 60-091427 U | 6/1985 |
| JP | 62-45136 U | 3/1987 |
| JP | 62-141189 U | 9/1987 |
| JP | 62-204093 A | 9/1987 |
| JP | 07-091594 A | 4/1995 |
| JP | 7-103955 B | 11/1995 |
| JP | 08-028776 A | 2/1996 |
| JP | 10-253243 A | 9/1998 |
| JP | 2000-097390 A | 4/2000 |
| JP | 2000-249290 A | 9/2000 |
| JP | 2001-336691 A | 12/2001 |
| JP | 2002-188791 A | 7/2002 |
| JP | 2003-293256 A | 10/2003 |
| JP | 2004-245258 A | 9/2004 |
| JP | 2004-340197 A | 12/2004 |
| JP | 2005-061611 A | 3/2005 |
| JP | 2005-076725 A | 3/2005 |
| JP | 3656028 B2 | 6/2005 |
| JP | 2005-257232 A | 9/2005 |
| JP | 2005-344832 A | 12/2005 |
| JP | 2005-344870 A | 12/2005 |
| JP | 2006-017151 A | 1/2006 |
| JP | 2006-029456 A | 2/2006 |
| JP | 2006-029505 A | 2/2006 |
| JP | 2006-077790 A | 3/2006 |
| JP | 2006-112440 A | 4/2006 |
| JP | 2006-118808 A | 5/2006 |
| JP | 2006-125631 A | 5/2006 |
| JP | 2006-161939 | 6/2006 |
| JP | 2006-161939 A | 6/2006 |
| JP | 2006-162076 A | 6/2006 |
| JP | 2006-170303 A | 6/2006 |
| JP | 2006-183810 A | 7/2006 |
| JP | 2006-283817 A | 10/2006 |
| JP | 2006-292361 A | 10/2006 |
| JP | 2006-307921 A | 11/2006 |
| JP | 2007-056972 A | 3/2007 |
| JP | 2007-056974 A | 3/2007 |
| JP | 2007-092776 A | 4/2007 |
| JP | 2007-155065 A | 6/2007 |
| JP | 2007-155276 A | 6/2007 |
| JP | 2007-309478 A | 11/2007 |
| JP | 4012903 B2 | 11/2007 |
| JP | 2007-321925 A | 12/2007 |
| JP | 2008-157431 A | 7/2008 |
| JP | 2008-157516 A | 7/2008 |
| JP | 2008-185220 A | 8/2008 |
| JP | 2008-223922 A | 9/2008 |
| JP | 2008-232372 A | 10/2008 |
| JP | 2009-041592 A | 2/2009 |
| JP | 2009-121671 A | 6/2009 |
| JP | 2008-215632 A | 9/2009 |
| JP | 2009-228917 A | 10/2009 |
| WO | 01/11119 A1 | 2/2001 |

OTHER PUBLICATIONS

Chinese Office Action (Text Portion of the Notification of the Third Office Action) dated Nov. 11, 2013, issued by the Chinese Patent Office in corresponding Chinese Patent Application No. 201110187463.X, and English language translation of Office Action. (8 pages).
Chinese Office Action (Text Portion of the Notification of the Third Office Action) dated Nov. 18, 2013, issued by the Chinese Patent Office in corresponding Chinese Patent Application No. 201080046442.X, and English language translation of Office Action. (12 pages).
Office Action issued by the U.S. Patent and Trademark Office in the U.S. Appl. No. 13/530,153, mailed Oct. 30, 2013, U.S. Patent and Trademark Office, Alexandria, VA. (11 pages).
Office Action issued by the U.S. Patent and Trademark Office in U.S. Appl. No. 13/133,585, mailed Jan. 9, 2014, U.S. Patent and Trademark Office, Alexandria, VA. (8 pages).
Office Action dated Apr. 15, 2013, issued by the U.S. Patent and Trademark Office in corresponding U.S. Appl. No. 13/530,153. (20 pages).
Office Action issued on Feb. 28, 2014, by the Chinese Patent Office in corresponding Chinese Patent Application No. 201080046444.9 and an English translation of the Office Action. (16 pages).
Office Action issued by the U.S. Patent and Trademark Office in the U.S. Appl. No. 13/161,234, mailed Mar. 1, 2013, U.S. Patent and Trademark Office, Alexandria, VA. (13 pages).
Office Action dated Mar. 12, 2013, issued in corresponding Japanese Patent Application No. 2011-536052, and an English Translation of the Office Action. (6 pages).
International Search Report (PCT/ISA/210) issued on Mar. 23, 2010, by Japanese Patent Office as the International Searching Authority for International Application No. PCT/JP2010/052246.
International Search Report (PCT/ISA/210) issued on May 11, 2010, by Japanese Patent Office as the International Searching Authority for International Application No. PCT/JP2010/052245.
International Search Report (PCT/ISA/210) issued on Mar. 16, 2010, by Japanese Patent Office as the International Searching Authority for International Application No. PCT/JP2010/052244.
International Search Report (PCT/ISA/210) issued on Mar. 2, 2010, by Japanese Patent Office as the International Searching Authority for International Application No. PCT/JP2010/000528.
Office Action for U.S. Appl. No. 13/127,596 dated Oct. 13, 2011.
Advisory Action issued by the U.S. Patent and Trademark Office in the U.S. Appl. No. 13/161,234, mailed Dec. 31, 2013, U.S. Patent and Trademark Office, Alexandria, VA. (3 pages).
The extended European Search Report dated Jan. 21, 2013, issued in corresponding European Patent Application No. 12179415.0. (7 pages).
Japanese Office Action dated Jun. 11, 2013, issued by the Japanese Patent Office in corresponding Japanese Application No. 2011-002839, and an partial English Translation thereof. (5 pgs.).
Japanese Office Action dated Jun. 11, 2013, issued by the Japanese Patent Office in corresponding Japanese Application No. 2011-105767, and an partial English Translation thereof. (5 pgs.).
Japanese Office Action dated Jan. 29, 2013, issued by the Japanese Patent Office in corresponding Japanese Application No. 2011-105767, and an partial English Translation thereof. (6 pgs.).
Japanese Office Action dated Dec. 4, 2012, issued by the Japanese Patent Office in corresponding Japanese Application No. 2011-002839, and an partial English Translation thereof. (7 pgs.).
European Office Action dated Jun. 13, 2013, issued in corresponding European Patent Application No. 09 834 568.9.
European Office Action dated Jun. 13, 2013 issued in corresponding European Patent Application No. 11 004 596.0.

(56) References Cited

OTHER PUBLICATIONS

Chinese Office Action (Notification of the First Office Action) dated Jun. 18, 2013 issued in corresponding Chinese Patent Application No. 201080046442.X, and an partial English translation thereof.

Advisory Action dated Jul. 11, 2013 issued by the U.S. Patent and Trademark Office in corresponding U.S. Appl. No. 13/530,153.

Chinese Office Action (Notification of the Second Office Action) dated Jun. 20, 2013 issued in corresponding Chinese Patent Application No. 201110187463X, and an English translation thereof. (15 pgs).

Extended Search Report issued on Jan. 8, 2014 by the European Patent Office, in corresponding European Patent Application No. 10823214.1 (6 pages).

Extended Search Report issued on Jan. 8, 2004 by the European Patent Office, in corresponding European Patent Application No. 10824676.0 (8 pages).

Extended Search Report issued on Jan. 15, 2014 by the European Patent Office, in corresponding European Patent Application No. 10823215.8 (7 pages).

Chinese Office Action (Notification of the Third Office Action) dated May 15, 2014, issued by the Chinese Patent Office in corresponding Chinese Patent Application No. 201080046442.X, and English language translation of Office Action. (15 pages).

Chinese Office Action (Decision of Rejection) dated Apr. 15, 2014, issued by the Chinese Patent Office in corresponding Chinese Patent Application No. 201110187463.X, and English language translation of Office Action. (18 pages).

Office Action issued on May 13, 2014 by the U.S. Patent and Trademark Office in U.S. Appl. No. 13/501,227. (8 pages).

Office Action issued on Apr. 28, 2014 by the U.S. Patent and Trademark Office in U.S. Appl. No. 13/501,200. (8 pages).

Office Action issued on Mar. 20, 2014, by the European Patent Office in corresponding European Patent Application No. 12 179 415.0. (5 pages).

Office Action issued by the U.S. Patent and Trademark Office in U.S. Appl. No. 13/501,227, mailed Jul. 15, 2014. (6 pages).

Office Action issued by the U.S. Patent and Trademark Office in U.S. Appl. No. 13/530,153, mailed Jul. 17, 2014. (18 pages).

Office Action issued by the U.S. Patent and Trademark Office in U.S. Appl. No. 13/161,234, mailed Jul. 30, 2014. (11 pages).

Office Action issued on Oct. 22, 2014 by the U.S. Patent and Trademark Office in corresponding U.S. Appl. No. 13/501,227 (8 pages).

Office Action issued on Dec. 15, 2014 by the U.S. Patent and Trademark Office in U.S. Appl. No. 13/530,153 (19 pages).

Office Action issued on Jan. 8, 2015 by the European Patent Office in corresponding European Patent Application No. 10 823 214.1 (5 pages).

Office Action issued on Jan. 8, 2015 by the European Patent Office in corresponding European Patent Application No. 10 823 215.8 (4 pages).

Office Action issued on Jan. 8, 2015 by the European Patent Office in corresponding European Patent Application No. 10 824 676.0 (4 pages).

Office Action dated Sep. 4, 2014, issued in corresponding Chinese Patent Application No. 201080046444.9, and an English translation thereof.

Office Action issued May 4, 2015 by the European Patent Office in corresponding European Patent Application No. 11 004 596.0 (5 pages).

International Search Report dated Aug. 25, 2009 issued by the Japanese Patent Office in corresponding PCT/JP2009/062102.

\* cited by examiner

Fig. 22

| P/d | HEAT CONDUCTIVITY [W/mK] |
|---|---|
| 2 | 0.0042 |
| 3 | 0.0025 |
| 4 | 0.0019 |
| 5 | 0.0019 |
| 6 | 0.0018 |
| 7 | 0.0019 |
| 8 | 0.0026 |
| 9 | 0.004 |
| 10 | 0.0063 |
| COMPARISON EXAMPLE (COTTONLIKE CORE MATERIAL) | 0.003 |

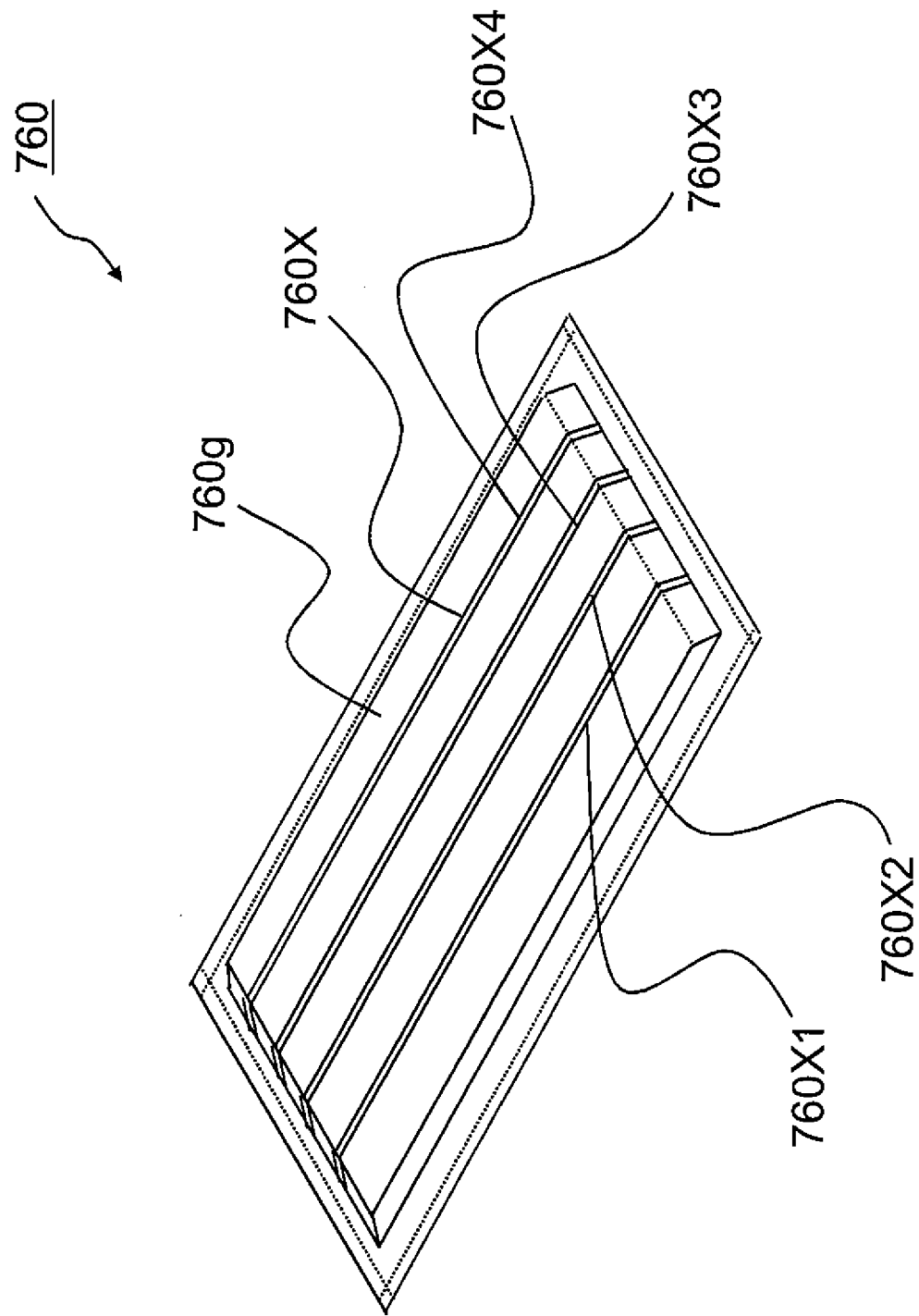

VACUUM HEAT INSULATING MATERIAL, HEAT INSULATING BOX, REFRIGERATOR, REFRIGERATING/AIR-CONDITIONING APPARATUS, WATER HEATER, APPLIANCE, AND MANUFACTURING METHOD OF VACUUM HEAT INSULATING MATERIAL

TECHNICAL FIELD

The present invention relates to vacuum heat insulating material, a heat insulating box using this vacuum heat insulating material, in particular vacuum heat insulating material and a heat insulating box suitable for being used in a cooling device, a refrigerator, appliances, and a housing (wall surface, etc.) and so on. The appliances of the present invention include appliances in which the vacuum heat insulating material can be used such as an automatic vending machine, a cool box, a refrigerator, a calorifier, a water heating appliance (water heater) for family use or business use, a refrigerating/air-conditioning apparatus for family use or business use, a showcase, a jar pot, etc.

BACKGROUND ART

Conventionally, urethane foam has been used for heat insulating material used for the heat insulating box of the refrigerator, etc. Recently, according to requests from the market for energy-saving or space-saving and capacity-increasing, instead of the urethane foam, another structure, in which vacuum heat insulating material having heat insulating performance better than the urethane foam is embedded in the urethane foam and used together, is used. Such vacuum heat insulating material is also used for the refrigerator, etc.

The vacuum heat insulating material is formed by inserting powder, foam, fiber body, etc. as a core material in an outer cover material made of a plastic laminated film, etc. in which aluminum foil is used for a gas barrier layer. Inside of the vacuum heat insulating material, the degree of vacuum is kept to no more than some Pa (pascal).

Further, in order to suppress degradation of the degree of vacuum which becomes a cause of decrease in the heat insulating performance of the vacuum heat insulating material, adsorption agent to sorb gas or water is provided in the outer cover material. For the core material of the vacuum heat insulating material, powder such as silica, etc., foam such as urethane, etc., and fiber body, etc. is used. Currently, glass fiber having excellent heat insulating performance is mainly used for the core material of the vacuum heat insulating material.

Materials of the fiber include inorganic fibers such as glass fiber, ceramic fiber, etc. (e.g., refer to Patent Document 1 and Patent Document 8).

Further, there are organic fibers such as polypropylene fiber, polylactate fiber, aramid fiber, LCP (liquid crystalline polymer) fiber, polyethylene terephthalate fiber, polyester fiber, polyethylene fiber, cellulose fiber, etc. (e.g., refer to Patent Document 2 and Patent Document 7).

Shapes of the fiber body include cottonlike and lamination of sheets (e.g., refer to Patent Document 3 and Patent Document 4). Shapes of the fiber body also include lamination of sheets with alternating fiber orientations of sheets (e.g., refer to Patent Document 5, Patent Document 6 and Patent Document 12).

Laminating methods of the sheets include laminating in a manner of superpositioning a sheeted member with a continuous strip-shape by alternately folding back the sheeted member in different directions (e.g., refer to Patent Document 11).

Processing of the vacuum heat insulating material includes formation of an opening portion (e.g., refer to Patent Document 9) or forming a concave portion on the core material for folding processing (e.g., refer to Patent Document 10).

CITATION LIST

Patent Literature

Patent literature 1: JP 8-028776 A
Patent literature 2: JP 2002-188791 A
Patent literature 3: JP 2005-344832 A
Patent literature 4: JP 2006-307921 A
Patent literature 5: JP 2006-017151 A
Patent literature 6: JP 7-103955 B
Patent literature 7: JP 2006-283817 A
Patent literature 8: JP 2005-344870 A
Patent literature 9: JP 2006-161939 A
Patent literature 10: JP 10-253243 A
Patent literature 11: JP 62-204093 A
Patent literature 12: JP 2008-223922 A

SUMMARY OF INVENTION

Technical Problem

Like the above, for the currently used vacuum heat insulating material, the glass fibers are mainly used as the core material. However, since the glass fiber is stiff and brittle, at the time of manufacturing the vacuum heat insulating material, powder dust flows dispersedly and sticks to skin/mucous membrane of a worker, which may cause stimulus, and a problem exists in the usability and workability.

Further, from the viewpoint of recycling, for example, the refrigerator is demolished for each product in a recycle factory. At this time, the glass fiber is mixed with urethane waste, etc. and supplied to thermal recycle. There is a problem that the recyclability of the glass fiber is not good such that it causes to degrade the combustion efficiency, to remain as residue, etc.

On the other hand, in a case of using polyester fiber for the core material, the usability and the recyclability are excellent. However, the vacuum heat insulating material using polyester fiber for the core material shows the heat conductivity which is an index representing the heat insulating performance is around 0.0030 [W/mK] (e.g., refer to Patent Document 7). There is a problem that the vacuum heat insulating material using polyester fiber for the core material, compared with the general vacuum heat insulating material using the glass fiber for the core material (the heat conductivity: around 0.0020 [W/mK]), shows worse heat insulating performance.

Because of this, it is possible to improve the heat insulating performance by making the organic fiber layer thin and directing the orientation of the fibers in the direction being orthogonal to the heat transfer direction. However, in such a case, the number of laminated sheets exceeds some hundreds, hence the productivity is bad. Further, when the hole formation or the notch formation, etc. are conducted, since the number of laminated sheets is large, it is not easy to carry out the hole formation or the notch formation of the laminated sheet-shaped body of the organic fiber assembly. Further, for the bending process, since the number of laminated sheets is large, it is difficult to bend the laminated sheet-shaped body, and the usability and the productivity are bad.

Further, when the organic fiber assembly is used for the core material, if the thickness of one sheet (represented by the fabric weight) is small, the fiber may be deformed by the pressure force due to the vacuuming pressure at the time of vacuum forming and the temperature. When the fibers are deformed, the thickness is largely decreased, and the number of laminated sheets may increase drastically.

When manufacturing the vacuum heat insulating material by inserting glass fibers, etc. as the core material in the outer cover material made of an aluminum foil laminated film, etc. and by decompressing and sealing the inside, the glass fibers may stick out of the outer cover material and damage or rip the outer cover material at the time when the core material is inserted inside the outer cover material made of an aluminum foil laminated film, etc., especially in a case wherein nonorganic fibers such as glass fibers, etc. are used. Thus, the core material made of the glass fibers is not inserted directly in the outer cover material, but is inserted in the outer cover material in an inserted state in a bag as a separate body such as a plastic bag, etc. Since an extra plastic bag, etc. is necessary, the manufacturing processes of the core material and the vacuum heat insulating material become complicated, which increases the manufacturing cost.

Further, the vacuum heat insulating material in which the glass fibers are used for the core material is excellent in the heat insulating performance. However, if the hole formation or the notch formation, etc. is done, processed powder of the glass fiber flows dispersedly around the processed portion of the hole formation or the notch formation. Accordingly, even if the outer cover material around the hole formation is sealed/weld-sealed, the processed powder of the glass fiber may intrude into the sealing portion, which causes incomplete sealing and degrades the degree of vacuum.

Additionally, in a case wherein organic fibers are used for the core material, when the core material is formed by laminating sheet-shaped organic fiber assemblies one by one, whose end faces are not cut, the sheet-shaped organic fiber assemblies may be laminated in a disjointed manner. In this case, the end face of the core material is not aligned, and there is a problem that the core material may unravel or be everted when the core material is inserted in the outer cover material, and it is difficult to insert the core material.

It may be considered to form the core material by laminating the sheeted member (used paper) with a continuous strip-shape in a superpositioning manner by alternately folding back the sheeted member in different directions and by forming a folding line as in Patent Document 11. However, a device for forming a folding line and folding back is necessary, and the structure of this folding device is complicated and expensive, which increases the manufacturing cost.

Further, even when the organic fiber is used for the core material, if short fibers of which the fiber length is short are used, in a case of doing the hole formation or the notch formation, processed powder of the fiber may protrude or flow dispersedly around the processed portion of the hole formation or the notch formation. The protruding fiber powder may intrude into the sealing portion for sealing/weld-sealing of the outer cover material inside of the processed portion of the hole or the notch formation, which causes incomplete sealing and degrades the degree of vacuum, and further degrades the heat insulating performance. Further, similarly to the above, also from the processed portion of the end face (cutoff portion) of the core material, the processed powder may protrude or flow dispersedly to the neighborhood and intrude to the sealing portion of the outer cover material for sealing/weld-sealing, which may cause incomplete sealing, degrades the degree of vacuum, and decreases the heat insulating performance.

Here, in the vacuum heat insulating material described in Patent Document 9, the core material has the size of 200 mm×200 mm, and the vacuum heat insulating material uses sheet-shaped fiber assembly formed by short-fibered organic fiber having the fiber length of 10 to 150 mm, preferably 20 to 80 mm. Then from the center portion of the sheet, the size of 100 mm×100 mm is cut and removed to form a through hole. However, since the short fibers having short fiber length are used, the fibers are cutoff by cutting to form the through hole. At this time, the fiber length of the fiber remaining on the sheet side possibly becomes extremely short. If the fiber length of the remaining fiber is short, the remaining fiber cannot be tangled with the existing fiber which exists in the sheet, the remaining fiber may protrude from around the through hole, flow dispersedly to intrude into the sealed portion of the outer cover material around the through hole, which may cause the sealing failure.

In the vacuum heat insulating material described in Patent Document 12 (FIG. 2), the thicknesses of the first fiber layer and the second fiber layer whose end faces are cut are approximately the same, and the first fiber layer and the second fiber layer are laminated in such a manner that the drawing directions or the rolling directions of the first and the second fiber layers are not arranged in parallel to each other (approximately perpendicular). However, there is no description about the fiber length. In FIG. 2, a case wherein the fiber length is shorter than the width of the sheet is shown. In the case wherein the fiber length is shorter than the width of the sheet, the remaining fiber may protrude from the end face of the cut sheet, flow dispersedly to intrude into the sealed portion of the outer cover material, which may cause the sealing failure. Especially, when the end face of the sheet is cut for a purpose of lining up an edge line after lamination, since the remaining fiber remained on the sheet gets short, the remaining fiber may protrude from the end face of the cut sheet, flow dispersedly to intrude into the sealed portion of the outer cover material, which may cause the sealing failure. (As shown in FIG. 2, the fiber length seems to be as same as the length of the sheet in the length direction of the sheet. However, the fiber length is not described in particular, and the length in the width direction is described as shorter than the length of the width of the sheet. Further, there is no description about the fiber length such that things with different fiber lengths are used for the first fiber layer and the second fiber layer, and the fiber length is not considered at all. Therefore, it is not considered that the remaining fiber may protrude from the end face of the sheet, flow dispersedly to intrude into the sealed portion of the outer cover material, which may cause the sealing failure).

For example, it is assumed that the initial fiber length is 80 mm. When the through hole having the size of 100 mm×100 mm is made by cutting, if 75 mm out of the initial fiber length 80 mm is cut by the through hole formation, the remaining fiber on the sheet is 5 mm. When the remaining fiber is short such as 5 mm, the remaining fiber cannot be tangled with the existing fiber on the sheet and maintained on the sheet, but may protrude from around the through hole to the outside of the sheet, and further may come out of the sheet. Similarly, in case of using the short fiber for the core material, when the end face of the core material or the fiber assembly is cut in order to form the sheet of a predetermined size, the remaining fiber remaining on the sheet may protrude from the end face of the core material, or may come out of the sheet. When the core material is inserted into the outer cover material and sealed, the remaining fiber intrudes to the sealing portion, which may cause the sealing failure. Accordingly, it is necessary to make the length of sealing long, which increases the manufacturing cost.

Further, in a case of the vacuum heat insulating material using the glass fiber for the core material, the glass fiber is excellent in heat insulating performance. However, since the glass fiber is hard and brittle, it is difficult to do folding processing after vacuuming.

Further, in a case of the vacuum heat insulating material using the glass fiber for the core material, the glass fiber is excellent in heat insulating performance. However, since the glass fiber is hard and brittle, if the piping such as a cooler piping, etc. is inserted between the vacuum heat insulating materials for heat insulating, the vacuum heat insulating material cannot be deformed to be a tubular shape, and thus there exists a gap corresponding to the diameter of the piping between the vacuum heat insulating materials. Accordingly, heat leak occurs from the gap between the vacuum heat insulating materials, which degrades the heat insulating performance drastically.

Further, in a case of using the organic fiber for the core material, when one sheet is laminated into plural layers to form the core material, the vacuum heat insulating material becomes harder as the number of the laminated layers increases. Accordingly, when it is necessary to do folding process after vacuuming, there is a problem that it is difficult to fold at a portion where folding is needed, and the portion which is not desired to be folded may be deformed.

Here, in the vacuum heat insulating material described in Patent Document 10, the micro-powder of silica, pearlite, etc. and fiberglass (the glass fiber), or foam urethane heat insulating material of continuous foaming is used for the core material. It is described then, the concave groove is formed on the core material of the vacuum heat insulating material, and from this concave groove, the folding is done. However, in this case, since the micro-powder such as silica, pearlite, etc. and fiberglass (the glass fiber), etc. are used for the core material, as discussed above, usability is not good, and there is a problem at the time of the recycling.

Further, since the manufacturing method for the concave groove is not described, when micro-powder such as silica, pearlite, etc., and fiberglass (the glass fiber) are used for the core material, it is unclear how to provide the core material with a desired concave groove. In particular, in a case of using the glass fiber, the formation of the concave groove is itself difficult.

In a case of foam urethane, there are some problems: manufacturing is difficult, the manufacturing cost is high, and further the heat insulating performance is worse. Further, it is necessary to change the size of the concave portion according to the size of the curve. However, in the case of foam urethane, to change the size requires changing of a forming die, etc. and manufacturing time and manufacturing cost are largely increased.

The present invention is provided to solve the above problems and aims to provide the vacuum heat insulating material including at least features which will be shown below, the heat insulating box using the vacuum heat insulating material, and the appliances using the heat insulating box such as an automatic vending machine, a cool box, a refrigerator, a water heater, a refrigerating/air-conditioning apparatus, etc.

(1) having high heat insulating performance and excellent productivity (especially productivity of the core material);
(2) having high heat insulating performance, and excellent handleability and recyclability;
(3) in a case of using the organic fiber assembly for the core material, having excellent productivity, wherein the core material is less likely to deform by compression force at the time of vacuum forming or temperature;
(4) being easy to carry out a hole formation, a notch formation, folding processing, having good sealing property, of low cost, having high heat insulating performance, and being easy in handling;
(5) being changeable in a shape and a size of a folding-processed part according to the size of the curve of folding process, and being easy to produce; and
(6) having a concave groove along a shape of piping.

Solution to Problem

According to the present invention, a vacuum heat insulating material includes: a core material structured by a laminated structure of a fiber assembly wherein a fiber is formed into a sheet shape, having a cutting portion where an end face is cut so as to be in a predetermined length or a predetermined width, and an outer cover material having a gas barrier property, which contains the core material inside, and has a sealing portion for sealing an area larger than a size of an outer shape of the core material by an amount of a length of a seal, for sealing an inside in a decompressed state, wherein, as the fiber, a fiber continuous for at least approximately as long as a length or a width of the core material is used, and protrusion of a remaining fiber that is generated by cutting from the cutting portion is suppressed.

Advantageous Effects of Invention

According to the vacuum heat insulating material of the present invention, since the long-fibered fiber assembly is used for the core material, it is possible to suppress protrusion to the cutting portion (e.g., the cutting portion on the end face of the sheet, the cutting portion of hole formation, the cutting portion of a notch formation part, etc.) of the non-woven cloth sheet of remaining fiber generated by cutting. The protrusion, etc. of the remaining fiber, generated by cutting from the cutting portion that is generated when the short fibers are used for the core material, would never occur. Therefore, sealing performance is not damaged by the protruding remaining fiber when the core material is inserted and sealed in the outer cover material.

Further, by using the organic fiber non-woven cloth sheet for the core material, it is possible to provide the vacuum heat insulating material having excellent processability, handleability, heat insulating performance, and productivity, and appliances having this vacuum heat insulating material such as the heat insulating box, the automatic vending machine, the cool box, the refrigerator, the water heater, the refrigerating/air-conditioning apparatus, showcase, etc.

BRIEF DESCRIPTION OF DRAWINGS

FIG. 22 shows the first embodiment and shows measured result of heat conductivity of the vacuum heat insulating material 7.

FIG. 42 is a pattern diagram of the winding device in a case wherein winding on the reel 1311 is performed by using at least one original fabric roll 1307 with the first predetermined width, and at least one combination original fabric roll 1305 wherein original fabric rolls with widths smaller than the first predetermined width are combined in a width direction so as to have approximately the same width as the first predetermined width, and is a diagram illustrating a manufacturing method of another core material in the present embodiment.

FIG. 45 shows the first embodiment, and is a perspective view of vacuum heat insulating material using the core material that is manufactured by using and winding on a reel at least one original fabric roll with a predetermined width, and at least one combination original fabric roll.

DESCRIPTION OF EMBODIMENTS

Embodiment 1

Figure 1:
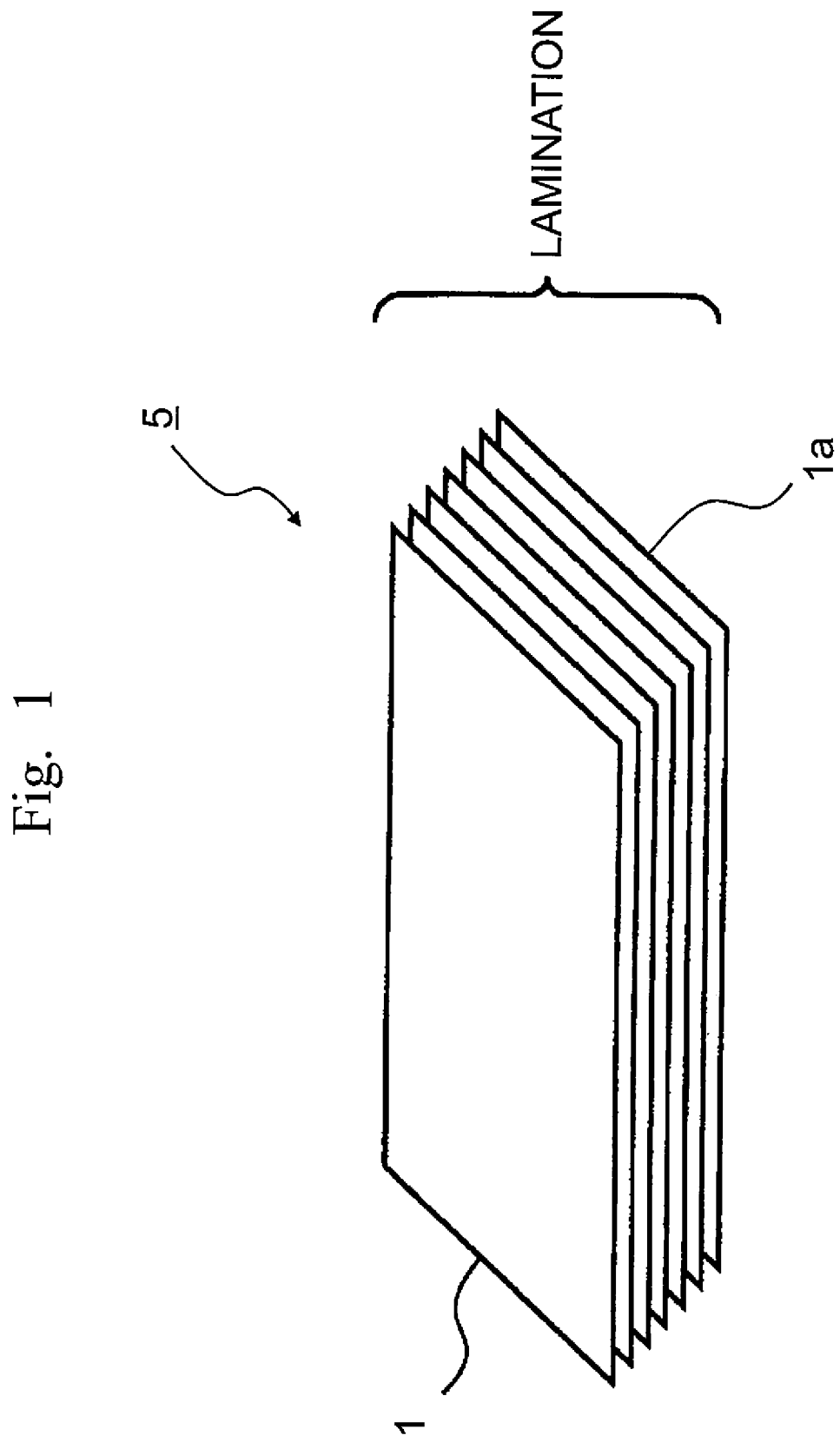
FIG. 1 shows the first embodiment and is a pattern diagram of a vacuum heat insulating material 7, and is a perspective view of a core material 5 of the vacuum heat insulating material 7 made by laminating a plurality of non-woven cloth sheets.
Figure 2:
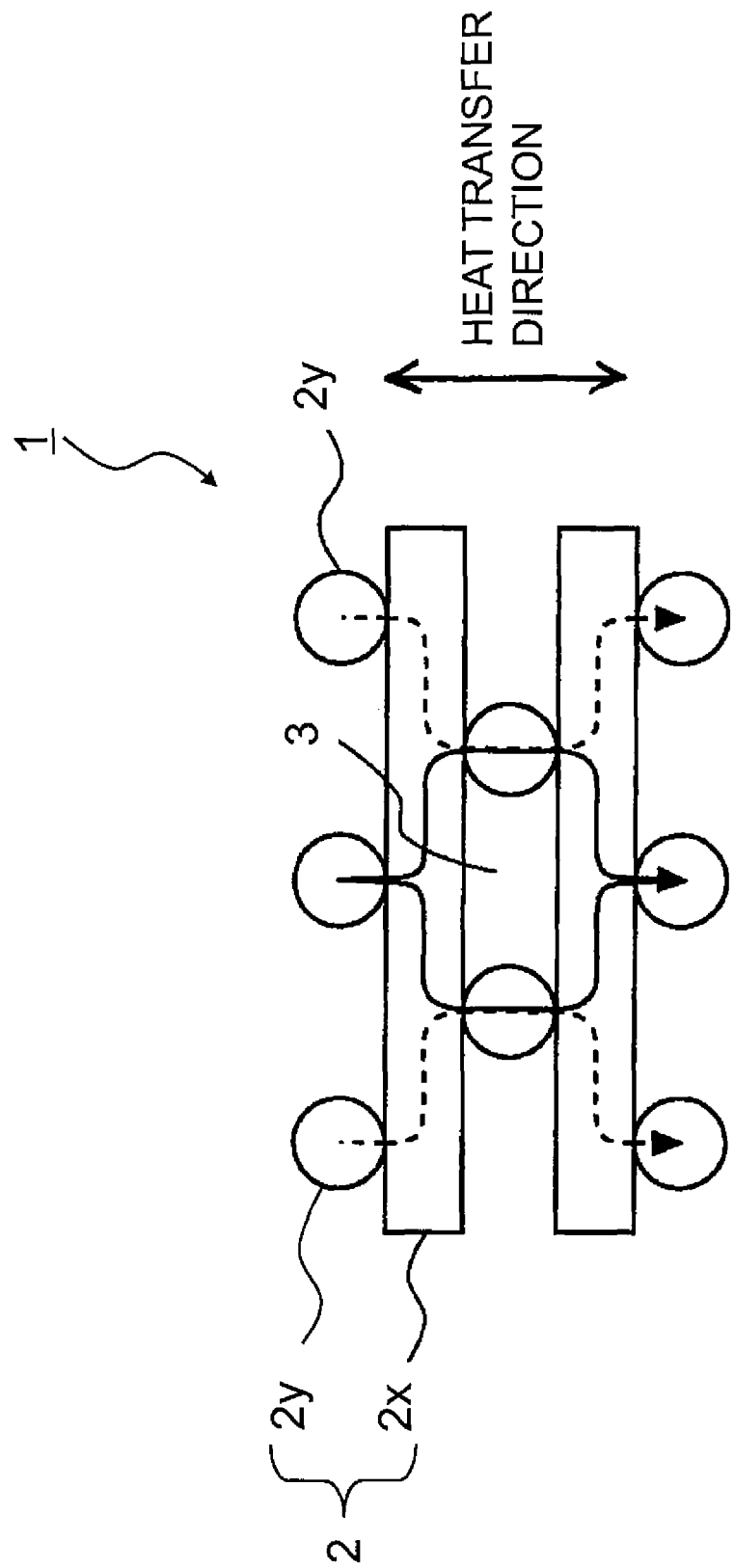
FIG. 2 shows the first embodiment and is a pattern diagram of the vacuum heat insulating material 7, and is a side view showing orientation of fiber in one non-woven cloth sheet.
Figure 3:
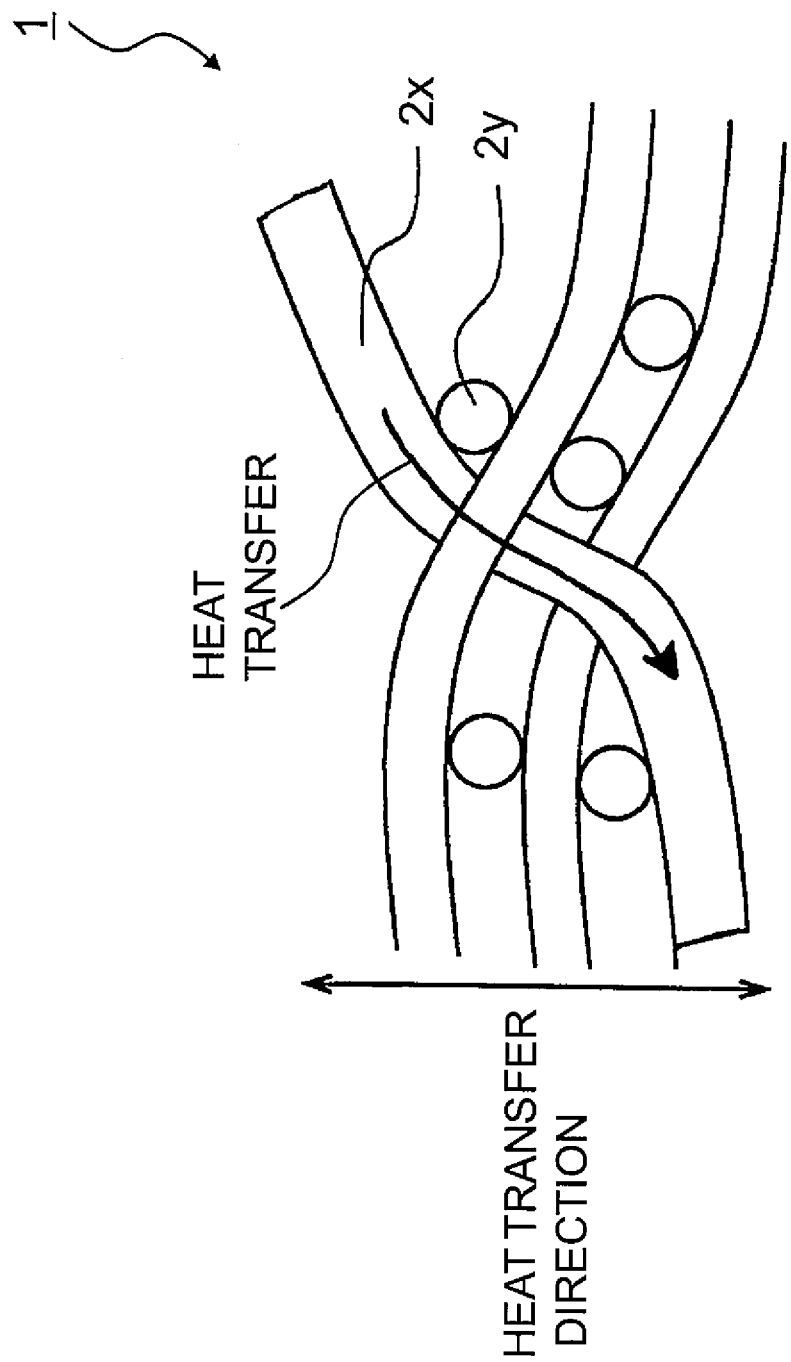
FIG. 3 shows the first embodiment and is a pattern diagram of the vacuum heat insulating material 7, and is a side view showing orientation situation of fiber when the core material 5 is thick.
Figure 4:
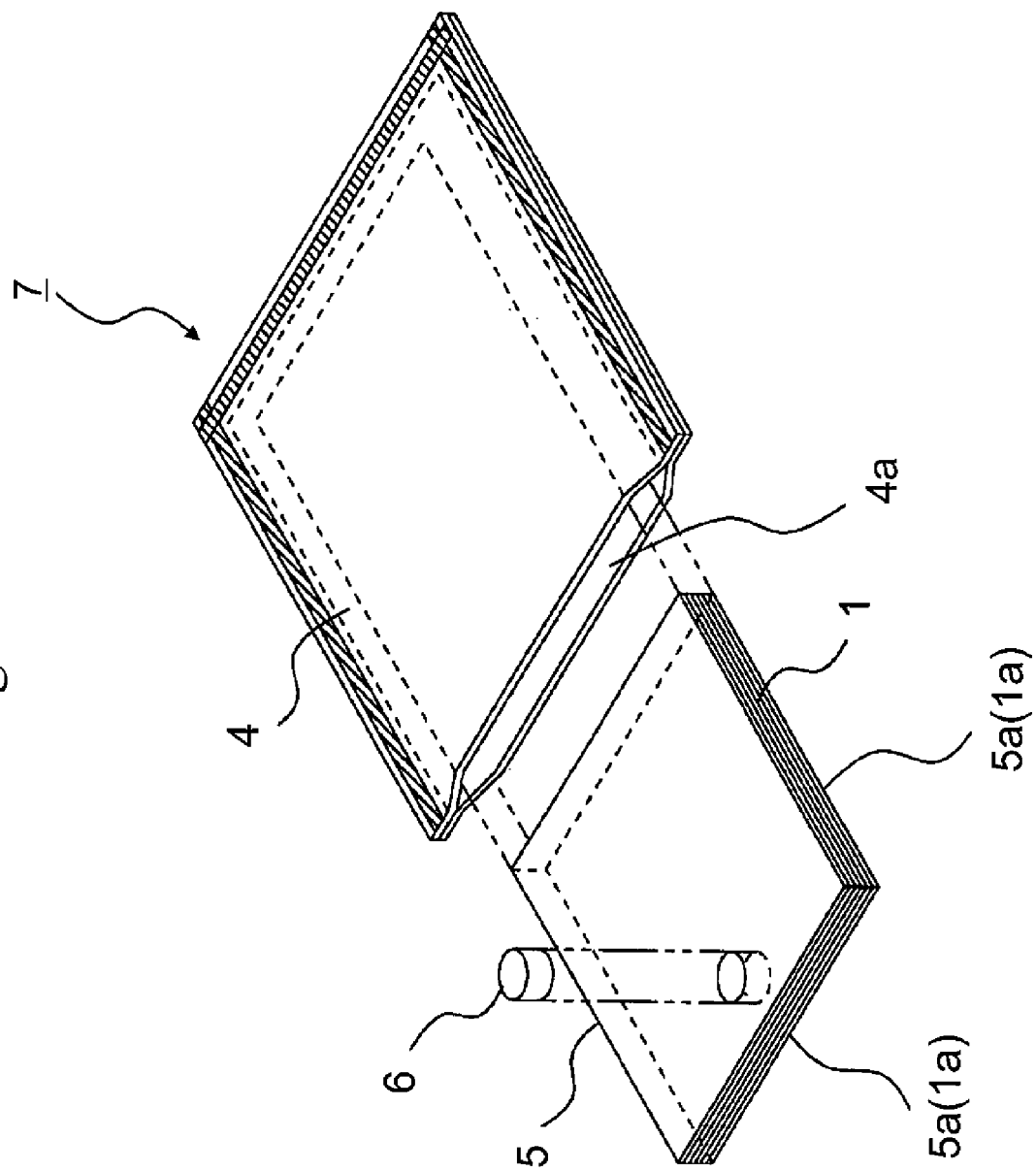
FIG. 4 shows the first embodiment and is an exploded perspective view showing a structure of the vacuum heat insulating material 7.

FIGS. 1 through 4 show the first embodiment; FIG. 1 is a pattern diagram of a vacuum heat insulating material 7 and is a perspective view of a core material 5 of the vacuum heat insulating material 7 made by laminating a plurality of non-woven cloth sheets; FIG. 2 is a pattern diagram of the vacuum heat insulating material 7, and is a side view showing an orientation of fabric in one sheet of non-woven cloth; FIG. 3 is a pattern diagram of the vacuum heat insulating material 7, and is a side view showing an orientation situation of fabric when the core material 5 is thick; and FIG. 4 is an exploded perspective view showing a structure of the vacuum heat insulating material 7.

(Laminated Structure)

In FIG. 1, the core material 5 has a laminated structure in which sheet-shaped fiber assembly 1 (e.g., organic fiber assembly using organic fibers 2) is laminated, at least one end face of which is cut. That is, the core material 5 shown in FIG. 1 is formed in a sheet shape, at least one side out of four sides of an approximately rectangle shape of which is cut after a plurality of layers of the fiber assembly 1 (e.g., the organic fiber assembly) in an approximately rectangle shape are laminated. Otherwise, a plurality of layers of the fiber assembly 1 are laminated after at least one side out of four sides of the fiber assembly 1 in an approximately rectangle shape is cut to be formed in a sheet shape in an approximately rectangle shape. Here, the core material 5 may be simply referred to as a core material.

In FIG. 2, the fiber assembly 1 is the organic fiber assembly for which the organic fibers 2 are used, for example, in the present embodiment. The fiber assembly 1 is formed by a plurality of organic fibers 2$x$ which are arranged with a predetermined interval, and a plurality of organic fibers 2$y$ which are arranged with a predetermined interval in a direction being approximately orthogonal to the organic fibers 2$x$.

At this time, the organic fibers 2$x$ and the organic fibers 2$y$ make approximate point contact. Among the organic fibers 2$y$, an air layer 3 being a heat insulated room is formed.

As a collective term of the organic fibers 2$x$ and the organic fibers 2$y$, the organic fibers 2 are used.

Here, as shown in FIG. 3, if the thickness of one sheet (the fiber assembly 1) is increased, the fiber tends to be orientated in a thickness direction which is a heat transfer direction. In particular, when the organic fibers 2 (sometimes simply called as fibers) are short fibers having a short fiber length (e.g., the fiber length is around 5 to 150 mm), the short fiber tends to be orientated in the thickness direction which is the heat transfer direction. Through this short fibers, heat is transferred from a front surface of the sheet to a rear surface (shown by an arrow in FIG. 3), and the heat insulating performance is degraded.

Accordingly, by thinly laminating the fiber assembly 1 to make a thin sheet-shape, it is possible to prevent the fibers from being made orientated in the heat transfer direction (the laminating direction of the fibers of the fiber assembly 1; the thickness direction of the sheet-shaped fiber assembly 1). Thereby, degradation of heat insulating performance caused by heat transfer through the fibers orientated in the heat transfer direction can be suppressed. Therefore, a heat conductivity of the core material 5 can be made small, which enables to increase the heat insulating performance.

In FIG. 2, an arrow in a solid line and an arrow in a broken line show the heat transfer direction. Since the organic fibers 2$x$ and the organic fibers 2$y$ are almost orthogonal, contacting parts of the organic fibers 2$x$ and the organic fibers 2$y$ become point contact, and thus the heat resistance is increased and the heat insulating performance is improved.

Here, the above shows a case when the organic fibers 2$x$ and the organic fibers 2$y$ intersect almost orthogonal. However, the present embodiment is not limited to this case. The organic fibers 2$x$ and the organic fibers 2$y$ can intersect with an angle other than a right angle. It is sufficient unless all the organic fibers 2$x$ and the organic fibers 2$y$ are placed in parallel. Only if the degradation of heat insulating performance caused by the heat transfer through the fibers orientated in the heat transfer direction can be suppressed a little bit, it is possible to improve the heat insulating performance. Meanwhile, parallel placement is also fine if necessary heat insulating performance can be obtained In FIG. 4, the vacuum heat insulating material 7 has a gas barrier container ("an outer cover material 4," hereinafter) having air barrier properties, the core material 5 and an adsorption agent 6 (e.g., gas adsorbent or water adsorbent (CaO), etc.) sealed inside of the outer cover material 4. The inside of the outer cover material 4 is decompressed to a predetermined degree of vacuum (some Pa (pascal) to some hundreds Pa). Here, the vacuum heat insulating material 7 may be simply referred to as vacuum heat insulating material.

(Fiber to be Used)

The organic fibers 2 are used for the organic fibers 2 that form the core material 5 in the vacuum heat insulating material 7 in the present embodiment. As for material used for the organic fibers 2, polyester, and others such as polypropylene, polylactate, aramid, LCP (liquid crystalline polymer), PPS, polystyrene, etc. can be used. Further, if the heat-resistant properties of the core material 5 are desired to be increased, heat-resistant resin such as LCP (liquid crystalline polymer), PPS (polyphenylene sulfide), etc. should be used for the organic fibers. Further, if the compressive creep properties are desired to be increased, fibers having a large fiber diameter should be used. Further, if the above resins are mixed and used, the vacuum heat insulating material 7 having an excellent compressive creep properties, high heat-resistance, and high heat insulating properties can be obtained. Polystyrene has small solid heat conductivity, and it is expected that the heat insulating performance can be improved, and manufacture can be done at low cost.

Since polypropylene has low hygroscopic property, it is possible to reduce time for drying or vacuuming and the productivity can be improved. Further, since polypropylene has small solid heat conductivity, it is possible to expect the improvement of heat insulating performance of the vacuum heat insulating material 7.

Further, since polylactate has biodegradability, after use of the product, the disorganized and sorted core material can be processed by disposal by landfill.

Further, since aramid or LCP has high stiffness, shape retention capacity is good when being vacuum-packed and applied with air pressure, and the porosity can be increased. Accordingly, there is a merit that it is possible to expect the improvement of the heat insulating performance.

The core material 5 serves, for example, in the vacuum heat insulating material 7 which uses a plastic laminating film for the outer cover material 4, a role to secure a space within the vacuum heat insulating material 7 for supporting air pressure, and another role to reduce the heat conduction of gas, etc. by precisely dividing the space. Here, from a view point of heat conduction control of gas, it is desirable that the distance within this room should be made smaller than free travel distance of air molecule at the degree of vacuum.

In this embodiment, since the organic fibers 2, for example, are used for the core material 5 of the vacuum heat insulating material 7, when compared with a case in which hard and brittle glass fiber is used as the core material as conventional, at the time of manufacturing the vacuum heat insulating material 7, powder dust does not flow dispersedly and does not stick to the skin/mucosal membrane, etc. of a worker to cause irritation. Thus, the handleability and the workability can be improved.

(Manufacturing Method of Fiber Assembly Material (Original Fabric Roll Material))

The fiber assembly 1 (organic fiber assembly, the same as the sheet-shaped assembly) which forms the core material 5 is manufactured by making heated and melted resin such as polyester resin or polystyrene resin fall freely on a conveyer from a number of nozzles aligned in a line along a width in which the organic fiber assembly 1 is desired to be produced, be pressurized by a pressure roller with feeding the conveyer at an arbitrary speed, and be reeled on a cylindrical original fabric roller. Thus an original fabric roll material in an approximately cylindrical shape is produced. The bulk density of the fiber assembly 1 is adjusted by discharge amount of the melted resin and the speed of the conveyer, and it is possible to obtain the fiber assemblies 1 having different thicknesses.

Further, as for long fibered non-woven cloth which is the fiber assembly 1, continuous fiber melted and extruded from a spinning nozzle by an extruder is collected on the conveyer to be formed into a sheet shape by feeding the conveyer at an arbitrary speed, and long fibered non-woven cloth being able to be reeled is obtained. Since the continuous sheeted fiber assembly 1 which is formed of continuous organic fibers 2 is obtained, it is possible to wind the fiber assembly 1 continuously like a coil about the cylindrical original fabric roller, and to obtain an original fabric roll of long fibered non-woven cloth.

Further, for fiber spinning, a method can be used, in which after cooling the resin by cold air, etc. directly under the nozzle, the resin is stretched by compressed air, etc. to make the resin into fiber; and another method by blowing, from the side of a nozzle hole, the resin with high-temperature air which is as high as the melting temperature of the resin to make the resin into fiber.

Here, the fiber assembly 1 obtained by the above methods may be difficult to handle at the time of manufacturing the vacuum heat insulating material 7, since the organic fibers 2 are disjointed with each other. Then, at the time of applying pressure, the organic fibers 2 can be heat-welded. At this time, applying excessive pressure, or excessive heat-welding may increase a contacting area between the organic fibers 2, increase heat transfer, and generate heat conduction from the welding unit, which degrades the heat insulating performance. Therefore, the contacting area between the organic fibers 2 should be made small as much as possible. The contacting area between the organic fibers 2 is desired to be no more than 20% of the total area (the sheet area), preferably no more than 15%, more preferably no more than 8%.

Since it is confirmed that the heat welding accounts for more than 20% of the total area (the sheet area), the heat conductivity becomes large, and the heat insulating performance is degraded. Therefore, the ratio of the heat welding is preferably no more than 20% of the total area (the sheet area). Here, if the ratio of the heat welding in the total area (the sheet area) is made small, the heat insulating performance is extremely improved. Therefore, it is desired that the ratio of the heat welding is suppressed to be no more than 15% of the total area (the sheet area), and further, no more than 8% of the total area (the sheet area).

As for the heat welding, by performing an embossing 110 by, for example, adding dotted welded spots by a heat roller, etc., long-fibered non-woven cloth (the fiber assembly 1) which is windable and having a good heat insulating performance can be obtained, while securing handling strength. Here, in the present embodiment, the temperature of the heat roller is made about 195 degrees Celsius.

Here, instead of heat welding, a needle-punching method may be applicable which makes fibers interlocked with each other by repeatedly sticking and drawing upward plural needles having hooks, so that the fibers are not disjointed but formed into a sheet. However, forming into a sheet by heat welding (e.g., embossing) is better since the forming can be performed with simple equipment, and operations on a conveyer can be easily performed.

(Fiber Diameter)

In this first embodiment, organic fiber assembly is used, for example, for the fiber assembly 1. The fiber diameter of the organic fiber assembly is adjusted by the nozzle diameter for shaping the fiber, and is about 15 µm. In terms of the heat insulating performance, the smaller the fiber diameter is, the better the heat insulating performance is. Theoretically, the fiber diameter is desired to be small due to the relation between degree of internal vacuum of the vacuum heat insulating material 7 with the spatial distance segmented by fibers, and with a free travel distance of gas molecule. The fiber diameter is desired to be no more than 15 µm, preferably no more than 10 µm; the average fiber diameter of around 9 µm can be used.

The measurement of the average fiber diameter can be done by measuring diameters of some to some tens of parts (e.g., ten parts) using a microscope and using an average value. Further, fabric weight (weight (g) of fiber per 1 m$^2$) can be obtained by measuring an area and a weight of one sheet and obtaining a weight per unit area of one sheet.

In the present embodiment, by regulating an orientation direction of fiber to almost orthogonal to the thickness direction which is heat insulating direction, a plurality of the fiber assemblies 1 are laminated to form a multi-layered structure.

Further, when short fibered non-woven cloth is used for the fiber assembly 1, since the fiber length is short, the organic fibers 2$x$ and the organic fibers 2$y$ tend to be orientated in the heat insulating direction (the thickness direction of the sheet). In order to suppress degradation of the heat insulating performance due to the heat transfer through the fibers orientated in the heat insulating direction, long-fibered non-woven cloth using long fibers (e.g., long-fibered non-woven cloth equal to or longer than the length or the width of the sheet) is used.

In the present embodiment, as for the fiber length, at least almost the same length as the length of the sheet is used, hence it is prevented that the fibers may be torn halfway in the sheet and a part (a mid) or an end of the fibers may be orientated in the heat insulating direction, so as not to degrade the heat insulating performance.

(Laminating Method of Fiber Assembly, Manufacturing Method 1 of a Core Material)

Next, the obtained sheet-shaped fiber assembly 1 is cut (cut out) on an end face 1a so as to be, for example, a size of A4 (width 210 mm×length 297 mm) which is a predetermined size. By laminating these into a plurality of layers (e.g., twenty-five layers), the core material 5 is formed, which has a predetermined size and a predetermined thickness, and of which an end surface 5a is cut. The core material 5 can be formed by cutting on the end face 5a to obtain a predetermined size after laminating the sheet-shaped fiber assembly 1 into plural layers. Here, the number of sheets to be laminated can be set arbitrarily based on the thickness of the obtained fiber assembly 1 and the thickness of the vacuum heat insulating material 7 which is desired to be manufactured.

(Outer Cover Material)

For the outer cover material 4 (FIG. 4) of the vacuum heat insulating material 7, a laminated film having the thickness of no less than 5 μm and no more than 100 μm. In the present embodiment, for example, a gas-barrier plastic laminated film structured by nylon (6 μm), aluminum evaporated PET (polyethylene telephthalate) (10 μm), aluminum foil (6 μm), and high-density polyethylene (50 μm) is used.

Other than the above, if the laminated film without including an aluminum foil structured by polypropylene, polyvinyl alcohol, and polypropylene, etc. is used for the outer cover material 4 of the vacuum heat insulating material 7, it is possible to suppress the degradation of the heat insulating performance caused by heat bridge. Here, three sides out of four sides of the outer cover material 4 are heat-sealed by a seal packaging machine. The remaining one side is heat-sealed after the core material 5 is inserted.

(Manufacturing Method 1 of a Vacuum Heat Insulating Material)

As for manufacturing the vacuum heat insulating material 7, first, the core material 5 having a predetermined size and thickness is inserted into the outer cover material 4 which is shaped in a bag having an opening portion 4a. The outer cover material is fixed so as not to close the opening portion 4a, and dried in a constant temperature reservoir at the temperature of about 105 degrees Celsius for a half day (about 12 hours). Then, adsorption agent 6 (gas adsorption agent or water adsorption agent, etc.) for sorbing remaining gas after vacuum packaging, out gas discharged over time from the core material 5, and permeated gas entering through a seal layer of the outer cover material 4 is inserted in a filmed bag (the outer cover material 4), and vacuuming (decompression treatment) is done using Kashiwagi-type vacuum packaging machine (a product of Nucleopore Corporation; KT-650). The vacuuming is done until the degree of vacuum in the chamber becomes about 1 to 10 Pa, the opening portion 4a of the filmed bag (outer cover material) 4 is heat-sealed in the chamber, and a plate-shaped vacuum heat insulating material 7 is obtained.

(Laminating Method of Fiber Assembly, Manufacturing Method 2 of a Core Material)

As shown above, it is applicable to produce the vacuum heat insulating material 7 by forming the core material 5 through cutting the sheet-shaped fiber assembly 1 into a predetermined size, and laminating plural pieces of the fiber assembly 5, or by forming the core material 5 through cutting on the end face 5a to obtain a predetermined size after laminating the sheet-shaped fiber assembly 1 into plural layers. Meanwhile, another manufacturing method of the core material 5 will be described here. A manufacturing method of the core material 5 by continuously winding the continuous sheet-shaped fiber assembly 1J (e.g., organic fiber assembly) like a coil will be described.

Figure 5:
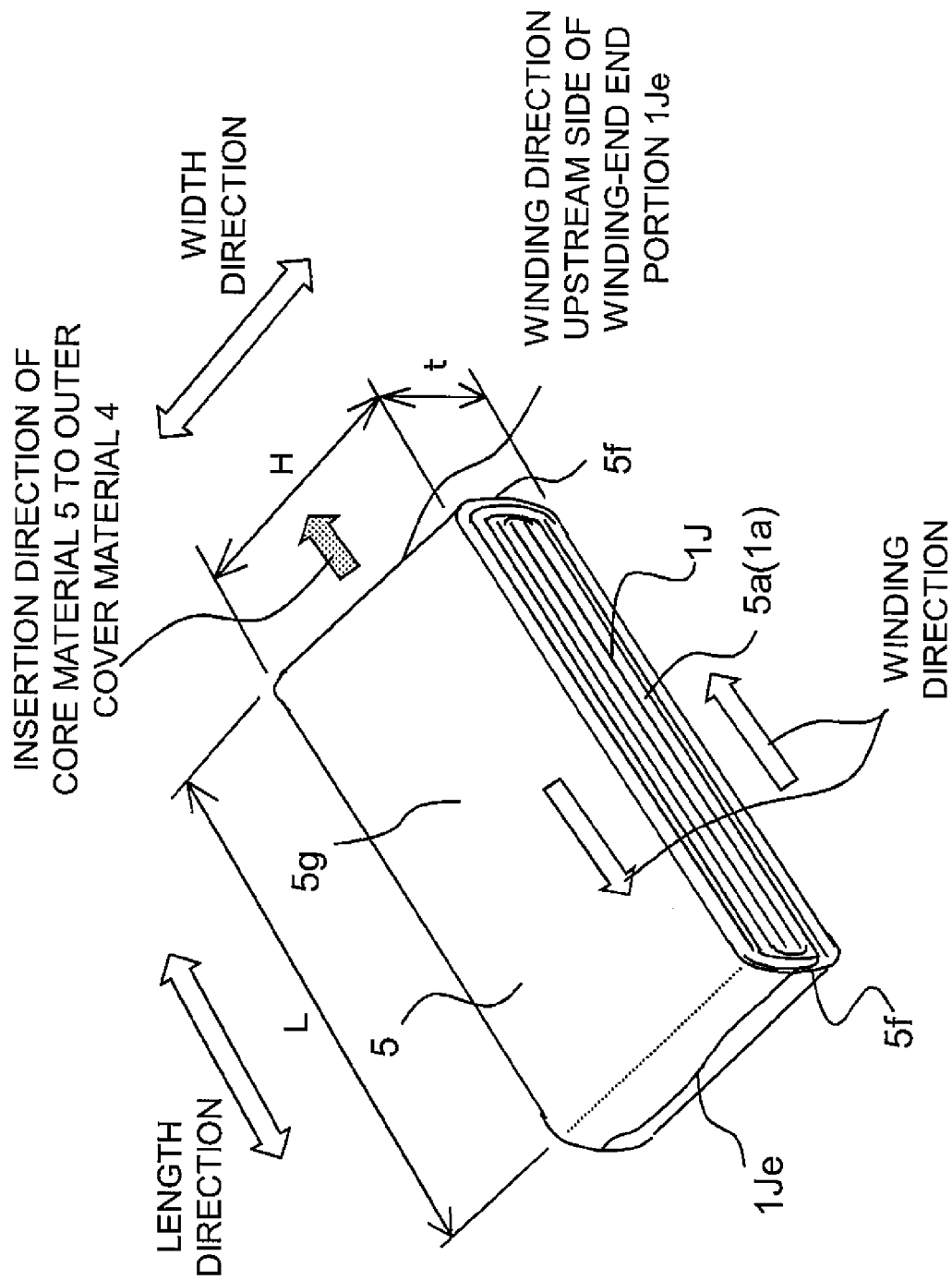
FIG. 5 shows the first embodiment and is a perspective view showing by pattern a lamination state of the core material 5 that forms the vacuum heat insulating material 7.
Figure 6:
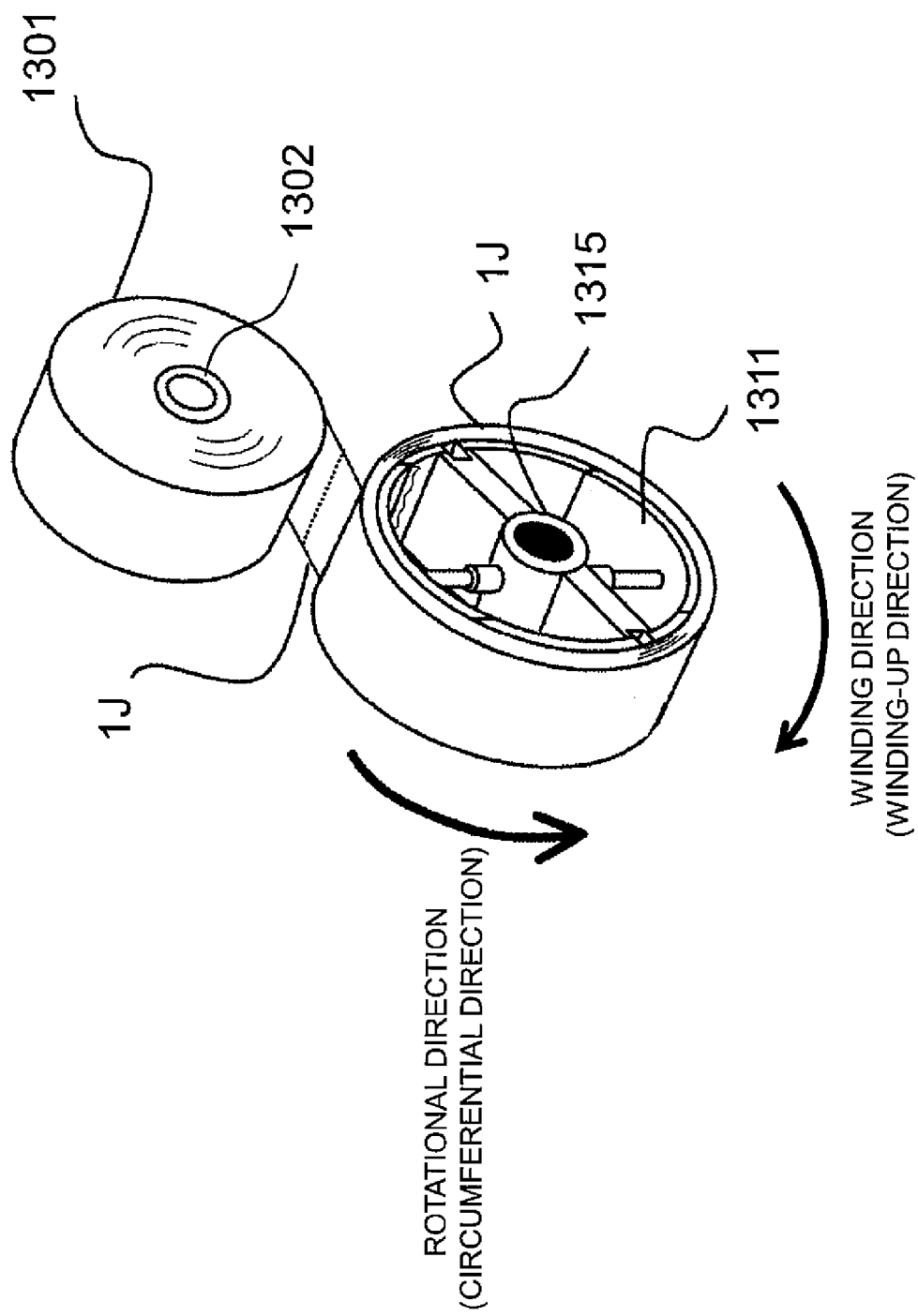
FIG. 6 shows the first embodiment and is a perspective view showing by pattern an original fabric roller and a reel of a laminating device for the core material 5 that forms the vacuum heat insulating material 7.

FIGS. 5 and 6 show the first embodiment. FIG. 5 is a perspective view showing by pattern a lamination state of the core material 5 that forms the vacuum heat insulating material 7. FIG. 6 is a perspective view showing by pattern an original fabric roller and a reel of a laminating device for the core material 5 that forms the vacuum heat insulating material 7.

In FIGS. 5 and 6, the core material 5 is manufactured by making a continuous sheet-shaped fiber assembly 1J (e.g., organic fiber assembly with a thickness of no less than around 30 μm and no more than around 500 μm, preferably no less than 80 μm and no more than 300 μm) that is formed of continuous fibers (e.g., the organic fibers 2) formed into a plate shape after being winded around a reel 1311 like a coil (after being winded around the reel 1311 continuously) with a predetermined tensile force at which the sheeted fiber assembly 1J is not cut halfway during winding, or, if not being cut, necessary property as fiber does not become deficient by being stretched to the limit. That is, the core material 5 is formed in a laminated structure of the fiber assembly wherein the sheet-shaped fiber assembly 1J that is continuous in the length direction (winding direction) is continuously winded from the inner side to the outer side.

The core material 5 is shaped, for example, in a manner to crush the continuous sheet-shaped fiber assembly 1J which is winded in an approximately cylindrical shape into a plate (sheet) after the reel 1311 is removed in a direction of the shaft center of the reel 1311 (the direction of the shaft center of the rotational shaft 1315 that is off from the winding direction by approximately 90 degrees) in a state wherein the sheet-shaped fiber assembly 1J with a predetermined width, which is continuous in the length direction, and is winded about an approximately cylindrical original fabric roller 1301 like a coil, is winded plural times about the reel 1311 continuously like a coil. The plated core material 5 is formed in a plate shape (sheet shape, smooth shape) having a flat portion 5g (smooth portion) that forms a plate shape (smooth shape) by laminating plural layers of the continuous sheet-shaped fiber assembly 1J, and a bending end portion 5f that is the continuous sheet-shaped fiber assembly 1J shaped in a folded state at end portions on both sides in the length direction of the flat portion 5g (the continuous sheet-shaped fiber assembly 1J is in a bent and winded state on the both end sides in the winding direction of the plate shape since the continuous sheet-shaped fiber assembly 1J is winded continuously in the winding direction). Here, it is generally used the original fabric roller 1301 of which the end face 1a in the width direction is cut to a predetermined width.

In this case, the number of rotation R of winding about the reel 1311 is determined so that the core material 5 has a predetermined thickness t in a state of being formed in a plate shape and sealed in an approximately vacuum state in the outer cover material 4. For example, when the thickness t necessary for the core material 5 (the predetermined thickness of the core material 5) is 8 mm, and the thickness of one piece of the continuous sheet-shaped fiber assembly 1J is 80 μm, the necessary number of pieces of lamination is 100 (8 mm/80 μm). Thus, the necessary predetermined winding number R which is necessary to be winded about the reel 1311 becomes 50 times, which corresponds to 50 pieces of the continuous sheet-shaped fiber assemblies 1J. The thickness t of the core material 5 becomes the thickness of 100 pieces, which corresponds to twice the winding number R around the original fabric roller 1301, i.e., 50 times, since the core material 5 in a state of being removed from the reel 1311 (cylindrical shape, coil shape) is crushed and formed into a plate shape (sheet shape). The core material 5 becomes in a laminated state of plural pieces of the continuous sheet-shaped fiber assembly 1J (100 pieces as the predetermined number of pieces are laminated).

When the core material 5 is in a state of being formed in a plate shape, after the continuous sheet-shaped fiber assembly 1J is winded about the reel 1311 from the original fabric roller 1301 for the number of the predetermined pieces R thereby the predetermined thickness t is obtained, the remaining continuous sheet-shaped fiber assembly 1J, which is unnecessary, on the side of the original fabric roller 1301 is cut on a winding-end end portion 1Je. That is, since the continuous sheet-shaped fiber assembly 1J is cut halfway between the original fabric roller 1301 and the reel 1311, the cut end portion of the continuous sheet-shaped fiber assembly 1J on the side of the reel 1311 becomes the winding-end end portion 1Je (cut end portion). Here, in the present embodiment, the continuous sheet-shaped fiber assembly 1J is cut so that the winding-end end portion 1Je is in an adjacent position of a bending end portion 5f. Since the winding-end end portion 1Je of the continuous sheet-shaped fiber assembly 1J is allocated in the adjacent position of the bending end portion 5f of the core material 5 as just described, the winding-end end portion 1Je is not placed in the flat portion 5g of the core material 5. Therefore, the core material is in a plate-shape having a flat portion formed of laminated layers of the fiber assembly, and two bending end portions respectively formed on both longitudinal sides of the flat portion. Thus, an uneven surface is not formed in the flat portion 5g.

Therefore, since the uneven surface is not formed in the flat portion 5g (plane portion, smooth portion) in the vacuum heat insulating material 7, it becomes easier to attach the vacuum heat insulating material 7 in attaching or fixing the vacuum heat insulating material 7 to a product. Further, since it becomes easier to attach or fix the flat portion 5g to an attaching position of the vacuum heat insulating material 7 of a product, etc., the vacuum heat insulating material 7 does not become uneven or detached, and there is an effect that the vacuum heat insulating material 7 is less likely to be detached or separated from the product, etc. Additionally, in a case of an appliance such as a refrigerator, etc. wherein the vacuum heat insulating material 7 is used in combination with a heat insulating box using urethane, etc. as a heat insulating material by foaming urethane, etc., since an uneven surface does not exist in the flat portion 5g (plane portion, smooth portion) of the vacuum heat insulating material 7, a flow of the urethane is not prevented by an obstacle of the uneven surface when urethane flows through inside of the heat insulating box. Therefore, degradation of heat insulating performance due to lack of flow of urethane can be suppressed.

When the core material 5 is inserted in the outer cover material 4, among two bending end portions 5f in the length direction (the length direction of the continuous sheet-shaped fiber assembly 1J), the core material 5 is inserted from the side of a bending end portion 5fa on which side the winding-end end portion 1Je of the continuous sheet-shaped fiber assembly 1J is not caught and does not unravel in the opening portion 4a of the outer cover material. For example, it is preferable to insert the core material 5 from the side of the bending end portion 5fa on the upstream side in the winding direction (opposite side in the winding direction) of the continuous sheet-shaped fiber assembly 1J with respect to the winding-end end portion 1Je as shown in FIG. 5. In this way, the core material 5 is not caught in the opening portion at the time of inserting the core material 5 from the opening portion 4a of the outer cover material 4. Thus, the core material 5 can be smoothly inserted into the outer cover material 4, insertability is drastically improved, and the vacuum heat insulating material 7 can be produced in a short period of time.

A width L (predetermined width) necessary for the core material 5 is arbitrary adjusted by the width of the continuous sheet-shaped fiber assembly 1J that is winded about the original fabric roller 1301 or the width of the reel 1311. For example, when the width (predetermined width) L necessary for the core material 5 is 1500 mm, it is applicable to set the width of the reel 1311 to around 1500 mm, which is the predetermined width, or to set the width of the reel 1311 to a width (e.g., around 1520 mm) slightly larger than 1500 mm, which is the predetermined width, and then to cut an extra portion (both width portions).

Figure 7:
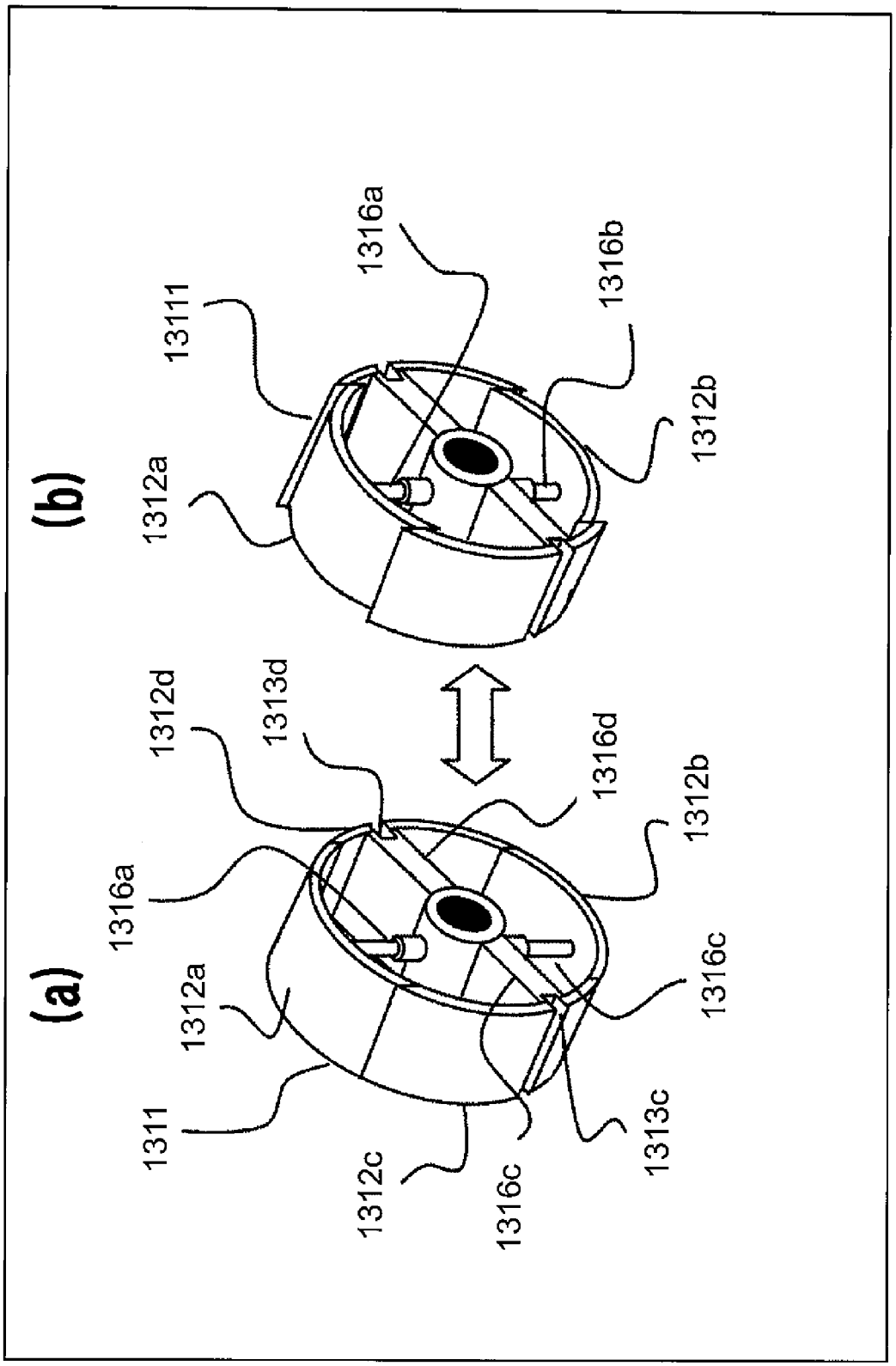
FIG. 7 shows the first embodiment and is a diagram illustrating a structure of the reel of a vacuum heat insulating material manufacturing device.
Figure 8:
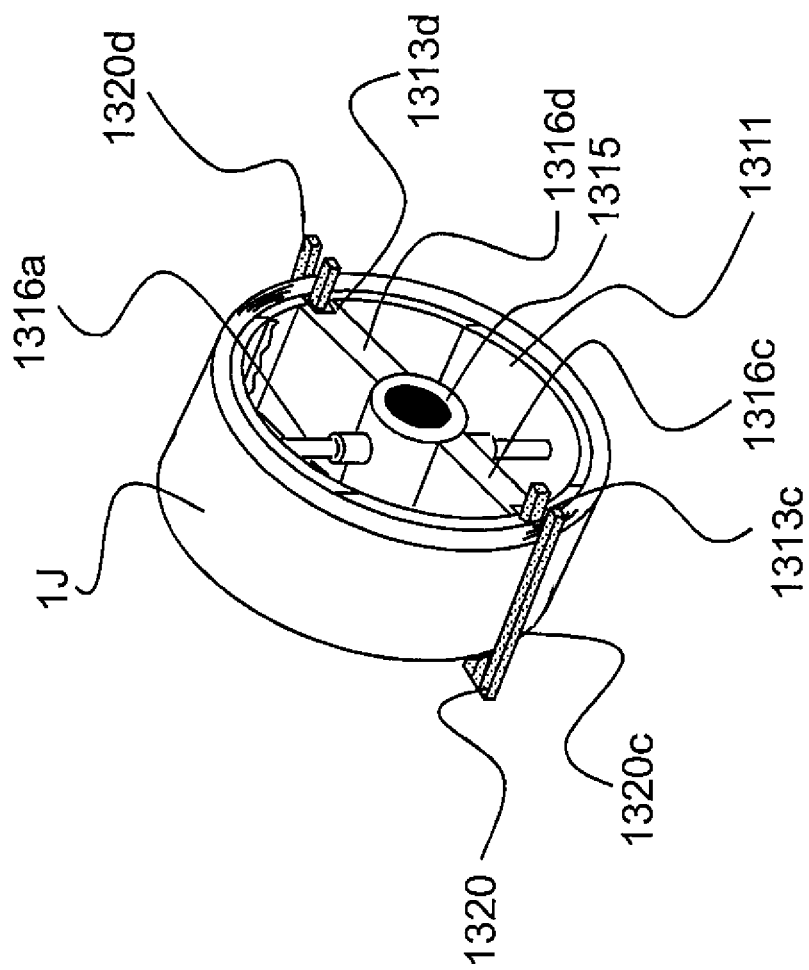
FIG. 8 shows the first embodiment and is a diagram illustrating a clamping member for clamping the organic fiber assembly that is wound around the reel of the vacuum heat insulating material manufacturing device.

FIGS. 7 and 8 show the first embodiment. FIG. 7 is a diagram illustrating a structure of the reel of a vacuum heat insulating material manufacturing device. (a) of FIG. 7 illustrates a state of the reel at the time of winding organic fiber assembly. (b) of FIG. 7 illustrates a state of the reel when the continuous sheet-shaped fiber assembly 1J is removed (detached) from the reel after completion of winding of the continuous sheet-shaped fiber assembly 1J. FIG. 8 is a diagram illustrating a clamping member for clamping the organic fiber assembly that is wound around the reel of the vacuum heat insulating material manufacturing device.

In the present embodiment, the reel 1311 is, for example in an approximately cylindrical shape, and is partitioned into plural parts (e.g., partitioned in quarters (circumferential members 1312a to 1312d)) in plural circumferential members 1312, for example, in a circumferential direction. Here, circumferential member supporting shafts 1316 (circumferential member supporting shafts 1316a to 1316d) that are connected to a rotational shaft 1315 of the reel 1311 are provided to the circumferential members 1312, respectively, on the inner circumference sides near an approximate center in the circumferential direction of each of the circumferential members 1312a to 1312d that are partitioned into plural parts. Plural circumferential members 1312 are connected to and supported by the rotational shaft 1315 of the reel 1311 via the circumferential member supporting shafts 1316. A driving shaft that is driven by an electric motor, etc. is inserted in and connected to the rotational shaft 1315 of the reel 1311.

Since the circumferential member supporting shaft 1316 that is extensible and movable in the radial direction (the circumferential member supporting shafts 1316a and 1316b in the present embodiment) is provided to at least one circumferential member (two circumferential members 1312a and 1312d that are opposed in a radial direction in the present embodiment) among the circumferential members 1312 (four circumferential members 1312a to 1312d in the present embodiment) that are partitioned into plural parts, by making the circumferential member supporting shafts 1316a and 1316b movable in a shrinking direction toward the center side in the radial direction after winding the continuous sheet-shaped fiber assembly 1J about the reel 1311, it is possible to loosen the tensile force of the continuous sheet-shaped fiber assembly 1J that is wound about the reel 1311 in an approximately cylindrical shape (like a coil) with a predetermined tensile force, and to remove the continuous sheet-shaped fiber assembly 1J that is wound in an approximately cylindrical shape from the reel 1311 in a shaft center direction of the rotational shaft 1315. That is, since it becomes easier to remove the continuous sheet-shaped fiber assembly 1J that is wound about the reel 1311 from the reel 1311 by loosening the tensile force of the continuous sheet-shaped fiber assembly 1J that is wound about the reel 1311 with a predetermined tensile force, it is possible to easily remove the continuous sheet-shaped fiber assembly 1J without damaging the fiber assembly 1J.

Here, a clamping member 1320 for holding or fixing the fiber assembly 1 in the approximately cylindrical shape after removing of the reel 1311 is provided at least one part of the reel 1311. In the present embodiment, the clamping members 1320 are detachably provided to clamping member installation parts 1313c and 1313d that are placed in at least two places (countering two places) of the circumferential members 1312c and 1312d, or the circumferential member supporting shafts 1316c and 1316d, respectively. Further, two clamping member installation parts 1313c and 1313d are provided in sites (e.g., different circumferential member supporting shafts 1316c and 1316d) other than the circumferential member supporting shafts (the circumferential member supporting shafts 1316a and 1316b in the present embodiment) that are extensible and movable in the radial direction.

The clamping members 1320 are provided so that the continuous sheet-shaped fiber assembly 1J can be held or fixed (held or fixed by tucking) between the inner circumferential side of the continuous sheet-shaped fiber assembly 1J in the approximately cylindrical shape and an outer circumferential side of the reel 1311 in a state wherein the continuous sheet-shaped fiber assembly 1J is wound about the reel 1311 in the approximately cylindrical shape (like a coil). The clamping members 1320 are in a shape of a rod or plate, for example, and may be provided on the reel 1311 side detachably from the reel 1311 before the continuous sheet-shaped fiber assembly 1J is wound; or may be provided afterward between the continuous sheet-shaped fiber assembly 1J (inner circumferential side) and the reel 1311 (outer circumferential side) in a manner to be inserted in two clamping member installation parts 1313 (e.g., the clamping member installation parts 1313c and 1313d that are placed in the circumferential members 1312c and 1312d or the circumferential member supporting shafts 1316c and 1316d, respectively), for example, from a shaft direction of the rotational shaft 1315 in a state in which the continuous sheet-shaped fiber assembly 1J is wound about the reel 1311 like a coil, so as to hold the continuous sheet-shaped fiber assembly 1J; or may tuck and hold the continuous sheet-shaped fiber assembly 1J in two places of the clamping member installation parts (e.g., the clamping member installation parts 1313c and 1313d).

Here, in the present embodiment, clamping member installation parts 1313 (e.g., a concave portion or a notch that is provided to have a predetermined width (or length), for example, in the direction of the rotational shaft 1315) wherein the clamping members can be housed or inserted in the shaft direction of the rotational shaft 1315 of the reel 1311 are provided on the outer circumferential surface side of the circumferential members (e.g., the circumferential members 1312c and 1312d that are not movable in the radial direction) where the clamping members 1320 are placed in the reel 1311.

The clamping members 1320 that are housed or inserted in the clamping member installation parts 1313 (e.g., the clamping member installation parts 1313c and 1313d) are, for example, in a shape of a rod or plate. It is applicable that the clamping members 1320 are placed in the clamping member installation parts 1313 (clamping member installation part 1313c and 1313d) before the continuous sheet-shaped fiber assembly 1J is wound about the reel 1311, and after the continuous sheet-shaped fiber assembly 1J is wound about the reel 1311, the circumferential members 1312a and 1312b are moved toward a center direction (shrinking direction) in the radial direction, and the continuous sheet-shaped fiber assembly 1J is clamped (clamped in at least two parts (the clamping member installation parts 1313c and 1313d) in the present embodiment) by the clamping members 1320 and removed from the reel 1311 after loosening of the tensile force of the continuous sheet-shaped fiber assembly 1J in the approximately cylindrical shape that is wound about the reel 1311 with the predetermined tensile force.

It is also applicable that after the continuous sheet-shaped fiber assembly 1J is wound about the reel 1311 in the approximately cylindrical shape (like a coil) with the predetermined tensile force, at least one clamping member 1320 is inserted in concave portions or notches, etc. of the clamping member installation parts 1313 (the clamping member installation parts 1313c and 1313d) that are placed in the circumferential members 1312c and 1312d, which are not movable, of the reel 1311 placed between the inner circumferential side of the continuous sheet-shaped fiber assembly 1J and the outer circumferential side of the reel 1311, and the continuous sheet-shaped fiber assembly 1J in the approximately cylindrical shape is clamped (clamped in at least two parts (the clamping member installation parts 1313c and 1313d) in the present embodiment), then the circumferential members 1312a and 1312b are moved toward the center direction (shrinking direction) in the radial direction, the tensile force of the continuous sheet-shaped fiber assembly 1J in the approximately cylindrical shape that is wound about the reel 1311 with the predetermined tensile force, and the reel 1311 is removed.

Here, at least one clamping member 1320 (two clamping members 1320 and 1320d in the present embodiment) is provided detachably from the reel 1311, and is placed in at least one circumferential member (two circumferential members 1312c and 1312d in the present embodiment) that is not movable of the reel 1311.

As shown, by making at least one of the movable circumferential members 1312a and 1312b in a loosening direction of the tensile force, it is possible to easily loosen the tensile force of the continuous sheet-shaped fiber assembly 1J in the approximately cylindrical shape that is wound about the reel 1311 with the predetermined tensile force. Therefore, since the continuous sheet-shaped fiber assembly 1J can be simply detached from the reel 1311 without damaging or impairing the continuous sheet-shaped fiber assembly 1J or the organic fibers 2, it is possible to obtain a highly-reliable winding device of a simple structure, and the continuous sheet-shaped fiber assembly 1J and the vacuum heat insulating material 7, which are low in cost and highly reliable.

Here, the positions to clamp the continuous sheet-shaped fiber assembly 1J are two parts (in a cross-sectional shape (in a case of an approximately cylindrical shape, the cross-sectional shape is approximately circular) in consideration of a cross section approximately orthogonal to the shaft direction of the rotational shaft 1315 of the reel 1311, two parts (in a case of a circle, two parts that intersect with the circumference) where a straight line passing through rotational center of the rotational shaft 1315 of the reel 1311 intersects with the cross-sectional shape (outer shape of the cross section, the circumference in the case of the circle)) at positions where a perimeter in a circumferential direction of a circle in cross-section of the continuous sheet-shaped fiber assembly 1J that is wound in the approximately cylindrical shape is divided into two approximately equal parts with approximately same lengths.

Therefore, since the positions to clamp are the positions of two parts where the perimeter of the outer shape (circle in the case of the approximately cylindrical shape) of the cross section in the approximately cylindrical shape is divided into approximately equal parts, by removing the continuous sheet-shaped fiber assembly 1J from the reel 1311 in a clamped state with two clamping members 1320 (the clamping members 1320c and 1320d), and making two clamping members 1320c and 1320d movable or moving in an opposite direction to the approximately straight line direction (approximately 180 degrees opposite direction), the continuous sheet-shaped fiber assembly 1J that is wound plural times and laminated into plural layers is pulled in a contradictory direction by two clamping members 1320c and 1320d. Thus, the continuous sheet-shaped fiber assembly 1J is shaped in a plate shape that is bent from the clamped parts by the clamping members 1320c and 1320d. After that, by removing the clamping members 1320 (the clamping members 1320c and 1320d) from the continuous sheet-shaped fiber assembly 1J that is formed in the plate shape in a state of being laminated into plural layers, the continuous sheet-shaped fiber assembly 1J is laminated into plural layers in a continuous sheeted state, and the plated core material 5 with the predetermined width L and the predetermined length 1J having the flat portion 5g in a plated (sheet) shape bent at the bending end portions 5f.

(Manufacturing Method 2 of Vacuum Heat Insulating Material)

Figure 9:
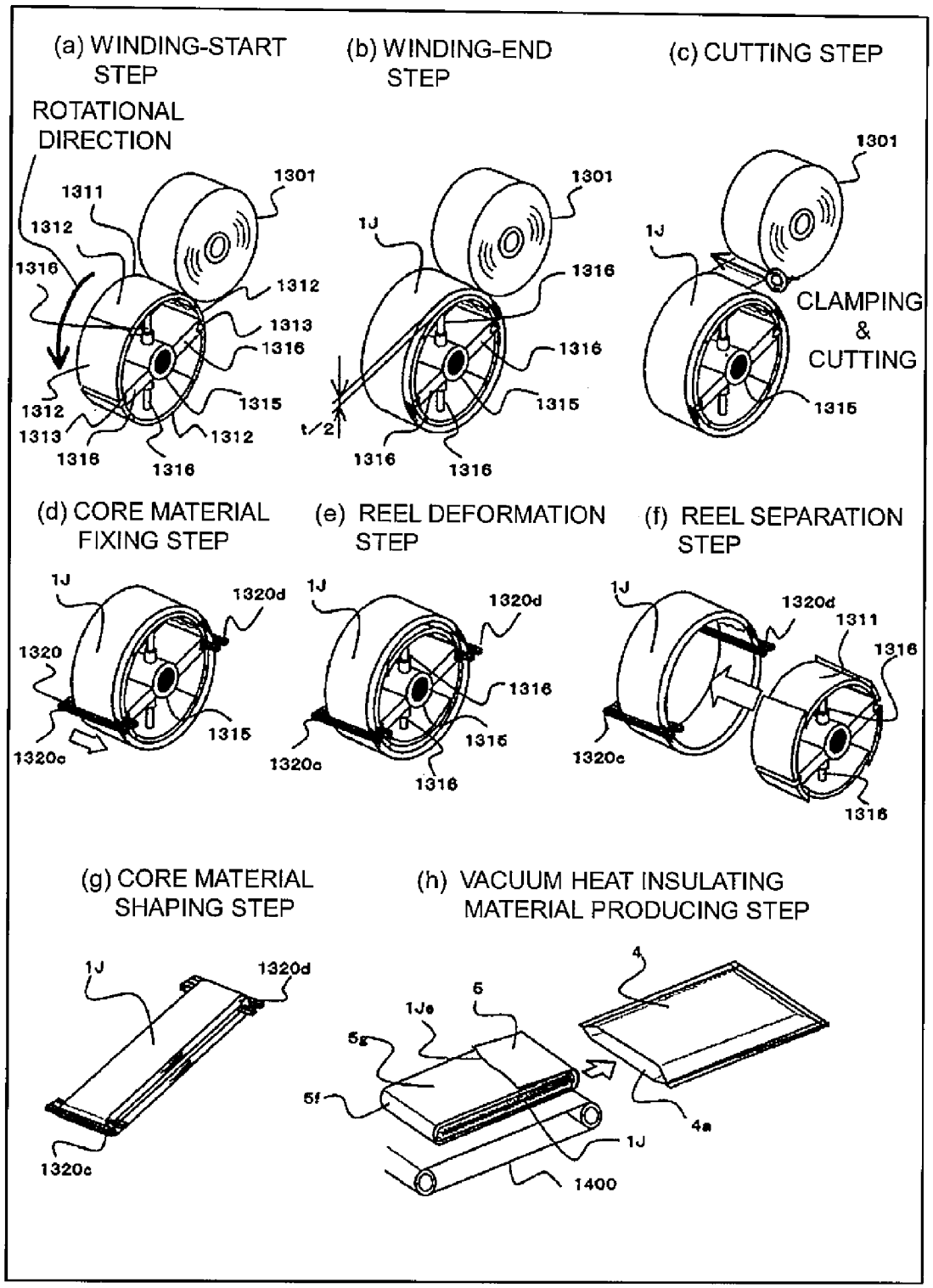
FIG. 9 shows the first embodiment and is a diagram illustrating a manufacturing method of the vacuum heat insulating material.

Next, a manufacturing method of the vacuum heat insulating material 7 in the present embodiment will be described based on FIG. 9. FIG. 9 is a diagram describing a manufacturing method of a vacuum heat insulating material. In FIG. 9, (a) through (i) of FIG. 9 illustrate steps of manufacturing the vacuum heat insulating material 7.

(a) of FIG. 9 is a winding-start step in which the continuous sheet-shaped fiber assembly 1J (e.g., the non-woven cloth sheet, which is the organic fiber assembly made of the continuous organic fibers 2) is wound about the reel 1311. The winding-start step includes the original fabric roller 1301 that is formed by winding the continuous sheet-shaped fiber assembly 1J in a coil-like fashion for plural times, and that is cut to the predetermined width, and the reel 1311 having the predetermined width for winding the continuous sheet-shaped fiber assembly 1J (e.g., in a coil-like shape) that is wound about the original fabric roller 1301 in a coil-like shape are included, wherein the continuous sheet-shaped fiber assembly 1J wound about the original fabric roller 1301 is started to be wound about the reel 1311 by rotating the original fabric roller 1301 and the reel 1311. This step is the start of winding step.

(b) of FIG. 9 is a winding-end step wherein the continuous sheet-shaped fiber assembly 1J is wound about the reel 1311 only for a predetermined number of times R (in an approximately cylindrical shape, or in a coil-like shape) and the winding is completed. In the winding-start step, the continuous sheet-shaped fiber assembly 1J is wound about the reel 1311 from the original fabric roller 1301, in which case, the thickness a of the continuous sheet-shaped fiber assembly 1J that is wound about the reel 1311 corresponds to t/2, which is half the thickness of a predetermined thickness t necessary for the core material 5. When the continuous sheet-shaped fiber assembly 1J is wound for R times that is the predetermined number of times corresponding to the predetermined thickness a, the rotations of the original fabric roller 1301 and the reel 1311 stop, and the winding of the continuous sheet-shaped fiber assembly 1J is completed. This step is the winding-end step.

(c) of FIG. 9 is a cutting step wherein the continuous sheet-shaped fiber assembly 1J (e.g., the organic fiber assembly) is cut. In the winding-end step, the continuous sheet-shaped fiber assembly 1J is wound about the reel 1311, and when the number of wound times R reaches the number of times corresponding to t/2, which is half the thickness of the predetermined thickness t necessary for the core material 5, the rotations of the original fabric roller 1301 and the reel 1311 stop. The cutting step is a step of cutting the continuous sheet-shaped fiber assembly 1J at a predetermined point, and a step of cutting the continuous sheet-shaped fiber assembly 1J at a predetermined cutting point between the original fabric roller 1301 and the reel 1311 in a state of clamping anterior and posterior parts of the predetermined cutting point, and separating the original fabric roller 1301 from the reel 1311.

Here, the continuous sheet-shaped fiber assembly 1J in the approximately cylindrical shape (or in the coil-like shape) that is wound about the reel 1311 is clamped and held by the clamping members 1320 (the clamping members 1320c and 1320d), in which case, it is desirable that the continuous sheet-shaped fiber assembly 1J is cut at a posterior position (e.g., just behind the clamped position) of the clamped position by the clamping members 1320 so that a cut end face (the winding-end end portion 1Je) where the continuous sheet-shaped fiber assembly 1J that is wound about the reel 1311 is cut does not unravel, or the cut end face (the winding-end end portion 1Je) is placed at the bending end portion 5f (i.e., is not placed at the flat portion 5g) when the continuous sheet-shaped fiber assembly 1J is formed into the core material 5, as shown in FIG. 5.

(d) of FIG. 9 is a core material fixing step wherein the continuous sheet-shaped fiber assembly 1J (e.g., the organic fiber assembly) in the approximately cylindrical shape (or in the coil-like shape) is clamped by the clamping members 1320. After the continuous sheet-shaped fiber assembly 1J is cut in the cutting step, the clamping members 1320 are inserted in the clamping member installation parts 1313 (the clamping member installation parts 1313c and 1313d) such as the concave portion, the notch, etc. formed in the reel 1311, and the vicinity of the winding-end end portion 1Je is clamped lest the winding-end end portion 1Je of the continuous sheet-shaped fiber assembly 1J unravels or reveals.

(e) of FIG. 9 is a reel deformation step wherein winding tension of the continuous sheet-shaped fiber assembly 1J that is wound about the reel 1311 is loosened by making at least one of the circumferential members 1312a and 1312b out of plural circumferential members 1312a to 1312d formed in the circumferential direction of the reel 1311 movable and deformed in the center direction of the radial direction. Whereas the vicinity of the winding-end end portion 1Je (cut end face) is clamped in the core material fixing step, in the reel deformation step, in a state wherein the continuous sheet-shaped fiber assembly 1J is wound about the reel 1311 for the number of times R corresponding to the predetermined thickness (t/2) and clamped by the clamping members 1320 (the clamping members 1320c and 1320d), at least one circumferential member (two circumferential members 1312a and 1312b which are opposed in the radial direction) out of plural circumferential members 1312 (the circumferential members 1312a to 1312d) of the reel 1311 is made movable in a shrinking direction toward the center side in the radial direction of the reel 1311. That is, by making the circumferential member holding shafts 1316a and 1316b movable in the shrinking direction toward the center side in the radial direction after the continuous sheet-shaped fiber assembly 1J is wound about the reel 1311, the circumferential members 1312a and 1312b are also made movable in the shrinking direction toward the center side in the radial direction.

Accordingly, since the tensile force of the continuous sheeted fiber assembly 1J that is wound about the reel 1311 in an approximately cylindrical shape with the predetermined tensile force is loosened by making the circumferential members 1312a and 1312b in the shrinking direction toward the center side in the radial direction, it is possible to easily remove the continuous sheet-shaped fiber assembly 1J that is wound in the approximately cylindrical shape from the reel 1311. (It is possible to easily remove the continuous sheet-shaped fiber assembly that is clamped in the shaft center direction of the rotational shaft 1315 of the reel 1311). That is, by loosening the tensile force of the continuous sheet-shaped fiber assembly 1J (e.g., the organic fiber assembly) that is wound about the reel 1311 with the predetermined tensile force, it becomes easier to remove the continuous sheet-shaped fiber assembly 1J that is wound about the reel 1311 from the reel 1311.

(f) of FIG. 9 is a reel separation step wherein the continuous sheet-shaped fiber assembly 1J that is wound about the reel 1311 is removed from the reel 1311, and the reel is separated from the continuous sheet-shaped fiber assembly 1J in the approximately cylindrical shape (or in the coil-like shape). Since at least one of the circumferential members 1312a and 1312b in the reel 1311 is made movable and deformed toward the center side in the radial direction, and the tensile force generated by winding of the continuous sheet-shaped fiber assembly 1J that is wound about the reel 1311 is loosened, in the reel separation step, the continuous sheet-shaped fiber assembly 1J in the approximately cylindrical shape whose tensile force is loosened is removed from the reel 1311 in the shaft center direction of the rotational shaft 1315. Otherwise, it is also applicable that the reel 1311 is removed from the continuous sheet-shaped fiber assembly 1J in the approximately cylindrical shape in a clamped state.

(g) of FIG. 9 is a core material shaping step wherein the plated core material 5 is shaped by pulling the continuous sheet-shaped fiber assembly 1J in the approximately cylindrical shape (or in the coil-like shape) that is separated from the reel 1311 in approximately opposite directions (reverse directions) by the clamping members 1320 (the clamping members 1320c and 1320d), which are shaping members. Whereas in the reel separation step, the continuous sheet-shaped fiber assembly 1J is separated from the reel 1311 in a clamped state by the clamping members 1320, which are the shaping members, in the core material shaping step, the continuous sheet-shaped fiber assembly 1J in the approximately cylindrical shape is folded at the clamping positions by the clamping members 1320, which are the shaping members, by pulling the continuous sheet-shaped fiber assembly 1J in the approximately cylindrical shape that is removed from the reel 1311 in a clamped state by two clamping members 1320c and 1320d toward reverse direction sides respectively, in the opposite directions in an approximately linear direction. Thus, the continuous sheet-shaped fiber assembly 1J in the approximately cylindrical shape is shaped into the plated (sheeted) core material 5 including the bending end portions 5f (folding-up portions) and the flat portion 5g. The core material 5 structured by the continuous sheet-shaped fiber assembly 1J that is formed in a plate shape by the clamping members 1320, which are the shaping members, is moved on a conveyer 1400 in a state of being clamped the bending end portions 5f (folding portions) by two clamping members 1320, and shaped into the core material 5 by the clamping members 1320 being removed. That is, the continuous sheeted fiber assembly 1J (e.g., the organic fiber assembly) that is made of continuous fibers (e.g., the organic fibers 2) are continuously wound from the inner side toward the outer side to form and produce the plated core material 5, and is moved on the conveyer 1400.

(h) of FIG. 9 is a vacuum heat insulating material producing step for producing the vacuum heat insulating material 7 by after making the core material 5 that is shaped on the conveyer 1400 be inserted in the gas-barrier outer cover material 4 having the opening portion 4a with one end open, making the gas-barrier outer core material 4 be approximately sealed in a state with the inside being decompressed. The core material 5 that is formed in a plate shape by making the continuous sheet-shaped fiber assembly 1J be laminated into plural layers, and continuously wound from the inner side toward the outer side is inserted in the gas-barrier outer cover material 4 having the opening portion 4a, at least one end of which is open, and conveyed into a vacuum furnace, and then by heat sealing a sealing portion (e.g., the opening portion 4a) of the outer cover material 4 in an approximately vacuum state, the vacuum heat insulating material 7 is completed.

Here, since the circumferential members 1312 of the reel 1311 are formed in a cylindrical shape (coil-like shape) nearly continuous in the winding direction (the circumferential direction), the tensile force generated by winding becomes approximately uniform when the continuous sheet-shaped fiber assembly 1J is wound about the reel 1311. Thus, a scratch or a cutting, etc. is not generated on the continuous sheet-shaped fiber assembly 1J at the time of winding, and the highly-reliable core material 5 and vacuum heat insulating material 7 are obtained. Further, when the core material 5 is inserted in the outer cover material 4, the core material 5 is inserted from the bending end portion 5fa on a side where the bending end portion 1Je of the continuous sheet-shaped fiber assembly 1J is not caught and does not unravel by the opening portion 4a of the outer cover material, out of two bending end portions 5f in the length direction of the continuous sheet-shaped fiber assembly 1J. For example, the core material 5 should preferably be inserted from the side of the bending end portion 5fa on the upstream side in the winding direction (the opposite side in the winding direction) of the continuous sheet-shaped fiber assembly 1J with respect to the position of the winding-end end portion 1Je, as shown in FIG. 5. Namely, the present embodiment includes a core material inserting step for inserting the core material 5 that is formed in the plate shape by winding the sheet-shaped fiber assembly 1J with the predetermined width, which is continuous in the length direction, in the outer cover material 4 from the opening portion 4a of the gas-barrier outer cover material 4 from the side of the bending end portion 5fa on the upstream side in the winding direction with respect to the winding-end end portion 1Je of the continuous sheet-shaped fiber assembly 1J out of two bending end portions 5f in the length direction of the core material 5, and an outer cover material sealing step for decompressing inside of the outer cover material 4 in a state with the core material 5 inserted, and for sealing the opening portion 4a. In this way, since the winding-end end portion 1Je does not unravel and is not caught on by the opening portion 4a when the core material 5 is inserted from the opening portion 4a of the outer cover material 4, the core material 5 can be smoothly inserted in the outer cover material 4, insertability can be considerably improved, and the vacuum heat insulating material 7 can be produced in a short period of time. In addition, it becomes unnecessary to fix the winding-end end portion 1Je to the core material 5 with an adhesive, etc. lest the winding-end end portion 1Je reveals or unravels, hence the cost can be reduced.

Figure 10:
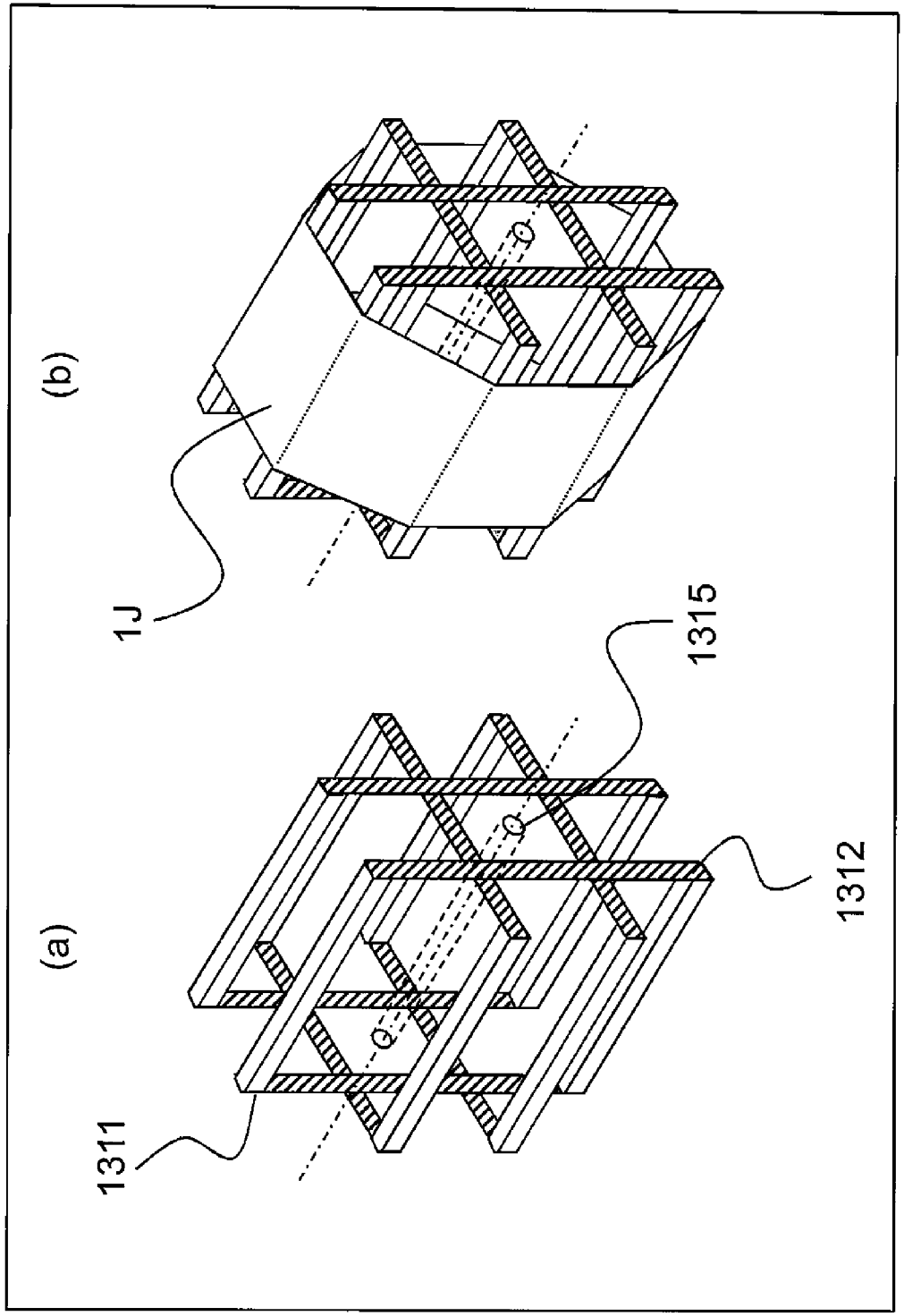
FIG. 10 shows the first embodiment, and is a view showing a frame format of another reel.

In the present embodiment, the circumferential members 1312 formed in the approximately cylindrical shape (coil-like shape) nearly continuous in the winding direction (circumferential direction) are used for the reel 1311. However, the circumferential members 1312 may not be in an approximately cylindrical shape, and may be in a polygonal shape (octagon shape, hexagon shape, plate shape, etc.). FIG. 10 shows the first embodiment, and is a view showing a frame format of another reel. (a) of FIG. 10 is a diagram illustrating one example of an octagon-shaped reel. (b) of FIG. 10 is a diagram illustrating a state wherein the continuous sheet-shaped fiber assembly 1J (e.g., the fiber assembly 1) is wound about the octagon-shaped reel. As shown in the diagrams, the circumferential members 1312 need not be continuous in the winding direction (circumferential direction). In the diagrams, the circumferential members 1312 in the shape of a rod (e.g., rectangular column or circular cylinder) are approximately evenly placed in eight parts in the circumferential direction in the reel 1311, whereby the continuous sheet-shaped fiber assembly 1J is reeled off from the original fabric roller 1301 by rotating the circumferential members 1312 upon the rotational shaft 1315. As shown in the diagrams, when plural circumferential members 1312 (e.g., in eight parts) are not continuous in the winding direction, for example, it becomes possible to clamp the continuous sheet-shaped fiber assembly 1J that is wound about the reel 1311 by inserting the clamping members 1320 in a space between plural circumferential members 1312 (between a circumferential member 1312 and another circumferential member 1312) in a rectangular columnar shape or a columnar shape, etc. that are placed at approximately equal intervals in the winding direction. Thus, the clamping member installation parts 1313 are unnecessary, and the reel 1311 of simple structure, lightweight and low-cost can be obtained.

In the present embodiment, it is included the original fabric roller 1301 of long fibered non-woven cloth that is obtained by continuously winding the continuous sheet-shaped fiber assembly 1J formed of the continuous organic fibers 2 about the original fabric roller in the approximately cylindrical shape (coil-like shape), and the reel 1311 with the predetermined width for reeling off the continuous sheet-shaped fiber assembly 1J of long fibered non-woven cloth on the original fabric roller 1301 (e.g., into an approximately cylindrical shape or a coil-like shape). By winding the continuous sheet-shaped fiber assembly 1J (e.g., the organic fiber assembly) that is wound about the original fabric roller 1301 for the predetermined number of times R (corresponding to t/2, which is half the thickness of the predetermined thickness t necessary for the core material 5), the continuous sheet-shaped fiber assembly 1J laminated for the predetermined thickness t necessary for the core material 5. Thus, there is no necessity to laminate non-woven cloth sheet (the fiber assembly 1) that is cut to a predetermined size (width or length) layer by layer, and the core material 5 of low cost can be simply produced with low-cost production equipment.

That is, the core material 5 is formed in the plate shape by continuously winding the continuous sheet-shaped fiber assembly 1J (e.g., the organic fiber assembly) formed of continuous fibers (e.g., the organic fibers 2) from the inner side toward the outer side, and the end portions in the length direction (the bending end portions 5f) out of four end faces of the approximately rectangular and plated core material 5 are shaped by bend forming (fold forming) of the continuous sheets. Thus, since the end faces of two length-direction end faces (the bending end portions 5f) whereon bending processing (folding processing) is performed are not cut, the organic fibers 2 do not protrude from the bending end portions 5f, and since the end faces are not disordered, there is no necessity to cut the end faces.

Additionally, a part (area) to be cut is small in size, and the core material 5 and the vacuum heat insulating material 7 which are low in cost, and which can be easily processed are obtained. When the original fabric roller 1301 is used by cutting the original fabric roller 1301 to a necessary predetermined width, two end faces in the width direction out of four end faces of the core material 5 in the approximately rectangular and plate shape correspond to the width-direction end faces of the core material 5. Thus, since two end faces of the core material 5 in the width direction are also cut to a predetermined width beforehand at the time of the original fabric roller 1301, there is no necessity to cut the original fabric roller 1301 after the core material 5 is formed, the production line of the core material 5 is simplified, and the core material 5 and the vacuum heat insulating material 7 low in cost are obtained.

Since the core material is continuously wound from the inner side toward the outer side, both ends (the bending portions 50 in the length direction of the fiber assembly 1 are continuously connected to the flat portion 5g. Thus, in comparison with a case wherein the fiber assembly is laminated layer by layer, wherein both ends are not connected to the flat portion, a strength of stiffness (especially, a bending strength) of the core material 5 and the vacuum heat insulating material 7 is increased. Therefore, when a heat insulating box of a refrigerator, etc. is to be configured, since the strength of stiffness can be obtained only by the vacuum heat insulating material, the strength (bending stiffness) can be obtained without using urethane foamed material, etc. in combination. Thus, urethane, etc. is unnecessary, or only a small amount of urethane, etc. is sufficient, and a heat insulating box, or an appliance such as a refrigerator, etc. which is low in cost, with a small thickness can be obtained.

The organic fibers 2 do not protrude from the end faces, and cutting of the end faces is unnecessary since the end faces are not disordered. Therefore, there is no possibility that the fiber length of remaining fibers gets short by cutting the end faces, or that the remaining fibers protrude from the cut end faces, and sealing property of the sealing portion of the outer cover material 4 is impaired.

Figure 11:
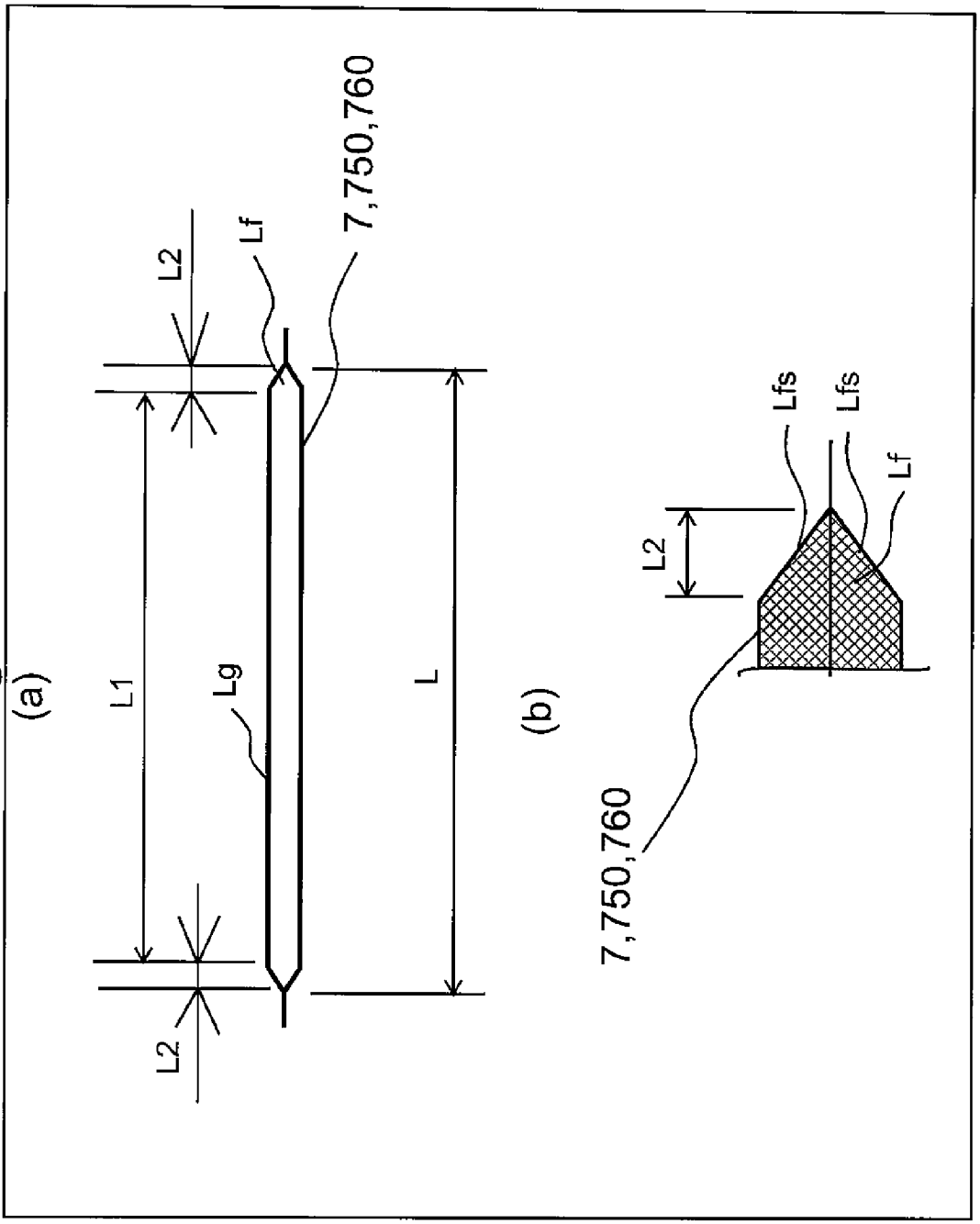
FIG. 11 shows the first embodiment and is a view showing a frame format of the shape of the vacuum heat insulating material.

As shown in FIG. 11, when the core material 5 that is continuously wound about the vacuum heat insulating material 7 or 750, or a vacuum heat insulating material 760 from the inner side toward the outer side, and is laminated in the plate shape, a cross-sectional shape (a cross section orthogonal to the width direction) in the length direction of the length direction end portions (the bending end portions 50 of the core material 5 becomes an approximately triangular shape. FIG. 11 is a diagram describing the first embodiment, and is a view showing a frame format of the shape of the vacuum heat insulating material. (a) of FIG. 11 is a cross-sectional (a cross section orthogonal to the width direction) view in the length direction of the vacuum heat insulating material 7, 750 or 760. (b) of FIG. 11 is a front view of major parts of the length direction end portions of the vacuum heat insulating material 7, 750 or 760, seen from a direction orthogonal to the length direction.

In FIG. 11, in a case wherein the core material 5 that is continuously wound about the vacuum heat insulating materials 7, 750 and 760 from the inner side toward the outer side and that is laminated in the plate shape, when both end faces (the bending end portions 5f) in the length direction of the core material 5 are sealed in a state of being inserted in the outer cover material 4 and decompressed, the core material 5 is composed of a plated smooth portion Lg (a part with a length L1), and a length direction both end portions Lf (parts with a length L2) in an approximately triangle shape. In this case, when both ends (the bending end portions 50 in the length direction of the core material 5 is sealed in a state of being inserted in the outer cover material 4 and decompressed, the cross-sectional shape (the cross-sectional shape orthogonal (perpendicular) to the width direction) of the length direction both end portions Lf becomes an approximately triangular shape with a thickness gradually getting small toward the outer direction in the length direction with respect to the length direction. Thus, since the outer cover material 4 is less likely to get crimpy, and to be torn, the highly-reliable vacuum heat insulating material can be obtained. That is, the vacuum heat insulating material including the core material 5 with the laminated structure that is formed in the plate shape in the state wherein the sheet-shaped fiber assembly, which is continuous in the length direction, is wound from the inner side toward the outer side, and the gas-barrier outer cover material 4 which houses inside the core material 5 from the opening portion 4a, and of which the opening portion 4a is sealed in a state with the inside decompressed, and the cross-sectional shape of the vacuum heat insulating material that is orthogonal to the width direction in the length direction end portions (the bending end portions 5f, which are both end portions in the length direction) of the core material 5 is an approximately triangular shape with a thickness gradually getting small toward the outer side in the length direction in the state with the core material 5 decompressed inside the outer cover material 4. Further, when the end faces in the length direction are made to face each other to be connected and used in a case wherein one of the vacuum heat insulating materials 7, 750 and 760 is processed, e.g. bent into a cylindrical shape, etc., or in a case wherein the end faces of two or more vacuum heat insulating materials 7, 750, and 760 are made to face each other to be used, by connecting the end faces in a manner of making slant portions (slant portions Lfs in FIG. 11) in the approximately triangular end faces of plural vacuum heat insulating materials 7 contact with each other, a joint thickness of the contacting portion can be reduced, heat leak from the contacting portion can be reduced, and it is possible to obtain the vacuum heat insulating materials 7, 750 and 760, and an appliance such as a refrigerator, etc. whereon the vacuum heat insulating materials 7, 750 and 760 is mounted, of high performance.

(Laminating Method of Fiber Assembly, Manufacturing Method 3 of a Core Material)

Figure 12:
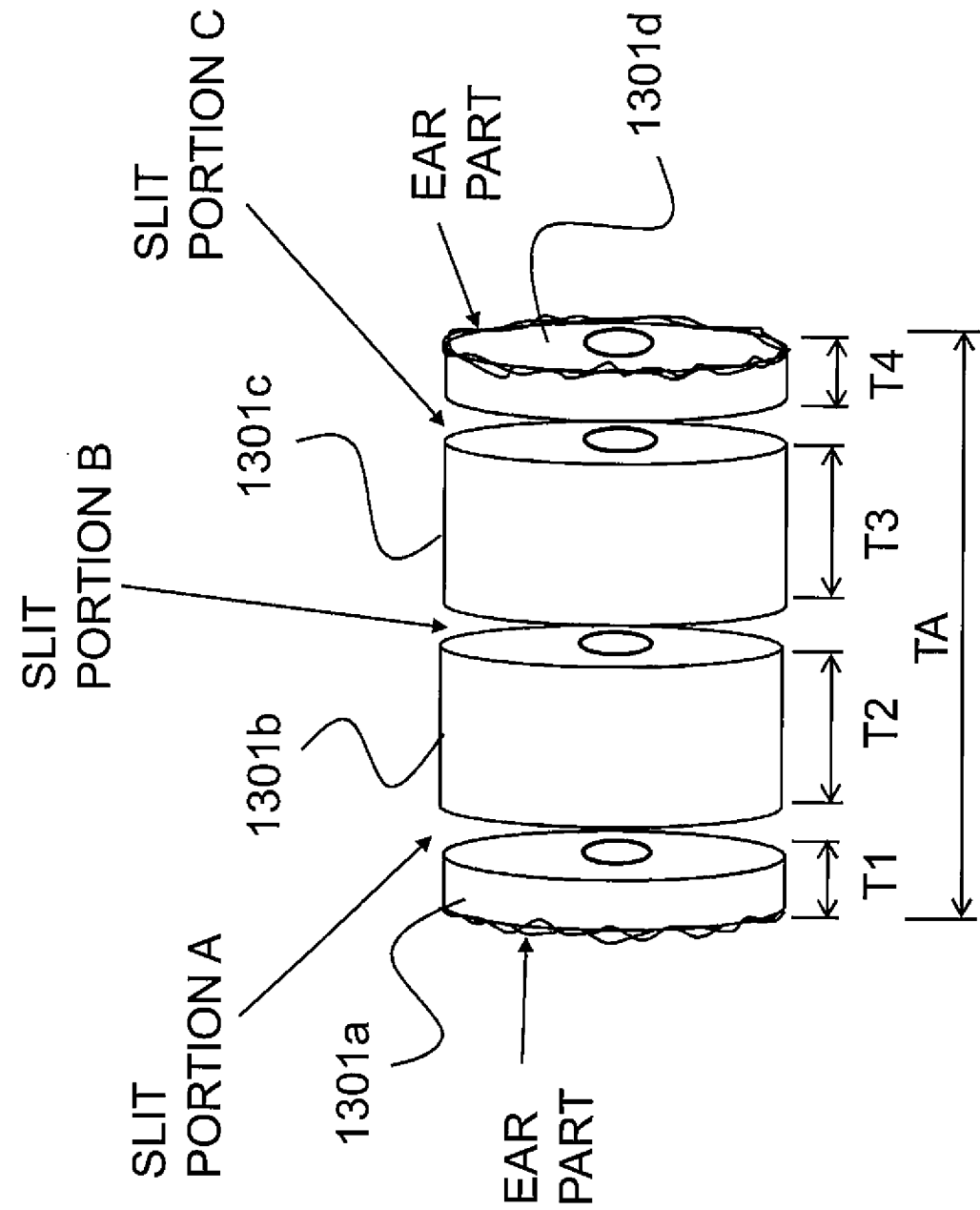
FIG. 12 shows the first embodiment and is a diagram illustrating the structure of a combination original fabric roll with a large width by combination of plural original fabric rolls.
Figure 13:
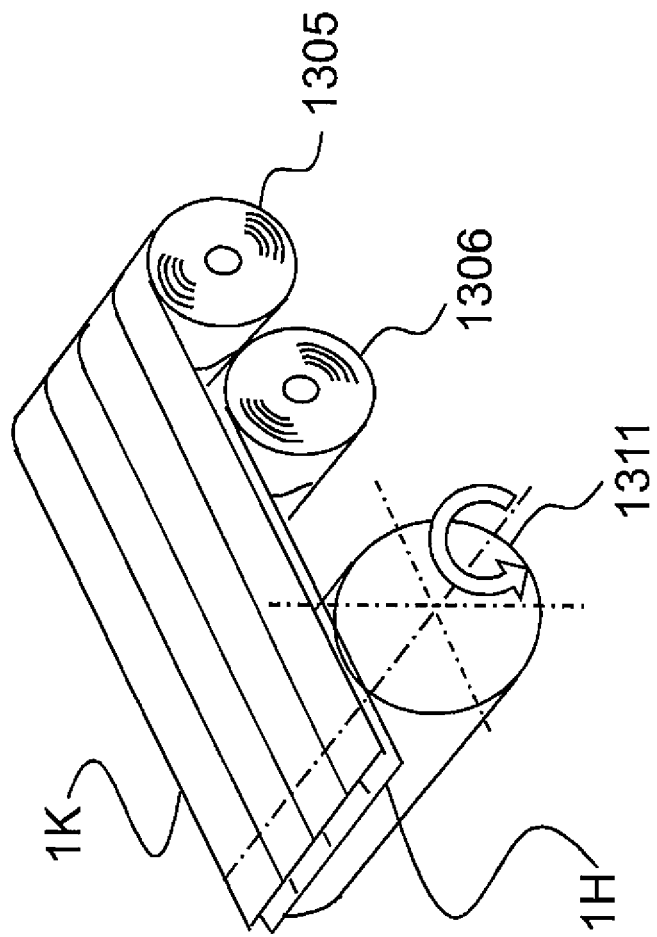
FIG. 13 shows the first embodiment and is a view showing a frame format of a winding device in a case wherein two combination original fabric rolls are used and wound about the reel.
Figure 14:
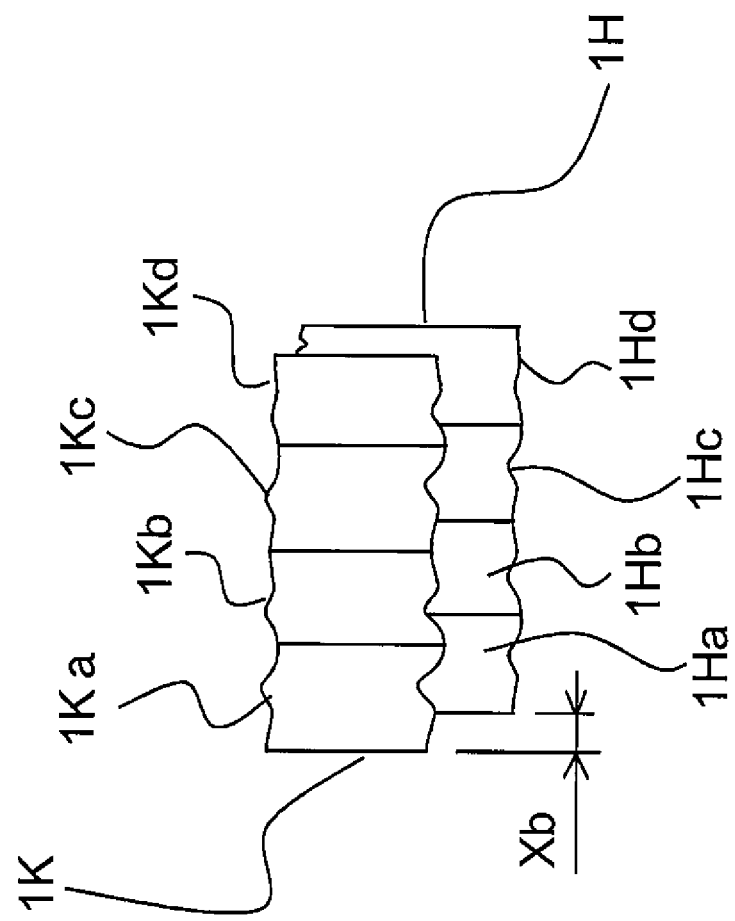
FIG. 14 shows the first embodiment and is a view showing a frame format of the structure of organic fiber assembly that is wound about the winding device using two combination original fabric rolls (an upper side original fabric roll and a lower side original fabric roll).
Figure 15:
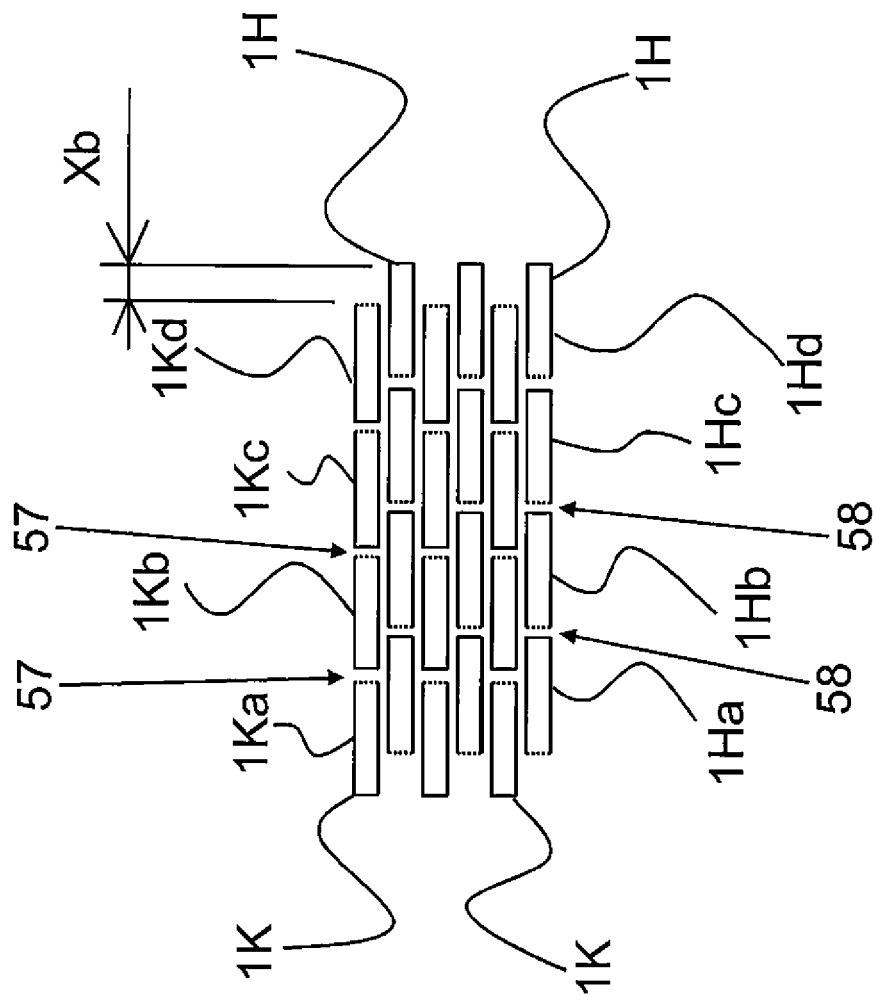
FIG. 15 shows the first embodiment and is a cross section view of the core material that is wound by the winding device using two combination original fabric rolls.

Next, a method of producing the core materials 5 and 550 by combining plural original fabric rollers 1301 will be described. FIGS. 12 to 15 are diagrams describing the first embodiment. FIG. 12 is a diagram illustrating the structure of a combination original fabric roll with a large width by combining plural original fabric rolls. FIG. 13 is a view showing a frame format of a winding device in a case wherein two combination original fabric rolls are used and wound about the reel. FIG. 14 is a view showing a frame format of the structure of organic fiber assembly that is wound by the winding device using two combination original fabric rolls (an upper side original fabric roll and a lower side original fabric roll). FIG. 15 is a cross section view of the core material that is wound by the winding device using two combination original fabric rolls.

For example, the first original fabric roll 1305 (upper side roll) having a predetermined width is formed by combining plural original fabric rolls (e.g., a main body part A 1301a, a main body part B 1301b, a main body part C 1301c, and a main body part D 1301d) in an approximately cylindrical shape whereon winding is performed for nearly the same number of times (the same number of layers of lamination) so as to be adjacent to each other (although it is desirable to align plural original fabric rolls without gap, it is also applicable to align plural original fabric rolls with a predetermined gap when the gap is needed, as will be described below) in a width direction (lateral direction), and the second original fabric roll 1306 (lower side roll) with a predetermined width is formed by combining plural original fabric rolls (e.g., a main body part E 1301e, a main body part F 1301f, a main body part G 1301g, and a main body part H 1301h) whereon winding is performed for the same number of times (the same number of layers of lamination) as in the first original fabric roll so as to be adjacent to each other (although it is desirable to align plural original fabric rolls without gap, it is also applicable to align plural original fabric rolls with a predetermined gap) in a width direction (lateral direction).

Here, plural original fabric rolls (e.g., the main body part A 1301a, the main body part B 1301b, the main body part C 1301c and the main body part D 1301d) in an approximately cylindrical shape (or in a coil-like shape) may have the same width or different widths. Similarly, plural original fabric rolls (e.g., the main body part E 1301e, the main body part F 1301f, the main body part G 1301g and the main body part H 1301h) may have the same width or different widths. The number of plural original fabric rolls used for the first original fabric roll 1305 may be the same as or different from the number of plural original fabric rolls used for the second original fabric rolls 1306.

Since in both of the first original fabric roll 1305 and the second original fabric roll 1306, plural original fabric rolls (e.g., plural main body parts) are aligned so as to be adjacent to each other in the width direction, a gap (a minute gap, a predetermined gap) exists between the adjacent main body parts (e.g., the main body part A 1301a and the main body part B 1301b, etc.), and the adjacent main body parts are not connected but intermissive, slit parts (e.g., a slit part A between the main body part A 1301a and the main body part B 1301b, a slit part B between the main body part B 1301b and the main body part C 1301c, a slit part C between the main body part C 1301c and the main body part D 1301d, etc.) exist. Further in the present embodiment, in at least one of the first original fabric roll 1305 and the second original fabric roll 1306, an ear part original fabric roll having an ear part whose edge line is not aligned when original fabric roll material is cut to a predetermined width is used for an original fabric roll (e.g., the main body part A 1301a or the main body part D 1301d, the main body part E 1301e or the main body part H 1301h, etc.) arranged on an end side in the width direction among plural original fabric rolls.

In the present embodiment, the number of plural original fabric rolls (four of the main body part A 1301a, the main body part B 1301b, the main body part C 1301c, and the main body part D 1301d) used for the first original fabric roll 1305 and the number of plural original fabric rolls (four of the main body part E 1301e, the main body part F 1301f, the main body part G 1301g, and the main body part H 1301h) used for the second original fabric roller 306 are the same. Plural original fabric rolls (the main body part A 1301a, the main body part B 1301b, the main body part C 1301c and the main body part D 1301d) used for the first original fabric roll 1305 and plural original fabric rolls (the main body part E 1301e, the main body part F 1301f, the main body part G 1301g and the main body part H 1301h) used for the second original fabric roll 1306 are respectively displaced by a predetermined amount Xb in the width direction, and the fiber assembly 1K wound about the first original fabric roll 1305 and the fiber assembly 1H wound about the second original fabric roll 1306 are wound off together about the reel 1311 so as to overlap one above the other (in an approximately perpendicular direction to the sheet surface) in a state of being displaced by the predetermined amount Xb in the width direction of the sheet surface. In this case, the first original fabric roll 1305 and the second original fabric roll 1306 are arranged in a longitudinal direction, a vertical direction, or an oblique direction with respect to the moving direction (wound direction) of the first (organic) fiber assembly 1K and the second (organic) fiber assembly 1H. The width of plural original fabric rolls in the second original fabric roll 1306 corresponding to plural original fabric rolls in the first original fabric roll 1305 is approximately the same, and displaced by the predetermined amount Xb.

That is, the width of each original fabric roll (e.g., the main body part A 1301a) constituting the first original fabric roll 1305 and the width of each original fabric roll (e.g., the main body part E 1301e) constituting the second original fabric roll 1306 placed behind (or in a lower part, etc.) the first original fabric roll 1305 are approximately the same. Similarly, the widths of respective original fabric rolls (the main body part B 1301b and the main body part F 1301f, the main body part C 1301c and the main body part G 1301g, the main body part D1301d and the main body part H 1301h) are set approximately the same. In this regard, it is desirable that a predetermined width of the first original fabric roll 1305 (upper roll) and a predetermined width of the second original fabric roll 1306 (lower side roll) are approximately the same.

In the present embodiment, as for alignment of the first original fabric roll 1305 (upper side roll) and the second original fabric roll 1306 (lower side roll) in a core material producing device, the first original fabric roll 1305 (upper roll) is aligned on a back side (or an upper side or an obliquely upper side, etc.) to the second original fabric roll 1306 (lower side roll) in the direction of the reel 1311 (sending direction of the fiber assembly 1), as described in FIG. 13. That is, the second original fabric roll 1306 (lower side roll) and the first original fabric roll 1305 (upper side roll) are arranged in the direction toward the reel 1311 in this order. In this case, the first (organic) fiber assembly 1K wound about the first original fabric roll 1305 (upper side roll) is placed on an upper side to the second (organic) fiber assembly 1H wound about the second original fabric roll 1306 (lower side roll). Since the first (organic) fiber assembly 1K wound about the first original fabric roll 1305 (upper side roll) and the second (organic) fiber assembly 1H wound about the second original fabric roll 1306 (lower side roll) are wound about the reel 1311, they are wound, for example, in a cylindrical shape (or a coil-like shape) in a state wherein the first (organic) fiber assembly 1K is constantly placed on the outer side in the radial direction of the reel 1311 to the second (organic) fiber assembly 1H. It is preferable to arrange the first original fabric roll 1305 (upper side roll) and the second original fabric roll 1306 (lower side roll) so that the first (organic) fiber assembly 1K and the second (organic) fiber assembly 1H are wound about the reel 1311 in an overlapped state one above the other.

In the meantime, when a predetermined width necessary for a product is small (e.g., around 100 mm or 200 mm), it is easy to manufacture original fabric rolls since only a small space is necessary. However, when a predetermined width necessary for the product is large (e.g., 1100 mm or 2000 mm, etc.), it is difficult to manufacture original fabric rolls. Further, there is a case wherein the vacuum heat insulating materials 7 with different widths are necessary depending on the product. When it is intended to deal with such a case by one original fabric roll, the original fabric rolls are necessitated for the number of necessary predetermined widths. Thus, it becomes difficult to manufacture the original fabric roll, and further, the number of kinds of original fabric rolls gets large and the cost for manufacturing is increased. Therefore, in the present embodiment, plural original fabric rolls are combined so as to be adjacent to each other in the width direction, and used as a combination roll (e.g., the first original fabric roll 1305 or the second original fabric roll 1306).

By using original fabric rolls (e.g., the main body part A 1301a, the main body part B 1301b, the main body part C 1301c and the main body part D 1301d) with plural widths (different widths) so as to be adjacent to each other in a width direction as an original fabric roll (e.g., the first original fabric roll 1305) with a large width, as in the present embodiment, a width of each original fabric roll can be small. Thus, the original fabric roll (e.g., the main body part A 1301a, the main body part B 1301b, etc.) can be easily manufactured at any manufacturing sites of the original fabric roll, and if an original fabric roll with a large width is necessary, the original fabric roll (e.g., the first original fabric roll 1305, the second original fabric roll 1306, etc.) with a large width can be produced by combining plural original fabric rolls with small widths. Thus, the core material 5 and the vacuum heat insulating material 7, which are low in cost, and whose possibility of design is expanded, can be obtained at any manufacturing sites of the original fabric roll, and reducing kinds of original fabric rolls. For example, it is applicable to produce an original fabric roll with a large width by combining plural original fabric rolls (the main body part A 1301a, the main body part B 1301b), etc. with different widths, or by combining plural original fabric rolls (e.g., one original fabric roll with a same width, such as the main body part B 1301b) with an approximately the same and small width.

In the present embodiment, the first (organic) fiber assembly 1K wound about the first original fabric roll 1305 (upper roll), which is the combination original fabric roll made up of plural original fabric rolls (e.g., the main body part A 1301a, the main body part B 1301b, the main body part C 1301c and the main body part D 1301d) and the second (organic) fiber assembly 1H wound about the second original fabric roll 1306 (lower roll), which is the combination roll made up of plural original fabric rolls (e.g., the main body part E 1301e, the main body part F 1301f, the main body part G 1301g and the main body part H 1301h) are displaced by the predetermined amount Xb (e.g., around 5 mm to 40 mm, preferably 10 mm to 20 mm) in the width direction (lateral direction), the reason for which is as follows.

(1) For example, a connecting area of original fabric rolls (e.g., the main body part A 1301a, and the main body part B 1301b, etc.), which are adjacent in the width direction, out of plural original fabric rolls (the main body part A 1301a, the main body part B 1301b, the main body part C 1301c and the main body part D 1301d) that make up the first original fabric roll 1305 is separated by a slit portion since the slit portion (a connecting portion, an adjacent part) comes to an appropriately equivalent position when plural pieces are layered without being displaced by the predetermined amount Xb, since the slit portion (e.g., the slit portion A between the main body part A and the main body part B) exists in the connecting portion, and is not continuous even when the adjacent original fabric rolls contact with each other without gap, although actually there is a slight gap. That is, since the slit portion (the connecting portion, the adjacent portion) is not continuous, the core material 5 may be folded or torn, hence a necessary bending strength as the core material 5 cannot be obtained. Further, since the slit portion (the adjacent portion) is not continuous, but is a cut, from which part the core material 5 may unravel, the outer cover material 4 may peel, and so on, hence the core material 5 with a necessary width cannot be obtained, and performance as the vacuum heat insulating material 7 also cannot be obtained. In the present embodiment, since the first original fabric roll 1305 and the second original fabric roll 1306 are laminated into plural layers so that the first original fabric roll 1305 (upper roll) is displaced from the second original fabric roll 1306 (lower roll) so as to lap over the second original fabric roll 1306 by the predetermined amount Xb, the core material 5 does not unravel or is not separated by the slit portion (adjacent portion) due to friction, etc. at the part that is displaced by the predetermined amount Xb. Thus, the core material 5 of a predetermined necessary size with a necessary heat insulating performance can be obtained.

(2) Although the first original fabric roll 1305 and the second original fabric roll 1306 are displaced so as to lap over the second original fabric roll 1306 by the predetermined amount Xb, since the slit portion (adjacent portion) exists, each of the first (organic) fiber assembly 1K and the second (organic) fiber assembly 1H is not continuous on a same plane surface. Therefore, the first (organic) fiber assembly 1K and the second (organic) fiber assembly 1H are likely to be bent at the slit portion. In the conventional vacuum heat insulating material, a special devise such as performing a concave groove processing, etc. for bending, which increases the manufacturing cost. In the present embodiment, since the adjacent portion (slit portion) is manufactured to be likely to be bent in the manufacturing process, the portion likely to be bent is placed at a portion of the product necessary to be bent, and is effectively used. For example, in a case of a refrigerator, it is considered that a vacuum heat insulating material is allocated across wall surfaces that are bent at a predetermined angle (e.g., approximately 90 degrees), such as a rear surface wall and an upper surface wall, etc. For this, since a large vacuum heat insulating material is necessary, and bending of the vacuum heat insulating material is necessary, large manufacturing equipment is necessary for manufacturing original fabric roll material. Thus, the manufacturing site is limited, the manufacturing is difficult, and the manufacturing cost is increased since a special processing for bending is necessary, which makes it difficult to perform the manufacturing. However, in the vacuum heat insulating material 7 in the present embodiment, a width of an original fabric roll can be freely selected by combination of original fabric rolls with small widths since plural original fabric rolls can be used as a large original fabric roll by making plural original fabric rolls be adjacent to each other in the width direction, and since the slit portion (adjacent portion) can be placed at a position necessary to be bent. Further, since a special processing for bending is unnecessary, and the core material 5 with a large width can be manufactured by combining plural original fabric rolls with small widths, it becomes possible to place the vacuum heat insulating material 7 across wall surfaces which are bent at a predetermined angle of a refrigerator, etc., which has been conventionally difficult.

(3) Both side end portions in the width direction of the original fabric roll material before both ends in the width direction are cut is called as ear parts, where necessary thickness of the organic fibers 2 of the fiber assembly 1 and the continuous sheet-shaped fiber assembly 1J does not exist, variation in thickness may occur, or an edge line in the end faces in the width direction may not be aligned. Therefore, in a case wherein the original fabric roll material is used as an original fabric roll, both sides of the original fabric roll material is cut for a necessary predetermined width and the original fabric roll material is used as an original fabric roll. Thus, an ear part original fabric roll which is an ear part at both side parts in the width direction cut from the original fabric roll material, has been conventionally discarded since the strength was weak, and the end faces (edge line) were not aligned. In the present embodiment, the ear part original fabric roll (in the present embodiment, corresponding to the main body part A 1301a or the main body part D 1301d, for example) that has been discarded conventionally is used as an original fabric roll (e.g., the main body part A 1301a, the main body part D 1301d, etc.) used at both sides in the width direction out of plural original fabric rolls that make up the first original fabric roll 1305 or the second original fabric roll 1306, as shown in FIG. 12. Since the first original fabric roll 1305 and the second original fabric roll 1306 are laminated into plural layers by displacing by the predetermined amount Xb, the ear part and a part which is not the car part are laminated alternately, and the position of the ear part is displaced, hence the ear parts are not laminated continuously. Therefore, even when the ear part mater roll is used, a strength necessary for the core material 5 can be obtained.

As shown in FIG. 12, in the first original fabric roll 1305, the main body part A 1301a, the main body part B 1301b, the main body part C 1301c and the main body part D 1301d are placed in the width direction in this order so as to be adjacent to each other. The widths of the main body part A 1301, the main body part B 1301b, the main body part C 1301c and the main body part D 1301d are T1, T2, T3 and T4, respectively, and the width of the first original fabric roll 1305 is TA (TA=T1+T2+T3+T4). Therefore, the widths (T1, T2, T3, and T4) of each original fabric roll in the first original fabric roll 1305 can be determined depending on the predetermined necessary width for the product. Similarly, the widths of each original fabric roll in the second original fabric roll 1306 can be determined. That is, the widths of the main body part A 1301a, the main body part B 1301b, the main body part C 1301c and the main body part D 1301d (the widths of the main body part E 1301e, the main body part F 1301f, the main body part G 1301g and the main body part H 1301h) can be selected. In this case, the widths T1, T2, T3 and T4 may be the same or different.

Therefore, since each of the widths of plural original fabric rolls (e.g., the main body part A 1301a, the main body part B 1301b, the main body part C 1301c, the main body part D 1301d, the main body part E 1301e, the main body part F 1301f, the main body part G 1301g and the main body part H 1301h) can be selected arbitrarily, the freedom of design is increased, and the core material 5, the vacuum heat insulating material 7, and an appliance, such as a refrigerator, etc. low in cost can be obtained. Additionally, since the core material 5 is manufactured by winding the first original fabric roll 1305 and the second original fabric roll 1306 in a state of being displaced by the predetermined amount Xb about the reel 1311, the core material 5 can be easily bent at the slit portion, the bendable vacuum heat insulating material 7 can be easily manufactured without necessity of special processing, etc., and the vacuum heat insulating material 7 can be easily placed on a heat insulating wall of an appliance, such as a refrigerator, etc. having a heat insulating wall surface which bends at a predetermined angle. Thus, it is possible to increase coverage factor of the vacuum heat insulating material 7, and the vacuum heat insulating material 7 and an appliance of high performance and low in cost can be obtained.

As shown in FIG. 14, when the continuous sheet-shaped fiber assembly 1J (the first (organic) fiber assembly 1K, the second (organic) fiber assembly 1H) is wound about the reel 1311 (e.g., into an approximately cylindrical shape or a coil-like shape), the first (organic) fiber assembly 1K (an upper side organic fiber assembly, first (organic) fiber assemblies 1Ka through 1Kd) from the first original fabric roll 1305 (the upper side roll) and the second (organic) fiber assembly 1H (a lower side organic fiber assembly, the second (organic) fiber assemblies 1Ha through 1Hd) from the second original fabric roll 1306 (lower side roll) are wound about the reel 1311 in a state of being displaced by the predetermined amount Xb. The first (organic) fiber assembly 1K and the second (organic) fiber assembly 1H in a cross section orthogonal to the winding direction in a state of being wound about the reel 1311 are laminated alternately in a state of being displaced by the predetermined amount Xb as shown in FIG. 15, and are continuously wound and laminated from the inner side toward the outer side. Therefore, since the first (organic) fiber assembly 1K and the second (organic) fiber assembly 1H are displaced by the predetermined amount Xb, a distance between the slit portion (the first slit portion 57 (upper side slit portion)) of the first (organic) fiber assembly 1K and the slit portion (the second slit portion 58 (lower side slit portion)) of the second (organic) fiber assembly 1H corresponds to the amount of displacement Xb, the first (organic) fiber assembly 1K and the second (organic) fiber assembly 1H overlap and are laminated by the amount of Xb, and the first (organic) fiber assembly 1K and the second (organic) fiber assembly 1H become difficult to separate due to friction, etc.

Here, the thicker the thickness t of the core material 5 made by laminating plural layers of the fiber assembly 1 (the continuous sheet-shaped fiber assembly 1J, the first (organic) fiber assembly 1K, the second (organic) fiber assembly 1H) in a vacuumed state (decompressed state) becomes, the more it gets difficult to be bent. However, in the present embodiment, since two slit portions (the first slit portion 57 and the second slit portion 58) exist at positions the predetermined amount Xb distant from each other, by bending the core material 5 in two stages at two slit portions (the first slit portion 57 and the second slit portion 58), even when the core material 5 becomes thick, it is possible to easily bend the core material 5 (obtain a predetermined bending angle).

In the present embodiment, a lapping margin Xb is determined depending on the thickness of the core material 5. That is, whereas when the core material 5 is thin, the predetermined amount Xb can be small, when the core material 5 is thick, it becomes difficult to bend the core material 5, hence the predetermined amount Xb is made arbitrarily large to deal with the thickness. Here, when the predetermined amount Xb is too small, the overlapping length (lapping margin) gets short and a frictional force cannot be obtained, hence the first (organic) fiber assembly 1K separates from the second (organic) fiber assembly 1H at a lapping portion (between the main parts), and the core material 5 with a predetermined width cannot be obtained. Thus, in the present embodiment, the lapping margin Xb is set no less than 7 mm (preferably no less than 10 mm). In a case wherein the lapping margin is 5 mm, a necessary frictional force cannot be obtained due to short length of the lapping margin, and each of the first (organic) fiber assemblies 1Ka through 1Kd in the first (organic) fiber assembly 1K, and each of the second (fiber) assemblies 11Ha through 1Hd of the second (organic) fiber assembly 1H separate from the slit portions, and the core material 5 with the predetermined width cannot be obtained. When the lapping margin Xb is no less than 10 mm, it is recognized that a frictional force can be stably obtained even when the ear portion is used for the lapping portion, and decrease in the thermal conductivity can be suppressed.

The larger the lapping margin Xb is, the larger the necessary frictional force can be obtained, hence reliability of the core material 5 is increased. However, if the lapping margin Xb is too large for the thickness of the vacuum heat insulating material 7, the distance (Xb) between two slit portions becomes large at the time of bending, the width of the bending portion becomes large, and the vacuum heat insulating material 7 becomes less likely to be bent. Therefore, when the vacuum heat insulating material 7 is bent, the lapping margin Xb should preferably be no more than around three times of the thickness of the vacuum heat insulating material 7 (e.g., when the thickness t of the vacuum heat insulating material is 10 mm, the lapping margin Xb should preferably be no more than around 30 mm).

Figure 16:
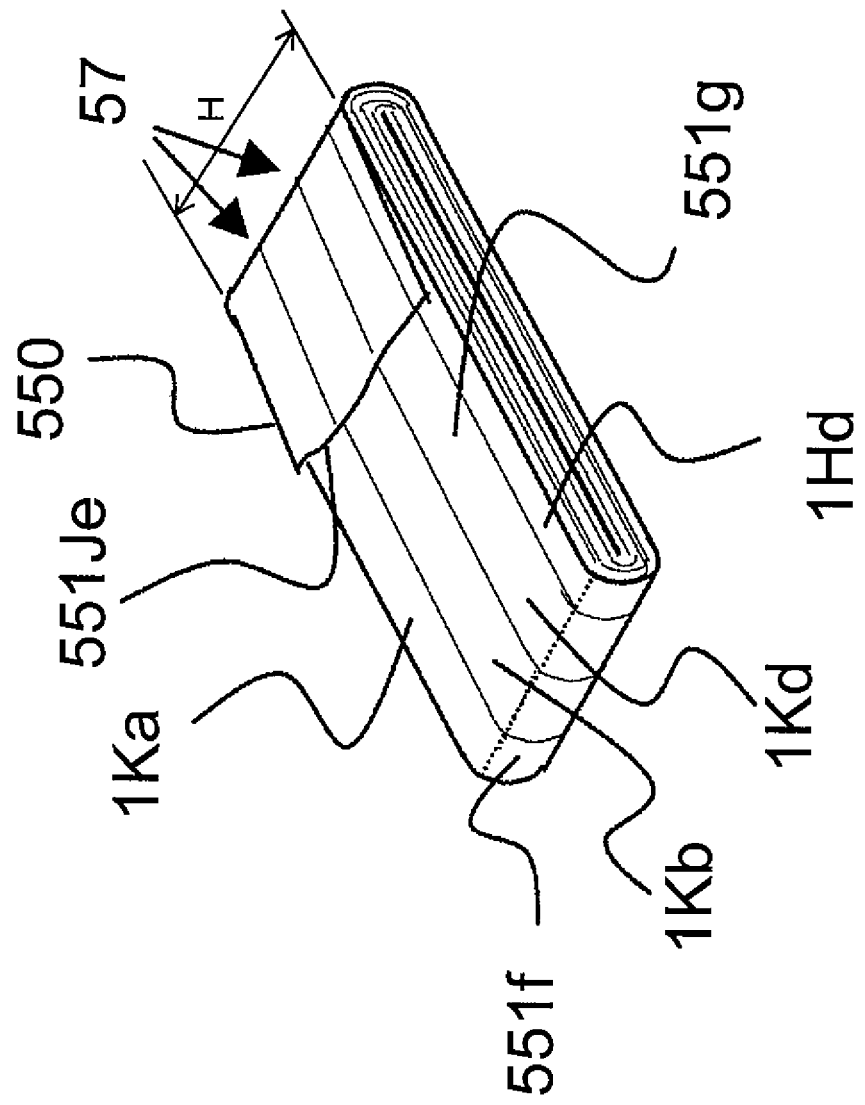
FIG. 16 shows the first embodiment and is a perspective view of the core material in a case of manufacturing the core material by using a combination original fabric roll wherein three original fabric rolls are combined and winding the combination original fabric roll about the reel.

FIG. 16 shows the first embodiment, and is a perspective view of the core material in a case of manufacturing the core material by using a combination original fabric roll wherein three original fabric rolls are combined and winding the combination original fabric roll about the reel. In FIG. 16, the first (organic) fiber assembly 1K (the upper side organic fiber assembly, the first (organic) fiber assemblies 1Ka, 1Kb, and 1Kd) from the first original fabric roll 1305 (upper side roll) and the second (organic) fiber assembly 1H (lower side organic fiber assembly, the second (organic) fiber assemblies 1Ha, 1Hb and 1Hd) from the second original fabric roll 1306 (lower side roll) are wound about the reel 1311 in a state of being displaced by the predetermined amount Xb, and are continuously wound and laminated from the inner side toward the outer side. Then, the first (organic) fiber assembly 1K and the second (organic) fiber assembly 1H are clamped at two parts by two clamping members 1320, and bent at the clamped parts, thus a plated core material 550 is produced. Here, the core material 550 may be simply called as a core material.

The core material 550 is composed of two bending portions 551$f$ (bending end portions, or folding-up portions) that is bent (folded up) by the clamping members 1320, and a flat portion 551$g$ (smooth portion) in a plate shape formed between two bending portions 551$f$. The adjacent portions of each of the first (organic) fiber assemblies 1Ka, 1Kb and 1Kd in the first (organic) fiber assembly 1K (upper side organic fiber assembly) are the first slit portions 57 (upper side slit portions) shown in FIG. 15, and the adjacent portions of each of the (second) fiber assemblies 1Ha, 1Hb and 1Hd in the second (organic) fiber assembly 1H (lower side organic fiber assembly) are the second slit portions 58 (lower side slit portions). The distance (length) in the width direction between the first slit portion 57 and the second slit portion 58 corresponds to the amount of displacement Xb. Therefore, it is possible to easily perform a bending processing at the first slit portions 57 and the second slit portions 58.

Although the winding-end end portion 551Je is placed on the flat portion 551$g$ in FIG. 16, it is preferable that the winding-end end portion 551Je is placed adjacent to the bending portions 551$f$. It is not preferable if the winding-end end portion 551Je is placed in the flat portion 551$g$, since an uneven surface is likely to be formed in the flat portion 551$g$. Further, when the core material 551 is formed into a plate shape by the clamping members 1320, the winding-end end portion 551Je moves from the positions of the clamping members 1320, hence a length between the positions of the clamping members 1320 and the winding-end end portion 551Je gets long. Since the parts of the first (organic) fiber assembly 1K and the second (organic) fiber assembly 1H between the positions of the clamping members 1320 and the winding-end end portion 551Je are not clamped, the core material 550 may unravel or be bent. Thus, it is preferable to perform cutting so that the winding-end end portion 551Je becomes adjacent to the bending portions 551$f$ where clamping by the clamping members 1320 can be performed. It is preferable to cut the first (organic) fiber assembly 1K and the second (organic) fiber assembly 1H after (immediately after is preferable) the first (organic) fiber assembly 1K and the second (organic) fiber assembly 1H are clamped by the clamping members 1320, within a range where an uneven surface is not formed in the flat portion 551g, which is adjacent to the bending portions 551f. There is less possibility that the core material 550 unravels and is bent. Further, it is less likely that an uneven surface is formed in the flat portion 551g, and that an uneven surface is caught in, and a preferable appearance is presented.

Figure 17:
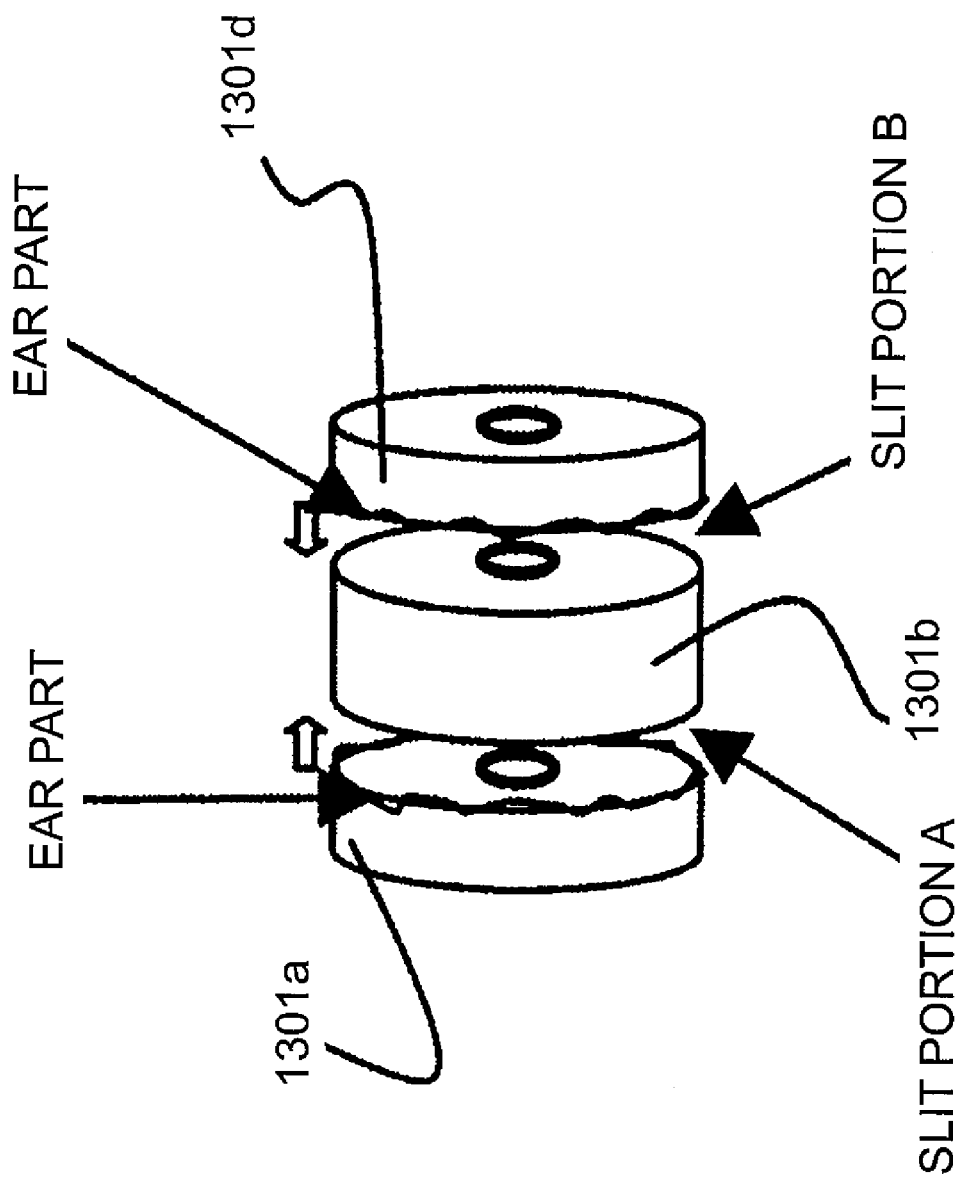
FIG. 17 shows the first embodiment and is a diagram for describing a structure of another combination original fabric roll.

As shown in FIG. 17, when three original fabric rolls (the main body part A 1301a, the main body part B 1301b and the main body part D 1301d) are used for the first original fabric roll 1305 or the second original fabric roll 1306, which is a combination original fabric roll made up of plural original fabric rolls, an ear part original fabric roll whose one side is an ear part may be used for the original fabric rolls (the main body part A 1301a and the main body part D 1301d) on the both sides in the width direction. In this case, it is also applicable that the ear part of the ear part original fabric roll is arranged so as to be directed to the side of the main body part B 1301b as a main body part original fabric roll, which is an original fabric roll placed at a center and not having an ear part.

FIG. 17 shows the first embodiment and is a diagram for describing a structure of another combination original fabric roll. In FIG. 17, the first original fabric roll 1305 (upper side roll) which is a combination original fabric roll is made up of the main body part A 1301a, the main body part 1301b and the main body part 1301d, and the main body part A 1301a, the main body part B 1301b and the main body part D 1301d are arranged in the width direction in this order so as to be adjacent to each other. That is, the main body part B 1301b, which is a main body part original fabric roll not having an ear part is placed at a center position in the width direction, and on both sides thereof, the main body part A 1301a and the main body part D 1301d, which are ear part original fabric rolls having the ear parts are placed. Further, the ear part sides of the ear part original fabric rolls are placed so as to be adjacent to the side of the main body part B 1301b, which is placed at the center position and not having an ear part.

As shown above, since the ear parts of the ear part organic fiber assembly that are wound about the ear part original fabric rolls are made not to be placed on the both sides in the width direction of the first original fabric roll 1305 or the second original fabric roll 1306, which is the combination roll, when the first (organic) fiber assembly 1K and the second (organic) fiber assembly 1H are wound about the reel 1311 to form the core material 5, not the ear parts but the cut faces are placed on the both sides in the width direction, and cutting of the both sides in the width direction of the core material 5 is unnecessary, hence a vacuum heat insulating material low in cost can be obtained. In this case, when the main body part original fabric roll (the main body part B 1301b) not having an ear part is placed at the center position in the width direction, and on both sides thereof; the ear part original fabric rolls (the main body part A 1301a and the main body part D 1301d) having the ear parts are placed, it is also applicable that either one ear part of the ear parts of the ear part original fabric rolls (the main body part A 1301a and the main body part D 1301d) is placed so as to be adjacent to the side of the main body part original fabric roll (the main body part B) at the center position. The ear part original fabric rolls can be arranged so that an ear part is placed only on one side of the combination original fabric roll, in which case, compared to a case wherein the ear part original fabric rolls are placed on the both sides of the combination original fabric roll, it is only necessary to cut only one side in the width direction, and a low-cost vacuum heat insulating material can be obtained. Of course, even in a case of the ear original fabric rolls (the main body part A 1301a and the main body part D 1301d) having the ear parts, if the thickness of the organic fibers 2 in the ear parts is sufficient and the variation in thickness is small, or the variation of the end face position (edge line) is small and is of no matter in terms of the heat insulating performance of the core material 5 and the vacuum heat insulating material 7 or for manufacturing, it is not necessary to cut the end face in the width direction of the ear part original fabric roll even when the ear part original fabric roll is used on the end side in the width direction of the combination original fabric roll.

Therefore, in the present embodiment, as for manufacturing of the core material 550, the core material 550 can be manufactured with simple equipment only for winding a fiber assembly without need of laminating layer by layer. Thus, an ear part fiber assembly (e.g., the fiber assembly that is wound about the main body part A or the main body part D, which is the ear part original fabric roll) having an ear part whose edge line is not aligned (which is not a cut surface) on the end side in the width direction, and which has been conventionally discarded, can be easily used for at least one of plural fiber assemblies 1 (e.g., the first (organic) fiber assemblies 1Ka through 1Kd1, or the second (organic) fiber assemblies 1Ha through 1Hd) making up the first (organic) fiber assembly 1K (e.g., the first (organic) fiber assemblies 1Ka through 1Kd) or the second (organic) fiber assemblies 1H (e.g., the second (organic) fiber assemblies 1Ha through 1Hd), which is a combination fiber assembly. Thus, the ear part original fabric roll can be used as it is without cutting the ear part fiber assembly (fiber assembly that is wound about the ear part original fabric roll) having the ear part that has been conventionally discarded, which does not make waste. Therefore, the core materials 5 and 550, and the vacuum heat insulating materials 7 and 750 low in cost can be obtained.

That is, since the ear part fiber assembly (e.g., the fiber assembly which is wound about the main body part A 1301a (the main body part A) or the main body part D 1301d (the main body part D), which is the ear part original fabric roll) including the both sides end portions in the width direction (ear parts) of fiber assembly material (e.g., the fiber assembly that is wound about the original fabric roll material having the ear part) whose edge line is not aligned, is used for at least one of plural fiber assemblies making up the first (organic) fiber assembly 1K (e.g., the first (organic) fiber assemblies 1Ka through 1Kd) or the second (organic) fiber assembly 1H (e.g., the second (organic) fiber assemblies 1Ha through 1Hd), the ear part original fabric roll including the ear part needs not be discarded by cutting the original fabric roll material to a predetermined width, and can be used. Thus, the material can be effectively used, and a vacuum heat insulating material low in cost can be obtained.

Figure 18:
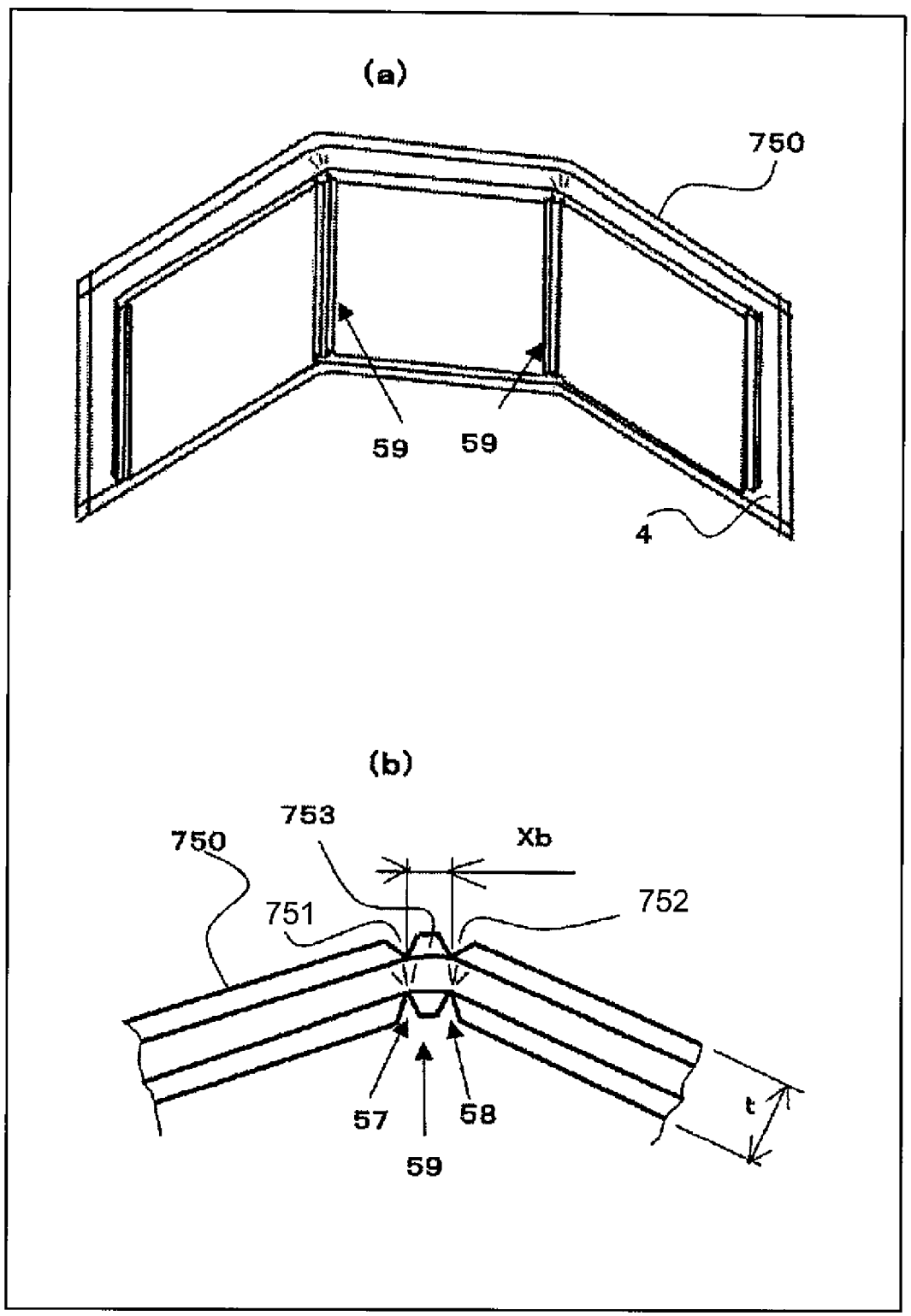
FIG. 18 shows the first embodiment and is a perspective view illustrating appearance of the vacuum heat insulating material being bent.

FIG. 18 shows the first embodiment and is a perspective view illustrating appearance of the vacuum heat insulating material being bent. In FIG. 18, (a) of FIG. 18 is a perspective view of the vacuum heat insulating material 7 being bent, and (b) of FIG. 18 is an enlarged view of a major part of a bent portion in the vacuum heat insulating material 7. In a vacuum heat insulating material 750, the core material 550 is inserted in the gas-barrier outer cover material 4, and the outer cover material 4 is sealed in a state with the inside decompressed. The vacuum heat insulating material 750 is bent in two stages at the parts of the first slit portion 57 and the second slit portion 58, to form a bent portion 59. In this case, the bent portion 59 is bent to have the width of the lapping margin Xb. The width of the lapping margin Xb corresponds to and is approximately the same as the distance (length) between the first slit portion 57 and the second slit portion 58. Here, the vacuum heat insulating material 750 may be simply called as vacuum heat insulating material.

In the vacuum heat insulating material 750, the fiber assembly 1 and the continuous sheet-shaped fiber assembly 17 are stacked in pairs and laminated into plural layers by being displaced by the lapping margin Xb in the width direction. Therefore, by being displaced by the lapping margin Xb, when the first slit portion 57 and the second slit portion 58 are inserted in the outer cover material 4 to be decompressed, the outer cover material 4 sags in each of the first slit portion 57 and the second slit portion 58, and concave portions 751 and 752 are formed. Further, a protrusion portion 753 in an approximately trapezoidal shape is formed so as to protrude between two concave portions 751 and 752, which are respectively indented at two parts of the first slit portion 57 and the second slit portion 58. Since the bent portion 59 is made up of the concave portions 751 and 752 which are respectively indented at the parts of two slit portions 57 and 58, and the protrusion portion 753 in the approximately trapezoidal shape that is formed so as to protrude between the concave portions 751 and 752, the bent portion 59 can be easily bent by using inclined planes of the protrusion portion 753 in the approximately trapezoidal shape by making the concave portions 751 and 752 as base points. Further, since the concave portions 751 and 752 at the parts of the first slit portion 57 and the second slit portion 58, and the protrusion portion 753 in the trapezoidal shape that is formed between the concave portions are formed on the both sides in the thickness direction of the vacuum heat insulating material 750, even when the vacuum heat insulating material 750 is made thick, for example, the vacuum heat insulating material 750 can be easily bent at the parts of the first slit portion 57 and the second slit portion 58 formed on the both sides on the sheet surface. Therefore, even when the vacuum heat insulating material 750 is bent, the outer cover material 4 is not torn or damaged, and the heat insulating performance is not decreased, hence a vacuum heat insulating material that is highly reliable, which can suppress decrease of the heat insulating performance, whereon a bending processing can be performed regardless of the thickness, and having a high degree of freedom for installment, can be obtained.

As in the present embodiment, in the vacuum heat insulating material 750 including the bent portions 59 that are made up of the concave portions 751 and 752 formed by a plurality of the first slit portion 57 and the second slit portion 58, and the protrusion portions 753 in the approximately trapezoidal shape that are formed at the slit portions, bending verification is performed at the thickness t of 5 mm, 7 mm, 10 mm, and 30 mm, and there is no problem. However, when the thickness t of the vacuum heat insulating material 750 is large (e.g., in a case of t=30 mm), if the pieces of the fiber assembly 1 and the continuous sheet-shaped fiber assembly 1J (the first (organic) fiber assembly 1K and the second (organic) fiber assembly 1H) to be lapped is two (in FIG. 13, two pieces of the first (organic) fiber assembly 1K and the second (organic) fiber assembly 1H), as shown in FIGS. 13 and 14, there are two slit portions for one bent portion 59, and there are two concave portions, which is small in number and which makes bending difficult. Thus, it is preferable to make the number of pieces to be lapped be no less than three, the number of the slit portions for one bent portion 59 be no less than three, to make the number of the concave portions by the slit no less than three, which can be arbitrarily selected depending on the thickness t of the vacuum heat insulating material 7, the material or the feature of the fiber assembly 1, the material or the tension strength of the outer cover material 4, etc.

According to the above, as in the present embodiment, by producing the core materials 5 and 550 by lapping plural pieces (e.g., two pieces) of the fiber assembly 1 and the continuous sheet-shaped fiber assembly 1J, and laminating the fiber assembly 1 and the continuous sheet-shaped fiber assembly 1J for plural times in a state of being displaced by the predetermined length (lapping margin Xb) in the width direction, the number of the slits for one bent portion corresponds to the number (e.g., plural number, when three pieces are lapped and displaced, three slits for one bent portion) of pieces of the lapped fiber assembly 1 and the continuous sheet-shaped fiber assembly 1J. Thus, even when the vacuum heat insulating material is thick, it is possible to easily bend the vacuum heat insulating material to both sides of the sheet surface at the bent portion 59, by the concave portions formed by the slit portions formed on the both sides of the sheet surface.

Figure 19:
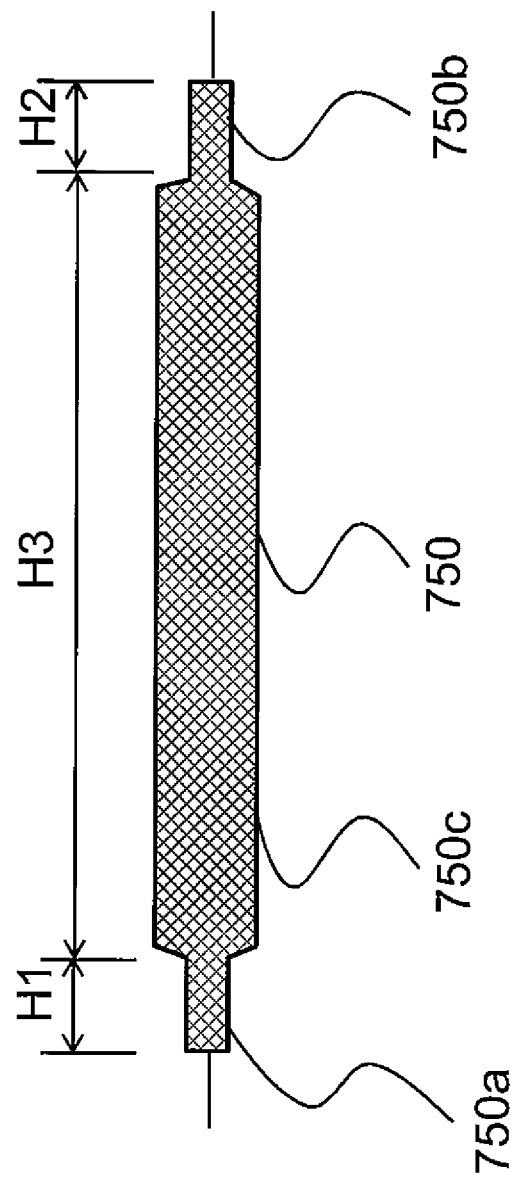
FIG. 19 shows the first embodiment and is a diagram showing the vacuum heat insulating material viewed from a width direction.

When the lapping margin Xb is increased in size, a thin part with a length approximately the same as the lapping margin Xb is formed in a thin-walled portion 750a in the width direction of the vacuum heat insulating material 750, as shown in FIG. 19. FIG. 19 shows the first embodiment and is a diagram showing the vacuum heat insulating material viewed from a width direction. The vacuum heat insulating material 750 includes thin-walled portions 750a and 750b, which have a thickness about a half of a predetermined thickness t of a predetermined thickness portion 750c with the predetermined thickness t, and which are placed on the both sides in the width direction of the predetermined thickness portion 750c. Since the thin-walled portions 750a and 750b have an insulation thickness smaller than the predetermined thickness portion 750c, heat insulating performance is slightly decreased than in the predetermined thickness portion 750c. Therefore, since the width H1 (approximately the same length as the length of the lapping margin Xb) of the thin-walled portions 750a and 750b is increased when the lapping margin Xb is increased in size, the lapping margin should not be too large. That is, when the vacuum heat insulating material 750 is used in a bent state, the lapping margin Xb should preferably be no less than 7 mm and no more than around 30 mm.

When the vacuum heat insulating material 750 is not used in a bent state, since the larger the lapping margin Xb is, the more the reliability is increased, the lapping margin Xb should be no less than 7 mm, preferably be no less than 10 mm. Further, since the larger the lapping margin Xb is, the longer the lengths of the thin-walled portions 750a and 750b become, and the larger the part where heat insulating performance is slightly decreased becomes, the lapping margin Xb should preferably be no more than around 30 mm. Since the lapping margin Xb is also influenced by the thickness t of the vacuum heat insulating material 750, the lapping margin Xb should preferably be around no less than one times and no more than five times (preferably be no more than three times) of the predetermined thickness t of the vacuum heat insulating material 750. In the present embodiment, the core material is prevented from being disjointed by setting the predetermined amount Xb no less than 7 mm, the crease performance is increased by making the predetermined amount Xb no more than about three times the thickness t of the core material 550 in an approximately vacuum state inside the outer cover material 4, and decrease in the heat insulating performance is suppressed by making the width of the both end portions in the width direction of the core material 5. Further, by setting a range of the lapping margin Xb depending on the thickness of the core material 5 at the time of decompression, reliability (the core material 550 does not separate or unravel at the slit portions) is obtained, and the core material and the vacuum heat insulating material 750, which are likely to be bent and have good heat insulating performance, can be obtained.

In the present embodiment, an example wherein two slit portions (the first slit portion 57 and the second slit portion 58) are bent in two stages is described. However, by using plural combination original fabric rolls, not two combination original fabric rolls, which are made by combining plural original fabric rolls, by lapping plural combination original fabric rolls in a state displaced by the predetermined Xb, and by winding plural combination original fabric rolls about a reel, plural slit portions exist, hence a vacuum heat insulating material can be bent in plural stages, and a bending angle at a slit portion can be made small. Thus, the vacuum heat insulating material can be easily bent at a predetermined angle without much strain on the core material 550 and the outer cover material 4 at the time of bending. Further, since it becomes possible to bend the vacuum heat insulating material in plural stages for one bent portion 59, the vacuum heat insulating material can be bent also at a sharp angle, and can be applied to every appliance as a heat insulating material. Accordingly, it is also possible to insulate a piping, such as a condensation pipe of an appliance like a refrigerator, an air conditioner, etc. Additionally, since the vacuum heat insulating material in the present embodiment has good folding processability, even when a piping, such as a condensation pipe, etc. is tucked and insulated between the vacuum heat insulating materials, the vacuum heat insulating materials can be bending-deformed along the shape of the piping. Thus, heat leak from a gap between the vacuum heat insulating materials and the pipe can be suppressed, and decrease in the heat insulating performance can be also suppressed.

That is, the vacuum heat insulating materials 7 and 750 in the present embodiment include the first (organic) fiber assembly 1K wherein plural sheet-shaped fiber assemblies 1J continuous in the length direction are arranged adjacent to each other in the width direction, the second (organic) fiber assemblies 1H wherein plural sheet-shaped fiber assemblies 1J continuous in the length direction are arranged adjacent to each other in the width direction, that is placed so as to be lapped with the first (organic) fiber assembly 1K on top and bottom, back and front, or right and left, the core materials 5 and 550 formed in a lamination structure of fiber assemblies, which are the first (organic) fiber assembly 1K and the second (organic) fiber assembly 1H that are continuously wound from the inner side toward the outer side in a state of being displaced by the predetermined amount Xb in the width direction, and formed into a plate shape, and the gas-barrier outer cover material 4 containing the core materials 5 and 550 inside and having a sealing portion whereby a surrounding area is sealed in a state with the inside decompressed. Since the outer cover material 4 is hermetically sealed by making the inside of the outer cover material 4 in an approximately vacuum state and sealing the sealing portion, by combining plural fiber assemblies with small widths (fiber assemblies that are wound about the main body part of the original fabric roll), the core materials 5 and 550 with large widths can be formed. Further, by arbitrarily select the number of plural fiber assemblies 1 and the continuous sheet-shaped fiber assembly 1J, and the widths of plural fiber assemblies 1 and the continuous sheet-shaped fiber assembly 1J, the widths of the core materials 5 and 550 can be freely set regardless of the widths of the fiber assemblies. Therefore, the degree of freedom of design of the core materials 5 and 550, and the vacuum heat insulating materials 7 and 750 is increased. In addition, since there is no necessity to laminate the fiber assemblies layer by layer by purposely cutting the fiber assemblies to a predetermined size layer by layer, in order to laminate the fiber assemblies into plural layers, cutting equipment or laminating equipment is unnecessary, and the core materials 5 and 550 can be easily manufactured with the use of simple equipment only for winding fiber assemblies and in a small amount of time.

The first slit portion 57 and the second slit portion 58 between adjacent fiber assemblies (e.g., between the first (organic) fiber assembly 1Ka and the first (organic) fiber assembly 1Kb) in the first (organic) fiber assembly 1K or the second (organic) fiber assembly 1H in a state of being inserted inside the outer cover material 4 and decompressed are in a concave shape in the length direction on the front and back surfaces of the plated core materials 5 and 550. Thus, the vacuum heat insulating materials 7 and 750 can be easily bent from the first slit portion 57 and the second slit portion 58 in the concave shape to either side of the front and back surfaces of the plated (sheeted) core materials 5 and 550.

The widths of the fiber assemblies 1 and the continuous sheet-shaped fiber assembly 1J (the width of the main body part of the original fabric roll) can be arbitrarily selected so that the slit portions (adjacent portions) can be placed at a region where bending is necessary, the lapping margin (the predetermined amount Xb) of the first (organic) fiber assembly 1K and the second (organic) fiber assembly 1H can be arbitrarily selected, and a special processing for bending is unnecessary. Additionally, since the bent portions 59 are formed on the both front and back surfaces on the sheet surface, it is possible to easily bend the vacuum heat insulating material in the both front and back directions on the sheet surface by using the first slit portion 57 and the second slit portion 58.

Since it is made possible to bend the vacuum heat insulating material at a connecting portion between adjacent fiber assemblies (the main body part A 1301a, the main body part B 1301b, the main body part C 1301c and the main body part D 1301d) in the first (organic) fiber assembly 1K or the second (organic) fiber assembly 1H, it is unnecessary to separately perform a processing of a concave portion, etc. for bending, and it becomes possible to easily bend the vacuum heat insulating material at the concave portions 751 and 752 by the first slit portion 57 and the second slit portion 58 that are formed in a process of manufacturing the core material 550. Further, since the concave portions 751 and 752 that are formed by the first slit portion 57 and the second slit portion 58 are formed on the both sides (front and back of the sheet surface) in the thickness direction of the vacuum heat insulating material 750, even when the thickness of the core material is large, the first slit portion 57 and the second slit portion 58 are formed on the both surface sides of the sheet surface, it is possible to bend the vacuum heat insulating material easier than in a case wherein the slit portion is formed on one surface side. Thus, the core material and the outer cover material 4 are not torn or damaged at the time of bending, and decrease in the heat insulating performance can be suppressed.

By setting the predetermined amount (lapping margin) Xb no less than 7 mm, and no more than three times the thickness t of the core material in an approximately vacuum state inside the outer cover material, since the lapping margin Xb is no less than 7 mm, it is possible to prevent the core material from being disjointed, and further, to prevent the heat insulating material from decreasing by the core material being disjointed. Further, since the lapping margin Xb is set no more than three times the thickness t of the core material in the approximately vacuum state inside the outer cover material 4, the crease performance at the bent portion 59 can be improved. Therefore, the vacuum heat insulating material can be easily applied to an appliance having two wall surfaces continuous at a predetermined angle, such as a refrigerator, etc., as a heat insulating material, and decrease in the heat insulating performance can be suppressed.

When the ear part fiber assembly having the ear part whose edge line is not aligned (which is not a cut surface) is used on a width-direction end side for at least one of plural fiber assemblies (e.g., the first (organic) fiber assemblies 1Ka through 1Kd, the second (organic) fiber assemblies 1Ha through 1Hd) making up the first (organic) fiber assembly 1K or the second (organic) fiber assembly 1H, the ear part fiber assembly (fiber assembly that is wound about the ear part original fabric roll) having the ear part, which has conventionally been discarded, can be used, which does not waste the material. Thus, the core materials 5 and 550, and the vacuum heat insulating materials 7 and 750, which are low in cost, can be obtained.

In a refrigerator or an appliance whereto the vacuum heat insulating material 7 or 750 in the present embodiment is applied, the vacuum heat insulating material 7 or 750 is bent at a predetermined angle (e.g., approximately 90 degrees) at a connecting portion (slit portion) between the adjacent fiber assemblies of the first (organic) fiber assembly 1K or the second (organic) fiber assembly 1H, and is placed on at lest two continuous wall surfaces of a heat insulating box having an upper surface, both side surfaces, a back surface and a bottom surface. Although conventionally, it has been difficult to bend the vacuum heat insulating materials 7 and 750 freely at a predetermined necessary angle, and hence application to two continuous wall surfaces has been difficult, by using the vacuum heat insulating materials 7 and 750 in the present embodiment, application to two continuous wall surfaces having the predetermined angle is also made possible since the vacuum heat insulating materials 7 and 750 can be easily bent at a predetermined part. Thus, since the vacuum heat insulating material can be continuously placed also at a corner between two continuous wall surfaces having the predetermined angle, coverage factor of the vacuum heat insulating material relative to an outer surface area of a container box (external box) of an appliance, such as a refrigerator, etc., except a door can be drastically increased. For example, in a case of a refrigerator, the coverage factor of equal to or more than 80% relative to the external box surface area is made possible, which has been conventionally difficult.

(Manufacturing Method 4 of a Core Material)

In the above, it is described a case wherein the vacuum heat insulating material 7 is produced by cutting the sheeted fiber assembly 1 to the predetermined size, laminating plural layers of the sheeted fiber assembly 1, and forming the core material 5, a case wherein the vacuum heat insulating material 7 is produced by cutting on the end face 5a after laminating plural layers of the sheeted fiber assembly 1 to be formed into the predetermined size, and forming the core material 5 (the manufacturing method 1 of the core material), a method to produce the core material 5 by continuously winding the continuous sheet-shaped fiber assembly 1J (e.g., the organic fiber assembly) in the coil-like shape (the manufacturing method 2 of the core material), and a method to produce the core materials 5 and 550 by winding combination of plural combination original fabric rolls (e.g., the combination original fabric rolls 1305 and 1306), which are made by combining plural original fabric rolls in the width direction to have a large width, in a lapped state in a direction approximately orthogonal to the sheet surface (the manufacturing method 3 of the core material).

In the manufacturing method 3 of the core material as described above, it is described a method to produce the core material by using at least each one of the first original fabric roll (upper side original fabric roll) 1305, which is a combination original fabric roll with a predetermined width made by arranging plural original fabric rolls plurally in the width direction, and the second original fabric roll (lower side original fabric roll) 1306, which is a combination original fabric roll with a predetermined width made by arranging plural original fabric rolls plurally in the width direction, and by lapping in a direction (radial direction of the reel 1311) approximately orthogonal to the sheet surface and winding about the reel 1311 the fiber assembly 1K of the first original fabric roll 1305 and the fiber assembly 1H of the second original fabric roll 1306. Here, it will be described a case of using the third original fabric roll 1307, which is a single original fabric roll with the first predetermined width, instead of the second original fabric roll 1306 being the combination original fabric roll.

That is, it will be described a method to produce a core material 560 with reference to FIGS. 42 through 25 by winding the fiber assemblies 1 or 1J of the third original fabric roll 1307 with the first predetermined width, which is the continuous sheet-shaped fiber assembly 1 or 1J (e.g., organic fiber assembly) with the predetermined width that is continuously wound in a coil-like shape about at least one original fabric roll, and the fiber assembly 1K of the first original fabric roll 1305 being the combination original fabric roll, which are plural continuous sheeted fiber assemblies having smaller widths than the first predetermined width combined in the width direction to have approximately the first predetermined width, in a lapped state in a direction approximately orthogonal to the sheet surface, so that the first original fabric roll 1305 is on the outer side in the radial direction of the reel 1311 relative to the third original fabric roll 1307.

Figure 42:
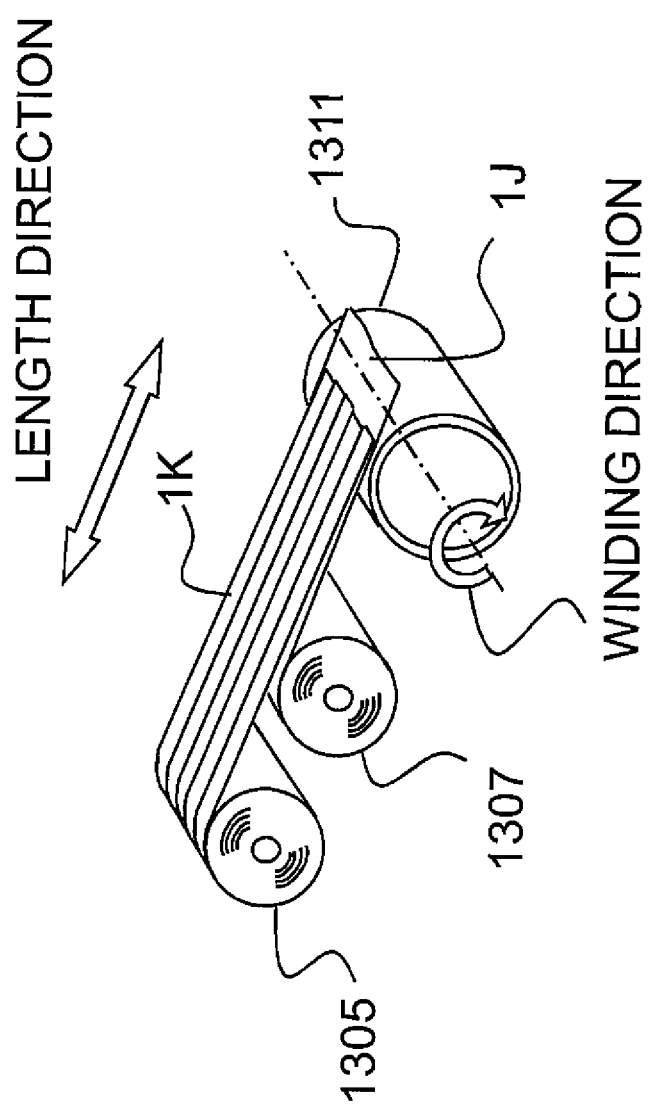
FIG. 42 shows the first embodiment.
Figure 43:
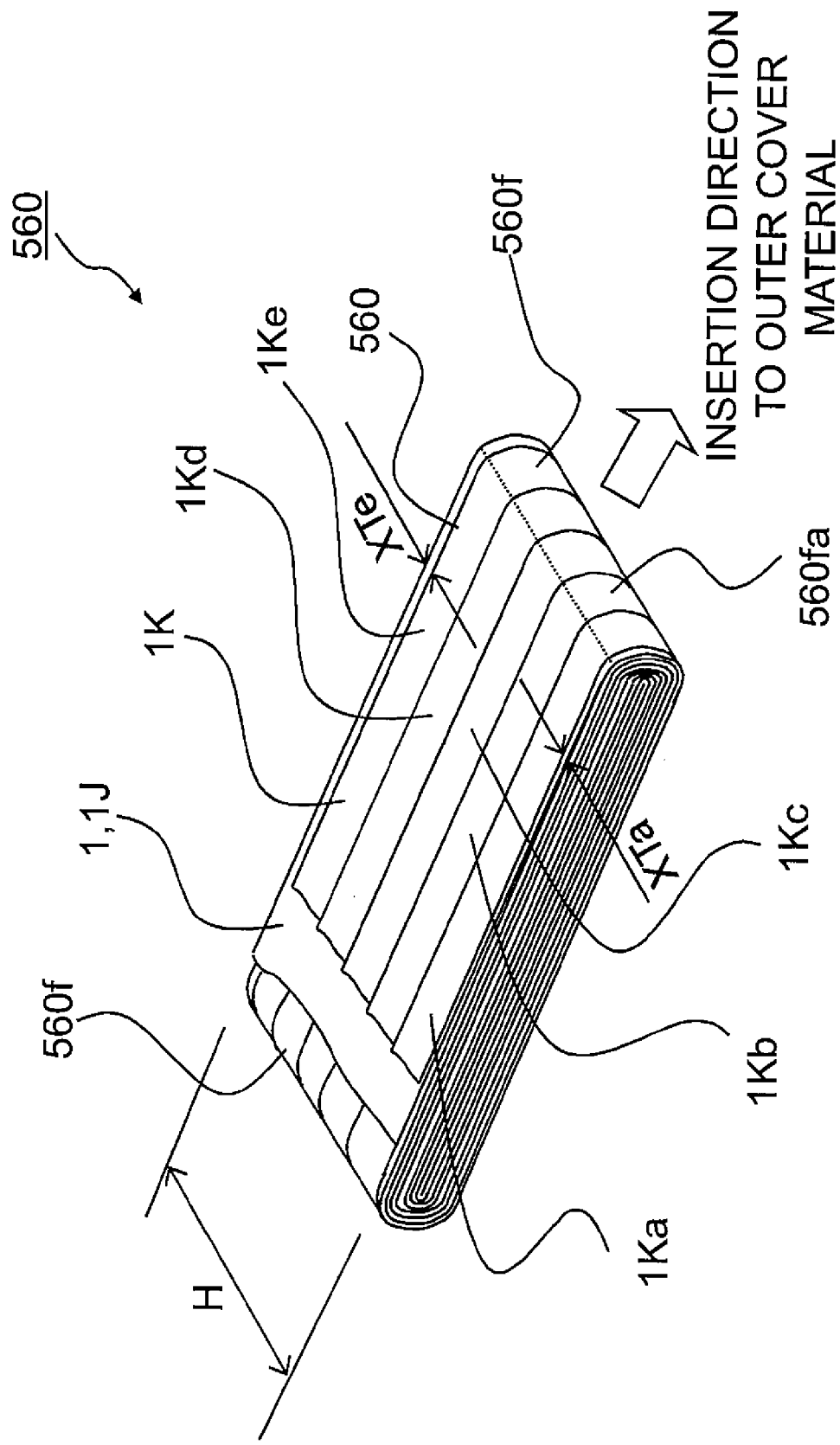
FIG. 43 shows the first embodiment, and is a perspective view of a core material that is manufactured by using and winding on the reel at least one original fabric roll 1307 with a predetermined width, and at least one combination original fabric roll.
Figure 44:
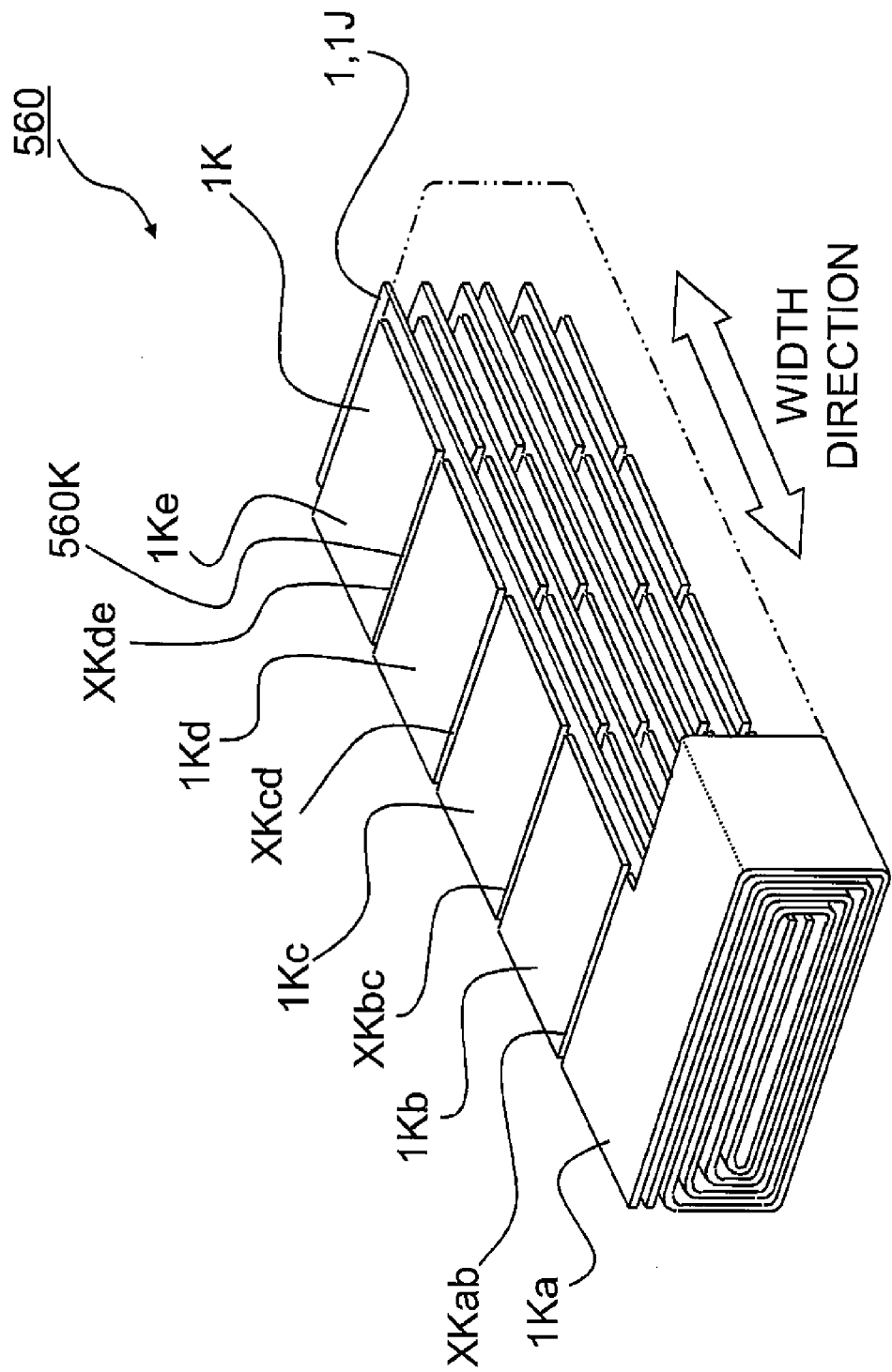
FIG. 44 shows the first embodiment, and is a perspective view of a core material that is manufactured by using and winding on a reel at least one original fabric roll with a predetermined width, and at least one combination original fabric roll.

FIG. 42 is a pattern diagram of the winding device in a case wherein winding on the reel 1311 is performed by using at least one original fabric roll 1307 with the first predetermined width, and at least one combination original fabric roll 1305 wherein original fabric rolls with widths smaller than the first predetermined width are combined in a width direction so as to have approximately the same width as the first predetermined width, and is a diagram illustrating a manufacturing method of another core material in the present embodiment. FIG. 43 is a perspective view of a core material that is manufactured by using and winding on the reel at least one original fabric roll 1307 with the predetermined width, and at least one combination original fabric roll. FIG. 44 is a perspective view of a core material that is manufactured by using and winding on a reel at least one original fabric roll with a predetermined width, and at least one combination original fabric roll. FIG. 45 is a perspective view of vacuum heat insulating material using the core material that is manufactured by using and winding on a reel at least one original fabric roll with a predetermined width, and at least one combination original fabric roll.

It will be described a case wherein the core material 560 is manufactured by winding the third original fabric roll 1307 with the first predetermined width wherein the continuous sheet-shaped fiber assembly 1 or 1J (e.g., organic fiber assembly) that is continuous in the length direction with the first predetermined width is wound in a coil-like shape about at least one original fabric roll, out of plural original fabric rolls, and the first original fabric roll 1305 that is at least one combination original fabric roll (e.g., a combination of only original fabric rolls with the second predetermined width smaller than the first predetermined width, a combination of an original fabric roll with the second predetermined width and an original fabric roll with the third predetermined width smaller than the second predetermined width, or a combination with an ear part original fabric roll, etc.), wherein plural fiber assemblies that are continuous in the length direction with the second width smaller than the first predetermined width are combined to have a width approximately the same as the first predetermined width, in a lapped state in a direction approximately orthogonal to the sheet surfaces of the fiber assemblies 1, 1J and 1K, so that the fiber assembly 1 or 1J of the third original fabric roll 1307 is on the inner side in the radial direction of the reel 1311.

In the diagrams, the first original fabric roll 1301 is approximately equal to the first original fabric roll 1305 (or the second original fabric roll 1306) as described in FIG. 12, and a detailed description for the equal parts is omitted, whereto the same signs are assigned. Plural original fabric rolls (e.g., the main body part A 1301*a*, the main body part B 1301*b*, the main body part C 1301*c* and the main body part D 130Id) in an approximately cylindrical shape (or coil-like shape) whereon winding is performed approximately the same number of winding (the same number of lamination) are combined to form a clearance (plural original fabric rolls may be arranged to be adjacent to each other to form a minute clearance, may be arranged without clearance, or may be arranged via a spacer to form a predetermined clearance) in the width direction, thereby the first original fabric roll 1301 is formed to have a width approximately the same as the first predetermined width.

The third original fabric roll 1307 is approximately the same as the original fabric roll 1301 in the approximately cylindrical shape with the predetermined width, whereon the fiber assembly 1 or 1J continuous in the length direction, with the predetermined widths, as described in FIGS. 6 through 9, is wound, and a detailed description for the equal parts is omitted, whereto the same signs are assigned. The third original fabric roll 1307 has the first predetermined width, and is formed to have the first predetermined width by winding the fiber assembly 1 or 1J continuous in the length direction continuously in a coil-like shape. Here, the fiber assembly 1 or 1J that is wound about the third original fabric roll 1307 is continuous in the width direction, and is set to have a size approximately the same as the width of the core material 560. The third original fabric roll 1307 may be manufactured by being wound the fiber assembly 1 or 1J with the predetermined width, or may be manufactured by cutting a fiber assembly with a width larger than the first predetermined width in the width direction so that the width size becomes the first predetermined width after the fiber assembly is wound in an approximately cylindrical shape.

Plural original fabric rolls (e.g., the main body part A 1301*a*, the main body part B 1301*b*, the main body part C 1301*c* and the main body part D 1301*d*) in an approximately cylindrical shape (or coil-like shape) of the first original fabric roll 1305 may have a same width or may have different widths. Further, plural original fabric rolls may be ear part original fabric rolls as shown in FIG. 12.

The first original fabric roll 1305 has a similar structure as the first original fabric roll 1301 as shown in FIG. 12, and is a combination original fabric roll wherein plural original fabric rolls (e.g., plural main body parts) are arranged adjacent to each other in the width direction. Thus, there is a minute clearance or a predetermined clearance between the adjacent main body parts (e.g., between the main body part A (1301*a*) and the main body part B (1301*b*)), and since the adjacent main bodies are not continuous but are intermissive, there exists a slit portion (e.g., the slit portion A between the main body part A 1301*a* and the main body part B 1301*b*, the slit portion B between the main body part B 1301*b* and the main body part C 1301*c*, the slit portion C between the main body part C 1301*c* and the main body part D 1301*d*, etc.). Further, in the third original fabric roll 1307, an ear part original fabric roll having an ear part, whose edge line is not aligned, and which is generated when an original fabric roll material is cut to a predetermined width can be used for an original fabric roll (e.g., the main body part A 1301*a* or the main body part D 1301*d*, etc.) arranged on an end side in a width direction out of plural original fabric rolls.

Accordingly, at least one single original fabric roll (e.g., the third original fabric roll 1307) with a width approximately the same as the first predetermined width whereon a continuous sheeted fiber assembly is wound in the length direction with the first predetermined width, and at least one combination original fabric roll (e.g., the first original fabric roll 1305) wherein plural sheeted fiber assemblies continuous in the length direction with widths smaller than the first predetermined width are arranged in the width direction, and combined in the width direction to form a width approximately the same as the first predetermined width are included. The fiber assembly 1 or 1J of the single original fabric roll 1307 with the first predetermined width, and the fiber assembly 1K of the combination original fabric roll 1305 are wound continuously in a coil-like shape from the inner side toward the outer side in a state wherein the fiber assembly 1 or 1J and the fiber assembly 1K are lapped in a direction approximately orthogonal to the sheet surface, so that the fiber assembly 1 or 1J of the single original fabric roll 1307 is placed on the inner side in the radial direction of the reel 1311, thereby the core material 560 is formed.

Thus, it is possible to easily manufacture the core material 560 only by lapping and winding the continuous fiber assemblies 1, 1J and 1K in a direction approximately orthogonal to the sheet surface. Further, the ear part original fabric roll that has been conventionally discarded can be effectively used, and the core material 560 and the vacuum heat insulating material 760 which are low in cost, and which do not make waster, can be obtained.

Since it is included the third fiber assembly (the fiber assembly 1 or 1J wound about the third original fabric roll 1307) in a sheet shape continuous in the length direction, and the first fiber assembly (the fiber assembly 1K of the first original fabric roll 1305 being the combination original fabric roll) wherein plural sheeted fiber assemblies continuous in the length direction, with widths smaller than the first predetermined width, are arranged via a predetermined clearance in the width direction so as to form a width approximately the same as the first predetermined width, a core material that is formed of a lamination structure of fiber assembly, which is the first fiber assembly and the third fiber assembly continuously wound in a coil-like shape from an inner side toward an outer side in a lapped state in a direction approximately orthogonal to a sheet surface of the first fiber assembly 1K or the third fiber assembly 1 or 1J, formed into a plate shape, a gas-barrier outer cover material for housing the core material inside, and having a sealing portion whereby a circumference is sealed in a state with the inside decompressed, and a vacuum heat insulating material that is produced by hermetically sealing the outer cover material by sealing the sealing portion in a state wherein the inside of the outer cover material is in an approximately vacuum state. Thus, a left-over material, such as an ear part original fabric roll which is remained after an original fabric roll is cut to a predetermined width, etc. can be effectively used, and an effective use of the left-over material, such as the ear part that has been conventionally discarded can be made.

Since a spacer, etc of a predetermined width is formed between each original fabric roll (e.g., between the main body part A and the main body part B, between the main body part B and the main body part C, the main body part C and the main body part D, etc.) of the first original fabric roll 1305 being a combination original fabric roll, and a predetermined clearance with the width of the spacer is set between each fiber assembly (e.g., between the fiber assemblies 1Ka and 1Kb, between 1Kb and 1Kc, between 1Kc and 1Kd, etc.) of the fiber assembly 1K of the first original fabric roll 1305, a concave portion with an approximately predetermined width is also formed in the vacuum heat insulating material 560, and a piping can be embedded in or positioned in the concave portion. Thus, it is possible to reduce hours worked for heat insulation of the piping, or piping installation, and the vacuum heat insulating material or an appliance, high in efficiency, and low in cost can be obtained.

When the first (organic) fiber assembly 1K (the first (organic) fiber assemblies 1Ka, 1Kb, 1Kc and 1Kd) of the first original fabric roll 1305 being the combination roll, and the third fiber assembly 1 or 1J of the third original fabric roll 1307 are lapped in a direction approximately orthogonal to the sheet surface, and wound about the reel 1311, as shown in FIG. 42, it is preferable to lap the first (organic) fiber assembly 1K (the first (organic) fiber assemblies 1Ka, 1Kb, 1Kc and 1Kd) of the first original fabric roll 1305, and the fiber assembly 1 or 1J of the third original fabric roll 1307 so that the first (organic) fiber assembly 1K is placed closer to the outer side in the radial direction with respect to the rotational shaft 1315 of the reel 1311 than the fiber assembly 1 or 1J.

As shown in (e) of FIG. 9, when the third fiber assembly 1 or 1J in the continuous sheet shape and the first (organic) fiber assembly 1K (the first (organic) fiber assemblies 1Ka, 1Kb, 1Kc and 1Kd) in the continuous sheet shape are wound about the reel 1311 in a lapped state about the reel 1311 in an approximately cylindrical shape (a coil-like shape) with a predetermined tensile force, and the reel 1311 is removed by loosening the tensile force after clamping the approximately cylindrical fiber assemblies 1, 1J and 1K by the clamping members 1320, it is preferable that the third fiber assembly is lapped in a direction approximately orthogonal to the sheet surface and wound to be closer than the first fiber assembly to the inner side in the radial direction of the reel 1311, so that the fourth fiber assembly with the first predetermined width not having a cut line, etc. in the width direction is located on the innermost periphery side of the approximately cylindrical fiber assembly with respect to the first fiber assembly where a cut or a clearance, etc. exists in the width direction by adjacently combining plural fiber assemblies in the width direction. In this case, when the cylindrical fiber assembly is removed from the reel 1311, it is fine that the fiber assembly is not disjointed to be disordered on the innermost periphery side, or caught in the reel.

That is, when the first fiber assembly and the third fiber assembly are wound in a lapped state, since the third fiber assembly is wound about the reel 1311 from the inner side toward the outer side in a state wherein the third fiber assembly is lapped on the inner side to the first fiber assembly, the third fiber assembly 1 or 1J with the first predetermined width, and which are continuous in the width direction, are located at the innermost side of the approximately cylindrical fiber assembly at the time when the approximately cylindrical fiber assembly wound about the reel 1311 is removed from the reel 1311. Therefore, since the fiber assembly located at the innermost side is continuous in the width direction, in comparison with a case wherein the first fiber assembly wherein plural fiber assemblies with widths smaller than the first predetermined width that are arranged in the width direction are combined is located at the innermost side, the fiber assembly is not disjointed to be disordered, or caught in the reel 1311 when disordered fiber assembly is detached from the reel 1311. Thus, the fiber assembly can be easily detached, the core material 560 can be easily manufactured, workability is increased, and the production time can be reduced. Furthermore, the quality of the core material 560 produced by forming the approximately cylindrical fiber assemblies 1, 1J and 1K detached from the reel 1311 into a plate shape is made stable.

The width and the number of plural original fabric rolls (four of the main body part A 1301a, the main body part B 1301b, the main body part C 1301c and the main body part D 1301d) used for the first original fabric roll 1305 should be arbitrarily set to be approximately the same as the first predetermined width of the fiber assembly 1 or 1J of the third original fabric roll 1307 with the first predetermined width. However, it is more preferable that the width (the width of the sum of plural original fabric rolls and the clearance between the original fabric rolls) of the first original fabric roll 1305 wherein plural original fabric rolls are arranged in the width direction is slightly smaller than the first predetermined width of the third original fabric roll 1305, and that the fiber assembly 1K wound about the first original fabric roll 1305 and the fiber assembly 1 or 1J wound about the third original fabric roll 1307 are wound about the reel 1311 by lapping the fiber assembly 1K of the first original fabric roll on the outer side in an approximately orthogonal direction to the sheet surface with respect to the fiber assembly 1 or 1J of the third original fabric roll, since each fiber assembly is less likely to be disjointed, and is likely to be wound also at the time when each fiber assembly is wound about the reel 1311.

As for the first original fabric roll 1305 and the third original fabric roll 1307, when the fiber assembly 1K of the first original fabric roll 1305 and the fiber assembly 1 or 1J of the third original fabric roll 1307 are wound about the reel 1311, although the fiber assembly 1K is lapped and wound on the outer side in the approximately orthogonal direction to the sheet surface with respect to the fiber assembly 1 or 1J, the manufacturing method of the vacuum heat insulating material 560 is the same as in FIG. 9. When a combination of at least two original fabric rolls (e.g., a case wherein the first original fabric roll 1305 and the second original fabric roll 1306 are lapped as shown in FIGS. 12 through 18, or a case wherein the first original fabric roll 1305 and the third original fabric roll 1307 are lapped as shown in FIGS. 42 through 45, etc.) that are lapped in an approximately orthogonal direction to a sheet surface is used instead of one original fabric roll 1301 wound about the reel 1311 in FIG. 9, a winding method, a manufacturing method of a core material, and a manufacturing method of a heat insulating material, etc. are equivalent to the process shown in FIG. 9.

As described above, at least a single original fabric roll (e.g., the third original fabric roll 1307) in a width direction whereon a fiber assembly with the first predetermined width, continuous in a length direction, is wound, and at least one combination original fabric roll (e.g., the first original fabric roll 1305) wherein plural original fabric rolls whereon a fiber assembly with a width smaller than the first predetermined width, continuous in a length direction, is wound in a width direction so as to have a width approximately the same as the first predetermined width are included, and a left-over material, such as an ear part original fabric roll, etc. can be used for the first original fabric roll being a combination original fabric roll. Therefore, there is no need to discard the left-over material, etc. that has conventionally been discarded, and a core material and a vacuum heat insulating material can be manufactured effectively at low cost.

Plural layers of the fiber assembly 1 or 1J of the single original fabric roll 1307 and the fiber assembly 1K of the combination original fabric roll 1305 are laminated in an approximately orthogonal direction to the sheet surface, and wound about the approximately cylindrical reel 1311 from the inner side toward the outer side with a predetermined tensile force, and then the approximately cylindrical fiber assembly is removed from the reel 1311 by loosening the tensile force after the approximately cylindrical fiber assembly is clamped by the clamping members 1320, thereby the core material 560 is manufactured. Thus, a core material can be manufactured easily with simple equipment.

FIG. 43 is a perspective view of the core material that is manufactured in the above-mentioned manner. In FIG. 43, the first (organic) fiber assembly 1K (e.g., the first (organic) fiber assemblies 1Ka, 1Kb, 1Kc, 1Kd and 1Ke) of the first original fabric roll 1305 (upper side roll) and the third fiber assembly 1 or 1J (lower side fiber assembly) of the third original fabric roller 1307 (lower side roll) are wound about the reel 1311 in a state wherein five original fabric rolls are arranged in the width direction via a predetermined clearance XK, and wound and laminated continuously from the inner side toward the outer side. In the core material 560, the first fiber assembly being the combination fiber assembly assembly is lapped and wound on the outer side of the single third fiber assembly in the approximately orthogonal direction to the sheet surface of the fiber assembly 1 or 1J. Thus, the first plural (organic) fiber assemblies 1Ka, 1Kb, 1Kc, 1Kd and 1Ke that make up the first fiber assembly being the combination fiber assembly are arranged and placed via clearances (may be minute clearances, or may be predetermined clearances) in the width direction on the outer surface of the core material 560.

It is applicable that the width of the third fiber assembly is made approximately equivalent to the width of the first (organic) fiber assembly 1K. However, as shown in FIG. 43, it is also applicable that the width of the third fiber assembly is made larger than the width of the first (organic) fiber assembly 1K, and the first fiber assembly 1K is arranged so that a predetermined clearance of a length XT (e.g., XTa or XTe) is formed on the outer side in the width direction of the first (organic) fiber assembly 1K. By arranging this way, on at least one end side in the width direction of the third fiber assembly, the first fiber assembly 1K does not exist in the part of the length XT and only the third fiber assembly exists in the part of the length XT.

Therefore, when the first (organic) fiber assembly 1K and the third fiber assembly are formed in a plate shape by being wound from the inner side toward the outer side, the core material 560 wherein the first (organic) fiber assembly 1K does not exist in the part of the length XT on at least one end side in the width direction is produced. Thus, when the vacuum heat insulating material 760 is produced by sealing the outer cover material 4 in a state wherein the core material that is formed in a plate shape by winding the first (organic) fiber assembly 1K and the third fiber assembly in a lapped state from the inner side toward the outer side is inserted inside the outer cover material 4 and decompressed, the vacuum heat insulating material 760 includes thin-walled portions H1 and H2 on end sides in the width direction similarly as in the vacuum heat insulating material 750 as shown in FIG. 19. In this case, the length of the thin-walled portion H1 is approximately the same as XTa, the length of the thin-walled portion H2 is approximately the same as XTe, and a width H3 at the center part is approximately the same as the width of the first fiber assembly 1K. The thin-walled portions may be formed on both end sides in the width direction of the vacuum heat insulating material 760, and may also be formed on one end side in the width direction.

That is, since the width of the third fiber assembly is larger than the width of the first (organic) fiber assembly by at least the length XT between the width-direction end side fiber assemblies 1Ka and 1Ke placed on end sides in the width direction out of the first plural (organic) fiber assemblies 1Ka, 1Kb, 1Kc, 1Kd and 1Ke that are adjacently arranged via the predetermined clearance XK in the width direction in the first fiber assembly 1K, and an end portion in the width direction of the third fiber assembly (e.g., in FIG. 43, the length XTa between one end portion in the width direction out of two end portions in the width direction of the third fiber assembly and an end portion on one end portion side in the width direction of the third fiber assembly in the fiber assembly 1Ka being a width direction end side fiber assembly, or the length XTe between the other end portion in the width direction of the third fiber assembly and an end portion on the other end portion side in the width direction of the third fiber assembly in the fiber assembly 1Ka being a width-direction end side fiber assembly), the thin-walled portion H1 (or H2) is obtained on at least one end side in the width direction in the vacuum heat insulating material 760, similarly as in the vacuum heat insulating material 750.

That is, in the vacuum heat insulating materials 750 and 760, the core materials 550 and 560 have the predetermined thickness t in a state of being decompressed and sealed inside the outer cover material 4, and a cross-sectional shape in the width direction of a width-direction end portion of the core materials 550 and 560 is a thin-walled step shape (thin-walled portion H1 or H2) that protrudes toward the outer side in the width direction.

As described above, the thin-walled portion (H1 or H2 in FIG. 19) with a thickness smaller than the thickness (thickness t of the core materials 5, 550 and 560) of the vacuum heat insulating materials 750 and 760 is obtained on one end side in the width direction or both end sides in the width direction of the core material 550 and 560 without performing a special processing, etc. Thus, when the vacuum heat insulating material 750 or 760 is connected and used in a state wherein end faces (thin-walled portions (H1 or H2)) are lapped in the width direction at the time of bending one of the vacuum heat insulating materials 750 and 760 in a cylindrical shape, etc., or when end faces (thin-walled portions) in the width direction of two and more vacuum heat insulating materials 750 and 760 are lapped in the thickness direction and continuously used, by lapping both surfaces in the thickness direction of the thin-walled portions on the end faces in the width direction of plural vacuum heat insulating materials 750 and 760 so as to contact with each other, the vacuum heat insulating materials 750 and 760 can contact at portions where the core materials 550 and 560 exist, and a joint thickness of the contact portion can be made small since the thin-walled portions (stacked in pairs, and when one piece is displaced, the thickness is around a half) with a small thickness are lapped, and further, heat leak from the contact portion can be reduced. Thus, it is possible to obtain the high-performance vacuum heat insulating materials 750 and 760, an appliance such as a compressor, a refrigerator, a water heater, etc. whereon the vacuum heat insulating materials 750 and 760 are mounted.

The cross-sectional shape in an approximately orthogonal cross-section to the width direction of the end face in the length direction of plural vacuum heat insulating materials 7, 700, 701, 750 and 760 is an approximately triangle shape whose thickness is decreased toward the outer side in the length direction. Thus, by connecting plural vacuum heat insulating materials 7, 700, 701, 750 and 760 so that slant portions (slant portion with the length L2 in FIG. 11) of the approximately triangle shape contact with each other, the vacuum heat insulating materials 7, 700, 701, 750 and 760 can contact at portions where the core materials 550 and 560 exist, and a joint thickness of the contact portion can be made small, and further, heat leak from the contact portion can be reduced. Thus, it is possible to obtain the high-performance vacuum heat insulating materials 7, 700, 701, 750 and 760, an appliance such as a refrigerator, etc. whereon the vacuum heat insulating materials 7, 700, 701, 750 and 760 are mounted.

As for the shape of the length-direction end portion, the fiber assembly 1 and the continuous sheet-shaped fiber assembly 1J may not be continuous in the length direction, and it is only necessary that the length-direction end portion is in an approximately triangle cross-sectional shape in a lapped state of the fiber assemblies. That is, in the vacuum heat insulating materials 7, 700, 701, 750 and 760 with the predetermined length L, the predetermined width H and the predetermined thickness t, which are sealed in a state wherein the core materials 5, 550 and 560 are decompressed inside the outer cover material 4, and it is only necessary that the core materials 5, 550 and 560 are formed in a lamination structure of the fiber assembly 1 and the continuous sheet-shaped fiber assembly 1J, and a cross section of at least one end portion in the length direction or the width direction is in an approximately triangle shape whose thickness is reduced toward the outer side. Further, when the core materials 5, 550 and 560 are formed in a lamination structure wherein the sheeted fiber assemblies 1 and 1J with the predetermined width H, continuous in the length direction, are continuously wound from the inner side toward the outer side, and the length-direction end portions of the core materials 5, 550 and 560 are in an approximately triangle shape in a state wherein the core materials 5, 550 and 560 are sealed inside the outer cover material 4, the similar effect can be obtained.

Additionally, it is not necessary that the fiber assembly 1 and the continuous sheet-shaped fiber assembly 1J are continuous in the length direction also in the thin-walled portion shape (thin-walled protrusion shape) in the width direction, and it is also applicable that plural pieces of fiber assemblies with a length L are laminated. That is, it is only necessary that the vacuum heat insulating materials 7, 700, 701, 750 and 760 with the predetermined length L, the predetermined width H, and the predetermined thickness t, which are sealed in a state wherein the core materials 5, 550 and 560 are decompressed inside the outer cover material 4 include thin-walled portions 750*a* and 750*b* small in thickness in an end portion in either the length direction or the width direction, and the thin-walled portions 750*a* and 750*b* protrude toward the outer side. In addition, the similar effect can be obtained when the core materials 5, 550 and 560 have a lamination structure wherein plural sheet-shaped fiber assemblies 1 and the continuous sheet-shaped fiber assembly 1J with the predetermined width H are laminated in a lapped state, and the thin-walled portion 750*a* is formed by laminating at least one of plural fiber assemblies 1 and the continuous sheeted fiber assembly 1J into plural layers in a state displaced by a predetermined amount in the width direction.

As described above, since the vacuum heat insulating materials 750 and 760 in the present embodiment are in a plate shape with a predetermined width, and a cross-sectional shape of an end portion in one direction (e.g., the length direction) of the plate shape is an approximately triangle whose thickness is reduced in an outer direction, or a cross-sectional shape of an end portion in the other direction (e.g., the width direction) is in a step shape having a thin-walled portion small in thickness, the vacuum heat insulating materials 750 and 760 can be easily produced by a simple method of only lapping and winding the core materials 550 and 560, and a left-over material can be effectively utilized.

Since it is possible to form the end portion shape in a connectable shape without performing a special processing, etc. in the width direction or the width direction, by making the end portions contact and connect with each other, the joint thickness in the contact portion can be reduced, heat leak from the contact portion can be reduced, and the high-performance vacuum heat insulating materials 750 and 760, and an appliance, such as a compressor, a refrigerator, a water heater, etc. whereon the vacuum heat insulating materials 750 and 760 are mounted can be obtained.

Here, since two clamping members 1320 are moved in opposite directions (separating directions) in a state wherein the core material 560 is clamped by two clamping members 1320 at two points, similarly as in the core material 5 as shown in FIG. 9 and the core material 550, the fiber assembly is folded (bent) at a bending end portion 560*f* in the clamped portion, and produced in a plate shape. The core material 560 folded at the bending end portion 560l, which is an end portion in the length direction of the core material 560, is inserted into the opening portion 4*a* of the outer cover material 4 from the side of the winding direction upstream side 560*fa* of the fiber assemblies 1, 1J and 1K similarly as in the core material 5 as shown in FIG. 9, and sealed in a state wherein the inside is decompressed, thereby the vacuum heat insulating material 760 is completed.

FIG. 44 shows a cross-sectional shape in the width direction of the core material 560 folded in a plate shape. The core material 560 is continuous in the length direction from the inner side toward the outer side, and the fiber assembly 1 or 1J single in the width direction and continuous also in the width direction, and the first (organic) fiber assembly 1K that is continuous in the length direction and is divided into plural pieces in the width direction and plural in the width direction are continuously wound in a lapped state in an approximately orthogonal direction to the sheet surface, and folded in a plate shape. Then, the fiber assembly 1 or 1J that is continuous in the width direction and single in the width direction is lapped so as to be on the inner side to the first (organic) fiber assembly 1 wherein plural fiber assemblies are arranged in the width direction, and wound into a coil-like shape from the inner side, hence the first (organic) fiber assembly 1K (the first (organic) fiber assemblies 1Ka, 1Kb, 1Kc, 1Kd and 1Ke) are wound so as to be on the outer surface of the core material 560. In this case, the space between each of the first (organic) fiber assemblies 1Ka, 1Kb, 1Kc, 1Kd and 1Ke of the first (organic) fiber assembly 1K is set to the predetermined clearance XK, where the slit portion 560K (the third slit portion) is formed. The predetermined clearance XK is each of predetermined clearances XKab, XKbc, XKcd and XKde, and each of the predetermined clearances XKab, XKbc, XKcd and XKde may be the same or may be different.

FIG. 45 describes the vacuum heat insulating material 760 which is hermetically sealed by sealing the opening portion 4*a* of the outer cover material 4 in a state wherein the core material 560 is inserted inside the outer cover material 4, and the inside is decompressed. In the vacuum heat insulating material 760, concave portions 760*x* (groove portions, which are the first concave portion 760x1, the second concave portion 760x2, the third concave portion 760x3, and the fourth concave portion 760x4, for example) with an approximately same width as the predetermined clearance XK formed in the core material 560 in the width direction are formed continuously in the length direction and plurally in the width direction. Here, the widths of the first concave portion 760x1, the second concave portion 760x2, the third concave portion 760x3, and the fourth concave portion 760x4 may be the same or different, and can be arbitrarily set by a size of a piping, etc.

Since the predetermined XK is continuous in the winding direction (length direction) of the core material 560, by producing the vacuum heat insulating material 760 using the core material 560, a concave portion 560X (groove portion) continuous in the length direction with approximately the same width as the predetermined clearance XK, with a depth of around one fourth the thickness of the vacuum heat insulating material 760 is formed on the both sides (when the depths of the concave of both concave portions are summed up, the depth becomes around a half (around one half) the thickness of the vacuum heat insulating material 760) of the plated surface of the plated vacuum heat insulating material 760. Thus, by allocating at least a part of a piping (e.g., a condensation pipe, a suction piping, a discharge piping, etc.) and a wire lead, etc. inside the concave portions, it becomes easy to perform heat insulation of the piping, and to house the wire lead without using another member. Further, by allocating the piping, the wire lead, etc. inside the concave portion 760x, positioning of the piping, the wire lead, etc. is made also possible at the same time, hence another member for positioning is unnecessary, and workability is drastically improved. It is easy to bend the core material 560 at the concave portion 760x without forming a concave portion for bending by a laser processing, etc. separately.

As described above, since the manufacturing device of the vacuum heat insulating material of the present invention includes the reel 1311 for winding the fiber assembly 1 and the continuous sheet-shaped fiber assembly 1J with the predetermined width that are wound about the approximately cylindrical original fabric roller 1301, which has been cut to the predetermined width, into an approximately cylindrical shape, a coil-like shape or a polygonal shape for the predetermined number of times R, the cutting means for cutting the fiber assembly 1 and the continuous sheet-shaped fiber assembly 1J that are wound about the reel 1311, and the shaping member (e.g., the clamping member 1320) for shaping the fiber assembly 1 and the continuous sheet-shaped fiber assembly 1J into the plated core material 5 after the fiber assembly 1 and the continuous sheet-shaped fiber assembly 1J, which have been wound about the reel 1311 for the predetermined number of times R and cut, are removed from the reel 1311, the core material 550 can be easily produced with a simple structure, and production time can be reduced. Further, since the fiber assembly 1 and the continuous sheet-shaped fiber assembly 1J are continuously wound in the winding direction, it is unnecessary to cut the end faces in the length direction, and since the original fabric roll cut beforehand in the width direction is used, it is also unnecessary to cut the core material 550 in the width direction. Thus, there is no need to cut the core material 550. Since the production equipment for cutting the end faces of the core material 550 is unnecessary, and time for cutting is unnecessary, the production equipment can be made low in cost, and the core material 550 and the vacuum heat insulating materials 7 and 750 low in cost can be obtained. Further, by combining plural main body parts (fiber assemblies) of original fabric rolls with small widths, the core materials 5 and 550 with large widths can be produced. By arbitrarily selecting the number of plural original fabric rolls and the widths of plural original fabric rolls, the widths of the core material 5 and 550 can be freely set regardless of the widths of the original fabric rolls, the degree of freedom of the core materials 5 and 550 is increased. Since a core material with a large width can be produced from original fabric rolls with small widths, the storage area for the original fabric rolls can be made small, and a large storage area is not needed. Further, there is no need to purposely cut the fiber assemblies to a predetermined size layer by layer for laminating the fiber assemblies into plural layers, and to laminate layer by layer. In comparison with a case wherein the core materials 5 and 550 are formed through laminating a continuous belt-like sheeted material to be overlapped by folding back the continuous belt-like sheeted material alternately in different directions and making a crease, a device for making a crease and folding back, etc. is unnecessary. Thus, lamination equipment, etc. is unnecessary, the core materials 5 and 550 can be produced easily in a short period of time with simple equipment only for winding up the fiber assemblies.

In the manufacturing device of the vacuum heat insulating material in the present invention, the reel 1311 includes the circumferential members 1312 divided into plural parts, at least one of plural circumferential members 1312 (e.g., movable circumferential members 1312a and 1312b) is made movable in the direction of the rotational center (rotational shaft 1315), and the fiber assembly 1 or the continuous sheet-shaped fiber assembly 1J is removed from the reel 1311 by loosening tensile force of the fiber assembly 1 or 1J by making the movable circumferential members 1312a and 1312b move in the direction of the rotational center after the fiber assembly 1 or the continuous sheeted fiber assembly 1J is wound up about the reel 1311. Thus, after loosening the tensile force on the continuous sheet-shaped fiber assembly 1J that is wound in an approximately cylindrical shape, for example, about the reel with a predetermined tensile force, the continuous sheet-shaped fiber assembly 1J wound in the approximately cylindrical shape can be easily removed from the reel 1311. That is, by loosening the tensile force of the continuous sheet-shaped fiber assembly 1J that is wound about the reel 1311 with the predetermined tensile force, it becomes easier to remove the continuous sheet-shaped fiber assembly 1J that is wound about the reel 1311 from the reel 1311.

In the manufacturing device of the vacuum heat insulating material of the present invention, since the fiber assemblies 1 and 1J are clamped by the clamping members 1320 and removed at the time of removing the fiber assemblies 1 and 1J from the reel 1311, the fiber assembly 1 and the continuous sheet-shaped fiber assembly 1J can be removed from the reel 1311 easily with a simple structure. Further, by making two clamping members 1320c and 1320d movable or move in opposite directions in an approximately linear direction (approximately 180 degrees opposite directions) in a state wherein the continuous sheet-shaped fiber assembly 1J is being clamped at two parts by using two clamping members 1320 (clamping members 1320c and 1320d), the continuous sheet-shaped fiber assembly 1J laminated into plural layers by being wound for plural times is pulled in opposite directions by two clamping members 1320c and 1320d and formed into a plate shape which is bent at the clamped parts. Thus, the plated core material 550 laminated into plural layers made by winding the continuous sheet-shaped fiber assembly 1J from the inner side toward the outer side continuously can be shaped easily with simple equipment.

According to the manufacturing method of the vacuum heat insulating material of the present invention, a winding step for winding the continuous sheet-shaped fiber assembly 1J with the predetermined width wound about the approximately cylindrical original fabric roller 1301, that has been cut to the predetermined width, for the predetermined number of times R about the reel 1311, a cutting step for cutting the continuous sheet-shaped fiber assembly 1J that is wound about the reel 1311, a separating step for removing the continuous sheet-shaped fiber assembly 1J that is wound about the reel 1311 for the predetermined number of times R and cut from the reel 1311, a shaping step for shaping the continuous sheet-shaped fiber assembly 1J that is removed from the reel 1311 in the separating step into the plated core material 550, and an outer cover material sealing step for sealing the gas-barrier outer cover material 4 in a state of housing the core material 550 inside, and of the inside being decompressed, are included. Thus, the core material 550 can be produced at a short period of time in a simple method. Further, since the continuous-sheet-shaped fiber assembly is wound continuously in the winding direction, it is unnecessary to cut on the end faces in the length direction, and since the original fabric roll cut beforehand in the width direction is used, it is also unnecessary to cut the core material 5 in the width direction. Thus, there is no need to cut the core material 550. Therefore, since production equipment for cutting on the end faces of the core material 550 is unnecessary, and time for cutting is unnecessary, the core material 550 and the vacuum heat insulating materials 7 and 750 low in cost can be obtained.

According to the manufacturing method of the vacuum heat insulating material of the present invention, since the separating step is comprised of a clamping step for clamping the continuous sheet-shaped fiber assembly 1J that is wound about the reel 1311 for the predetermined number of times R and cut by the clamping members, a fiber assembly tensile force loosening step for loosening tensile force of the continuous sheet-shaped fiber assembly 1J that is clamped in the clamping step on the reel 1311, and a reel removing step for removing the continuous sheet-shaped fiber assembly 1J whereof the tensile force is loosened in the tensile force loosening step from the reel 1311. Thus, the continuous sheet-shaped fiber assembly 1J can be removed from the reel 1311 easily with a simple method.

According to the manufacturing method of the vacuum heat insulating material of the present invention, in the shaping step, the continuous sheet-shaped fiber assembly 1J is clamped at two parts by using two clamping members (the clamping members 1320*c* and 1320*d*), the clamping members are made movable in the approximately opposite directions, and the core material is formed into a plate shape. Thus, it is possible to manufacture the sheeted core material 550 easily with the simple method only using the clamping members 1320.

Since the continuous sheet-shaped fiber assembly 1J is made by forming continuous organic fiber into a sheet shape, in comparison with a case of using glass fiber that is inorganic fiber, harmful effect on a human body due to powder dust can be suppressed, and the core material 550 and the vacuum heat insulating materials 7 and 750 having good recyclability can be obtained.

In the present embodiment, the manufacturing device and the manufacturing method may be a manufacturing device and a manufacturing method for manufacturing the core material 5 and the vacuum heat insulating material 7, etc. by using the continuous organic fibers 2 for the fibers, and using and winding the fiber assembly 1 or the continuous sheet-shaped fiber assembly 1J continuously from the inner side toward the outer side about the reel. The used fibers need not be continuous long fibers in the manufacturing device and the manufacturing method of the present embodiment. However, it is only necessary for the fiber assembly to be in a continuous sheet shape, and it is applicable if only the sheeted fiber assembly is not damaged, etc. when the sheeted fiber assembly is wound about the reel with predetermined tensile force. Therefore, the fiber assembly needs not be the fiber assembly 1 or the continuous sheet-shaped fiber assembly 1J, and may be inorganic fiber assembly. In the manufacturing device and the manufacturing method of the present embodiment, the similar effect can be obtained if only the fiber assembly is a continuous sheeted fiber assembly. The continuous sheet-shaped fiber assembly may be used as it is; however, it is more preferable when the continuous sheet-shaped fiber assembly is in a state of an original fabric roll wound about an original fabric roller, since the manufacturing is easy and the usability is increased.

When the fiber assembly 1 and the continuous sheet-shaped fiber assembly 1J are lapped and wound to manufacture the core materials 5 and 550, the fiber assembly 1 and the continuous sheet-shaped fiber assembly 1J may be wound without being lapped by the predetermined amount Xb to manufacture the core materials 5 and 550. When the number of lapped pieces of the fiber assembly 1 and the continuous sheet-shaped fiber assembly 1J is increased, the kind of the fiber assemblies can be changed for the number of lapped pieces. That is, since fiber assemblies having different fabric weights of the fiber assemblies can be used, or fiber assemblies (e.g., fibers of different temperature characteristics, fibers with different fiber diameters, fibers with good tension strength, fibers of different thermal conductive properties, etc.) of different kinds of fibers to be used for the fiber assemblies can be mixed according to the usage environment of an appliance, a core material and a vacuum heat insulating material tailored to a type of usage can be obtained. Therefore, it is possible to simultaneously pursue ensuring of heat insulating performance and high-temperature resistance, and ensuring of heat insulating performance, prevention of a harmful effect on a human body, and increase of recyclability. In this case, even when plural pieces of the fiber assemblies are lapped, there is no need to displace the fiber assemblies by the predetermined amount Xb, hence the core material 5 can be formed by lapping and winding the fiber assemblies with a same width without displacing the fiber assemblies. Further, the core material 5 can be formed by lapping and winding fiber assemblies with different widths.

When a vacuum heat insulating material used for heat insulation of an appliance having a high-temperature part (e.g., no less than 70° C.) such as a compressor having a hot water storage tank of a water heater wherein hot water at high temperature is stored, and a part that is raised to high temperature, etc. is necessary, fiber with high-temperature resistance (heat-resisting property) (LCP and PPS being organic fiber, and glass fiber being inorganic fiber, etc. are used independently or in combination) should be used for at least one piece of the fiber. In this case, the vacuum heat insulating material should be produced by lapping the fiber assembly using the fiber with high-temperature resistance (heat-resisting property) to be located on the surface side at the time when the core material is formed. In this way, the fiber assembly using the fiber with high-temperature resistance (heat-resistance property) is located on the surface side also as the vacuum heat insulating material, by arranging the vacuum heat insulating material so that the fiber assembly using the fiber with high-temperature resistance (heat-resistance property) is located on the side of the high-temperature part of the appliance, heat insulation of the appliance having the high-temperature part is made possible.

Since heat insulating performance is required in a case of a vacuum heat insulating material that is used for insulating an appliance such as a refrigerator, a heat insulating box, etc. whereof high heat insulating performance is required, it is applicable to use fiber (e.g., polystyrene being organic fiber, glass fiber being inorganic fiber, etc.) with small solid thermal conductivity, wherein increase in heat insulating performance can be expected, for at least one pieces of the fiber.

When glass fiber being inorganic fiber is used in a case of a vacuum heat insulating material that is used for insulating an appliance such as a refrigerator, an air conditioner, a water heater, etc. whereof recyclability is required, for example, in a case of the refrigerator, since the whole refrigerator is crushed in a recycling factory, glass fiber is supplied to thermal recycle, being mixed in urethane waste, etc. Since recyclability of the glass fiber is not high, such as the glass fiber lowers the combustion efficiency, or remains as a residue, etc., it is preferable to use organic fiber such as polyester, polystyrene, LCP, etc.

In consideration of environmental problems and a harmful effect on a human body, since glass fiber is solid and brittle, at the time of constructing or demolishing the vacuum heat insulating material, powder dust may flow and stick to skin/mucous membranes, etc. of a worker to give stimulus, and the handleability and the workability cause problems. It goes without saying that it is better to use organic fiber.

The core materials 5 and 550 structured by the lamination structure of the fiber assembly 1 formed of the organic fibers 2 in a sheet shape, having the cutting portion on which the end face is cut to obtain a predetermined length or width, and the gas-barrier outer cover material 4 containing the core material 5 or 550 inside and having the sealing portion with an area larger than the core material 5 or 550 by the sealing length amount, which is sealed in a state with the inside decompressed, are included. Since fiber continuous for a comparable size as or larger than the length L or the width H of the core material 5 or 550 is used for the organic fibers 2, and protrusion of remaining fiber generated by being cut from the cutting face is suppressed, and since the fiber assembly made of long fibers is used for the core material, it is possible to suppress protrusion and sticking out of remaining fiber generated by being cut from the cutting portion (e.g., the cutting portion on the end face of the sheet, the cutting portion of hole formation, the cutting portion of the notch formation part, etc.) of the fiber assembly 1 being a non-woven cloth sheet. The protrusion, etc. of the remaining fiber, generated by being cut from the cutting portion that is generated when short fibers are used for the core material, would never occur. Therefore, sealing performance is not damaged by the protruding remaining fiber when the core material is inserted and sealed in the outer cover material.

Since the core material 550 is structured by the lamination structure wherein the fiber assembly 1, the continuous sheet-shaped fiber assembly 1J, the first (organic) fiber assembly 1K and the second (organic) fiber assembly 1H are continuously wound from the inner side toward the outer side, and formed into a plate shape wherein the fiber assembly 1, the continuous sheet-shaped fiber assembly 1J, the first (organic) fiber assembly 1K and the second (organic) fiber assembly 1H are bent at the bending portions. Thus, there is no necessity to laminate non-woven cloth sheet (fiber assembly) that is cut to a predetermined size (width or length) layer by layer, and the core material 5 of low cost can be simply produced with low-cost production equipment.

Since in the core materials 5 and 550, the winding-end end portions 1Je and 551Je of the fiber assembly 1, the continuous sheet-shaped fiber assembly 1J, the first (organic) fiber assembly 1K and the second (organic) fiber assembly 1H are located to be adjacent to the bending end portion 5f (bending portion), the winding-end end portion 1Je is not placed in the flat portion 5g of the core material 5, a step is not formed in the flat portion 5g, and the appearance is improved. Further, a step does not prevent a flow of urethane by being an obstacle when urethane flows inside a heat insulating box, etc. Thus, it is possible to suppress decrease in heat insulating performance due to insufficient flow of urethane.

The outer cover material 4 includes the opening portion 4a for inserting the core materials 5 and 550. When the winding-end end portions 1Je and 551Je of the fiber assembly 1 (e.g., organic fiber) are located adjacent to one bending end portion 5f among two bending end portions 5f (bending portion) in the length direction, by inserting the core material 5 into the outer cover material 4 from the side of the other bending end portion 5fa (bending portion) where the winding-end end portions 1Je and 551Je are not located, the core materials 5 and 550 are not caught in the opening portion 4a, the core materials 5 and 550 can be smoothly inserted into the outer cover material 4, insertability can be drastically improved, and the vacuum heat insulating materials 7 and 750 can be produced in a short period of time.

The outer cover material 4 includes the opening portion 4a for inserting the core materials 5 and 550. When the winding-end end portions 1Je and 551Je of the fiber assembly 1 are not located adjacent to the bending end portion 5f, by inserting the core material 5 into the outer cover material 4 from the side of the bending end portion 5fa on the upstream side in the winding direction (side in the opposite direction of winding) of the fiber assembly 1 with respect to the positions of the winding-end end portions 1Je and 551Je of the fiber assembly 1. In this way, the core materials 5 and 550 are not caught in the opening portion 4a at the time of inserting the core materials 5 and 550 from the opening portion 4a of the outer cover material 4. Thus, the core materials 5 and 550 can be smoothly inserted into the outer cover material 4, insertability can be drastically improved, and the vacuum heat insulating materials 7 and 750 can be produced in a short period of time.

The core materials 5 and 550 structured by the lamination structure wherein the fiber assembly 1 formed into a sheet shape continuous in the length direction is continuously wound in the length direction from the inner side toward the outer side, having the end face 1a on which the end face in the width direction is cut to obtain a predetermined width, and the gas-barrier outer cover material 4 containing the core materials 5 and 550 inside, having the sealing portion 45 for sealing surrounding of the end face 1a in an area larger than the end face 1a of the core materials 5 and 550 by the sealing length amount, are included. Since long fibers with a length comparable to or larger than the width of the core materials 5 and 550 is used for the organic fibers 2 forming the fiber assembly 1, and the organic fiber assembly made of long fibers is used for the core materials 5 and 550, it is possible to suppress protrusion and sticking out of remaining fiber generated by being cut from the cutting portion (e.g., the cutting portion on the end face of the sheet, the cutting portion of hole formation, the cutting portion of the notch formation part, etc.) of the fiber assembly 1 being a non-woven cloth sheet. The protrusion, etc. of the remaining fiber, generated by being cut from the cutting portion that is generated when the short fibers are used for the core material, would never occur. Therefore, sealing performance is not damaged by protruded remaining fiber when the core material is inserted and sealed in the outer cover material 4. Further, the core materials 5 and 550 of the vacuum heat insulating materials 7 and 750 are made of organic fibers. Therefore, if the core materials 5 and 550 are mixed with urethane waste, etc. at the time of recycling and are supplied to thermal recycle, the combustion efficiency is not decreased, and the generation of residue is suppressed. Thus, it is possible to obtain an appliance having a good recyclability such as a refrigerator, a water heater, an electrical water heater, a refrigerating/air-conditioning apparatus, etc. Further, since powder dust due to the shredded powder of glass fiber is not generated at the time of disassembling or demolishing, it is possible to prevent sucking of such powder dust or sticking of the powder dust to the skin, and thus an adverse effect on a human body can be suppressed, and a vacuum heat insulating material and an appliance that are environmentally friendly can be obtained.

(Heat Insulating Performance 1)
(Thickness of Fiber Assembly)

It will be hereinafter described a case wherein the organic fibers 2 of long fiber is used for the fiber, and organic fiber assembly is used for the fiber assembly 1. First, as for effect of the thickness of the organic fiber assembly to the heat insulating performance, comparison of Embodiment examples 1 to 4 wherein the vacuum heat insulating materials 7 and 750 in which the core materials 5 and 550 formed by laminating the fiber assembly 1 are used is presented with Comparison example 1 (cottonlike core material) is done. The comparison result will be explained.

In Comparison example 1, cottonlike polyester having almost the same diameter as the fiber diameter (about 15 μm) of Embodiment examples 1 to 4 using the fiber assembly 1 of the present embodiment is used for the core material, and the vacuum heat insulating material 7 is manufactured in the above manufacturing method, that is, in the same method as in Embodiment examples 1 to 4.

For the manufactured Embodiment examples 1 to 4 and Comparison example 1 (all are the vacuum heat insulating materials 7), heat conductivities are measured using the thermal conductivity mater "Auto Λ HC-073 (EKO Instruments Co., Ltd.)" in a temperature difference between upper temperature of 37.7 degrees Celsius and lower temperature of 10.0 degrees Celsius. Here, measurement is done after leaving the vacuum heat insulating material for about one day since the vacuuming step is carried out until gas or water inside of the outer cover material is sorbed in the adsorption agent 6 and the heat conductivity of the vacuum heat insulating material (inside of the outer cover material) is stabled.

Here, the thickness of one sheet of the fiber assembly 1 is a value obtained by dividing by the number of laminated sheets a value that is obtained by subtracting two times of the thickness of the outer cover material 4 from the thickness of the vacuum heat insulating material 7.

Further, an average fiber diameter is an average value of measurement values at 100 points measured by the microscope. The result of division of the thickness of one sheet after vacuuming by the average fiber diameter is shown in Table 1.

TABLE 1

| | thickness of one sheet/average fiber diameter |
|---|---|
| Embodiment example 1 | 4 |
| Embodiment example 2 | 8 |
| Embodiment example 3 | 14 |
| Embodiment example 4 | 18 |
| Comparison example 1 | 369 |

Figure 20:
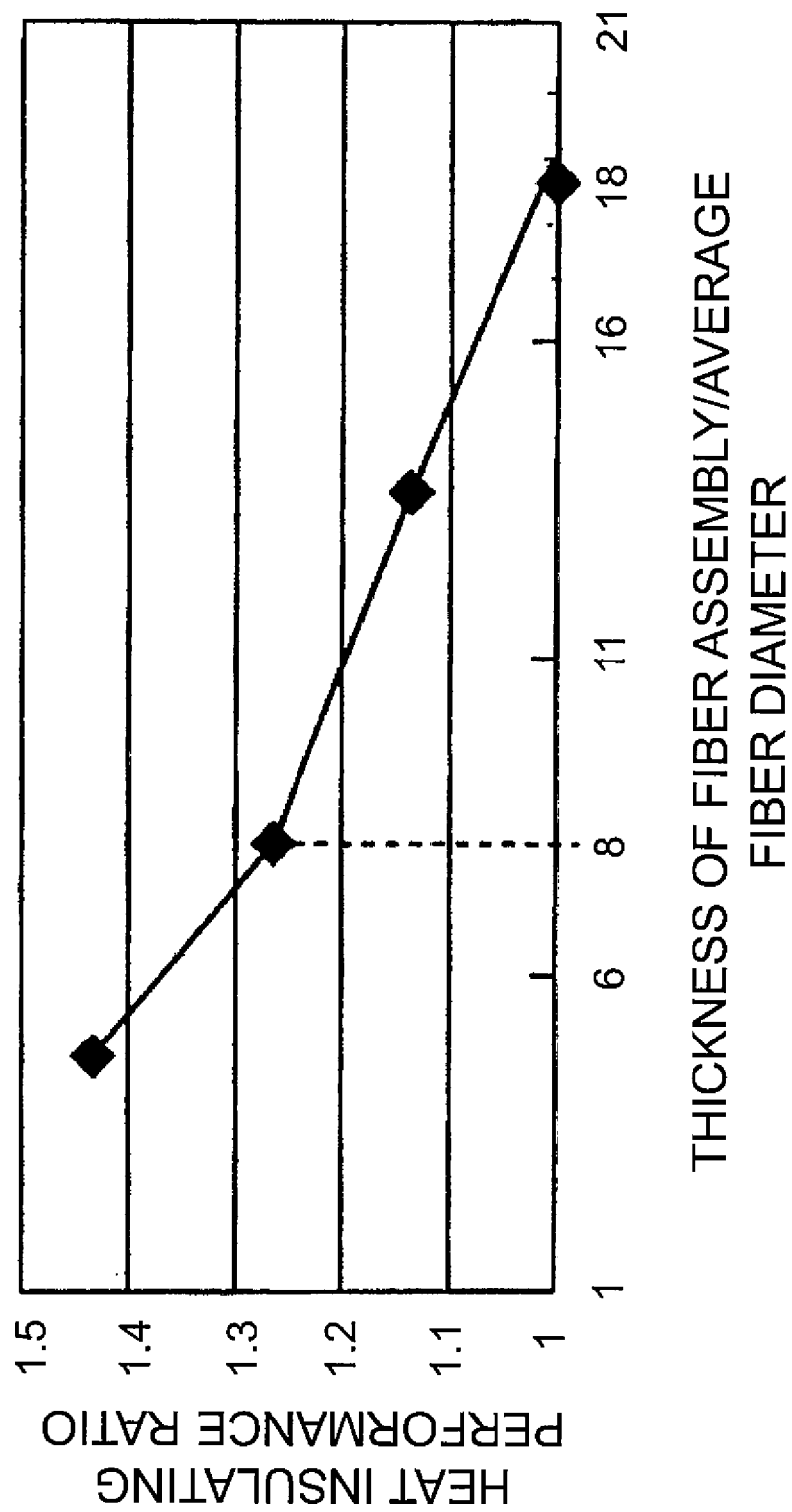
FIG. 20 shows the first embodiment and is a correlation diagram for explaining heat insulating performance of the vacuum heat insulating material 7.

FIG. 20 shows the first embodiment and is a correlation diagram for explaining heat insulating performance of the vacuum heat insulating materials 7 and 750. The horizontal axis of FIG. 20 is a numeral value obtained by dividing the thickness of the fiber assembly 1 by the average fiber diameter, and the vertical axis is a heat insulating performance ratio. Here, the heat insulating performance ratio is a value obtained by dividing the heat conductivity of Comparison example 1 by each of the heat conductivities of Embodiment examples 1 to 4 (the same as an inverse of a value obtained by dividing the heat conductivities of Embodiment examples 1 to 4 by the heat conductivity of Comparison example). Namely, it is shown that the larger the value of the heat insulating performance ratio is, the better the heat insulating performance is.

From FIG. 20, when the thickness of the fiber assembly 1 is less than 18 times of the average fiber diameter ("heat insulating performance ratio" in the figure corresponds to about 1 [thickness of fiber assembly/average fiber diameter]), the heat insulating performance is improved compared with Comparison example 1 using the cottonlike fiber for the core material. It is considered that this is because the smaller the thickness of the fiber assembly 1 is, the easier the fiber is orientated in the plane direction (the length or width direction of the sheet-shaped fiber assembly 1) which is almost orthogonal to the heat insulating direction (the thickness direction of the sheet-shaped fiber assembly), that is, a solid heat transfer passage within the vacuum heat insulating materials 7 and 750 in the heat insulating direction can be made long, and thus the heat insulating performance is improved.

Further, the closer the thickness of the fiber assembly 1 becomes to one time of an average fiber diameter, the better the heat insulating performance becomes. Therefore, it is preferable that the thickness of the fiber assembly 1 is one to eighteen times of the average fiber diameter.

Here, if the thickness of the fiber assembly 1 is no more than eight times of the fiber diameter, the heat insulating performance is abruptly (extremely) improved. Therefore, the thickness of the fiber assembly 1 is preferably one to eight times of the average fiber diameter. Here, it is understood that the smaller the average fiber diameter is compared with the thickness of the fiber assembly 1, the further the heat insulating performance is improved. However, since if the thickness of the fiber assembly 1 is one time of the average fiber diameter, the manufacturing becomes difficult, the average fiber diameter is preferably at least three times of the thickness of the fiber assembly 1.

Here, if the thickness of the fiber assembly 1 is less than three times of the average fiber diameter, the productivity of the fiber assembly 1 is degraded, the line speed of the manufacturing has to be extremely lowered, and the production efficiency becomes extremely degraded. Thus, the thickness of the fiber assembly 1 is preferably equal to or greater than three times of the average fiber diameter.

From the above, if the fiber assembly 1 manufactured so that the thickness is made at least one time and no more than eighteen times of the average fiber diameter is used for the core materials 5 and 550 of the vacuum heat insulating materials 7 and 750, the heat insulating performance is improved compared with the case in which cottonlike fiber is used for the core material.

In particular, if the fiber assembly 1 manufactured so that the thickness is made at least one time and no more than eight times of the average fiber diameter is used for the core materials 5 and 550 of the vacuum heat insulating materials 7 and 750, the heat insulating performance is further improved.

Further, if the fiber assembly 1 manufactured so that the thickness is made at least three times and no more than eighteen times (preferably, at least three times and no more than eight times of the average fiber diameter) of the average fiber diameter is used for the core materials 5 and 550 of the vacuum heat insulating materials 7 and 750, in addition to the effect of the improvement of heat insulating performance, the productivity is improved, and the manufacturing cost can be reduced; that is, the vacuum heat insulating material 7 with high performance and high reliability can be obtained at low cost.

(Heat insulating performance 2)
(Fiber Diameter and Inter-fiber Distance)

The following will explain an effect of a diameter of the organic fibers 2 and an inter-fiber distance on the heat insulating performance.

Figure 21:
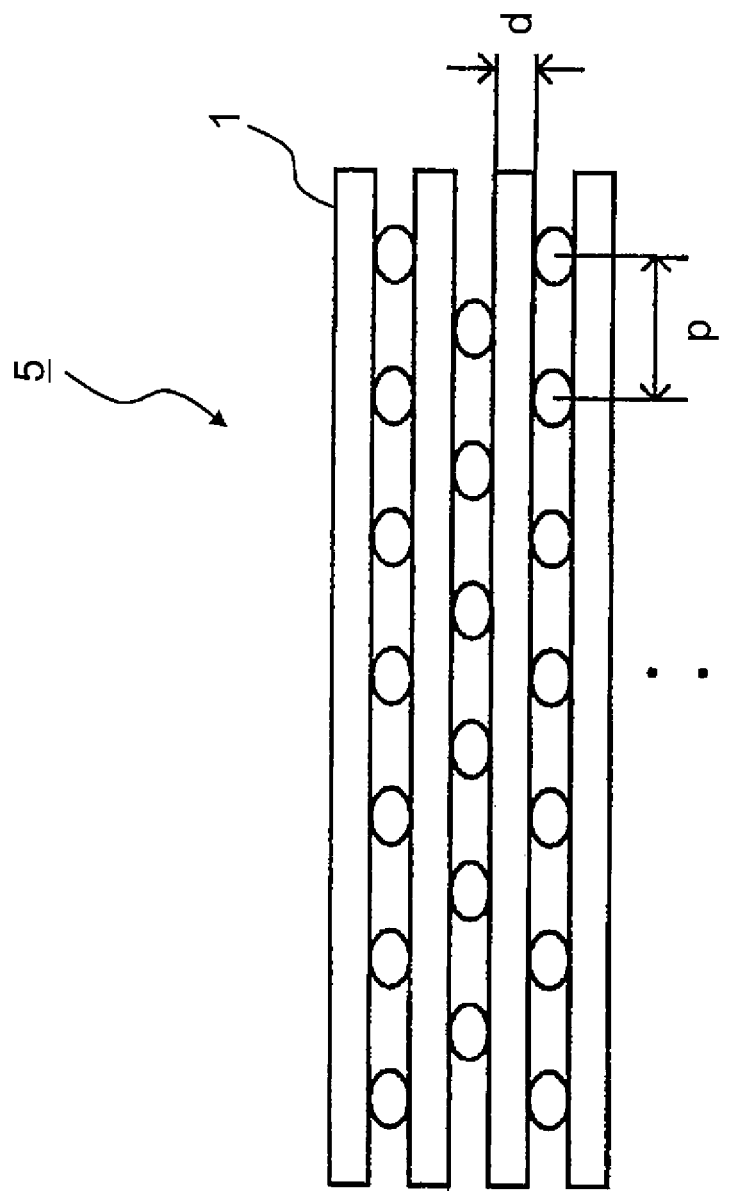
FIG. 21 shows the first embodiment and is a schematic view extendedly showing a structure of vertical cross section of the core material 5 used for the vacuum heat insulating material 7.

FIG. 21 shows the first embodiment, and is a schematic view extendedly showing a structure of vertical cross section of the core material 5 used for the vacuum heat insulating material 7, for example. With reference to FIG. 21, a structure of the core material 5 will be explained in detail. As shown in FIG. 21, the core material 5 is structured by laminating each layer of the fiber assembly 1, for example, with making each layer orientated in one direction so that the organic fibers 2 are not overlapped in the thickness direction of the sheet-shaped non-woven cloth and further each layer to be vertically laminated is overlaid so that the organic fibers 2 intersect almost orthogonally.

Specifically, the core material 5 is formed by laminating the fiber assembly 1, in which, for example, spun fibers orientated in one direction so as not to be overlapped among fibers, so that the fiber directions may be almost orthogonally intersected with each other. Here, it is assumed that an average fiber diameter is d and an average fiber interval (an average inter-fiber distance; an interval between fibers) is P.

Each layer of the fiber assembly 1 can be manufactured by stretching the film so as to make molecules orientated and then splitting the film into pieces. If this method is used at the time of splitting the film, it is possible to partially leave the connection part between fibers without completely separating the fibers. The fiber assembly 1 can be manufactured by stretching the torn sheet in a direction which is almost orthogonal to the fiber direction so as to maintain the interval P between fibers. Thereby the handleability of the core material 5 is improved. Here, it is preferable to use polyester, etc., for example, for material of the fiber which forms the fiber assembly 1.

Next, the obtained core material 5 is inserted to the outer cover material 4 which is a plastic laminated film. Then, the outer cover material 4 to which the core material 5 is inserted is dried for about five hours at the temperature of 100 degrees Celsius. After this, about five (g) of CaO (the adsorption agent 6) enveloped in a non-woven cloth bag is arranged inside the outer cover material 4, and then, the outer cover material 4 in which the core material 5 and the adsorption agent 6 are included is set inside the vacuum chamber. Subsequently, the outer cover material 4 is vacuumed to around 3 Pa inside the vacuum chamber, and while remaining inside the vacuum chamber, the opening portion is heat-sealed, thereby the vacuum heat insulating material 7 which is a vacuum heat insulating panel is completed.

Figure 23:
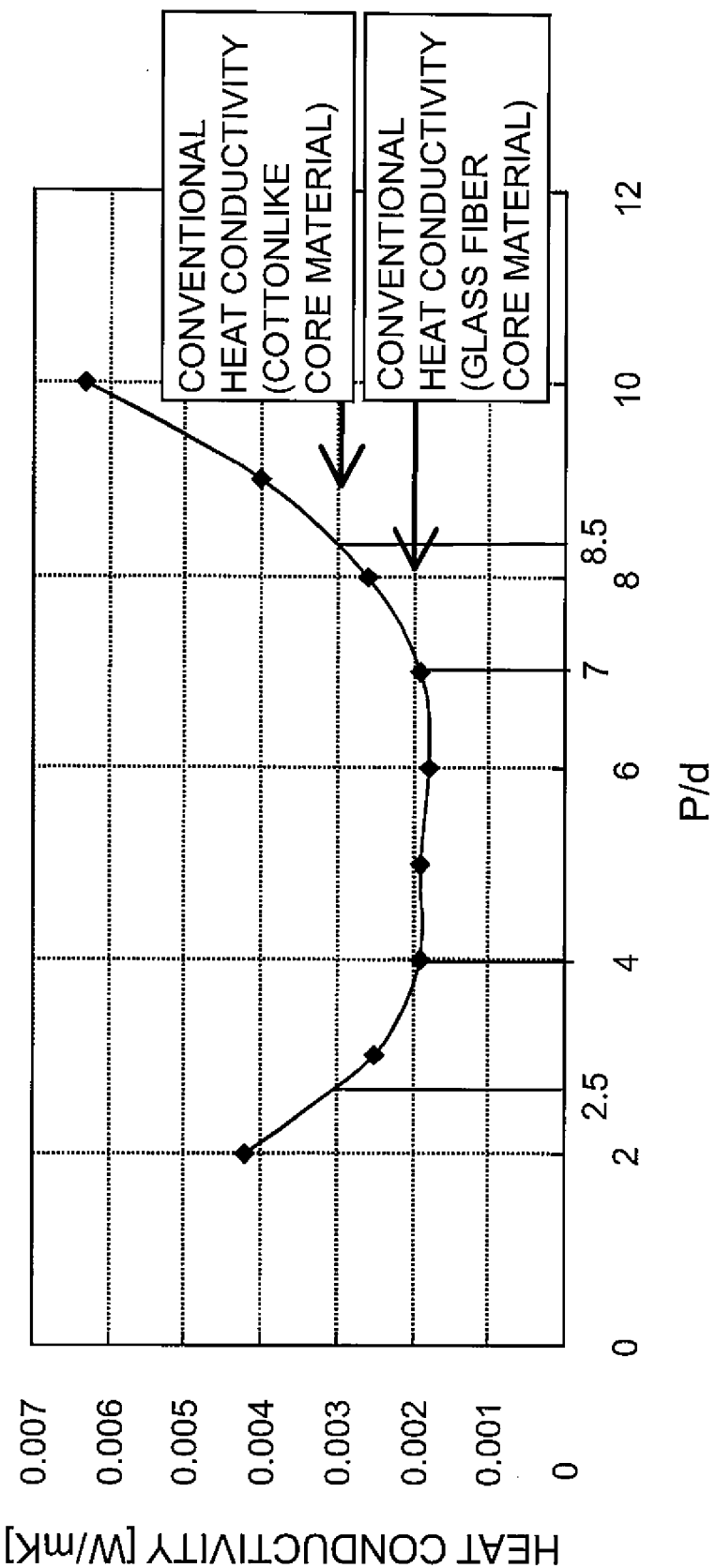
FIG. 23 shows the first embodiment and is a graphed chart of the measured result shown in FIG. 9.

FIGS. 22 and 23 show the first embodiment; FIG. 22 shows measured result of heat conductivity of the vacuum heat insulating material 7, and FIG. 23 is a graphed chart of the measured result shown in FIG. 22. With reference to FIGS. 22 and 23, the measurement result of the heat conductivity, which is carried out as heat insulating performance evaluation of the vacuum heat insulating material 7 obtained in the above method, will be explained.

FIGS. 22 and 23 show relation between the average fiber interval (P)/the average fiber diameter (d) of the vacuum heat insulating material 7 and heat conductivity [W/mK] in each layer. Here, FIG. 22 also shows heat conductivity of the vacuum heat insulating material 7 when cottonlike fiber (e.g., polyester fiber) is used for the core material 5 as a comparison example. Further, in FIG. 23, a horizontal axis shows the average fiber interval/the average fiber diameter (P/d), and a vertical axis shows the heat conductivity [W/mK].

From the measured result shown in FIGS. 22 and 23, when the average fiber interval (P) is within a range of 2.5 to 8.5 times of the average fiber diameter (d) (a range of P/d is at least 2.5 times and no more than 8.5 times), the heat conductivity of the vacuum heat insulating material 7 according to the first embodiment is smaller than heat conductivity 0.0030 [W/mK] of the vacuum heat insulating material 7 in a case of the comparison example using cottonlike core material. Namely, it can be understood the vacuum heat insulating material 7 according to the first embodiment is superior in the heat insulating performance.

This is because of the following: The vacuum heat insulating material 7 of the comparison example using the cottonlike fiber for the core material 5 includes a part in which fibers are orientated in the thickness direction which is the heat transfer direction (the heat insulating direction) due to the irregularity of arrangement of fibers. Heat is transferred through the part in which fibers are orientated in the thickness direction and leaked, which degrades the heat insulating performance. On the contrary to this, the vacuum heat insulating material 7 according to the first embodiment does not transfer heat in the thickness direction which is the heat transfer direction except transferring heat by a point contact through a contacting point with another fiber, hence it is possible to obtain an effect of contact thermal resistance.

In the vacuum heat insulating material 7 according to the present embodiment, leakage of heat in the thickness direction which is the heat transfer direction is low, and accordingly, solid heat transfer through the core material 5 can be reduced. Therefore, the vacuum heat insulating material 7 according to the present embodiment can reduce the heat conductivity, that is, the heat insulating performance is improved.

On the other hand, when the average fiber interval (P) is smaller than 2.5 times of the average fiber diameter (d) (when P/d is less than 2.5 times), the smaller the average fiber interval (P) is, the larger the heat conductivity of the vacuum heat insulating material 7 according to the first embodiment abruptly grows, that is, the heat insulating performance is abruptly degraded, compared with the comparison example using the cottonlike fiber for the core material 5.

It is considered that this is because the fibers of the vacuum heat insulating material 7 according to the first embodiment becomes thick compared with the comparison example using the cottonlike fiber for the core material 5, the heat transfer passage is shortened, and further, solid volume fraction in the vacuum heat insulating material 7 is raised.

Here, if the average fiber interval (P) is made large, namely, is made at least 2.5 times of the average fiber diameter (d) (P/d is at least 2.5 times), the solid volume fraction in the vacuum heat insulating material 7 can be reduced, and further, the heat transfer distance can be made long, which gradually reduces the heat conductivity. The above can be understood from this hypothesis.

Further, in a range in which the average fiber interval (P) is 4 to 7 times of the average fiber diameter (d) (P/d is at least 4 and no more than 7), the heat conductivity stays almost unchanged to be around 0.0020 [W/mK]. Since the heat conductivity becomes almost the same as around 0.0020 [W/mK] which is the heat conductivity of conventional general vacuum heat insulating material 7 using glass fiber for the core material 5, the vacuum heat insulating material 7 according to the present embodiment can present excellent heat insulating performance. From the point at which the average fiber interval (P) exceeds 7 times of the average fiber diameter (d) (when P/d is larger than 7 times), the heat conductivity grows abruptly. Namely, it can be understood that the heat transfer performance of the vacuum heat insulating material 7 according to the first embodiment becomes abruptly degraded. It is estimated that this is because, as the average fiber interval (P) is made larger, deflection of fiber, which is supported by the contacting point between fibers, becomes large, and the fibers are orientated in the thickness direction, and thus contact of fibers occurs between fibers of respective layers.

From the above explanation, as for the vacuum heat insulating material 7 according to the first embodiment, when the average fiber interval (P) is within a range of 2.5 to 8.5 times of the average fiber diameter (d) (a range of P/d is at least 2.5 and no more than 8.5 times), the heat conductivity becomes smaller than 0.0030 [W/mK] which is the heat conductivity of the conventional vacuum heat insulating materials 7 and 750 using cottonlike core material, namely, the heat insulating performance is superior.

Further, if the vacuum heat insulating material 7 according to the first embodiment is used in a range in which the average fiber interval (P) is 4 to 7 times of the average fiber diameter (d) (P/d is at least 4 and no more than 7 times), the heat conductivity becomes almost the same as 0.0020 [W/mK] which is the heat conductivity of the conventional general vacuum heat insulating materials 7 and 750 using the glass fiber for the core material 5; that is, the vacuum heat insulating material 7 according to the first embodiment can present excellent heat insulating performance.

Therefore, it is possible to obtain the vacuum heat insulating material 7 having excellent heat insulating performance if the average fiber interval (P) is set at least 2.5 and no more than 8.5 times of the average fiber diameter (d). Preferably, when the average fiber interval (P) is set at least 4 and less than 7, it can be expected that the heat insulating performance is further improved.

(Heat insulating performance 3)
(Influence of Heat Welding)

Next, influence of fabric weight on the heat insulating performance will be explained when the fiber assembly 1 is used for the core materials 5 and 550, and the fiber assembly 1 is non-woven cloth to which heat welding is applied by an embossing 110.

As discussed above, as for long-fibered non-woven cloth which is the fiber assembly 1, continuous fiber melted by the extruder and extruded from the spinning nozzle is collected on the conveyer, the conveyer is lead at an arbitrary speed, and the embossing 110 is carried out by the heat roller with forming, for example, a dotted heat welded portion. Thereby the fibers which form the sheet become hard to unravel or reveal, hence the handleability of the non-woven cloth sheet (fiber assembly 1) is improved, and the windable long-fibered non-woven cloth can be obtained with maintaining the handling strength.

Figure 24:
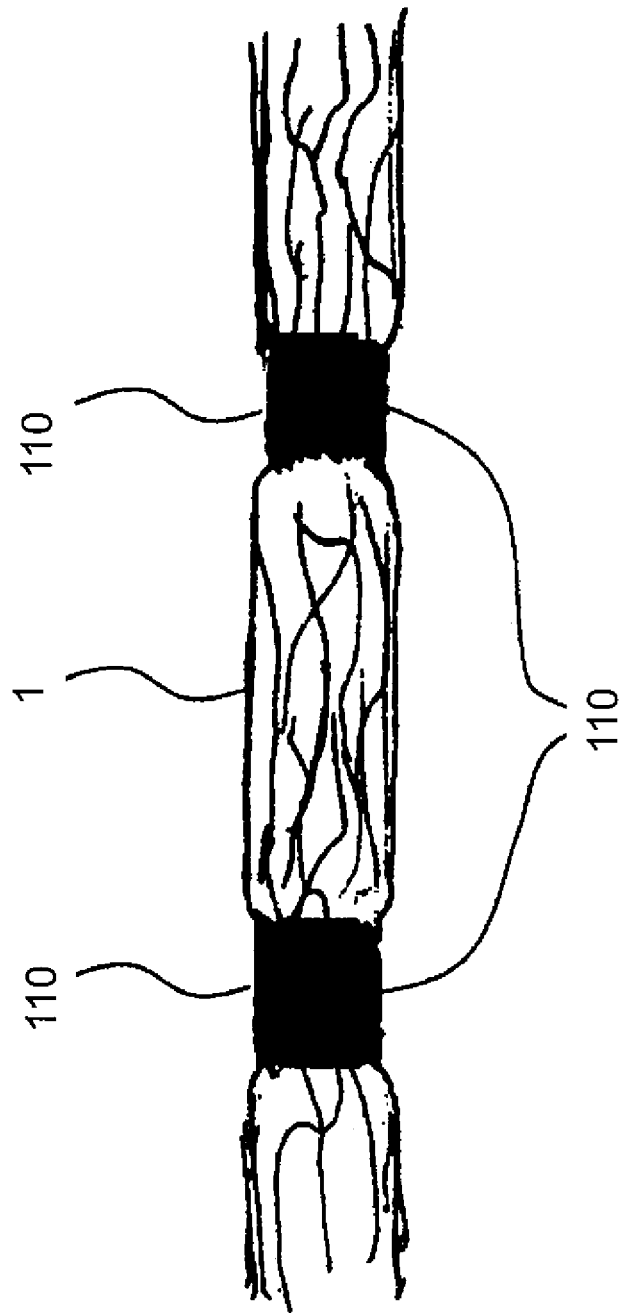
FIG. 24 shows the first embodiment and is a cross sectional view of non-woven cloth which is an organic fiber assembly 1 of the vacuum heat insulating material 7.

FIG. 24 shows the first embodiment and is a cross sectional view of non-woven cloth which is the fiber assembly 1 of the vacuum heat insulating material 7. In FIG. 24, on the sheet-shaped fiber assembly 1, the embossing 110 is applied appropriately and the sheet-shaped fiber assembly 1 is heat-welded. In this figure, the embossing 110 is applied by penetrating from the front surface to the rear surface of the sheet-shaped fiber assembly 1 (penetrating in the thickness direction of the sheet).

In the heat welding step by the embossing 110, long-fibered non-woven cloth which is the fiber assembly 1 can be manufactured by changing the fabric weight (fabric weight per unit area) with adjusting manufacturing condition such as the speed of the collecting conveyer so that the heat welded portion of the embossing 110 penetrates from the front surface to the rear surface, namely, in the thickness direction. Here, the embossing 110 needs to have a size (a diameter in a case of an almost circular shape; a length of one side in a case of a polygonal shape) of at least about 0.3 mm in order that the heat welding is securely done to the sheet. Further, in order not to degrade the heat insulating performance due to the heat transfer through the embossing 110, it is preferable that the size of the embossing 110 is no more than about 5 mm.

For example, it is preferable to set the diameter at least 0.3 mm and no more than around 5 mm if the embossing 110 is circular, or if polygonal, set one side at least 0.3 mm and no more than around 5 mm, preferably, at least 0.5 mm and no more than 1.5 mm.

In the present embodiment, by setting the embossing 110 to be almost circular and to have a diameter of around 0.5 to 1 mm, the heat insulating performance is improved, and the heat welding is securely done. A rate occupied by the embossing 110 in the sheet is made around 8% which does not degrade the heat insulating performance so much. Further, as for the measurement of the average fiber diameter, some portions to some hundreds portions (e.g., 10 portions) are measured by a micro-scope, and an average can be used. Further, the fabric weight (weight (g) of the fiber per 1 m$^2$) can be obtained by measuring the area and the weight of one sheet and obtaining the weight per unit area of one sheet.

Next, 300 sheets of the obtained non-woven clothes are laminated to form the core material 5, inserted into the outer cover material 4 which is an aluminum foil laminated film, and dried at about 100 degrees Celsius for about five hours. After dried, inside of the outer cover material 4 containing the core material 5, the adsorption agent 6 such as water adsorption agent (CaO) 5g or gas adsorption agent included in a bag having a good ventilation is provided, and the dried assembly is set inside of a chamber type vacuum packaging machine and vacuumed. The vacuuming is done until the inside of the chamber is 3 Pa, the opening portion is heat-sealed inside of the vacuum chamber, and the vacuum heat insulating materials 7 and 750 are produced as the vacuum heat insulating panel.

Figure 25:
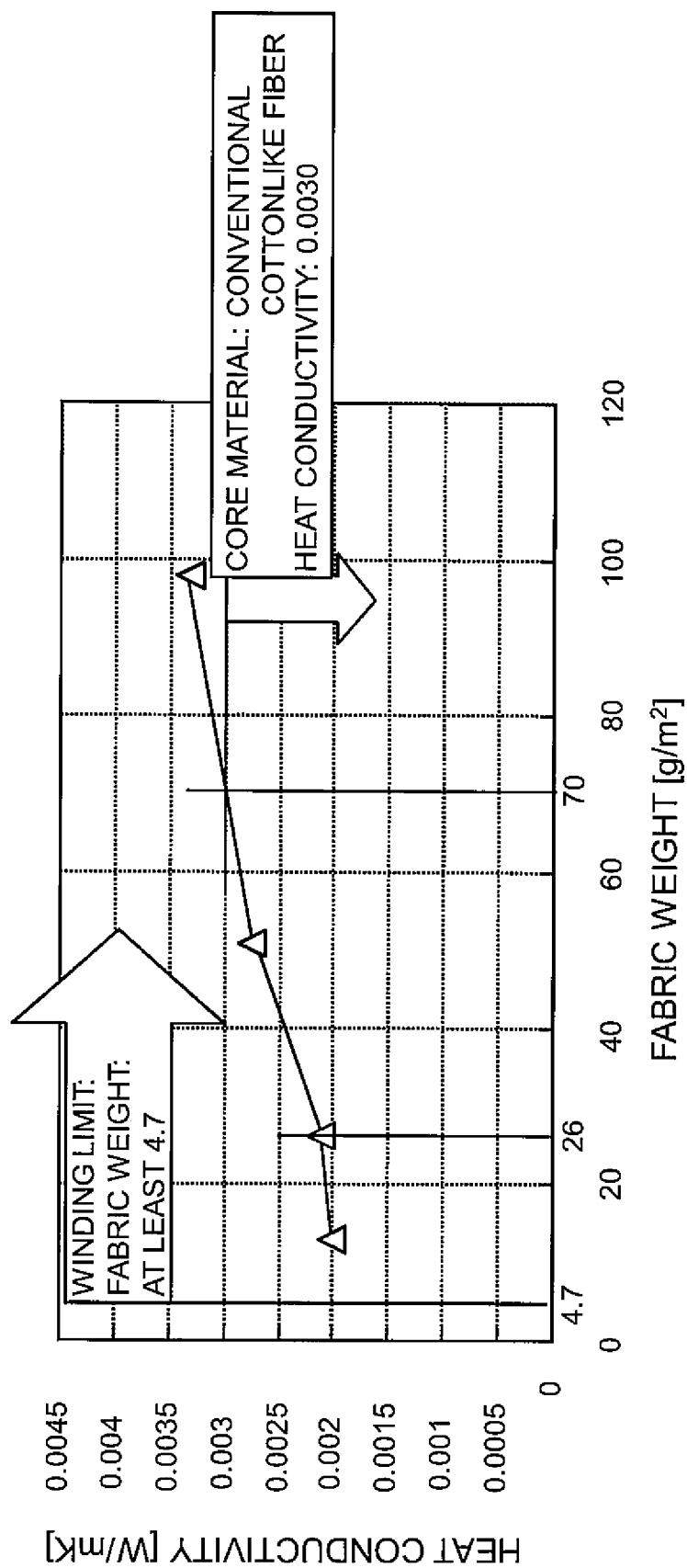
FIG. 25 shows the first embodiment and shows correlation between fabric weight of the vacuum heat insulating material 7 and heat conductivity.
Figure 26:
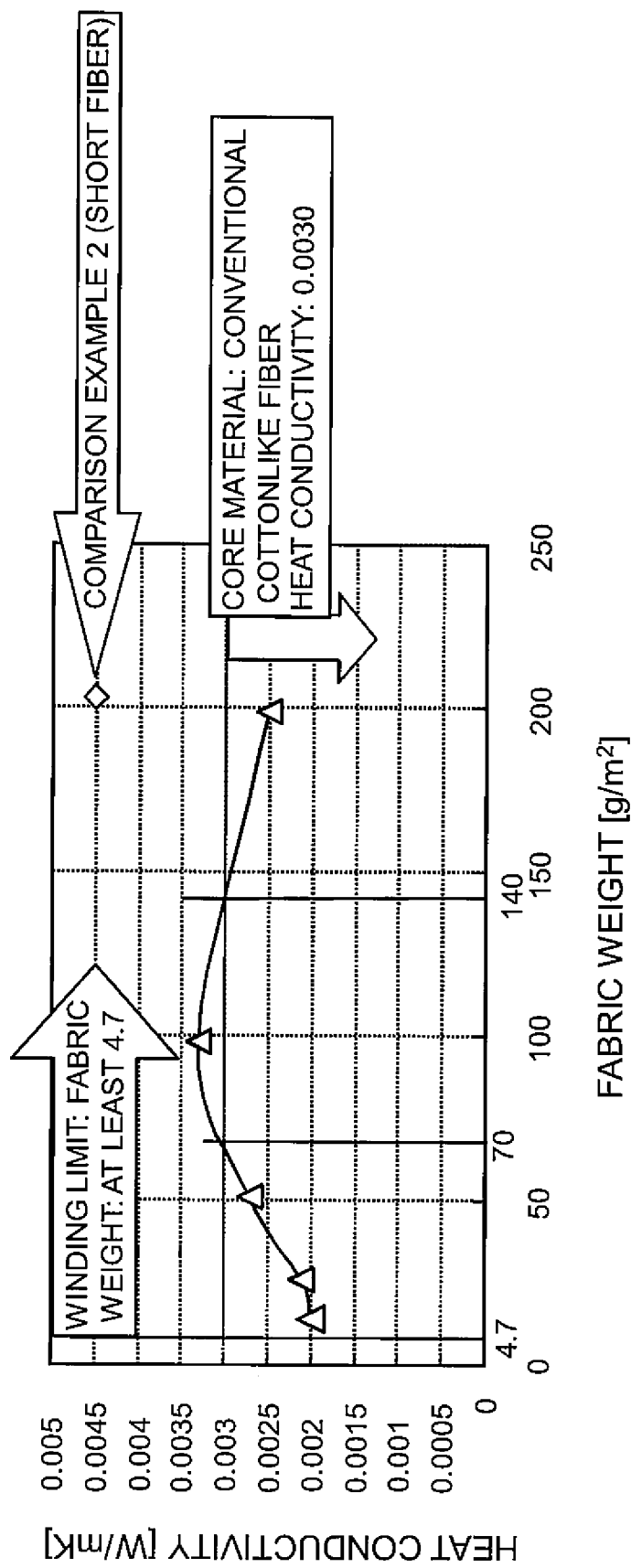
FIG. 26 shows the first embodiment and shows correlation between fabric weight of the vacuum heat insulating material 7 and heat conductivity.

Graphs in FIGS. 25 and 26 show the measured result of the heat conductivity of the obtained vacuum heat insulating material 7. FIGS. 25 and 26 show the first embodiment; FIG. 25 shows correlation between the fabric weight of the vacuum heat insulating material 7 and the heat conductivity, and FIG. 26 shows correlation between the fabric weight of the vacuum heat insulating materials 7 and 750 and the heat conductivity.

In each of FIGS. 25 and 26, the vertical axis shows the heat conductivity [W/mK] and the horizontal axis shows the fabric weight [g/m$^2$]. Normally, the fabric weight is represented by the fabric weight [g/m$^2$] showing the weight of fiber per 1 m$^2$. Further, in order to compare with other material of which a specific gravity of fiber material is different, the relation can be represented by a fabric volume [cc/m$^2$] showing the volume (cc) occupied by fiber per 1 m$^2$. Here, in a case of showing by the fabric volume [cc/m$^2$], the volume of fiber can be obtained by measuring the weight and converting the result by a specific gravity (e.g., in a case of PET, the self-weight is 1.34).

FIG. 25 shows relation between the fabric weight and the heat conductivity when the organic fibers of Embodiment examples 5 to 8 are used for the core materials 5 and 550 shown in Table 2.

TABLE 2

|  | fiber length | average fiber diameter (μm) | fiber weight (g/m$^2$) |
|---|---|---|---|
| Embodiment example 5 | long fiber | 13 | 13 |
| Embodiment example 6 | ↑ | ↑ | 26 |
| Embodiment example 7 | ↑ | ↑ | 51 |
| Embodiment example 8 | ↑ | ↑ | 98 |

From FIG. 26, 0.003 [W/mK] which is the heat conductivity of the vacuum heat insulating material 7 when the fabric weight is no more than 70 [g/m$^2$] and the conventional cottonlike core materials 5 and 550 are used becomes equivalent to the heat conductivity of the case in which non-woven cloth using the fiber assembly 1 of the present embodiment is made into the core materials 5 and 550. Therefore, if the fabric weight is no more than 70 [g/m$^2$], the heat conductivity of the vacuum heat insulating material 7 according to the first embodiment can be made smaller than 0.003 [W/mK] which is the heat conductivity of the vacuum heat insulating material 7 when the conventional cottonlike core material 5 is used; that is, it is understood that the heat insulating performance is improved.

This is considered that by reducing the fabric weight, the ratio occupied by fibers is reduced, the thickness of the non-woven cloth becomes small, and thus the fibers within the non-woven cloth tend to be orientated in the direction of the plane (the length direction or the width direction) which is approximately orthogonal direction to the heat insulating direction. Accordingly, the fibers are hard to be orientated in the thickness direction (the heat insulating direction), which suppresses the heat conduction in the thickness direction of the fibers. Therefore, in the present embodiment, within a range of being less than 0.003 [W/mK] which is the heat conductivity in the case of the cottonlike core material, the upper limit of the fabric weight is (no more than) 70 [g/m$^2$], with considering variation of manufacturing, etc. Consequently, it is possible to obtain the vacuum heat insulating materials 7 and 750 whose heat insulating performance is not degraded, is easy to manufacture, and has a good recyclability.

It is considered that in a case of the fabric weight exceeding 70 [g/m$^2$], the orientation direction of the fibers is easily directed in the thickness direction which is the heat insulating direction, and the heat welded portion of the embossing 110 works as the heat transfer passage in the thickness direction, the effect of the heat welded portion of the embossing 110 is increased, and thus the heat insulating performance is degraded.

Here, from FIG. 25, when the fabric weight exceeds 26 [g/m$^2$], the heat conductivity becomes suddenly larger than around 0.002 [W/mK], hence the fabric weight is desired to be no more than 26 [g/m$^2$]. If the fabric weight is made no more than 26 [g/m2], the heat conductivity is made no more than around 0.002 [W/mK] which is the heat conductivity of the conventional general vacuum heat insulating material 7 in which the glass fiber is used for the core material 5, and thus it is possible to obtain the vacuum heat insulating material 7 with high heat insulating performance.

Here, it is considered that the less the fabric weight is, the more the fibers in the non-woven cloth are easily orientated in the plane direction (the length direction or the width direction), and further the effect of the heat welded portion can be reduced. However, if the fabric weight is lowered too much, it becomes difficult to manufacture the vacuum heat insulating material 7, and as well the strength is decreased due to the degradation, etc. of the evenness of the non-woven cloth. Thus, the non-woven cloth of which the fabric weight is less than 4.7 [g/m$^2$] cannot be reeled as the non-woven cloth, and there occurs a case wherein fibers may be torn halfway.

Therefore, in the present embodiment, if the embossing 110 is applied on the vacuum heat insulating material 7, by making the fabric weight of the non-woven cloth at least 4.7 [g/m$^2$] and no more than 70 [g/m$^2$] which is the windable limit of the non-woven cloth, it is possible to obtain the vacuum heat insulating material 7 with high heat insulating performance having the core material 5 with a good handleability. Preferably, if the fabric weight is made at least 4.7 [g/m$^2$] and no more than 26 [g/m$^2$], it can be expected that the heat insulating performance is further improved.

Therefore, as for a heat insulating box or a heat insulating wall using the vacuum heat insulating material 7 having a small heat conductivity and high heat insulating performance as explained in the present embodiment, it is possible to make the thickness of the box or the wall thinner due to the good heat insulating performance. Thus, compared with the conventional heat insulating box having the same external appearance, the internal volume can be enlarged, and thus it is possible to supply appliances such as a refrigerator with a large capacity, and so on. Further, if the internal volume is made the same as the conventional one, the external appearance can be downsized, and thus it is possible to obtain an appliance such as a small compact refrigerator, etc.

Here, FIG. 26 shows a correlation between the fabric weight and the heat conductivity of Embodiment example 5 to Embodiment example 9 shown in Table 3 when the organic fibers 2 are used for the core materials 5 and 550.

TABLE 3

|  | fiber length | average fiber diameter (μm) | fiber weight (g/m$^2$) |
|---|---|---|---|
| Embodiment example 5 | long fiber | 13 | 13 |
| Embodiment example 6 | ↑ | ↑ | 26 |
| Embodiment example 7 | ↑ | ↑ | 51 |
| Embodiment example 8 | ↑ | ↑ | 98 |
| Embodiment example 9 | ↑ | ↑ | 198 |
| Comparison example 2 | short fiber | ↑ | 203 |

In FIG. 26, the horizontal axis shows the fabric weight and the vertical axis shows the heat conductivity. From FIG. 26, it is recognized that when the fabric weight is no more than 70 [g/m$^2$] and at least 140 [g/m$^2$], the heat conductivity becomes smaller than 0.0030 [W/mK] which is the heat conductivity of the conventional one having the cottonlike core material, and thus the heat insulating performance is improved.

Here, the more the fabric weight is greater than 140 [g/m$^2$] which is the predetermined value, the smaller the heat conductivity becomes, and the heat insulating performance is improved. It is considered that the above is because continuous long fibers are used for the fibers, and thus it is easy to make the fibers orientated at the time of manufacturing in the orthogonal direction to the heat transfer direction (the sheet reeling direction, the length direction or the width direction of the sheet).

Further, if the fabric weight is raised, the thickness per sheet becomes thicker, hence the sheet becomes hard to be folded at the time of lamination due to the thickness of the sheet. Therefore, the fibers become easy to be orientated in the orthogonal direction (the sheet reeling direction, the length direction or the width direction of the sheet) to the heat transfer direction. Consequently, it is considered that the heat conductivity in the heat transfer direction becomes small, and the heat insulating performance is improved.

On the contrary, as the fabric weight becomes less than 70 [g/m$^2$] which is the predetermined value, the heat insulating performance is improved. It is considered that the above is because the thickness per sheet becomes smaller, hence the fibers become less likely to be orientated in the heat transfer direction (the thickness direction), and thus the fibers become likely to be orientated in the orthogonal direction (the sheet reeling direction, the length direction or the width direction of sheet) to the heat transfer direction, the heat conductivity in the heat transfer direction becomes small, and the effect of improving the heat insulating performance becomes large.

Therefore, in the present embodiment, if the embossing 110 is applied to the vacuum heat insulating material 7, by making the fabric weight of the non-woven cloth to be at least 4.7 [g/m$^2$], which is the windable limit of the non-woven cloth, and no more than 70 [g/m$^2$], it is possible to obtain the vacuum heat insulating material 7, the handleability of the core material of which is good and the heat insulating performance is high. Preferably, if the fabric weight is made at least 4.7 [g/m$^2$] and no more than 26 [g/m$^2$], it is expected that the heat insulating performance is further improved. Further, if the fabric weight of the non-woven cloth is made at least 140 [g/m$^2$] and no more than 198 [g/m$^2$], it is possible to obtain the vacuum heat insulating material 7 whose heat insulating performance is high, and wherein the handleability of the core material 5 is good. The fabric weight is set no more than 198 [g/m$^2$] because this value is the measurement result of Embodiment example 9 shown in Table 3, and to this point, it is confirmed that the heat insulating performance is surely good compared with the conventional case using the cotton-like core material.

Therefore, as for a heat insulating box or a heat insulating wall using the vacuum heat insulating material 7 having a small heat conductivity and high heat insulating performance as explained in the present embodiment, it is possible to make the thickness of the box or the wall smaller due to the good heat insulating performance. Accordingly, compared with the conventional heat insulating box having the same external appearance, the internal volume can be enlarged, and thus it is possible to supply appliances such as a refrigerator with a large capacity, and so on. Further, if the internal volume is made the same as the conventional one, the external appearance can be downsized, and thus it is possible to obtain an appliance such as a small compact refrigerator, etc.

(Heat Insulating Performance 4)
(Long Fiber, Short Fiber)

Here, to demonstrate that the use of continuous long fibers improves the heat insulating performance when the fabric weight is at least 140 [g/m$^2$], the vacuum heat insulating material 7 having the short-fibered core material 5 made by the specification as in Comparison example 2 is generated and compared. Here, for the organic fibers 2 used for the core material 5 of Comparison example 2, short fiber having a fiber length of around 5 to 7 mm which is longer than the thickness of one sheet and no more than the equivalent length of the thickness (around 5 mm to 10 mm) of the sheet after lamination is used.

From Table 3, as a result of comparing Embodiment example 9 of long fibers and Comparison example 2 using short fibers, both of which the fabric weights are the same, it is found that the heat insulating performance is about 1.8 times better in a case of the heat conductivity (0.0025 [W/mK]) of Embodiment example 9 in which the long-fibered fiber assembly 1 is used for the core material 5 than in a case of the heat conductivity (0.0045 [W/mK]) of Comparison example 2 in which the short-fibered fiber assembly 1 is used for the core material 5. Therefore, it is found that using the continuous long fibers improves the heat conductivity when the fabric weight is 140 [g/m$^2$]. In this case, since the fabric weight is high, manufacturing can be easily performed, the speed of the manufacturing line can be increased, and thus the production efficiency is improved.

Here, in the present embodiment, as the long fibers, fibers having the continuous fiber length being at least the shortest length of the sheet in the length direction or the width direction of the sheet, etc. are used, and thus the heat insulating performance can be improved more than the a case in which the short fibers having the fiber length being shorter than the shortest length of the sheet in the length direction or the width direction of the sheet, etc. are used. Further, as for the fiber length, the continuous long fibers are preferable. During the manufacturing process of the fiber assembly 1, it is considered that fibers may be torn halfway. Further, it is also considered that short fibers, having the fiber length being not continuous exceeding or equal to the shortest length of the sheet in the length direction or the width direction of the sheet, may be mixed. In the present embodiment, if the fibers having the continuous fiber length are included at an occupied rate of at least 50% in the sheet, the heat insulating performance is improved. Consequently, in the present embodiment, the fiber assembly 1 formed by the long fibers, of which the fiber length is continuous no less than the shortest length of the sheet in the length direction or the width direction of the sheet, etc., of which the occupied rate is at least 50% (preferably, at least 70%) in the sheet is used.

It is considered when the short fibers are used such as in Comparison example 2, since the fiber length is short, the fibers are easy to slant, according to the increase of the fabric weight (the increase of the thickness of the sheet), the fibers are easily orientated in the heat transfer direction, and thus the heat insulating performance is degraded.

On the contrary, if the fiber length of the fiber assembly 1 is long, the fibers tend to be orientated in the plane direction (the reeling direction, the length direction, or the width direction) which is approximately orthogonal to the heat insulating direction (the thickness direction). That is, a passage for solid heat transfer within the vacuum heat insulating materials 7 and 750 in the heat insulating direction (the thickness direction) can be made long, and thus the heat insulating performance is improved. Further, since the sheet is thick because of the high fabric weight, the sheet is less likely to be folded at the time of lamination, and thus it becomes easy to make the fibers orientated in the direction (the reeling direction of the sheet, the length direction or the width direction of the sheet) orthogonal to the heat transfer direction. It is considered because of the above, the heat conductivity in the heat transfer direction is reduced, and the heat insulating performance can be improved. Consequently, the heat insulating performance of the vacuum heat insulating materials 7 and 750 in which the fiber assembly 1 formed not by short fibers, but by the organic fibers 2 being continuous in the length direction is used for the core material 5 is more excellent than in the case of using the short fibers for the core material 5.

(Heat Insulating Performance 5)
(Heat Welding Penetration, Non-Penetration)

Next, the result of comparison, which is conducted between a case in which the embossing 110 penetrates in the thickness direction and a case in which the embossing 110 does not penetrate, will be explained. It has been explained that in the above vacuum heat insulating material 7, when the embossing 110 penetrates, the heat insulating performance can be improved by lowering the fabric weight (no more than 70 [g/m$^2$], preferably no more than 26 [g/m$^2$]). Here, it is confirmed whether the heat insulating performance is changed or not between the case in which the embossing 110 penetrates in the thickness direction of one sheet and the case in which the embossing 110 does not penetrate in the thickness direction of the sheet (when the embossing is applied only on the front and rear surfaces of the sheet).

Then, so as not to make the heat welded portion of the embossing 110 penetrate in the thickness direction, non-woven cloth (the fiber assembly 1) is generated with changing the fabric weight by adjusting the temperature of the heat roller and the clearance between the heat rollers. Here, the temperature of the heat roller is set to 180 degrees Celsius, and the clearance between the heat rollers is set to ½ of the thickness of the non-woven cloth before heat welding is applied.

Figure 27:
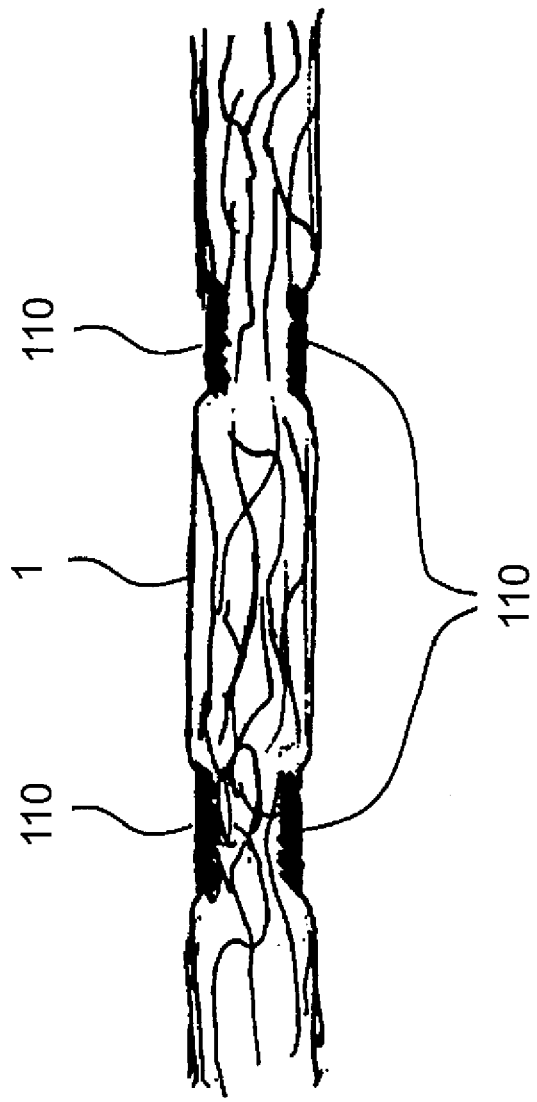
FIG. 27 shows the first embodiment and is a cross section view of non-woven cloth which is the fiber assembly 1 of the vacuum heat insulating material 7.

FIG. 27 shows the first embodiment, and is a cross sectional view of the non-woven cloth which is the organic fiber assembly 1 of the vacuum heat insulating material 7. In FIG. 27, for the sheet-shaped fiber assembly 1, the embossing 110 is arbitrarily applied only on the surface (the front surface and the rear surface) and heat welding is performed without penetrating in the thickness direction. Here, "the surface (the front surface and the rear surface)" means "at least one surface of the front surface and the rear surface."

The obtained non-woven cloth (the organic fiber assembly) is manufactured into the vacuum heat insulating materials 7 and 750 in the same manner as the above explanation. Then, the heat insulating performance is compared between the vacuum heat insulating material of which the heat welded portion of the embossing 110 does not penetrate in the thickness direction (not provided continuously in the thickness direction) and the vacuum heat insulating material of which the heat welded portion of the embossing 110 penetrates (provided continuously in the thickness direction, Comparison example). Here, the non-woven cloth to which the embossing 110 is applied is manufactured to have the same size of the embossing 110 and the same number of portions of the embossing 110 provided in the same dimension.

Figure 28:
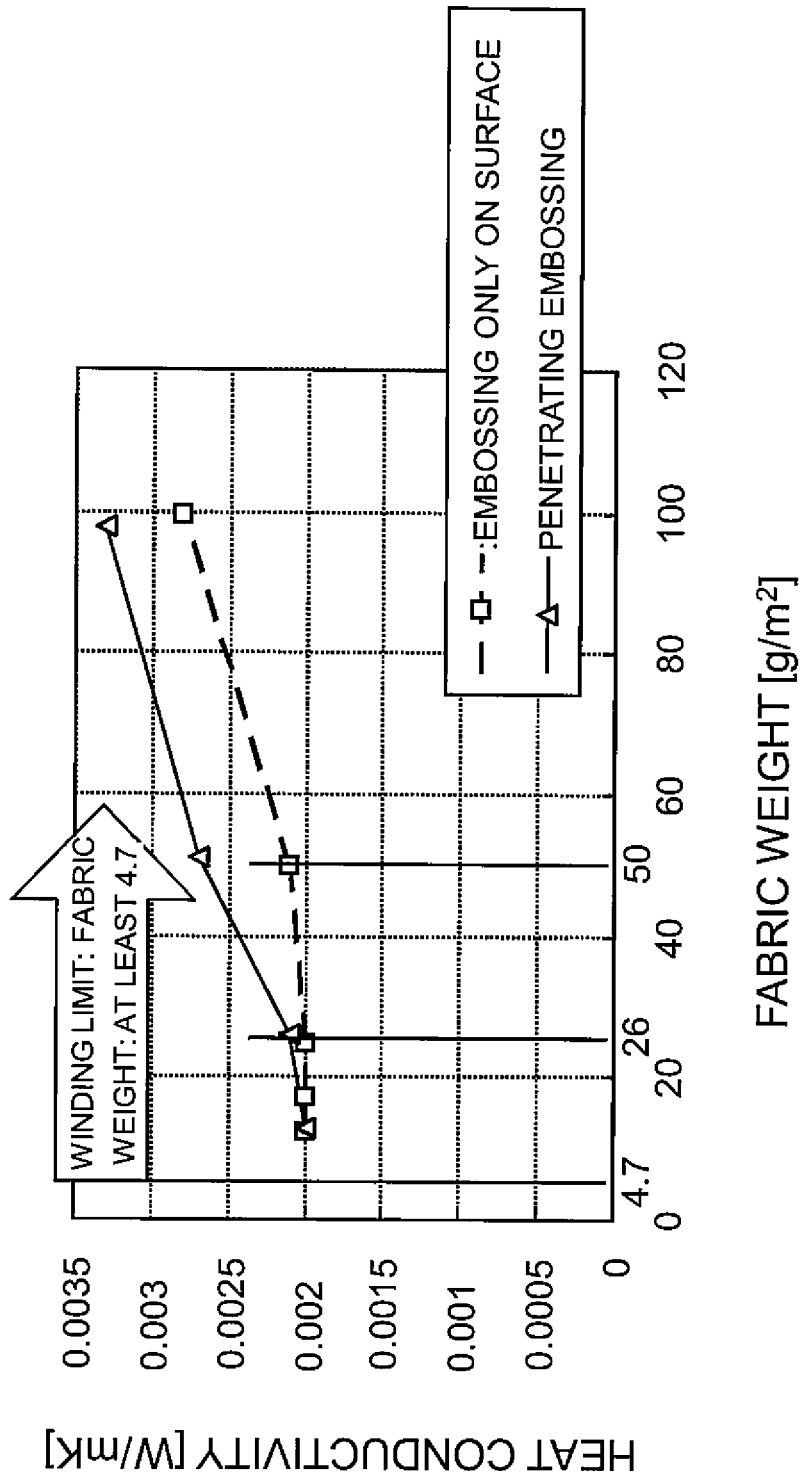
FIG. 28 shows the first embodiment and shows relation between fabric weight of the vacuum heat insulating material 7 and heat conductivity.

The obtained evaluation results of the heat insulating performance of the vacuum heat insulating material 7 is shown in a graph of FIG. 28. FIG. 28 shows the first embodiment and is a diagram showing relation between the fabric weight and the heat conductivity of the vacuum heat insulating materials 7 and 750. Also in FIG. 28, similarly to the above discussed FIG. 28, the vertical axis is the heat conductivity [W/mK] and the horizontal axis is the fabric weight [g/m$^2$]. In FIG. 28, a solid line shows the case in which the embossing 110 penetrates (the case shown by the solid line in FIG. 25). Further, a broken line shows the case in which the embossing 110 does not penetrate in the thickness direction of one sheet (only on the surface).

Here, in FIG. 28, when the heat welded portion of the embossing 110 penetrates in the thickness direction of the fiber assembly 1, from a point at which the fabric weight exceeds about 26 [g/m$^2$], the heat conductivity suddenly increases, and the heat insulating performance begins to degrade. If the fabric weight exceeds about 70 [g/m$^2$], the heat conductivity exceeds 0.003 [W/mK] which is the heat conductivity of the conventional case using the cottonlike core material, and the heat insulating performance is extremely degraded. However, as shown by the broken line, if the heat welding portion of the embossing 110 is formed so as not to penetrate in the thickness of the nonwoven cloth, up to about 50 [g/m$^2$] of the fabric weight, the heat conductivity is almost fixed, around 0.002 [W/mK], and the heat insulating performance is good. In the case shown by the broken line in which the heat welded portion of the embossing 110 does not penetrate in the thickness direction of the nonwoven cloth (fiber assembly 1), when the fabric weight exceeds around 50 [g/m$^2$], the heat conductivity suddenly increases. Until the fabric weight is up to about 130 [g/m$^2$] (the heat conductivity is about 0.0029 [W/mK]), the case does not exceed 0.003 [W/mK] which is the heat conductivity of the core material of cottonlike fiber, hence it is possible to obtain the vacuum heat insulating material 7 of which the heat insulating performance is more excellent than the conventional cottonlike fiber. Here, when the fabric weight is about 100 [g/m$^2$], the heat conductivity is around 0.0028 [W/mK].

From the above, when the heat welded portion of the embossing 110 does not penetrate in the thickness direction of the sheet-shaped non-woven cloth, by making the fabric weight to be at least about 4.7 [g/m$^2$] and no more than about 130 [g/m$^2$], it is possible to suppress the heat conductivity to no more than 0.003 [W/mK] which is the heat conductivity of the conventional case using the cottonlike core material. Consequently, it is possible to obtain the non-woven cloth, the vacuum heat insulating material 7, a heat insulating box, and appliances using the heat insulating material 7 such as the refrigerator, the water heater, the jar pot, etc. which secure necessary heat insulating performance, are easy to manufacture, and have a good recyclability. Here, if the fabric weight is set at least about 4.7 [g/m$^2$] and no more than about 50 [g/m$^2$], the heat conductivity can be equivalent to 0.002 [W/mK] which is the heat conductivity of the conventional general vacuum heat insulating materials 7 and 750. Therefore, it is possible to obtain the non-woven cloth, the vacuum heat insulating materials 7 and 750, a heat insulating box and appliances using the vacuum heat insulating materials 7 and 750 such as the refrigerator, the water heater, the jar pot, etc, of which the heat insulating performance is good, are highly efficient and easy to manufacture, and also have a good recyclability.

Further, when the heat welded portion of the embossing 110 penetrates in the thickness direction of the sheet-shaped non-woven cloth, by making the fabric weight to be at least about 4.7 [g/m$^2$] and no more than about 70 [g/m$^2$], it is possible to suppress the heat conductivity to no more than 0.003 [W/mK] which is the heat conductivity of the conventional case using the cottonlike core material. Consequently, it is possible to obtain the non-woven cloth and the vacuum heat insulating materials 7 and 750, a heat insulating box and appliances using the vacuum heat insulating materials 7 and 750 such as the refrigerator, the water heater, the jar pot, etc., which secure necessary heat insulating performance, are easy to manufacture and have a good recyclability. Here, if the fabric weight is set at least about 4.7 [g/m$^2$] and no more than about 26 [g/m$^2$], the heat conductivity can be equivalent to 0.002 [W/mK] which is the heat conductivity of the conventional general vacuum heat insulating materials 7 and 750 using the glass fibers as the core material. Therefore, it is possible to obtain the non-woven cloth, the vacuum heat insulating material 7 and 750, the heat insulating box and the appliances using the vacuum heat insulating materials 7 and 750, such as the refrigerator, the water heater, the jar pot, etc. of which the heat insulating performance is more excellent, which are highly efficient and easy to manufacture, and also have a good recyclability.

Further, when the heat welded portion of the embossing 110 penetrates and when the heat welded portion does not penetrate in the thickness direction of the sheet-shaped nonwoven cloth, by increasing the fabric weight within the above range of the fabric weight, it is possible to increase the thickness of one non-woven cloth sheet. Due to this, it is possible to reduce the number of laminated sheets of non-woven cloth which is the fiber assembly 1 for obtaining the vacuum heat insulating materials 7 and 750 with the desired thickness (the predetermined necessary thickness), and thus the productivity is improved.

Here, within a range of at least 4.7 [$g/m^2$] and no more than 26 [$g/m^2$], a difference from the heat conductivity is small between the case where the heat welded portion of the embossing 110 penetrates and the case where the heat welded portion does not penetrate in the thick direction of the sheet-shaped fiber assembly 1. Accordingly, if no problem occurs in the productivity, by using the non-woven cloth with a low fabric weight, there hardly occurs a difference in the heat insulating performance regardless whether the heat welded portion of the embossing 110 penetrates in the thickness direction of the sheet-shaped non-woven cloth or not, that is, the heat insulating performance is good. Therefore, if no problem occurs in the productivity, the fabric weight should be made within as small range as possible such as at least 4.7 [$g/m^2$] and no more than 26 [$g/m^2$], thus the degree of freedom of the embossing 110 is increased, and the heat insulating performance becomes also good.

Here, if the productivity is considered, the fabric weight should be as large as possible. In this case, the heat welded portion of the embossing 110 is made not to penetrate in the thickness direction of the sheet-shaped non-woven cloth, and with considering the manufacturing variation, etc., the range of the fabric weight should be made at least about 4.7 [$g/m^2$] and no more than 130 [$g/m^2$] so as to be smaller than about 0.003 [W/mK] which is the heat conductivity of the cotton-like core material.

Further, when the vacuum heat insulating materials 7 and 750 of the present embodiment of which the heat conductivity is small and the heat insulating performance is high are used, the thickness of the heat insulating box or the heat insulating wall can be made small due to the good heat insulating performance. Therefore, compared with the conventional heat insulating box with the same external appearance, the internal volume can be enlarged, and thus it is possible to provide an appliance such as a refrigerator with a large capacity, etc. Further, if the internal volume is made the same as the conventional one, the external appearance can be downsized, and thus it is possible to provide an appliance such as a small and compact refrigerator, etc.

Here, in order to provide the heat welded portion of the embossing, etc. of the core materials 5 and 550 with a hole penetrating in the thickness direction of the sheet, if the hole (e.g., a through hole) formation process is done by a laser processing, etc., the substantial size of the heat welded portion (heat conduction area) is reduced by the space for forming the hole, the heat transfer through the heat welded portion can be reduced, and thus the heat insulating performance can be improved. By forming the through hole being smaller than the size of the heat welded portion applied on the sheet, the heat insulating performance is improved compared with the case where the heat welded portion has no hole formation. For example, when the size of the heat welded portion is almost circle having the diameter of about 2 mm, the size of the through hole should be the diameter of about 1 mm. Since the through hole is smaller than the size of the heat welded portion, even when the through hole is formed, the welded status of the organic fibers 2 which forms the fiber assembly 1 can be maintained, and thus the handleability of the sheet is maintained to be good.

Namely, by providing a through hole being small enough to maintain the welded status (so that the heat welding can be maintained) of the organic fibers 2 which form the sheet being the organic fiber assembly at the heat welded portion such as the embossing, etc. applied in the thickness direction of the sheet, while maintaining the handleability and the productivity of the sheet good, it is possible to obtain the vacuum heat insulating material which can improve the heat insulating performance. Regardless the heat welded portion such as the embossing, etc. penetrates or does not penetrate in the thickness direction of the sheet, the heat insulating performance can be improved by providing the hole formation at the heat welded portion. Further, the hole formation needs not be limited to the through hole but may be a concave portion formation that can obtain the effect of the heat insulating performance improvement. Accordingly, by providing the through hole or the concave portion which is smaller than the size of the heat welded portion and can maintain the heat welding of the organic fiber assembly at the heat welded portion in the thickness direction of the sheet which is the organic fiber assembly, while the handleability of the sheet and the productivity are kept good, it is possible to obtain the vacuum heat insulating material which can improve the heat insulating performance.

(Heat Insulating Performance 6)
(Without Heat Welding)

Here, from the handleability problem of the core materials 5 and 550, after forming the sheet of the fiber assembly 1, the heat welding (the embossing 110) is often applied to the organic fibers 2x and the organic fibers 2y by the heat roller, etc. When the embossing 110 is applied, as explained above, the heat insulating performance is improved when the fabric weight is low; however, in a case of the non-woven cloth with a low fabric weight, since the thickness of one sheet is small, the number of laminations should be large for obtaining the vacuum heat insulating materials 7 and 750 having the predetermined thickness. Accordingly, the productivity is degraded such that the manufacturing line of the non-woven cloth becomes delayed or the time required for the lamination step becomes long, etc. Therefore, as for the fiber assembly 1 according to the present embodiment, the heat insulating performance will be explained hereinafter for the case where the heat welding such as the embossing 110, etc., is not applied. When the heat welding such as the embossing 110, etc. is not applied, since the heat transfer passage can be reduced, it is considered that the heat insulating performance is improved.

Here, when the heat welding such as the embossing 110, etc. is not applied to the fiber assembly 1, the long-fibered non-woven cloth which is the fiber assembly 1 can be manufactured by the following: the continuous fibers which are melted by the extruder and pushed off from the spinning nozzle are collected on the conveyer, and reeled by feeding the conveyer at an arbitrary speed. The fiber density of the fiber assembly 1 can be adjusted by the discharging amount of the melted resin and the speed of the conveyer, and the fiber assembly 1 having different thicknesses can be manufactured.

Then, it is considered a case wherein the core materials 5 and 550 are formed by cutting out the obtained fiber assembly 1 into, for example, an A4 size, or is continuously wound from the inner side toward the outer side. The number of lamination can be set arbitrarily based on the thickness of the obtained fiber assembly 1 and the thickness of the vacuum heat insulating materials 7 and 750 to be manufactured. The heat insulating performance of the organic fibers 2 is better when the fiber diameter is thinner. Theoretically, the fiber diameter is desired to be no more than 10 μm. Here, according to the thickness of the required core material 5, it is unnecessary to laminate the non-woven cloth sheet which is the fiber assembly 1, namely, the number of sheets can be one.

Next, effect on the heat insulating performance due to existence/absence of the heat welding of the fiber assembly 1 will be explained. Here, the organic fibers 2 used here is polyester having the diameter of about 10 μm to 13 μm. Further, the vacuum heat insulating materials 7 and 750 are manufactured by the manufacturing step equivalent to the above manufacturing method.

At this time, when manufacturing the non-woven cloth without heat welding, two samples "a" and "b" of the vacuum heat insulating materials 7 and 750, which are formed by the sheet-shaped fiber assembly 1 made of the organic fibers 2 being continuous in the length direction and to which the heat welding is not applied at the manufacturing step, are manufactured. When manufacturing the non-woven cloth with heat welding for the comparison example, the vacuum heat insulating materials 7 and 750, which are formed by the sheet-shaped fiber assembly 1 made of the organic fibers 2 being continuous in the length direction and to which the heat welding is applied at the manufacturing step, are manufactured. Here, the core materials 5 and 550 are formed without cutting out the fiber assembly 1 but with maintaining the continuous sheet shape in the length direction.

Then, the heat conductivities of the fiber assembly 1 of samples "a" and "b," and the comparison example which have been manufactured are measured using a heat conductivity tester "Auto Λ HC-073 (EKO Instruments Co., Ltd.)" at a temperature difference of the upper temperature being 37.7 degrees Celsius and the lower temperature being 10.0 degrees Celsius. Here, the measurement is done after carrying out the vacuuming step, and keeping as it is for about one day until gases or water within the outer cover material 4 is sorbed by the adsorption agent 6 and the heat conductivity of the vacuum heat insulating materials 7 and 750 become stable. Here, the average fiber diameter is the average value of the measured values of 10 points at Which the measurement is done using the microscope.

In this case, the heat insulating performance according to the existence/absence of the heat welding by the embossing 110 are compared using the fabric weight [g/m$^2$] which is the weight per unit weight.

The vacuum heat insulating materials 7 and 750 without heat welding by the embossing 110 are confirmed by two samples having different fabric weights. The fabric weights of the samples using the long fibers without the embossing 110 are about 70 [g/m$^2$] in the sample "a" and about 924 [g/m$^2$] in the sample "b." In both cases for the samples "a" and "b," the heat conductivities are 0.0019 to 0.0020 [W/mK]. The heat insulating performance of the samples "a" and "b" are improved compared with the case using the long fibers with the embossing 110 which are the comparison examples (Embodiment examples 5 to 9 in Table 3, refer to FIG. 14). Accordingly, the heat insulating performance can be improved more in the case without the heat welding by the embossing 110 rather than in the case with the heat welding by the embossing 110.

The reason for this is considered that there is no heat welding between the organic fibers 2 themselves of the fiber assembly 1, the passage of heat may be shortened due to the absence of the heat welding. Here, in the case of the vacuum heat insulating materials 7 and 750 in which the long-fibered organic fibers 2 are used for the core materials 5 and 550, even if the fabric weight is extremely high such as 924 [g/m$^2$], the heat conductivity is small and the heat insulating performance is improved. Therefore, by increasing the fabric weight to make the thickness of one sheet of the sheet-shaped non-woven cloth large, the number of lamination of the core material 5 can be reduced, the production speed can be increased, and further the productivity can be improved.

From the above, the heat insulating performance becomes better when the heat welding by the embossing 110 is not applied to the core materials 5 and 550 of the vacuum heat insulating materials 7 and 750, and the vacuum heat insulating materials 7 and 750 are manufactured by the fiber assembly 1 in which the long fibers being continuous equal to or exceeding the length of the sheet are used for the core material 5. Obviously, it is needless to say, also in the case where the heat welding by the embossing 110 is applied, the heat insulating performance becomes better than the case where the short fibers are used for the core materials 5 and 550 when the fiber assembly 1 is manufactured by the long fibers being continuous equal to or exceeding the length of the sheet.

(Heat Insulating Performance 7)
(Cross-sectional Shape of Fiber)

Next, the relation between the cross sectional shape of the organic fibers 2 and the heat insulating performance will be explained. The cross sectional shape of the above organic fibers 2 is almost circle. Another case will be explained, in which the cross sectional shape of the organic fibers 2 which form the fiber assembly 1 is made a triangular cross section which is modified cross section other than the almost circle. The case will be explained using an example, in which the organic fibers 2 having the modified cross section are used for manufacturing the fiber assembly 1, 300 sheets of the fiber assembly 1 are laminated to form the core materials 5 and 550, and the vacuum heat insulating materials 7 and 750 are manufactured in the same manner as discussed above.

The heat conductivity is measured as the heat insulating performance evaluation of the vacuum heat insulating materials 7 and 750 in which the fiber assembly 1 using the organic fibers 2 having a modified cross section, for example, a triangular cross section is applied. For a comparison example, the heat conductivity of the other vacuum heat insulating materials 7 and 750, in which the organic fibers 2 having an almost circular cross section including an almost same dimension of the cross section is used for the core material, is also measured. The heat conductivity is 0.0017 [W/m$^2$] for the vacuum heat insulating materials 7 and 750 in which the fiber assembly 1 using the organic fibers 2 having the almost triangular cross section is applied. On the other hand, the heat conductivity is 0.0020 [W/m$^2$] for the vacuum heat insulating materials 7 and 750 in which the fiber assembly 1 using the organic fibers 2 having the almost circular cross section is applied. Therefore, it is found that the heat insulating performance can be improved when the organic fibers 2 having the almost triangular cross section are used rather than when the organic fibers 2 having the almost circular cross section are used.

Since the inside of the vacuum heat insulating material 7 is in an approximately vacuum state, the fiber assembly 1 which forms the core material 5 receives atmospheric pressure through the outer cover material 4. When viewed from an arbitrary contacting point as a reference, at which the organic fibers 2 contact with each other, since the organic fibers 2 also contact with another fiber, the organic fibers 2 receive pressure by a contacting point with the other fiber as a point of support, become deflected. Thus, the organic fibers 2 come to contact with more other fibers, and the heat conductivity becomes larger; that is, the heat insulating performance is degraded.

Therefore, it is considered that the heat insulating performance is improved by having the modified cross section, because by making the cross sectional shape of the organic fibers 2 the almost triangular shape including the almost same cross sectional area as the fiber having the almost circular cross section, the stiffness is improved compared with the fibers having the almost circular cross section including the almost same cross sectional area, and the deflection of the fibers at the time of receiving the atmospheric pressure is reduced.

From the above, the heat insulating performance can be improved when the cross sectional shape of the organic fibers 2 is made to be the modified cross section (e.g., the almost triangular shape) rather than the almost circular shape. Further, if the organic fibers 2 have the modified cross sectional shape (e.g., an approximately triangular shape, a polygonal shape, etc.) including the almost same cross sectional area as the almost circular cross section of the fiber such that the modified cross sectional shape increases the second moment of area, the deformation of the vacuum heat insulating materials 7 and 750 at the time of receiving the atmospheric pressure can be reduced, the solid volume fraction within the vacuum heat insulating materials 7 and 750 can be decreased, and thus it is possible to obtain the vacuum heat insulating material 7 of which the heat insulating performance is improved.

Further, the cross sectional shape of the organic fiber 2 before vacuuming is made an almost C shape, and after vacuuming, a C-shaped opening portion is deformed by the pressure into a hollow tubular shape of which the C-shaped opening portion is closed (the diameter of the closed C-shaped opening portion is almost the same as the outer diameter of the almost circular shape). If such organic fiber 2 is used, since the cross section is tubular (the almost circular shape of which the center portion is hollow), the heat transfer becomes worse rather than the case of using the fiber having the almost circular cross section, and thus the heat insulating performance is improved.

In this case, if the hollow tubular fiber is used for the initial fiber, the air in the hollow portion is hard to be removed by vacuuming, and it takes long to vacuum. Further, there occurs a problem that the degree of vacuum of the hollow portion is not decreased. On the other hand, according to the present embodiment, the cross sectional shape of the organic fiber 2 before vacuuming is the almost C-shaped having the opening portion, and after vacuuming, the organic fiber 2 is pressed by the pressure and deformed into the hollow tubular shape of which the C-shaped opening portion is closed (the diameter of the closed C-shaped opening portion is almost the same as the outer diameter of the almost circular shape). Since such organic fiber 2 is used, the vacuuming time can be reduced, a predetermined degree of vacuum can be obtained, and further the vacuum heat insulating materials 7 and 750 having a good heat insulating performance can be obtained.

Here, when the organic fiber 2 having the C-shaped cross section is used, after vacuuming, the C-shaped opening portion is deformed by the pressure into the hollow tubular shape of which the C-shaped opening portion is closed (the diameter of the closed C-shaped opening portion is almost the same as the outer diameter of the almost circular shape). In this hollow tubular shape of which the C-shaped opening portion is closed, when a rate of the outer diameter to the inner diameter (when this rate is 0%, the inner diameter is 0, which shows the inside is solid and having a circular cross section including no opening portion nor hollow portion) when the C-shaped opening portion is closed is within a range of 30% to 70%, the heat conductivity is 0.0016 to 0.0019 (W/mK), which is small enough, and it is found that the heat insulating performance is improved. This is also confirmed for a case when the rate of the outer diameter to the inner diameter is no more than 20% and a case of at least 80%, and it is found the heat conductivities are larger, and the heat insulating performance is worse compared with the case of 30% to 70%.

(Heat Insulating Performance 8)
(Opening Portion Such as a Through Hole, a Notch, Etc.)

Next, in order to compare the size of strain and the deformation due to the creeping at the manufacturing step of the vacuum heat insulating materials 7 and 750, the thickness of the vacuum heat insulating materials 7 and 750 is measured after manufacturing the vacuum heat insulating materials 7 and 750 in the above-discussed manner. Then, after soaking in a normal temperature tank at 60 degrees Celsius, heating is applied for about 11 hours, and the vacuum heat insulating materials 7 and 750 are pulled out and the thicknesses of the vacuum heat insulating materials 7 and 750 are measured again.

Figure 29:
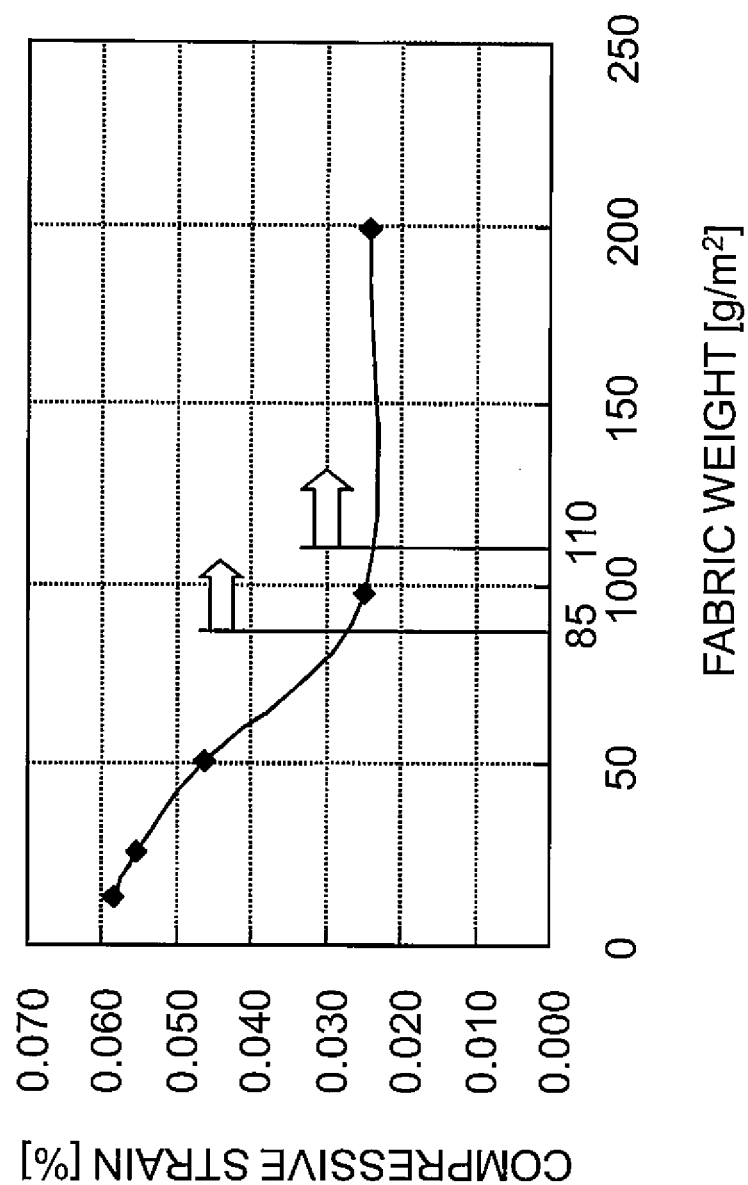
FIG. 29 shows the first embodiment and is a correlation diagram showing relation between fabric weight of the vacuum heat insulating material 7 or a vacuum heat insulating material 750 and compression strain when heat welding is applied to the fiber assembly 1, a continuous sheeted fiber assembly 1J, the first (organic) fiber assembly 1K, or the second (organic) fiber assembly 1H, which forms the core material 5 or 550.

FIG. 29 shows the first embodiment and is an correlation diagram showing the fabric weight of the vacuum heat insulating materials 7 and 750 and compressive strain when heat welding is applied on the fiber assembly 1, the continuous sheeted fiber assembly 1J, the first (organic) fiber assembly 1K and the second (organic) fiber assembly 1H forming the core materials 5 and 550. The compressive strain σ can be obtained, for example, as in the following:

$$\text{Compressive strain } \sigma = (t_B - t_A)/t_A$$

where $t_A$: the thickness of the vacuum heat insulating material 7 before heated $t_B$: the thickness of the vacuum heat insulating material 7 after heated at 60 degrees Celsius for 11 hours From FIG. 29, as for the compressive strain [%], from about 13 [g/m²] to 85 [g/m²] of the fabric weight, according to the increase of the fabric weight, the compressive strain is suddenly reduced. Further, as the fabric weight increases from about 85 [g/m²] of the fabric weight, the reduction of the compressive strain becomes slow. When the fabric weight is at least 110 [g/m²], it is understood that the compressive strain stays almost fixed, and is not changed so much. Namely, when the fabric weight is about 85 [g/m²], the reducing rate of the compressive strain is changed; that is, there exists a turning point.

It is considered that since if the fabric weight is small, the lamination becomes the one of thin sheets, the smaller the fabric weight is, the softer the lamination becomes; that is, the stiffness against the compression becomes small, the stiffness is unlikely to be maintained, the sheet becomes easily deformed, and thus the strain becomes large.

On the contrary, when the fabric weight exceeds about 85 [g/m²] (or about 110 [g/m²]), the thickness of one sheet becomes somewhat large, the stiffness against the compression can be obtained, and thus the sheet becomes hard to be deformed or strained.

Since FIG. 29 shows the case wherein heat welding (the embossing 110) is applied on the core materials 5 and 550, when comparing with a case wherein heat welding is not applied, it is confirmed that the compressive strain is about 10 to 30% smaller in the case wherein heat welding is applied than in the case wherein heat welding is not applied. This is considered because by applying the embossing 110, stiffness against the compression is improved, and the sheet becomes hard to be deformed. In this case, the stiffness of the sheet against compression or torsion can be increased and the compressive strain can be reduced more in the case wherein the heat welded portion (the embossing 110) penetrates through the sheet surface in the thickness direction than in the case wherein the heat welded portion only exists on the surface.

However, heat welding may increase a contact area between the organic fibers 2, lead to increase in heat transfer, generate heat transfer from the welded portion, and thus lead to decrease in the heat insulating performance. Thus, the contact area between the organic fibers 2 should be preferably as small as possible. Therefore, by suppressing the contact area between the organic fibers 2 no more than 20% (preferably no more than 15%, more preferably no more than 8%) of the total area (sheet area), the vacuum heat insulating materials 7 and 750 whose compressive strain is small and heat insulating performance is high can be obtained. Since it is confirmed that when the area of the heat welding exceeds 20% of the total area (sheet area), the heat conductivity is increased, and the heat insulating performance worsens, the area that the heat welding occupies in the total area (sheet area) should preferably be no more than 20%.

That is, by applying heat welding on the fiber assembly 1 (e.g., the organic fiber assembly), the continuous sheet-shaped fiber assembly 1J, the first (organic) fiber assembly 1K and the second (organic) fiber assembly 1H used for the core materials 5 and 550 of the vacuum heat insulating materials 7 and 750, the organic fibers 2 are not disjointed as a fiber assembly, and further by making the area that the heat welding occupies in the total area (sheet area) no more than 20% (it is necessary for the area for applying the heat welding to be no less than 3% of the total area (sheet area) so that the fiber assembly 1 is not disjointed), it is possible to obtain the vacuum heat insulating material 7 which is hard to be deformed due to small compressive strain, whose heat conductivity is small, and whereby heat insulating performance can be improved. In addition, by making the fabric weight no less than about 85 [g/m$^2$] (or about 110 [g/m$^2$]), the compressive strain can be reduced.

Therefore, if the fabric weight of the non-woven cloth which is the fiber assembly 1 is made at least 85 g/m$^2$ and no more than 198 g/m$^2$, since the thickness of one sheet becomes thick and the sheet becomes hard to be strained, the stiffness against the compression can be obtained, and thus the deformation becomes hard to occur at the time of vacuuming. Accordingly, the shape failure due to the deformation would not occur and the vacuum heat insulating material 7 with high reliability can be obtained.

Figure 30:
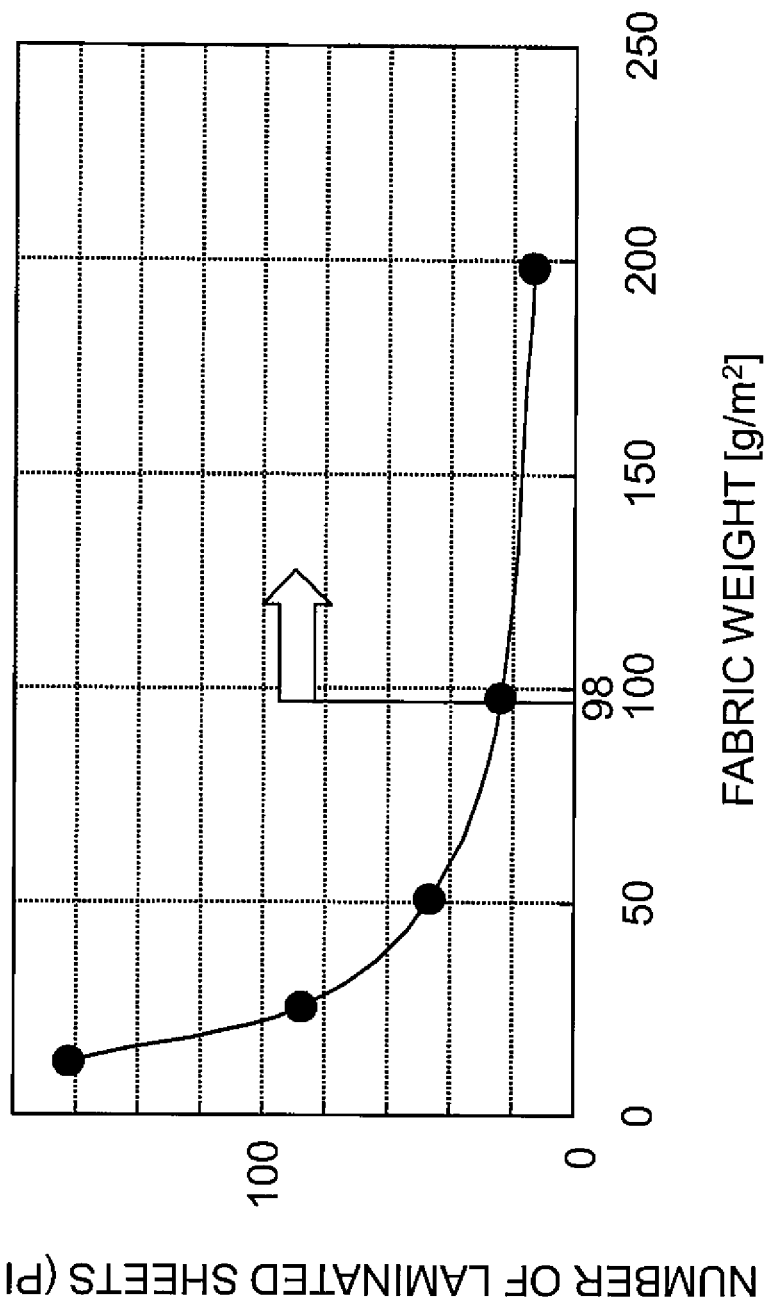
FIG. 30 shows the first embodiment and is a diagrammatic view showing a relation between fabric weight and the number of laminated sheets (the number of laminated sheets when the thickness of vacuum heat insulating material is a predetermined thickness, for example, the thickness after vacuuming is a predetermined thickness) of the vacuum heat insulating material 7.

FIG. 30 shows the first embodiment and a diagrammatic view showing a relation between the fabric weight of the vacuum heat insulating material 7 and the number of laminated sheets (the number of laminated sheets when the thickness of the vacuum heat insulating material 7 is a predetermined thickness, for example, the thickness after vacuuming is a predetermined thickness). The higher the fabric weight is, the less the number of laminated sheets becomes. Namely, when the fabric weight is high, the number of the laminated sheets is small, and the productivity is good; that is, the fabric weight is preferably at least 98 [g/m$^2$] which is a point in FIG. 30 from which a slope of the line becomes small (gradual).

Here, although the upper limit value of the fabric weight is not specifically described, the fabric weight is desirable to be the one which makes the number of laminated sheets one. The less the number of laminated sheets is, the laminating step can be saved during the production; that is, the productivity becomes good, and thus when the fabric weight is increased as much as possible and the number of laminated sheets is reduced, the productivity is improved.

From the above, from the viewpoint of productivity, it is understood that the fabric weight is desired to be at least 98 [g/m$^2$]. On the other hand, from the viewpoint of improvement of the heat insulating performance, the fabric weight is desired to be at least 4.7 [g/m$^2$] and no more than 70 [g/m$^2$], or the fabric weight is at least 140 [g/m$^2$] and no more than the fabric weight which makes the number of laminated sheets one. Further, from the viewpoint of the creeping characteristics with consideration of the compressive strain, the fabric weight is desired to be at least 85 [g/m$^2$], preferably at least 110 [g/m$^2$] and no more than the fabric weight which makes the number of laminated sheets one.

Further, by using the long fiber, if the fabric weight is made at least 98 [g/m$^2$] and no more than 198 [g/m$^2$], while the heat insulating performance is maintained, the compressive strain can be suppressed to be small, and thus it is possible to obtain the vacuum heat insulating materials 7 and 750 with less deformation and high reliability.

Further, by mixing and laminating the first core material having a high fabric weight and the second core material having a low fabric weight (e.g., by combining alternatively the first core material and the second core material), compared with the case of laminating the sheets having the same thickness, if the thickness after lamination is the same, the strain can be reduced in the core materials 5 and 550 totally, and further, the thickness can be reduced rather than the case of laminating the same number of sheets having the high fabric weight. Therefore, it is possible to obtain the highly reliable vacuum heat insulating materials 7 and 750 of which the heat insulating performance is good, the laminated thickness is thin, and the deformation due to the strain is small.

Further, the necessary heat insulating performance can be secured more compared with the case of laminating the same number of sheets having a low fabric weight, and a predetermined stiffness can be obtained as well, and thus it is possible to obtain the highly reliable vacuum heat insulating materials 7 and 750 whereof the heat insulating performance is good with less deformation and high performance. Here, the combination example of the first core material and the second core material has been explained; the similar effect can be obtained by combining and laminating plural sheet-shaped core materials 5 and 550 having different fabric weights.

For example, as shown in FIGS. 13 through 16, a sheet with a high fabric weight (e.g., the fabric weight within a range of small compressive strain is at least 110 [g/m$^2$] and no more than 198 [g/m$^2$]) and small compressive strain is used for the first fiber assembly 1K, and a sheet with a low fabric weight (e.g., the heat insulating performance ratio is at least 4.7 [g/m$^2$] and no more than 70 [g/m$^2$]) and a little bit large compressive strain is used for the second fiber assembly 1H, and they are laminated alternatively to form one sheet of the core material 550. In this way, the compressive strain can be suppressed by the first (organic) fiber assembly 1K with the high fabric weight, and the thickness of the core material 550 can be reduced totally by the second (organic) fiber assembly 1H of which the fabric weight is low and the heat insulating performance is good, and further the core material 550 comes to be easily folded. Therefore, the thickness of the vacuum heat insulating materials 7 and 750 which are formed by mixing and laminating plural types of sheets each having different thickness is made the same as the thickness of the vacuum heat insulating materials 7 and 750 which are formed by laminating sheets each having the same thickness, and thereby since the second fiber assembly 1H with good heat insulating performance is laminated, the heat insulating performance of the core materials 5 and 550 is improved, the stiffness becomes small, and thus folding process, etc. can be easily done. Further, since the organic fiber assembly 1K with small compressive strain is laminated, the compressive strain is small, the stiffness is high, and thus the vacuum heat insulating materials 7 and 750 with good usability and good heat insulating performance can be obtained.

Further, it is possible to obtain the similar effect by alternately arranging a plurality of the first (organic) fiber assemblies 1Ka through 1Kd that are arranged adjacently in sequence in the width direction, with different fiber weights, compressive strengths, tension strengths, etc. in the first (organic) fiber assembly 1K, and by alternately arranging a plurality of the second (organic) fiber assemblies 1Ha through 1Hd that are arranged adjacently in sequence in the width direction, with different fiber weights, compressive strengths, tension strengths, etc. in the second (organic) fiber assembly 1H. Further, the arranging manner of a plurality of the first (organic) fiber assemblies 1Ka through 1Kd in the first (organic) fiber assembly 1K in the width direction, and a plurality of the second (organic) fiber assemblies 1Ha through 1Hd in the second (organic) fiber assembly 1H in the width direction may be different, or may be the same.

Here, for the core materials 5 and 550 of the vacuum heat insulating materials 7 and 750, if the fiber assembly 1 is manufactured by continuous long fibers to which the heat welding by the embossing 110 is not applied and is continuous equal to or exceeding the length of the sheet, the heat insulating performance becomes better. Obviously, it is needless to say, also in the case where the heat welding by the embossing 110 is applied, the heat insulating performance becomes good when the fiber assembly 1 is manufactured by the long fibers being continuous equal to or exceeding the length of the sheet.

(Heat Insulating Performance 9)
(A Through Hole and a Notch)

Figure 31:
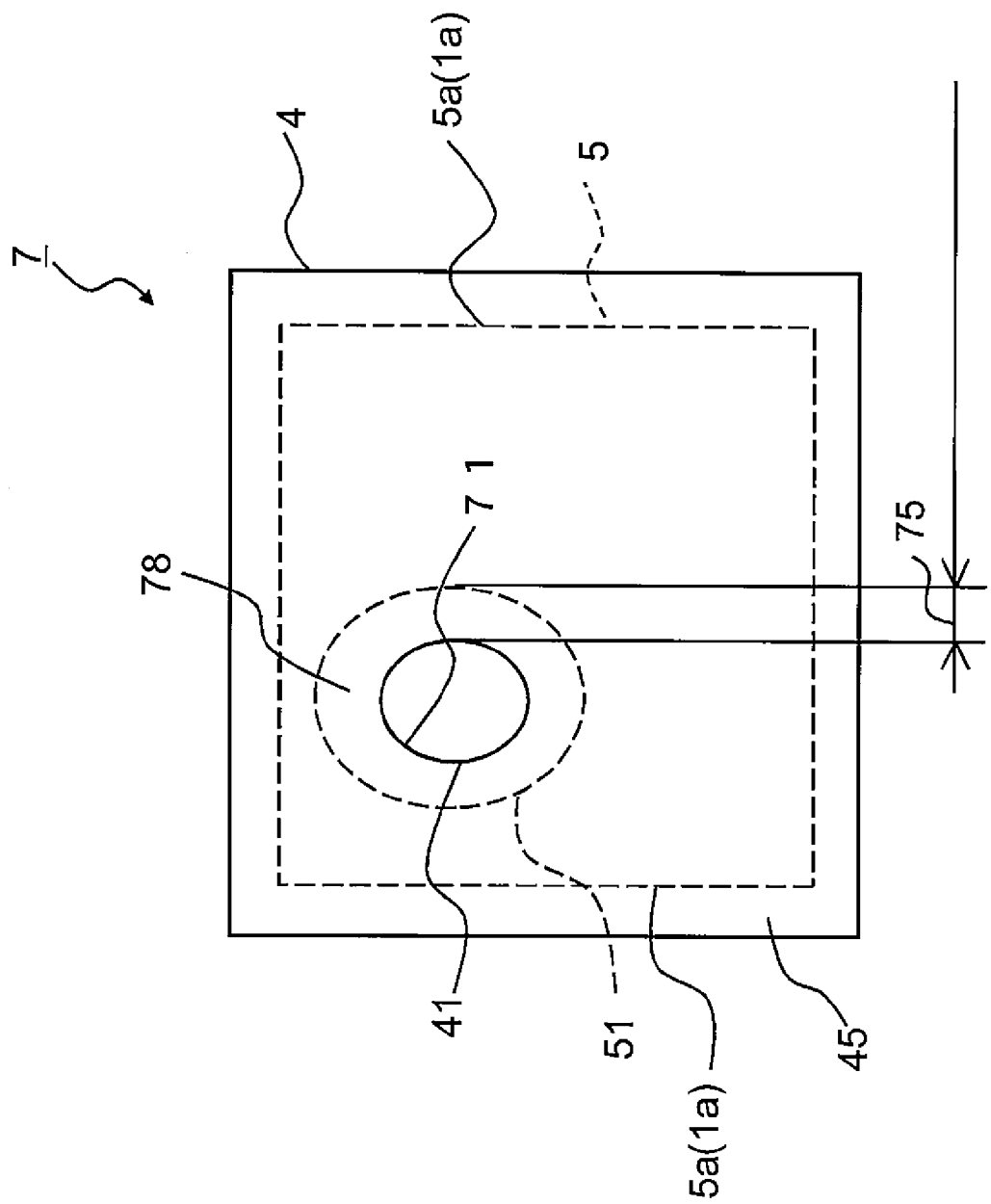
FIG. 31 shows the first embodiment and is a frontal view of the vacuum heat insulating material 7 or 750 having an opening portion.
Figure 32:
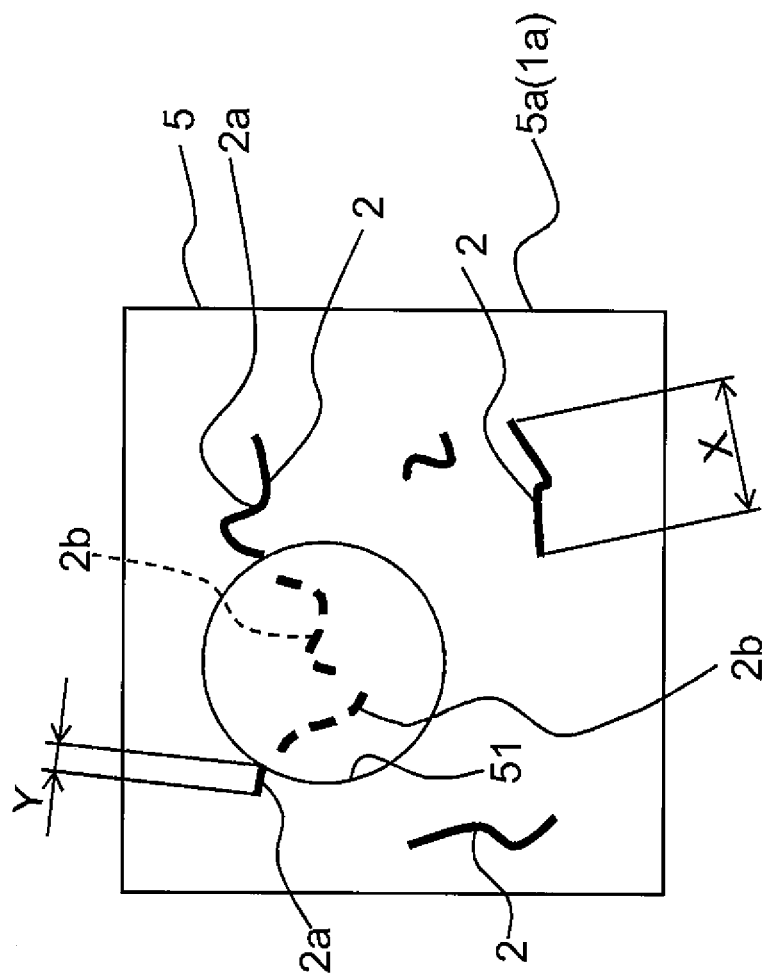
FIG. 32 shows the first embodiment and shows appearance of the opening portion of the core material 5 or 550 of the vacuum heat insulating material 7 or 750 when short fiber is used for the core material 5 or 550.
Figure 33:
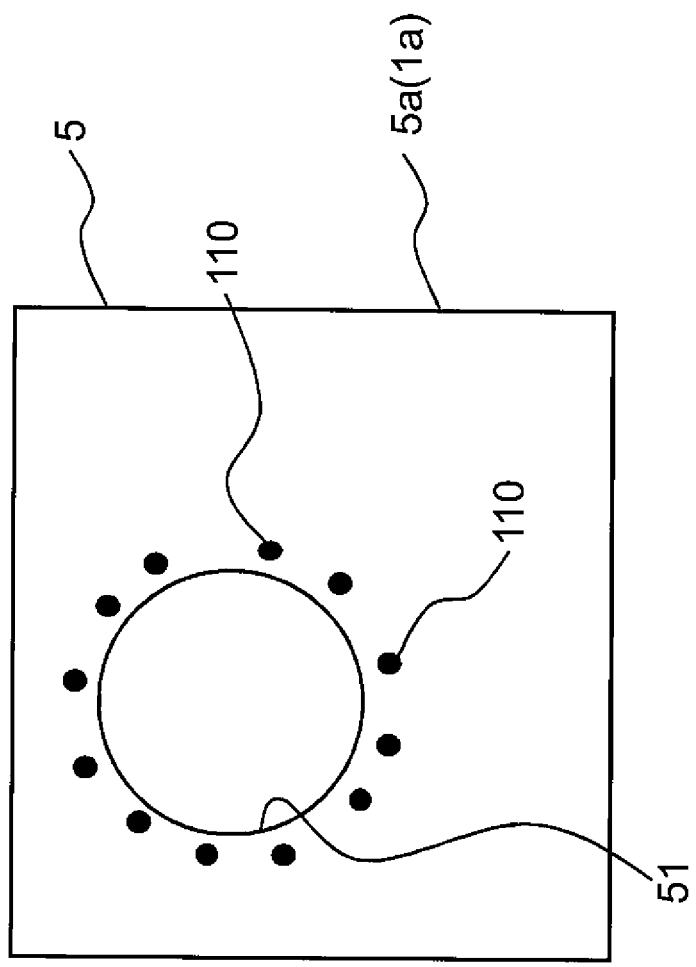
FIG. 33 shows the first embodiment and is a drawing showing an example in which a heat welded portion by an embossing 110, etc. around an outer circumference of the opening portion of the core material 5 or 550 of the vacuum heat insulating material 7 or 750.

In the present embodiment, the vacuum heat insulating material 7 is provided with a penetrating opening portion 70 such as a through hole and a notch, etc. FIGS. 31 through 33 show the first embodiment. FIG. 31 is a frontal view of the vacuum heat insulating materials 7 and 750 having the opening portion. FIG. 32 shows an appearance of the opening portion of the core materials 5 and 550 of the vacuum heat insulating materials 7 and 750 when conventional short fiber is used for the core materials 5 and 550. FIG. 33 is a drawing showing an example in which a heat welded portion such as the embossing 110, etc. is provided around an outer circumference of the opening portion of the core materials 5 and 550 of the vacuum heat insulating materials 7 and 750.

In FIGS. 31 through 33, at the core materials 5 and 550 of which the end face 5a (1a) is cut to a predetermined size (e.g., A4 size), a core material opening portion 51, which has a predetermined size being smaller than the size of the core materials 5 and 550 and equal to or larger than a necessary size, and penetrates the core materials 5 and 550 such as a through hole or a notch, is provided previously.

Here, as shown in FIG. 31, since the core material 5 or 550, or the organic fiber 2, etc. which has been discussed above in the present embodiment is used for the core material 5 or 550 or the organic fiber 2, etc. used in this case, the heat insulating performance is excellent.

The core material 5 or 550 is inserted to the outer cover material 4, dried, and vacuumed, and then a sealing portion 45 of an insertion hole of the outer cover material 4 is sealed by heat welding, etc. After that, vacuuming is done, the inside portion (a vacuum heat insulating material opening portion sealing area 78) of a core material opening portion 51 such as the through hole or the notch, etc. is heat-welded and sealed, and an outer cover material opening portion 41 which is a through hole is formed by cutting the outer cover material 4 to have an almost similar shape to the core material opening portion 51, and to be smaller than the core material opening portion 51 by an amount of a vacuum heat insulating material opening portion sealing area 75, which is a predetermined necessary sealing length. By this operation, a vacuum heat insulating material opening portion 71 such as the through hole or the notch, etc. is finally formed on the vacuum heat insulating material 7 or 750.

Here, on the outer cover material 4, the outer cover material opening portion 41, which is smaller than the size of the core material opening portion 51 by the amount of the vacuum heat insulating material opening portion sealing area 75 at the almost same position as the core material opening portion 51 of the core material 5 or 550 when the core material 5 or 550 is inserted, is provided, the core material 5 or 550 is inserted into the outer cover material 4, and a vacuum heat insulating material opening portion sealing portion 78 (with the length of the vacuum heat insulating material opening portion sealing area 75) between the outer cover material 4 and the core material 5 or 550 is heat-welded, dried, and vacuumed, and then the sealing portion 45 (the inserting portion) of the inserting hole of the outer cover material 4 can be sealed.

Here, as shown in FIG. 32, if a short fiber (e.g., fibers of which fiber length is about 5 to 150 mm) being shorter than the length or the width of the sheet of the predetermined size is used for the organic fiber 2 which is conventionally used for the core material 5 or 550, when the core material opening portion 51 such as the through hole or the notch, etc. is provided at the core material 5 or 550, when the core material opening portion 51 such as the through hole or the notch, etc. is removed from the fiber assembly 1 (sheet) by cutting (cut away), the organic fibers 2 bridging (bridging a cut portion to be removed and a remaining portion of the sheet not to be removed) the core material opening portion 51 is split into a remaining organic fiber 2a and a cutoff organic fiber 2b by cutting, the remaining organic fiber 2a remains on the sheet and the cutoff organic fiber 2b is removed from the sheet.

Since the remaining organic fiber 2a which remains at the sheet side other than the cutoff organic fiber 2b (a portion other than the portion to be removed) is cut (cut off), the length of the remaining organic fiber 2a becomes Y which is shorter than an initial fiber length X (e.g., a short fiber, about 5 to 150 mm).

In particular, if the initial fiber length X is short, the fiber length Y of the remaining organic fiber 2a remained at the sheet portion may be extremely short. In this case, the remaining organic fiber 2a cannot be tangled with the existing fibers of the sheet portion since the fiber length Y of the remaining fiber 2a is short, but the remaining organic fiber 2a may be ragged and protruded around the inner side of the core material opening portion 51 such as the through hole, the notch, etc. If this happens, when the vacuum heat insulating material opening portion sealing area 75 of the outer cover material 4 around the core material opening portion 51 is sealed by heat welding, etc., the remaining organic fiber 2a which has been ragged and protruded is intruded to the vacuum heat insulating material opening portion sealing area 75, which may generate sealing failure, and the heat insulating performance possibly may be extremely degraded.

For example, it is assumed that if the short fiber having the initial fiber length X of 55 mm is used, and the through hole which is the core material opening portion 51 has the diameter of about 50 mm, 50 mm out of the initial fiber length X of 55 mm is cut and removed by the through hole. In this case, the fiber length Y (the length) of the remaining organic fiber 2a remaining at the fiber assembly 1 (sheet) which is the core material 5 other than the through hole is about 5 mm. The fiber having the length of 5 mm cannot be tangled with the existing fiber in the sheet, and the remaining fiber may be ragged and protruded around the through hole which is the core material opening portion 51. When the outer cover material 4 around the through hole 51 is sealed by heat welding, etc., the fibers ragged and protruded to the through hole portion which is the core material opening portion 51 may be protruded and intrude in the vacuum heat insulating material opening portion sealing area 75, the sealing failure may occur, and thus the heat insulating performance is extremely degraded. Further, at the vacuuming step, the remaining organic fiber 2a (the remaining organic fiber 2a of which the fiber length becomes Y), of which the fiber length is made short by cutting, is made to easily protrude by the vacuuming, and it is possibly sucked by a vacuum pump, which may cause the failure of the vacuum pump.

However, in the present embodiment, since the long fiber of the continuous organic fiber 2 is used for the fiber assembly 1 (non-woven cloth sheet), the initial fiber length X is more than the length of the non-woven cloth sheet (e.g., the long side or the short side of the A4 size) in a status in which the core material 5 or 550 is cut (cutoff) into a predetermined size (e.g., A4 size). Accordingly, if the core material opening portion 51 such as the through hole or the notch, etc., the size of which is no more than the width (e.g., the length of the short side) of the fiber assembly 1, is cut, since the fiber length is long (continuous), if the organic fiber assembly is cut (cutoff) at the core material opening portion 51, the fiber length Y of the remaining organic fiber 2a remaining at the sheet side other than the cutoff organic fiber 2b of the portion to be removed by the cutoff can be secured long, and thus the remaining organic fiber 2a is tangled with the existing fiber in the fiber assembly 1 and does not protrude from the core material opening portion 51.

Namely, when the long fiber (e.g., a continuous fiber or a fiber having the length approximately the same or longer than the length of the sheet) is used, even if the core material opening portion 51 such as the through hole or the notch, etc. is provided by cutting, the fiber length Y of the remaining organic fiber 2a of the cutting portion of the core material opening portion 51 such as the through hole or the notch, etc. can be secured long. Therefore, fiber waste of the remaining organic fiber 2a remained on the sheet by cutting does not protrude around the inside of the cutting portion of the core material opening portion 51 such as the through hole or the notch, etc., the sealing failure does not occur, and thus it is possible to obtain the vacuum heat insulating materials 7 and 750 of which the heat insulating performance is not degraded even with the passage of time, the heat insulating box and the appliances, etc. using the vacuum heat insulating materials 7 and 750.

Further, in the present embodiment, the long fibers, of which the initial fiber length X is at least the same length (or the width) of the fiber assembly 1 (the non-woven cloth sheet), are used, hence if the vacuum heat insulating material opening portion 71 such as the through hole or the notch, etc. is provided at the vacuum heat insulating material 7, the sealing failure, etc. does not occur, and it is possible to obtain the vacuum heat insulating materials 7 and 750 of which the heat insulating performance is less likely to degrade.

Here, the fiber length being at least the same length as the length (or the width) of the fiber assembly 1 (the non-woven cloth sheet) is used. However, as for the fiber length of the long fiber, when the vacuum heat insulating material opening portion 71 such as the through hole or the notch, etc. is provided at the vacuum heat insulating materials 7 and 750, the fiber length Y of the remaining organic fiber 2a should be sufficiently long so that the remaining fiber is less likely to protrude to the inside (the outside), etc. of the core material opening portion 51 such as the through hole or the notch, etc. due to ravel, etc. When the fiber length is sufficiently longer than the core material opening portion 51 such as the through hole or the notch, etc. (the longer the fiber length is than the size of the diameter of the through hole or the size of the notch, the better; for example, the long fiber of which the fiber length Y of the remaining organic fiber 2a is at least about 10 mm (preferably at least 15 mm) longer than the diameter of the through hole or the size of the notch which is the core material opening portion 51), if the core material opening portion 51 such as the through hole or the notch, etc. is provided, and the sheet is removed at the core material opening portion 51, the length Y of the remaining organic fiber 2a of the remaining portion of the core material 5 other than the core material opening portion 51 is at least 10 mm (preferably, at least 15 mm), possibility of being ragged and protruded to around the through hole is decreased, the sealing property is less likely to degrade, and the degradation of the heat insulating performance due to the sealing failure can be suppressed.

In the present embodiment, the case in which the core material opening portion 51 of the vacuum heat insulating material 7 is cut (cutoff) has been explained. However, the application of the embodiment is not limited to the core material opening portion 51. If applied to the end face of the sheet of the core material 5 of the portion to be sealed (e.g., at least one end face of the fiber assembly 1 of which the end face 5a (or the end face 1a) is cut to be the predetermined size), etc., the sealing failure does not occur, and it is needless to say, the degradation of the heat insulating performance can be suppressed.

For example, when the core material 5 of which the end face is cut to be a predetermined size (e.g., A4 size) is inserted into the outer cover material 4, and the insertion opening 4a of the outer cover material is sealed, the embodiment can be applied to the end faces 5a and 1a (cutoff faces) of the core material 5 and the fiber assembly 1 (the non-woven cloth sheet) corresponding to the insertion opening 4a of the outer cover material 4. The insertion opening 4a to which the core material 5 of the outer cover material 4 is inserted is also sealed at the sealing portion 45 by the heat welding, etc. after the core material 5 is inserted. Accordingly, like the present embodiment, since the long fiber (e.g., the fiber of which the initial fiber length is at least the same length or width of the fiber assembly 1 (the non-woven cloth sheet) of which the end face 5a (or the end face 1a, or the core material opening portion 51) is cut, preferably the fiber of which the fiber length Y of the remaining organic fiber 2a remained on the sheet after the end face 5a (or the end face 1a, or the core material opening portion 51) is cut is at least 10 mm (preferably at least 15 mm, more preferably at least 20 mm) is used, if the core materials 5 and 550 are cut to produce the core material 5 or the fiber assembly 1 with the predetermined length, the fiber length Y of the remaining organic fiber 2a can secure the predetermined length (e.g., the fiber length of the remaining organic fiber 2a remained after cutting is at least 10 mm (preferably at least 15 mm, more preferably at least 20 mm)). Therefore, the remaining organic fiber 2a does not protrude from the cutoff face of the core material 5 or the fiber assembly 1, the sealing failure does not occur, and it is possible to obtain the highly reliable vacuum heat insulating materials 7 and 750 of which heat insulating performance is hardly degraded for a long term.

Here, the fiber length of the long organic fiber should preferably be, for example, the initial fiber of which the fiber length Y of the remaining organic fiber 2a remained on the sheet after cutting (cutoff) the sheet is at least 10 mm (preferably at least 15 mm, more preferably at least 20 mm). Preferably, it is desired that the long fiber should be at least the same length (or the width) of the non-woven cloth sheet, and more preferably, the long fiber should be continuous from one end to the other end of the length (or the width) of the sheet.

Therefore, since the long fiber of which the end face is cut and is continuous in the length direction or the width direction of the fiber assembly 1 having the predetermined size and width is used for the organic fiber 2, the length of the remaining organic fiber 2a which is generated on the cutting portion (e.g., the end faces 5a and 1a of the sheet end face of the core material 5 and the fiber assembly 1, the core material opening portion 51 of the hole formation, or the core material opening portion 51 of the notch formation, etc.) of the fiber assembly 1 (the non-woven cloth sheet) by cutting can be secured long, hence it is possible to suppress protrusion of the remaining organic fiber 2a generated on the end faces 5a and 1a and the core material opening portion 51 in a case wherein the short fiber is used for the core material 5 like in the conventional case by cutting. It becomes unnecessary to increase the length of sealing of the sealing portion 45 or the vacuum heat insulating material opening portion sealing area 78 with consideration of protrusion of the remaining organic fiber 2a like in the conventional case using the short fiber. Accordingly, the sealing length of the sealing portion 45 and the vacuum heat insulating material opening portion sealing area 78 of the outer cover material 4 can be shortened, and thus it is possible to obtain the compact low-cost vacuum heat insulating material 7. Further, if the size of the outer cover material 4 is the same, compared with the conventional case using the short fiber, the size of the core material 5 (the length or the width of the sheet) can be increased by an amount of the length of protrusion of the remaining organic fiber 2a (e.g., about 1 mm to 10 mm), the heat insulated area can be increased, and thus the heat insulating performance is improved.

The core materials 5 and 550 should be cut after laminating the fiber assembly 1 and the continuous sheet-shaped fiber assembly 1J since the edge lines in the end faces in the length direction or the width direction are aligned and degradation of the heat insulating performance is small, and further in a case as well in which the core materials 5 and 550 are inserted in the outer cover material 4, the core materials 5 and 550 can be easily inserted because the end faces are slightly depressed by cutting and the organic fibers 2 are tangled, attached with each other, and are less likely to disjoint.

Further, as shown in FIG. 33, if continuously to or with a predetermined interval with the periphery of a portion of the core material 5 or 550 which is not to be cut by the core material opening portion 51 such as the through hole or the notch, etc. which is to be cut (e.g., the outer circumference of the core material opening portion 51, if the portion to be cut is the core material opening portion 51, and the inside portion of the core material opening portion 51 is to be removed by cutoff), the heat welded portion such as the embossing 110, etc. is provided, it is possible to suppress the protrusion of the remaining organic fiber 2a. Further, when the portion to be cut is the end face of the fiber assembly 1, if the heat welded portion such as the embossing 110, etc. is provided continuously to or with a predetermined interval with neighborhood of the cutoff face of the end face of the remaining sheet portion (the portion which forms the fiber assembly 1) which is not the portion to be cut but is remained without being cut, the fibers of neighborhood of the cutoff portion are attached with each other due to the heat welding such as the embossing 110, etc. and the organic fibers 2 become hard to be ragged and thus it is possible to suppress the protrusion of the remaining organic fiber 2a. Like this, by providing the embossing 110, etc., it is possible to further reduce the sealing failure, and suppressing effect of the heat insulating performance is further improved. Here, the heat welded portion such as the embossing 110, etc. can be provided at only neighborhood of the cutoff portion; however, it is not necessary to have the heat welded portion concentratedly provided at neighborhood of the cutoff portion, but the effect can be obtained if plural heat welded portions are provided over the sheet-shaped fiber assembly 1 as a whole with a predetermined interval. Further, when the heat welded portion such as the embossing 110, etc. is provided so as to penetrate the thickness of the fiber assembly 1, the effect is large, and when the size of the heat welded portion is large, the effect is large. However, without penetrating, the length of the heat welded portion in the thickness direction can be set appropriately as well as the size of the heat welded portion within a range not to generate the sealing failure based on experiments, etc.

Here, in the present embodiment, it has been explained that using the long fiber having the continuous fiber length being equal to or longer than the shortest length of the sheet (the fiber assembly 1) such as in the length direction or the width direction of the sheet, etc. improves the heat insulating performance compared with the case of using the short fiber being shorter than the shortest length of the sheet such as in the length direction or the width direction, etc. of the sheet, and it is preferable to use the continuous long fiber. It is considered that the fiber may tear halfway during the manufacturing process of the fiber assembly 1, and that fibers which are not continuous longer than or equal to the shortest length of the sheet such as in the length direction or the width direction of the sheet may also be mixed. In the present embodiment, if the continuous fibers being equal to or longer than the length of the sheet shorter in the length direction and the width direction of the sheet are included with at least 60% of the whole fibers forming the sheet, the heat insulating performance can be improved (since it is confirmed that the incidence ratio of sealing failure is better than in a case of using the short fiber when the continuous fibers equal to or longer than the shortest length of the sheet in the length direction or the width direction, etc. account for at least 55% of the whole fibers forming the sheet, in the present embodiment, the ratio of the continuous fiber is set to be no less than 60% in consideration of variation). Therefore, in the present embodiment, the fiber assembly 1 formed by the long fibers, which are the continuous long fibers being equal to or longer than the shortest length of the sheet in the length direction or the width direction of the sheet, accounting for at least 60% (preferably at least 70%) of the sheet, is used.

(Heat Insulating Box)

Next, one embodiment example will be explained, in which the vacuum heat insulating material 7 of the present invention is applied to a refrigerator.

Figure 36:
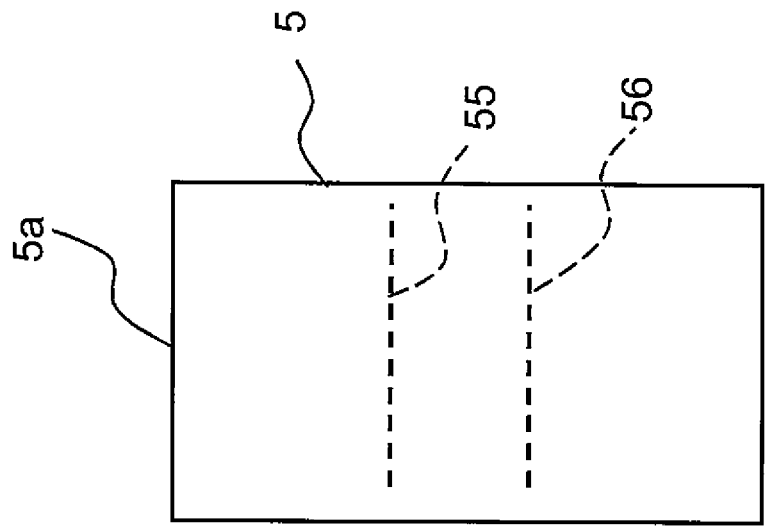
FIG. 36 shows the first embodiment and is a pattern diagram showing the core material 5 of the vacuum heat insulating material 7 used for a heat insulating partition of the refrigerator 100 shown in FIG. 23.

FIG. 36 shows the first embodiment for explaining a heat insulating box and is a sectional side view of frontal view showing an example applied to a refrigerator like a pattern diagram. Since the vacuum heat insulating material 7 or 750, the core material 5 or 550, or the fiber assembly 1, etc. which has been explained in the present embodiment is used for the vacuum heat insulating material 7 or 750, the core material 5 or 550, or the fiber assembly 1, etc. in this example, the heat insulating performance is excellent.

Figure 34:
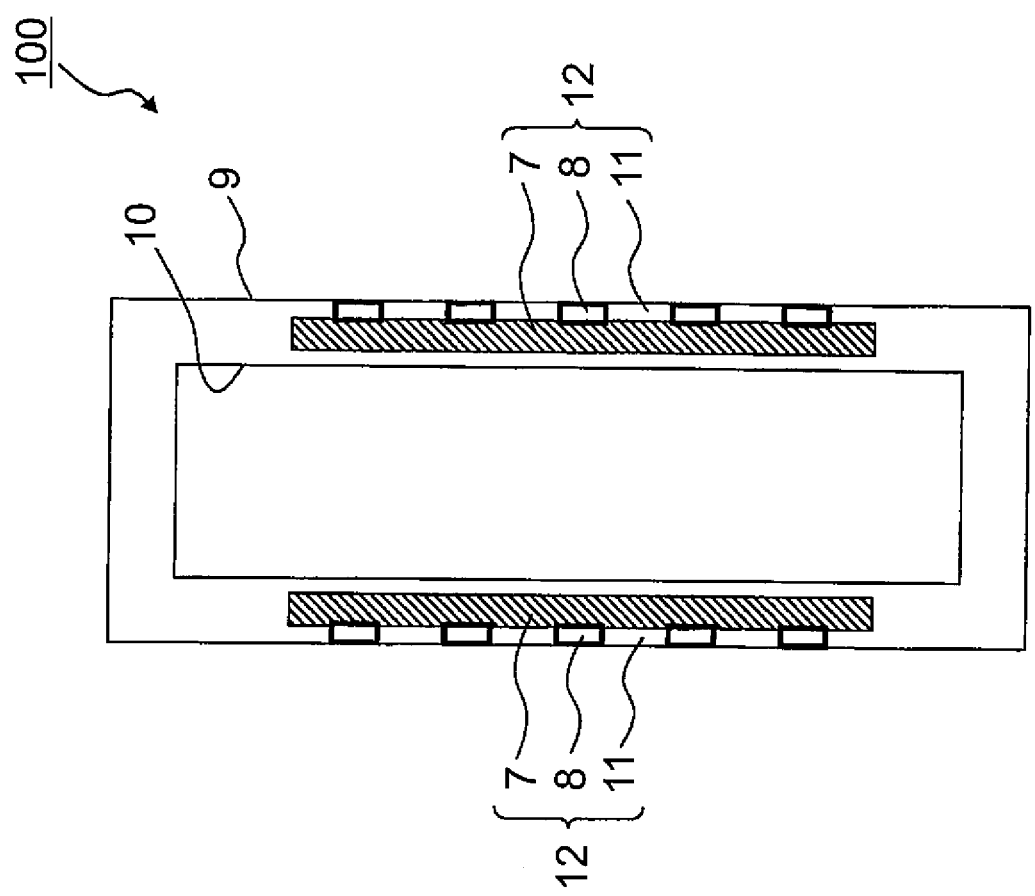
FIG. 34 shows the first embodiment and is a sectional side view of frontal view for explaining a heat insulating box and showing by pattern an application example to a refrigerator 100.

In FIG. 34, a refrigerator 100 includes an external box 9, an internal box 10 arranged inside of the external box 9, the vacuum heat insulating material 7 or 750 and a foam insulation 11, such as polyurethane foam, etc. arranged in a space between the external box 9 and the internal box 10, and a refrigeration unit (not illustrated) having a compressor, etc. for supplying cold energy to the inside of the internal box 10. Here, a heat insulating box body formed by the external box 9 and the internal box 10 is provided with an opening portion at the front face, and an opening/closing door is arranged at the opening portion (none of them illustrated).

Here, if the outer cover material 4 including aluminum foil is used for the outer cover material 4 of the vacuum heat insulating material 7 or 750, since the aluminum foil is included, heat may be transferred through the aluminum foil to generate a heat bridge which circulates heat, and the heat insulating performance may be degraded. Therefore, in order to suppress the effect of the heat bridge, the vacuum heat insulating material 7 is arranged separately from a coated steel plate of the external box 9 using a spacer 8 which is a resin molded product. Here, the spacer 8 is provided with a suitable hole for not preventing the flow, so that a void may not be generated in polyurethane form which will be injected into the heat insulating wall at a later step.

Namely, the refrigerator 100 includes a heat insulating wall 12 formed by the vacuum heat insulating material 7 or 750, the spacer 8, and the foam insulation 11. Here, a range at which the heat insulating wall 12 including the vacuum heat insulating material 7 is provided is not limited; it can be all or a part of the space formed between the external box 9 and the internal box 10, or the heat insulating wall 12 can be arranged inside of the opening/closing door.

After using, the refrigerator 100 is demolished/recycled at a recycle center at each location according to Electric Appliance Recycling Law. At this time, by using the vacuum heat insulating material 7 formed by the core material 5 which is the fiber assembly 1 (formed by the organic fibers 2) for the refrigerator 100 of the present embodiment, at the time of thermal recycle, the refrigerator 100 does not lower the combustion efficiency nor stay as a residue, that is, the recyclability is good, hence it is possible to carry out crushing process without removing the vacuum heat insulating material 7.

Further, in the refrigerator 100, of which the heat insulating box is provided with the vacuum heat insulating material 7, if the vacuum heat insulating material 7 is a vacuum heat insulating panel of which the core material 5 is inorganic powder, since the powder may fly dispersedly, the heat insulating box cannot be crushed as it is. Accordingly, it is necessary to remove the vacuum heat insulating material 7 from the refrigerator box body with a lot of time and effort.

Further, if the core material 5 or 550 is a vacuum heat insulating panel which is glass fiber, the heat insulating box can be crushed as it is; however, the crushed glass fiber may be mixed with ground product of polyurethane foam and supplied to thermal recycle. At this time, there is a problem in the recyclability that such vacuum heat insulating panel may lower the combustion efficiency or remain as a residue after combustion.

If the organic fibers 2 are used for the core material 5 or 550, and no inorganic fiber such as the glass fiber, etc. is included in the core material 5 or 550, even if it is crushed, powder such as glass powder, etc. is not generated. Therefore, a harmful effect on a human body due to the glass powder, etc. can be suppressed, and further, it is unnecessary to remove the vacuum heat insulating material 7 from the refrigerator box body with a lot of time and effort. Therefore, it is possible to largely reduce the time for demolishing, the recyclability is good, and the recycling efficiency is extremely improved.

In the above discussion, the refrigerator 100 is shown as an example of the heat insulating box; however, the present embodiment is not limited to this. Various effects which have been discussed above can be obtained when applied to cooling devices or heating devices such as a warmer box, a vehicle air-conditioner, a water heater, a hot-water tank, etc. In addition, the box body having a predetermined shape can be replaced with a heat insulating bag (a heat insulating container) having flexible external and internal bags.

(Refrigerator)

Figure 35:
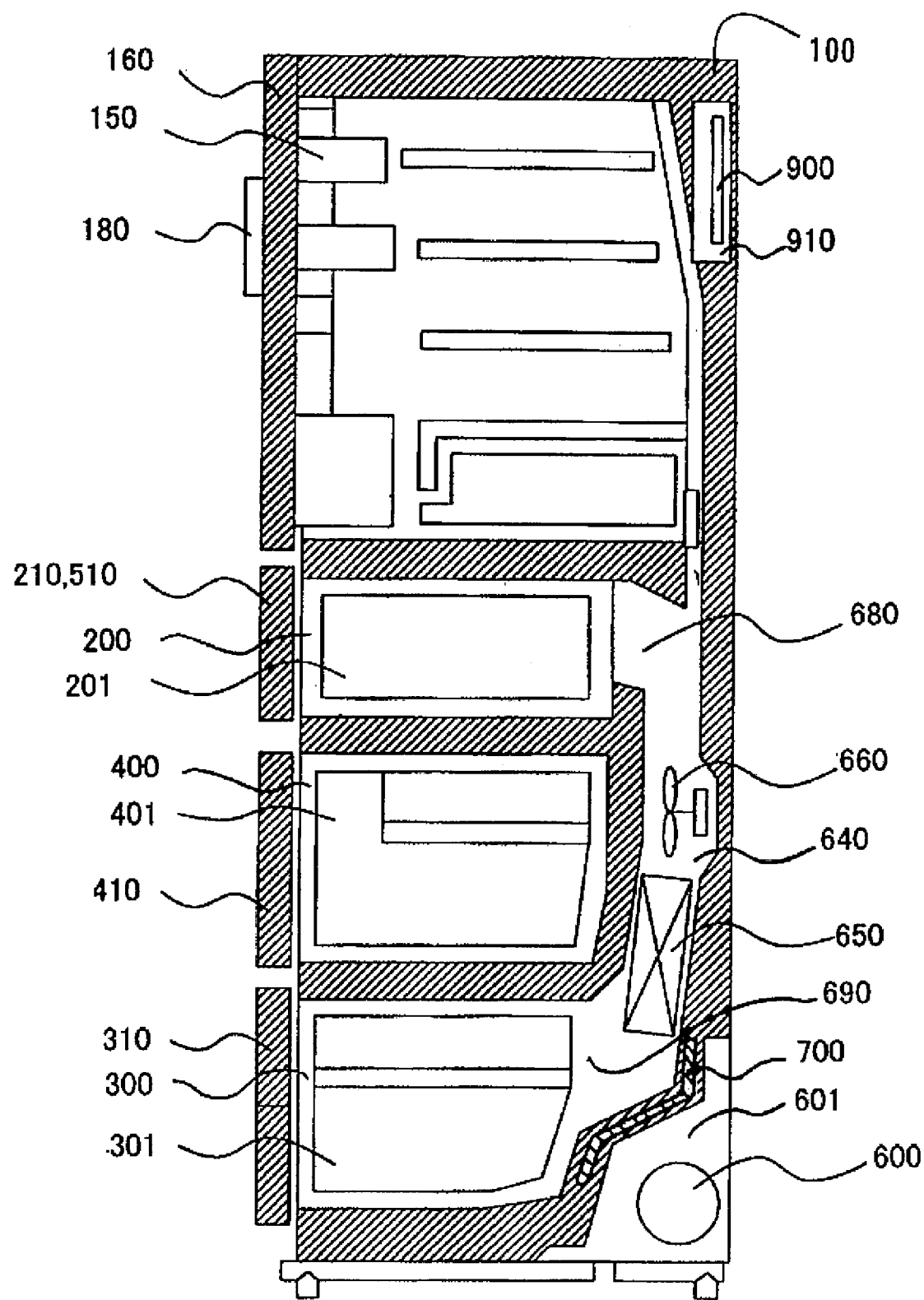
FIG. 35 shows the first embodiment and is a cross sectional view of the refrigerator 100.
Figure 37:
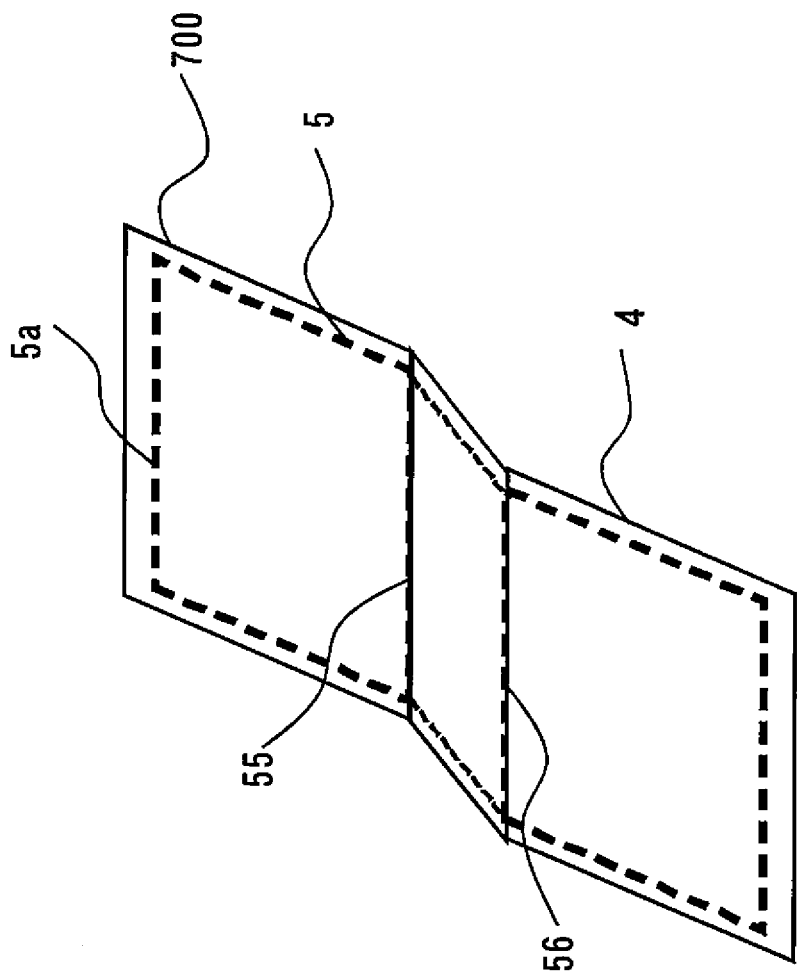
FIG. 37 shows the first embodiment and is a pattern diagram showing the vacuum heat insulating material 7 used for the heat insulating partition of the refrigerator 100.

FIGS. 35 to 37 show the first embodiment; FIG. 35 is a cross sectional view of the refrigerator 100, FIG. 36 shows a pattern diagram showing the core material 5 or 550 of the vacuum heat insulating material 7, 700 or 750 used for a heat insulating partition of the refrigerator 100 shown in FIG. 35, and FIG. 37 is a pattern diagram drawing showing the vacuum heat insulating material 7 used for the heat insulating partition of the refrigerator 100.

Since the vacuum heat insulating material 7, 700 or 750, the core material 5, and the fiber assembly 1, etc. which have been discussed in the above embodiment are used for the vacuum heat insulating material 7, 700 or 750, the core material 5, the fiber assembly 1, etc. used here, the heat insulating performance is excellent.

In the diagrams, a food storage room of the refrigerator 100 includes a refrigerating room 150 arranged at the topmost part and provided with a refrigerating room door 160 which is an opening/closing door, a switching room 200 which is able to switch the temperature band from the one for frozen storage (−18 degrees Celsius), for cool storage, for vegetables, for chilled storage, for softly freezing (−7 degrees Celsius), etc. arranged below the refrigerating room 150 and provided with a switching room door 210 which is a drawer type door; an ice making room 500 arranged in parallel with the switching room 200 and provided with an ice making room door 510 which is a drawer type door; a freezing room 300 arranged at the lowermost part and provided with a freezing room door 310 which is a drawer type door; and 400 provided with a vegetable room door 410 which is a drawer type door between the freezing room 300 and the switching room 200 and the ice making room 500, and so on. On the front side surface of the refrigerating room door 160 of the refrigerator 100 is provided with an operation panel 180 consisting of an operation switch for adjusting a temperature or a setting of each room and a liquid crystal for displaying the temperature of each room at the time, and so on.

At a lower part of the rear surface side of the refrigerator 100, a machine room 601 provided with a compressor 600 which forms a refrigerating cycle, a cooler 650, and a cooler room 640, in which a fan 660 for blowing cooling air cooled by the cooler 650 to the refrigerating room 150 or the switching room 200, and so on are arranged.

A cooling air passage 680 for introducing the cooling air cooled by the cooler 650 to the refrigerating room 150 from the cooler room 640 and an air passage 690 for introducing the cooling air cooled by the cooler 650 to the freezing room 300, and so on are provided.

Further, at the top part of the refrigerator 100, on the rear surface of the heat insulating wall arranged at the rear surface of the refrigerating room 150, a control board 900 is contained in a control board containing room 910. The control board 900 is provided with control lead wires, power source wires, etc. connected to the compressor 600 and a damper, etc. which opens/closes the cooling air passages for controlling temperatures in the storage rooms such as the refrigerating room 150 or the freezing room 300, etc. by opening/closing control of the compressor 600 and the cooling air passages.

Here, the switching room 200 is provided with a containing case 201, the freezing room 300 with a containing case 301, and the vegetable room 400 with a containing case 401, respectively, and it is possible to store foods in these cases.

Here, the vacuum heat insulating material 700 is provided at the heat insulating wall between the machine room 601 located at the lower part of the refrigerator 100 and the cooler room 640. The vacuum heat insulating material 700 can be provided as a single unit or can be also embedded or arranged in the foam insulation 11.

Namely, the refrigerator 100 of the present embodiment includes a plurality of storage rooms including the refrigerating room 150 provided with the opening/closing refrigerating room door 160, and the switching room 200, the freezing room 300, the vegetable room 400 and the ice making room 500, respectively provided with the switching room door 210, the freezing room door 310, the vegetable room door 410, and the ice making room door 510 which are drawer type doors, and so on; the cooler 650 arranged at the rear surface side of the storage rooms through the partition wall for generating cooling air to the storage rooms; the internal fan 660 for blowing the cooling air generated by the cooler 650 and the cooler 650 to each storage room; the cooler room 640 arranged at the rear surface side of the storage rooms through the partition wall for containing the cooler and the internal fan; the machine room 601 arranged at the lower part or the upper part of the main body of the refrigerator 100 for containing the compressor 600 which forms the refrigerating cycle; the first heat insulating wall arranged between the machine room 601 and the cooler room 640; the second heat insulating wall arranged between the machine room and the storage rooms; and the vacuum heat insulating material 7 or 700 which is provided at any of the doors of the storage rooms, the first heat insulating wall, and the second heat insulating wall, structured by the lamination structure of the fiber assembly 1 made by the sheet-shaped organic fibers 2, and formed by inserting the core material 5 or 550 having a cutting portion, of which the end face has been cut, into the outer cover material 4, and sealing the sealing portion of the outer cover material around the sheet so as to hermetically seal the inside in an almost vacuum state. In the above, the long fiber having at least the same length as the fiber assembly 1 is used for the organic fibers 2.

The vacuum heat insulating material 700 provided at the heat insulating wall between the machine room 601 and the cooler room 640 has a Z-shaped complex structure, in which the vacuum heat insulating material 700 is folded at two points as shown in FIG. 37. The vacuum heat insulating material 700 is inserted to the outer cover material 4 in a state of a sheet having a predetermined size, in which the core material 5 formed by laminating the fiber assembly 1 made of long fibers and the end face of which is cut. After drying and vacuuming, the vacuum heat insulating material 700 is completed by sealing the inserted portion in the outer cover material 4 with heat welding, etc.

In the present embodiment, the fiber assembly 1 is used for the core material 5, and folding-processed portions 55 and 56 (e.g., a hole formation or a groove formation, etc. by melting) such as forming a plurality of small shallow holes or continuous grooves which do not penetrate but can obtain the heat insulating performance by a laser processing, etc. on at least one surface of the side desired to fold. Therefore, after completing, the vacuum heat insulating material 700 can be easily bent by the folding-processed portions 55 and 56 of the core material 5 at a necessary predetermined angle.

At this time, the size, the groove width, and the depth, etc. of the folding-processed portions 55 and 56 are decided appropriately by an experiment, etc. based on the angle to be bent and the amount to be bent, etc.

Further, providing the folding-processed portions 55 and 56 on both surfaces of the bent portion within a range not to penetrate the bent portion makes folding easy, hence it becomes possible to fold at a large angle. In addition, since the folding-processed portions 55 and 56 do not penetrate the core material 5, the heat insulating performance can be maintained. Further, since the long fiber which is longer than the length of the sheet (the length of the long side or the short side of the sheet) having the predetermined size is used for the core material 5, the heat insulating performance is good. Further, since the organic fiber is used for the core material 5, compared with the case of using the glass fiber for the core material, it causes no harmful effect on a human body, and the recyclability is also good.

By using a laser processing, the hole formation can be easily done even if the hole has a complex shape, and the increase in the temperature can be suppressed at the time of melting. Therefore, it is possible to do the hole formation or the continuous groove formation with a necessary size, width, and depth at an only necessary portion. If the laser processing is applied to the embossing process, it becomes unnecessary to prepare a heat roller separately, that is, the equipment investment can be reduced, and the vacuum heat insulating material 7 or 700 and the refrigerator 100 can be obtained at low cost.

Here, instead of the laser processing as described with reference to FIGS. 13 through 19, by manufacturing the core material 5 or 550 by laminating plural pieces of (e.g., two pieces of) the fiber assembly 1 and the continuous sheet-shaped fiber assembly 1J for plural times in a state of being displaced by the predetermined length (lapping amount Xb) in the width direction, the number of the slits can be generated as many as the number of the laminated pieces of the fiber assemblies 1 and 1J (plural numbers, when three pieces are laminated and displaced, the number of the slits is three). Thus, even when the thickness of the vacuum heat insulating material is large, it becomes possible to easily bend the vacuum heat insulating material to the both sides of the sheet surface at the bent portion 59 (the first slit portion 57 and the second slit portion 58). Further, since concave trapezoidal shapes are formed at the parts of the first slit portion 57 and the second slit portion 58, and are formed on the both sides in the thickness direction of the vacuum heat insulating material 750, even when the thickness is large, it becomes possible to easily bend the vacuum heat insulating material at the parts of the first slit portion 57 and the second slit portion 58 formed on the both sides of the sheet surface, hence the outer cover material 4 is prevented from being torn or damaged. Furthermore, it is possible to easily produce in a complex shape such as the shape of "Z," "U," "C," or "W," etc.

Here, as described with reference to FIGS. 42 through 45, also in a case of using the core material 560 having the concave portions 760x instead of the core material 550 having the bent portion 59 (the first slit portion 57 and the second slit portion 58), since the concave portions 760x are provided on the both sides of the sheet surface, even when the thickness of the vacuum heat insulating material is large, it is possible to bend the vacuum heat insulating material easily to the both sides of the sheet surface. Further, since the cross sectional shapes of the concave portions 760x are concave trapezoidal shapes, and the concave portions 760x can be formed on the both sides in the width direction of the vacuum heat insulating material 760, even when the thickness is large, for example, the vacuum heat insulating material can be easily bent at the parts of the concave portions 760x formed on the both sides of the sheet surface. Thus, the outer cover material 4 is prevented from being torn or damaged. Furthermore, it is possible to easily produce in a complex shape such as the shape of "Z," "C," or "W," etc.

Therefore, it is possible to bend the vacuum heat insulating material 750 or 760 of the present embodiment at the connecting part (slit portion) between the adjacent fiber assemblies of the first (organic) fiber assembly 1K or the second (organic) fiber assembly 1H at a predetermined angle (e.g., approximately 90 degrees), and arrange the vacuum heat insulating material 750 or 760 on at least two continuous wall surfaces of a heat insulating box body having a top surface, both side surfaces, a rear surface and a bottom surface in a refrigerator, for example. Specifically, in a case of the refrigerator, when the predetermined angle is approximately 90 degrees, and the vacuum heat insulating material 750 or 760 is bent in an "L" shape, the vacuum heat insulating material 750 or 760 can be applied to two continuous wall surfaces of (1) a side wall and a rear surface wall, (2) a top surface wall and rear surface wall, (3) a top surface wall and a side wall, (4) a bottom surface wall and the side wall, (5) a bottom surface wall and the rear surface wall, etc. Further, when the vacuum heat insulating wall 750 or 760 is bent at two parts and made into a "U" shape, the vacuum heat insulating wall 750 or 760 can be applied to three continuous wall surfaces of (1) the rear surface wall and the both side walls, (2) the top surface wall and the both side walls, (3) the bottom surface wall and the both side walls, (4) the top surface wall, the rear surface wall and the bottom surface wall, etc.

Figure 38:
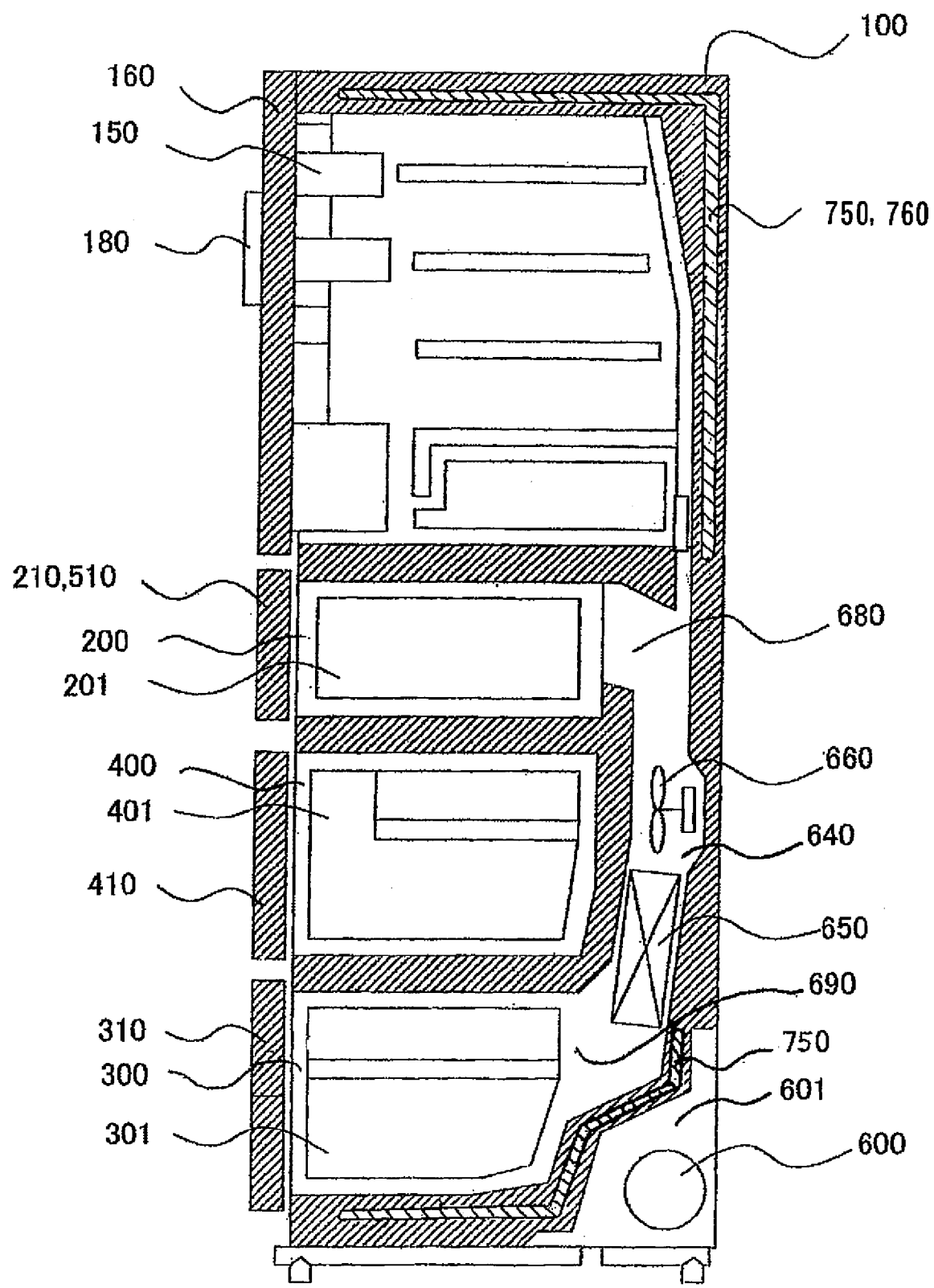
FIG. 38 shows the first embodiment and is another cross sectional view of the refrigerator 100.

FIG. 38 shows the first embodiment and is another cross sectional view of the refrigerator 100. In FIG. 38, the equivalent parts of FIG. 35 are assigned the same numbers, for which the explanation is omitted. In the diagram, the vacuum heat insulating material 700, 750 or 760 is bent in an "L" shape by the concave portions 760x formed by the folding-processed portions 55 and 56, which are formed by the laser processing, etc., the bent portion 59, which is formed by the first slit portion 57 and the second slit portion 58, etc., the predetermined clearance XK between the first (organic) fiber assembly 1K and each fiber assembly (the first (organic) fiber assemblies 1Ka, 1Kb, 1Kc, 1Kd and 1Ke), arranged across the top surface wall and the rear surface wall of the refrigerator 100, and further bent in a "W" shape, and arranged across the rear surface wall and the bottom surface wall of the refrigerator 100. As shown, by using the vacuum heat insulating material 7, 700, 750 or 760 described in the present embodiment by bending, etc., it is possible to easily apply the vacuum heat insulating material 7, 700, 750 or 760 also on a wall surface having a complex shape, such as the machine room 601 for housing the compressor 600 of the refrigerator. It goes without saying that the vacuum heat insulating material 7, 700, 750 or 760 can be easily applied also for insulating surrounding of a cylindrical container, such as a compressor, a hot water storage tank, etc., or for insulating a chassis (container) of an outdoor unit of an air conditioner or a heat source appliance of a water heater, other than the refrigerator.

In the present embodiment, the application example to the refrigerator has been explained; however, the present embodiment can be applied to appliances other than the refrigerator such as a water heater, a freezer, or an air-conditioner, etc. Further, in the present embodiment, the vacuum heat insulating material 700 having the "Z" shaped complex structure with two bent portions has been explained; however, the present embodiment can be easily applied to the vacuum heat insulating material having an "L" shaped structure with one bent portion, a "U" shaped structure with two bent portions, a "C" shaped, "J" shaped, or "W" shaped structure with plural bent portions. Therefore, the vacuum heat insulating material of the present embodiment is applicable to a complex shaped portion (portions of shapes of "Z," "U," "C," "J," or "W," etc., portions having a projection, or portions provided with a piping, etc.), to which it has been difficult to mount the vacuum heat insulating material since the folding process or the hole formation are difficult; that is, the vacuum heat insulating material of the present embodiment can be mounted to all kinds of appliances. The appliances such as a refrigerator mounting the vacuum heat insulating material of the present embodiment has a good recyclability, causes no harmful effect on a human body, and it is expected that the heat insulating performance is improved.

Here, the heat insulating wall between the machine room 601 and the cooler room 640 is sometimes penetrated by a piping for connecting the compressor 600 and the cooler 650. In this case, the vacuum heat insulating material 7, 700, 750 or 760 can be provided with a through hole 72 (a vacuum heat insulating material opening portion 71) as shown in FIG. 39.

Figure 39:
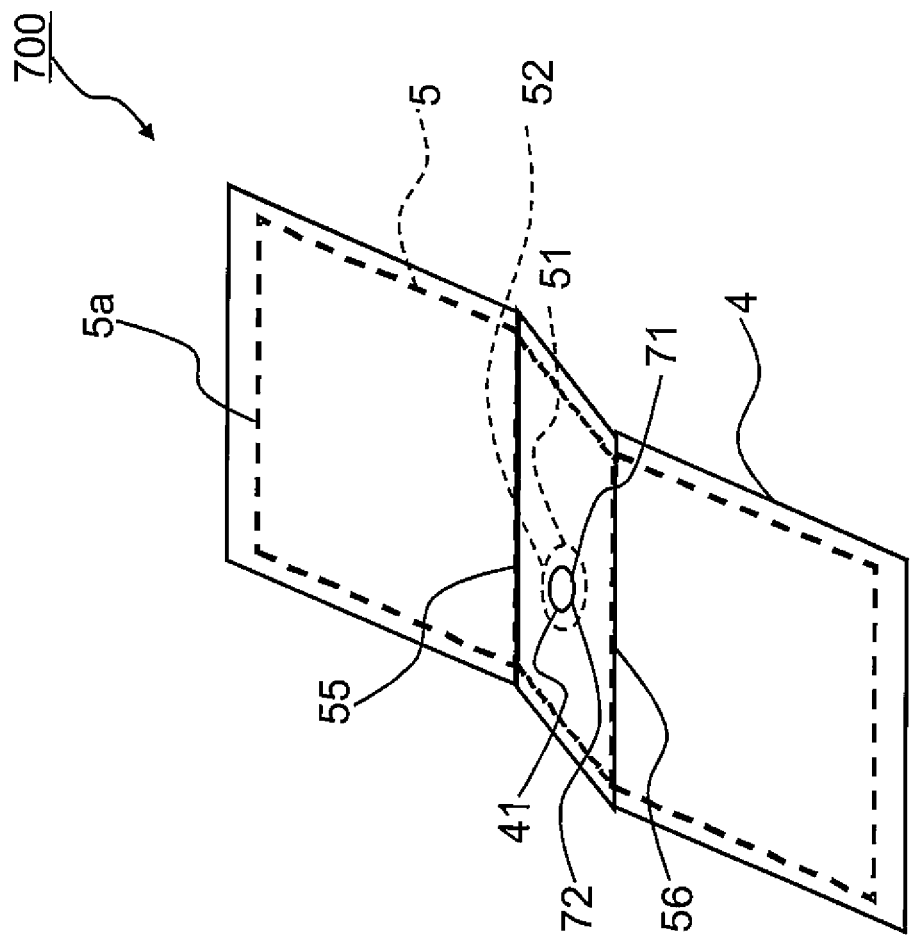
FIG. 39 shows the first embodiment and is a pattern diagram showing the vacuum heat insulating material 7 used for the heat insulating partition of the refrigerator 100.

FIG. 39 shows the first embodiment and is a pattern diagram showing the vacuum heat insulating material 700 used for the heat insulating partition of the refrigerator 100. In this case, the core material 5 is provided with the core material opening portion 51, the outer cover material 4 is provided with the outer cover material opening portion 41 which is smaller than the core material opening portion 51 by an amount of a sealing portion being necessary for sealing, and thereby the vacuum heat insulating material 700 having the vacuum heat insulating material opening portion 71 can be obtained. At this time, the through hole 72 which is the vacuum heat insulating material opening portion 71 of the vacuum heat insulating material 700 is sufficient to be a through hole having a hole diameter being larger than a diameter of a piping such as a suction pipe or a discharge pipe, etc. or lead wires for control or for power source, etc. which are desired to penetrate the heat insulating wall, or the through hole 72 can be a shape of notch.

Further, the example case shows that the vacuum heat insulating material 700 of the present embodiment is provided with the through hole 72 which is the vacuum heat insulating material opening portion 71 at a different location from the folding-processed portions 55 and 56; however, the through hole 72 can be provided so as to penetrate the folding-processed portions 55 and 56 by a piping, etc. At this time, by providing the core material through hole 52 which is the core material opening portion 51 at the portion of the folding-processed portions 55 and 56 of the core material 5, the vacuum heat insulating material 7 having the through hole can be obtained easily.

Namely, the refrigerator 100 of the present embodiment includes a plurality of storage rooms (the refrigerating room 150, the switching room 200, the freezing room 300, the vegetable room 400, and the ice making room 500) including the refrigerating room 150 and the freezing room 300, etc. provided with the opening/closing or drawer type doors (the refrigerating room door 160, the switching room door 210, the freezing room door 310, the vegetable room door 410, and the ice making room door 510); the cooler 650 arranged at the rear surface side of the storage rooms through the partition wall for generating cooling air to the storage rooms; the internal fan 660 for blowing the cooling air generated by the cooler 650 and the cooler 650 to each storage room; the cooler room 640 arranged at the rear surface side of the storage rooms through the partition wall for containing the cooler and the internal fan; the machine room 601 arranged at the lower part or the upper part of the main body of the refrigerator 100 for containing the compressor 600 which forms the refrigerating cycle; the heat insulating wall arranged between the machine room 601 and the cooler room 640; and the vacuum heat insulating material 7 or 700 which is provided at either of the doors of the storage rooms or the heat insulating wall, structured by the lamination structure of the fiber assembly 1 made by the sheet-shaped organic fibers 2, and formed by inserting the core material 5 having a cutting portion, of which the end face has been cut, into the outer cover material 4, and sealing the sealing portion of the outer cover material 4 around the sheet so as to hermetically seal the inside in an almost vacuum state. In the above, the long fiber having at least the same length as the sheet 1 is used for the organic fibers 2. Therefore, the heat insulating performance of the heat insulating material 7 or 700 is good, the recyclability is excellent, the sealing fault, etc. may not occur, and thus the reliability is high. Accordingly, appliances such as the refrigerator, etc. using this vacuum heat insulating material have also high performance for a long term and good recyclability.

Here, the example case shows that the vacuum heat insulating material 700 is provided at the heat insulating wall between the machine room 601 and the cooler room 640; however, the vacuum heat insulating material opening portion 71 can be applied to the cooling air passage. In this case, the vacuum heat insulating material 700 can be used for a section wall, a partition wall, or a heat insulating wall having the cooling air passage. Further, the vacuum heat insulating material can be provided at the heat insulating wall which forms the cooler room 640.

Further, the vacuum heat insulating material 700 can be provided in the heat insulating wall of the rear surface or the side surface of the refrigerator, a concave groove (a continuous concave groove having a width and a depth which is about the diameter of the piping such as the cooler pipe, etc.), to which a piping such as a cooler pipe can be contained, is formed by the heat welding, the laser processing, etc., the piping such as the cooler pipe, etc. is arranged within the concave groove, and the heat insulating of the cooler pipe, etc. can be performed.

In particular, when at least two vacuum heat insulating materials 700, to each of which a continuous concave groove having a width of about the diameter (can be no more than the diameter) of the cooler pipe and a depth of about a half of the diameter (can be no more than the diameter) of the cooler pipe, are used, and the piping such as the cooler pipe, etc. is fixed so as to be inserted between the two concave grooves of the vacuum heat insulating materials 7, it is possible to further improve the heat insulating performance of the piping such as the cooler pipe, etc. Accordingly, effect of temperature increase on the storage rooms due to the heat discharge or heat absorption of the piping such as the cooler pipe, etc. can be reduced and an energy-saving refrigerator 100 can be obtained.

When the refrigerator has a drain-pan function having a drain hole for receiving defrosted water fallen from the cooler 650 through the heat insulating wall, etc. between the machine room 601 and the cooler room 640, and discharging the defrosted water to the outside of the refrigerator 100 or the machine room 601, since the vacuum heat insulating material 701 of the present invention includes the vacuum heat insulating material opening portion 71, the vacuum heat insulating material 700 can be arranged so that the location of the vacuum heat insulating material opening portion 71 is almost matched with the one of the drain hole.

Here, in general, when resin foam is filled between the external box 9 and the internal box 10, a gas discharge hole is necessary for filling the resin foam. However, conventionally, when the vacuum heat insulating panel is arranged at the heat insulating wall between the external box and the internal box, the gas discharge hole of the external box should be arranged with avoiding the arranged area of the vacuum heat insulating panel, hence the resin foam cannot be filled sufficiently within the heat insulating box body, which may cause manufacturing failure. Here, it can be considered to form another gas discharge hole at the internal box; however, this is not sufficient. It can be also considered to adhere the vacuum heat insulating material to the internal box; however, it is difficult to adhere the vacuum heat insulating material to an inside surface having irregularities of the internal box. Therefore, because of necessity of securing the gas discharge hole between the vacuum heat insulating material 7, 700, 750 or 760 and the external box, it is also considered to form a spacer for making the vacuum heat insulating material float from the external box so as not to shut the gas discharge hole; however, in this case, the spacer is necessary, the cost should be increased, and further the assembling efficiency may be degraded.

On the other hand, according to the present invention, it is easy to form the vacuum heat insulating material opening portion 71 of the vacuum heat insulating material 7, 700, 750 or 760 such as a through hole or a notch, etc., and the vacuum heat insulating material opening portion 71 can be arranged at almost the same location as the gas discharge hole of the external box, hence the vacuum heat insulating material 7, 700, 750 or 760 can be adhered to the surface of the external box which is the gap between the external box and the internal box so as not to shut the gas discharge hole without providing the spacer, etc to the external box. Further, since the vacuum heat insulating material 7, 700, 750 or 760 of the present invention can be folded into a complex shape, it is possible to adhere the vacuum heat insulating material 7, 700, 750 or 760 easily to the inside surface having irregularities of the internal box which is the gap between the external box and the internal box. Therefore, the vacuum heat insulating material 7, 700, 750 or 760 of the present invention can be directly adhered without providing the spacer, etc. between the external box 9 and the vacuum heat insulating material 7, 700, 750 or 760, and between the internal box 10 and the vacuum heat insulating material 7, 700, 750 or 760, as well, hence it is possible to obtain the heat insulating box or the refrigerator having good heat insulating performance at low cost.

Here, the vacuum heat insulating material 7, 700, 750 or 760 of the present invention can be provided for the heat insulating material of the storage room door such as the refrigerating room door 160, the switching room door 210, the freezing room door 310, the vegetable room door 410, the ice making room door 510, etc. In this case, if the heat insulating material is penetrated by a screw, etc. for fixing a handling part such as a handle, etc. provided at the storage room door, the vacuum heat insulating material opening portion 71 of the vacuum heat insulating material 7, 700, 750 or 760 can be arranged at an almost same location as the location of the screw portion for fixing the handle. Further, since the heat insulating performance of the vacuum heat insulating material 7, 700, 750 or 760 of the present invention is good, it is possible to manufacture the vacuum heat insulating material 7, 700, 750 or 760 to be thin, hence the vacuum heat insulating material is applicable to the heat insulation of the top plate of the refrigerator 100.

Here, the vacuum heat insulating material opening portion 71 is formed by sealing the outer cover material 4 around the core material opening portion 51 with the sealing portion (the sealing area 75), and then cutting an unnecessary portion without the core material 5 inside of the sealing portion (the sealing area 75) of the outer cover material 4, and as a result, the through hole 72 is formed on the vacuum heat insulating material 7, 700, 750 or 760. At this time, in the vacuum heat insulating material 7, 700, 750 or 760, the unnecessary portion without the core material 5 inside of the sealing portion (the sealing area 75) of the outer cover material 4 can remain as it is without being cut so as to be the vacuum heat insulating material opening portion 71. In this case, the vacuum heat insulating material 7, 700, 750 or 760 does not have the through hole 72 in the vacuum heat insulating material opening portion 71; however, the unnecessary portion without the core material 5 inside of the sealing portion (the sealing area 75) of the outer cover material 4 corresponds to the vacuum heat insulating material opening portion 71.

Therefore, in a case of using the vacuum heat insulating material 7, 700, 750 or 760 including the core material opening portion 51 but without the vacuum heat insulating material opening portion 72, when it is used for an appliance such as the heat insulating box or the refrigerator, etc. as it is without forming the through hole 72, it becomes possible to do the hole formation or to do screwing after mounting the vacuum heat insulating material to the appliance such as the heat insulating box or the refrigerator, etc. at a range which does not cause effect on the sealing property of the sealing portion 75, hence the through hole formation of the outer cover material 4 becomes unnecessary, and thus the vacuum heat insulating material, or the appliance such as the heat insulating box, the refrigerator, etc. can be obtained at low cost.

Therefore, according to the present embodiment, in a case of using the vacuum heat insulating material 7, 700, 750 or 760 including the core material opening portion 51 in the core material but without having the vacuum heat insulating material opening portion 72 in the heat insulating material as heat insulating material of a wall of a house, for a through hole for a refrigerating piping or a drain piping of an air-conditioner, generally, in most cases a hole formation is done at the time of mounting the air-conditioner after completing the house so as to match the location where the air-conditioner is placed. In this case, the location where the air-conditioner is placed, take-out positions of the refrigerant piping or the drain piping can be estimated previously with some degree. Accordingly, the vacuum heat insulating material 7, 700, 750 or 760 having the core material opening portion 51 in the core material but without having the through hole 72 in the vacuum heat insulating material is placed adjacent to the estimated take-out position of the refrigerant piping or the drain piping, and thus take-off for the refrigerating piping and the drain piping can be carried out by the hole formation at the portion of the through hole 72 of the vacuum heat insulating material 7, 700, 750 or 760 after completing the house. In this way, even if the air-conditioner is not mounted at that place, since the outer cover material 4 is provided at the through hole 72, the inside and the outside of the house are not penetrated through, and the heat insulating performance, etc. would not be seriously degraded.

As for the vacuum heat insulating material 700 (or the vacuum heat insulating material 750 or 760) of the present embodiment, since the folding-processed portions 55 and 56 (or the bent portion 59 or the concave portion 760x) and the through hole 72 which is the vacuum heat insulating material opening portion 71 can be formed at the same time on one sheet of the vacuum heat insulating material, the vacuum heat insulating material 700 can be easily processed even when applied to a wall surface shape having a complex shape such as the heat insulating wall or the partition wall, etc. between the machine room 601 and the cooler room 640 of the refrigerator 100, and further, the vacuum heat insulating material 7 can be easily applied to the portion having the through hole portion such as the piping, the lead wires, or the drain hole, etc. provided to penetrate the heat insulating wall or a portion having a screw portion for fixing the handling portion, etc. In this case, by providing both of the folding-processed portions 55 and 56 (or the slit portion 57, 58, or 560X) and the core material opening portion 51 at the core material 5, it is possible to easily obtain the vacuum heat insulating material 7, which has the opening portion and for which folding process can be done easily. Therefore, it is possible to obtain energy-saving and low-cost refrigerator and appliances having good heat insulating efficiency, cooling efficiency, handleability, and processability.

Figure 40:
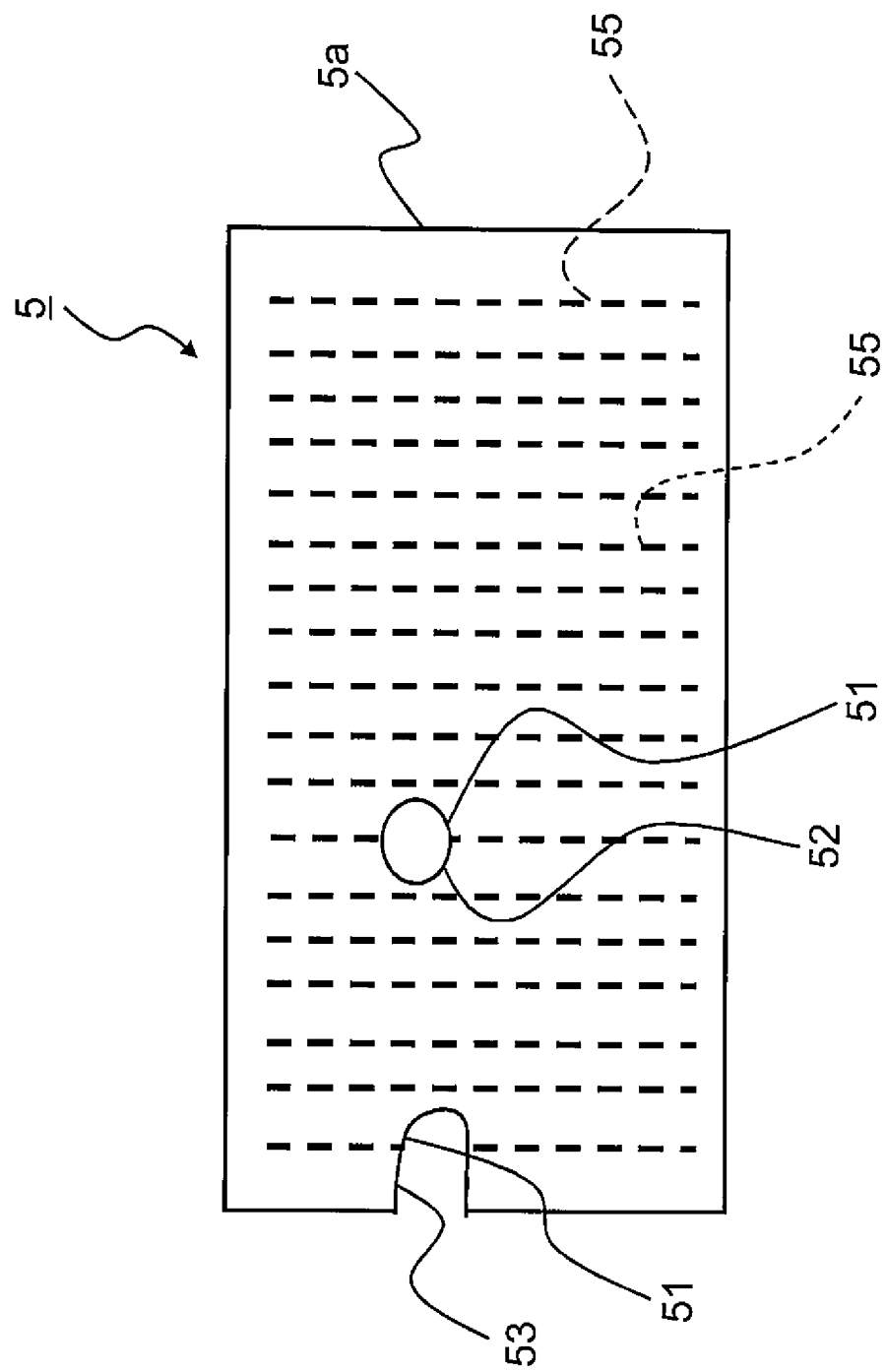
FIG. 40 shows the first embodiment and is a pattern diagram showing the core material 5 of a vacuum heat insulating material 701.
Figure 41:
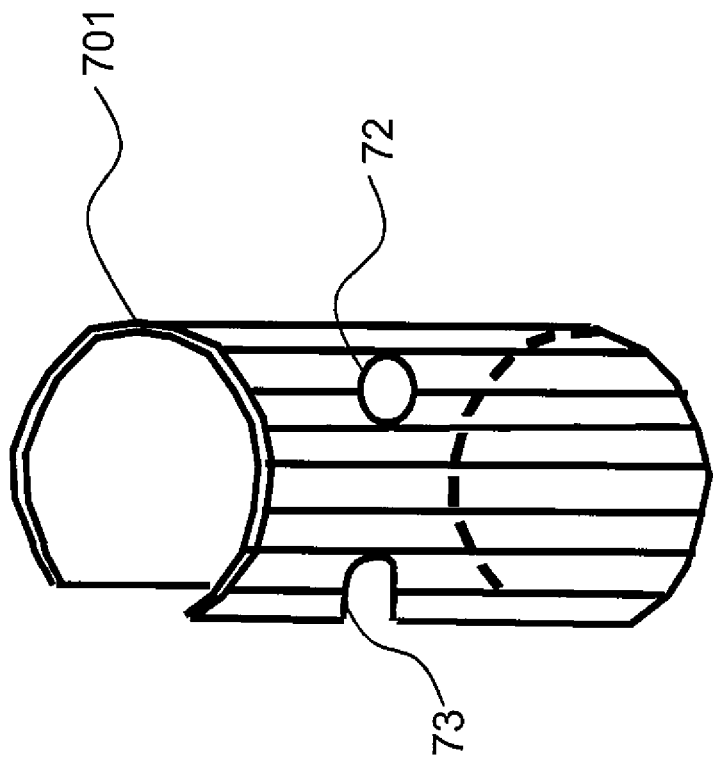
FIG. 41 shows the first embodiment and is a pattern diagram showing the vacuum heat insulating material 701 used for heat insulating of a compressor 600 or a hot water storage tank of a water heater.

FIGS. 40 and 41 show the first embodiment. FIG. 40 is a pattern diagram showing the core material 5 of a vacuum heat insulating material 701. FIG. 41 is a pattern diagram showing the vacuum heat insulating material 701 used for heat insulating of the compressor 600 or the hot water tank of the water heater, etc.

Since the vacuum heat insulating material 7, 700, 750 or 760, the core material 5, 550 or 560, and the fiber assembly 1, 1J or 1K, etc. which have been explained above in the present embodiment are used for the vacuum heat insulating material 701, the core material 5, and the fiber assembly 1, etc., the heat insulating performance is excellent.

In the diagrams, the core material 5 used for the vacuum heat insulating material 701 is structured by the laminated structure of the non-woven cloth sheets which are the fiber assembly 1. The core material 5 is provided with, by the heat roller or the laser processing, etc., a plurality of the folding-processed portions 55 (e.g., the hole formation or the groove formation by welding, etc.) by shallow and small hole formation (or the continuous groove formation), etc. within a range of not penetrating but possible to obtain the heat insulating performance with a predetermined interval or a necessary interval, whereto the heat welded portion such as the embossing 110 is provided. Accordingly the vacuum heat insulating material 701 can be folded easily at a predetermined angle after completion, at the folding-processed portions 55 of the core material 5, and thus it is possible to surely fold at the desired portion and suppress the undesired portion from being folded or deformed.

According to the present embodiment, the core material 5 is provided with a plurality of the folding-processed portions 55, to which a plurality of hole formations (or a continuous groove formation) with a thick interval (having a foldable interval and a depth) with some degree in the width direction are applied, in the length direction of the core material 5 with a predetermined interval or an interval with a necessary length. By folding at the folding-processed portion 55, the vacuum heat insulating material 701 having an almost cylinder shape can be obtained. The vacuum heat insulating material 701 is used for heat insulation of an almost cylindrical-shaped container such as heat insulation of an outer circumferential portion of a hermetic container of the compressor 600 of the refrigerator 100 or the refrigerating/air-conditioner, etc. or heat insulation of an outer circumferential portion of a hot water tank of the water heater, etc.

At this time, the size, the groove width, or the depth, etc. of the folding-processed portion 55 is determined appropriately by experiments based on a folding angle or a folding amount, etc. Further, if the folding-processed portion 55 is provided at a place to be folded on both sides of the core material 5 within a range of not penetrating, the vacuum heat insulating material 701 can be easily bent, and the folding process at a large angle can be done. In addition, since the folding-processed portion 55 does not penetrate the core material 5, the heat insulating performance can be maintained. If the laser processing is used, it is easy to do a curved face formation or a hole formation of a complex shape. Further, since the temperature increase at the time of melting can be controlled, the hole formation or the continuous groove formation of a necessary size, width, or depth can be done at only a necessary portion. If this laser processing is applied to the embossing 110, it becomes unnecessary to separately prepare the heat roller, facility investment can be reduced, and thus it is possible to obtain the vacuum heat insulating material 701, and appliances such as the refrigerator 100, the refrigerating/air-conditioner, the water heater, etc. at low cost.

Further, as for the vacuum heat insulating material 701 of the present embodiment, the example case shows that the folding-processed portion 55 formed at the core material 5 and the through hole 72 which is the vacuum heat insulating material opening portion 71 are provided at separate places; meanwhile, the through hole 72 through which the piping, etc. penetrate can be formed in the folding-processed portions 55 and 56. In this case, by forming the core material through hole 52 which is the core material opening portion 51 at the parts of the folding-processed portions 55 and 56 of the core material 5, it is easy to obtain the vacuum heat insulating material 701 having the through hole.

Here, the vacuum heat insulating material 700 of the present embodiment is not necessarily provided at the heat insulating wall between the compressor 600 and the cooler 650, but can be provided at the heat insulating wall between the control board containing room 910 in which the control board 900, etc. are contained and the storage rooms such as the refrigerating room 150, etc. In this case, since the vacuum heat insulating material 7 or 700 of which processability is easy, the degree of freedom in arrangement is high, and the heat insulating performance is high, can be used, no condensation occurs in the control board containing room 910, and thus the refrigerator 100 of high performance and high reliability can be obtained. Further, it is also effective to provide the vacuum heat insulating material 700 at the heat insulating wall or the partition wall between the storage rooms, or between the cooler room 640 and the storage rooms, where the heat insulating performance is necessary. Further, since the vacuum heat insulating materials 7 and 700 of the present embodiment are excellent in the heat insulating performance, they can be thinned, and also the folding processing and the processing of the opening portion can be done easily, thus the vacuum heat insulating materials 7 and 700 are applicable to the top panel, the partition board, and the air passage of the refrigerator 100.

Here, in the present embodiment, as shown in FIGS. 39 to 41, the core material 5 is provided with the core material through hole 52 and the notch 53, which are the core material opening portions 51, and the vacuum heat insulating material 701 is provided with the through hole 72 and the notch 73, which are the vacuum heat insulating material opening portions 71. In this case, the through hole 52 and the notch 53 are formed on the core material 5, and the through hole 72 and the notch 73 which are the outer cover material opening portions 41 smaller than the core material through hole 52 and the notch 53 by a sealing amount necessary for sealing are formed on the outer cover material 4, and thereby the vacuum heat insulating material 701 having the vacuum heat insulating material through hole and the vacuum heat insulating material notch, which are the vacuum heat insulating material opening portions 71, can be obtained. Here, according to the present embodiment, as discussed above, since the core material 5 is made by using the laminated structure of the fiber assembly 1 formed of long-fibered organic fibers, whereof the end face is cut to be a sheet of a predetermined size, there seldom occurs protrusion or coming-out of the remaining organic fiber 2a caused by cutting of the end face. Accordingly, the remaining organic fiber 2a would not protrude and be inserted to the sealing portion of the outer cover material 4 to degrade the sealing property. It is possible to shorten the sealing area 75 of the outer cover material 4, and further to obtain highly reliable vacuum heat insulating material which does not cause degradation of the sealing property at low cost. Further, similarly, it is also possible to shorten the sealing area 75 of the through holes 52 and 72 or the notch 73, and thus when the vacuum heat insulating material 701 is mounted to the appliances such as the heat insulating box or the refrigerator, etc., the through holes 52 and 72 can be used largely, hence the vacuum heat insulating material with a good usability can be obtained. Or, on the contrary, the sealing area 75 of the outer cover material 4 can be decreased in size, and thus the hole diameter of the through holes 52 and 72 or the opening width (length) of the notches 53 and 73 which are the core material opening portions 51 can be reduced. Consequently, if the vacuum heat insulating material 7, 700, 701 or 750 has the through hole 52 or 73 or the notch 53 or 73, the core material 5 can be increased in size, and thus the vacuum heat insulating material having a good heat insulating performance can be obtained.

The vacuum heat insulating material 701 is used for heat insulation for an almost cylindrical-shaped container such as heat insulation around an external circumferential part of a hermetic container of the compressor 600 of the refrigerator 100 or the refrigerating/air-conditioner, etc. or heat insulation around an external circumferential part of the hot water storage tank of the water heater, etc. (The vacuum heat insulating material 7, 700, 701, 750 or 760 is arranged so as to cover at least a part of the circumference of the almost cylindrical-shaped container.) At this time, the through hole 72 or the notch 73 which is the vacuum heat insulating material opening portion 71 of the vacuum heat insulating material 701 can be in a shape of a through hole or a notch having a larger hole diameter than a piping or a lead wire, etc. desired to penetrate, such as the piping such as the suction piping or the discharge piping, a lead wire for control, or a lead wire for power source, etc. which is desired to penetrate the vacuum heat insulating material 701.

Further, in a heat pump water heater including a container having an almost rectangular cube shape or an almost cylindrical shape, an almost cylindrical hot water storage tank contained in the container, for reserving water or hot water, a heat source appliance for heating the water in the hot water storage tank, having a refrigeration cycle (e.g., a refrigeration cycle connecting a compressor, the first heat exchanger (a heat exchanger for heating water), a squeezer, and the second heat exchanger (an evaporator) to form a circle), it is unnecessary to arrange the vacuum heat insulating material 7, 700, 701, 750 or 760 around the hot water storage tank so as to directly cover the hot water storage tank. By arranging the vacuum heat insulating material 7, 700, 701, 750 or 760 of the present invention at all of or at least a part of an inside wall of a chassis to cover the inside wall of the chassis, the heat insulating effect inside of the chassis can be improved, and thus it is possible to maintain the temperature of the hot water in the hot water storage tank at a predetermined temperature for a long term, and the energy-saving water heating apparatus (the water heater) can be obtained. Further, the noise reduction can be done, and yet further the recyclability becomes good.

Further, in a refrigerating/air-conditioning apparatus or a water heater, etc., which is formed by connecting a compressor, a cooler (or a gas cooler), a decompressor, and an evaporator in series, in which R410A, carbon dioxide ($CO_2$), flammable refrigerant (HC refrigerant, etc.), low GWP refrigerant (R32 or HFO refrigerant, etc.) being slightly flammable, etc. are used, when an outdoor unit or a heat source appliance, etc, has a structure wherein a partition wall for partitioning a fan room for containing a fan and a machine room for containing the compressor inside a chassis having the almost rectangular cube shape is provided, the vacuum heat insulating material 7, 700, 701, 750 or 760 of the present invention can be attached on the internal face of the machine room or can be formed with the chassis as one body. In this case, it is preferable to apply the vacuum heat insulating material 7, 700, 701, 750 or 760 on the front surface of the internal face of the chassis; however, the vacuum heat insulating material can be applied to five faces except the bottom face (the front face, two side faces (including the partition wall), the back face, and the top face), at least one face of the chassis, or to a part of one face. At this time, in a case of using the conventional vacuum heat insulating material, it is difficult to pull out the suction piping or the discharge piping of the compressor, the refrigerating piping or the hot water piping that are connected to the indoor unit or the hot water storage tank, and the piping or lead wires such as the control lead wire for controlling the compressor or the water temperature, etc. However, according to the present invention, it is easy to pull them out from the vacuum heat insulating material opening portion 71 of the vacuum heat insulating material 7, 700, 701, 750 or 760 to the outside of the chassis. This enables to improve the heat insulating performance of the compressor or obtain the effect of noise prevention.

Further, when the slightly flammable low GWP refrigerant (refrigerant having a low global warming potential such as R32, HFO refrigerant, etc.) is used, if non-ignitable flame-retardant material is used for the outer cover material 4 of the vacuum heat insulating material of the present embodiment, even if refrigerant leakage occurs, since the vacuum heat insulating material is non-ignitable, the ignition of the apparatus, etc. can be suppressed, and thus it is possible to obtain safe appliances such as the water heater, the refrigerating/air-conditioning apparatus, etc.

Further, since the partition wall for partitioning the fan room for containing the fan and the machine room for containing the compressor is provided in the chassis having the almost rectangular cubic shape, and at least a part of the inside (or the outside) of the machine room is covered by the vacuum heat insulating material 7, 700, 750 or 760, or all or at least a part of the surrounding of the almost cylindrical compressor is covered, the temperature of hot water or the heating performance can be improved, and thus it is possible to provide the energy efficient refrigerator, refrigerating/air-conditioning apparatus, and appliances. Further, for appliances such as a refrigerator, an automatic vending machine, a cool box, a water heater, a refrigerating/air-conditioning apparatus, etc. having an almost cylindrical compressor, by covering all or at least a part of the surrounding of the almost cylindrical compressor with the vacuum heat insulating material 7, 700, 750 or 760 of the present invention, the heat insulating effect is improved, further the noise reduction can be made, and yet further, the recyclability becomes good.

Further, in a heat source device of a heat pump water heater including a refrigerating cycle, as discussed above, a partition wall is provided in an almost rectangular cubic chassis for partitioning a fan room containing a fan and a machine room containing a compressor, and if the chassis is structured to have a gas cooler arranged at the bottom portion or the side portion of the fan room or the machine room, for example, inside the chassis, all of the internal surface inside the machine room or at least a part of the inside (or the outside) of the machine room is provided and covered with the vacuum heat insulating material 7, 700, 750 or 760 of the present invention, or all or at least a part of the surrounding of the almost cylindrical compressor is covered. Accordingly, it is possible to feed high-pressure refrigerant gas compressed by the compressor to the gas cooler or the cooler without heat loss, the temperature of hot water or the heating performance can be improved, and thus it is possible to provide the energy efficient heat pump water heater and calorifier. Further, by providing the vacuum heat insulating material 7, 700, 750 or 760 of the present invention inside of the chassis, there is also an effect to reduce the noise of the fan or the compressor.

Further, even when the vacuum heat insulating material 7, 700, 701, 750 or 760 of the present invention is used for the heat insulating material for an almost cylindrical container such as a jar pot, etc., the heat insulating performance is improved. Therefore, it is possible to keep the contents warm for long hours, and thus appliances such as the jar pot with high energy efficiency can be obtained.

Here, if insulating plastic laminated film is used for the outer cover material 4 of the vacuum heat insulating material 700, 701, 750 or 760, when the vacuum heat insulating material is used for the insulating material adjacent to the lead wire for control or the lead wire for power source, or when the lead wire for control or the lead wire for power source, etc. is used as the heat insulating material by penetrating through the vacuum heat insulating material opening portion 71, the vacuum heat insulating material functions also as an insulating material, and thus it is possible to obtain safe vacuum heat insulating material 700, 701, 750 or 760 with high heat insulating performance, and the appliances including the heat insulating material 700, 701, 750 or 760 such as the heat insulating box, the compressor 600, the automatic vending machine, the cool box, the refrigerator 100, the water heater, and the refrigerating/air-conditioning apparatus, etc. In particular, if used for the heat insulating material in the present embodiment adjacent to a portion where electric appliances are arranged such as adjacent to a power source connecting unit or a control board, or at least a part of the circumference of the power source box for containing the control boards, etc., it is possible to obtain an effect to provide further safe appliances. Especially, when the vacuum heat insulating material 750 or 760 of the present embodiment is used in the circumference of the power source box, the inner wall of the machine room, the circumference of the compressor, the circumference of the hot water storage tank of the water heater, etc., where a maintenance staff (or a user) is likely to touch, there is no possibility of electrical shock even when the maintenance staff (or the user) touches in a case of electric leakage, hence a further safer appliance can be obtained.

Further, for the appliance such as the refrigerator 100, the water heater, or the refrigerating/air-conditioning apparatus, etc. of the present invention, to facilitate visual understanding of the portion to which the vacuum heat insulating material is arranged at the time of demolishing or recycling, an overall view or a partial view such as a cross section, a development view, a cubic diagram, a perspective view, etc. of the whole appliance is shown on the rear surface or the side surface of the body of the appliance (in a case of the refrigerator 100, the rear surface or the side surface of the body of the refrigerator; in a case of the water heater, the side surface or the rear surface of the heat source device, the surrounding of the hot water storage tank, in a case of the electric water heater, the surrounding face of the tank, etc.) or the power source box, etc. Accordingly, by showing the arrangement location of the vacuum heat insulating material, the arrangement location of the getter agents, the arrangement location of the adsorption agent, etc. in the overall view or the partial view, etc., information being useful at the time of demolishing or recycling the appliances is made understandable visually and instantly.

Further, if the size and thickness of the vacuum heat insulating material used, the type or fabric weight of the core material of the vacuum heat insulating material, etc. are also shown, it is possible to easily grasp the quantity or the type of the re-usable core material at the time of recycling.

Further, the material name or the used quantity of the core material 5 of the vacuum heat insulating material 7 used in the appliance is shown and that the organic fiber is used for the core material 5 instead of the glass fiber is also shown. For example, by displaying "Glass fiber is not used for the core material of the vacuum heat insulating material used in this product. Since organic fiber (e.g., PET) is used for the core material, glass fiber fragments never appear at the time of disassembling or demolishing for recycling the product." and so on, it is possible to obtain the refrigerator 100, the water heater, and the appliances for which disassembling or demolishing is easily done. Therefore, even when the core material 5, 550 or 560 (organic fiber) of the vacuum heat insulating material 7, 700, 750 or 760 is mixed with urethane waste, etc. at the time of recycling and is supplied to thermal recycle, the combustion efficiency of the thermal recycle is not decreased, and the generation of residue is suppressed, hence it is possible to obtain the appliances having a good recyclability such as the refrigerator 100, the water heater, the electrical water heater, the refrigerating/air-conditioning apparatus, etc. Further, since powder dust due to the shredded glass fiber is not generated at the time of disassembling or demolishing, it is possible to prevent sucking of such powder dust or sticking of the powder dust to the skin, and thus an adverse effect on a human body can be suppressed.

As has been explained, according to the present embodiment, since the fiber assembly 1 of continuous long fibers is used for the core material 5, it is possible to secure the length of remaining fiber generated by the cutting in the cutting portion of the non-woven cloth sheet (e.g., the cutting portion of the end face of the sheet or the cutting portion of the hole forming or the cutting portion of the notch forming, etc.) to be long. Accordingly, it is possible to suppress the remaining fiber from coming out of the end face of the cutting portion, and thus there is no protrusion, etc. of the remaining fiber generated by the cutting from the cutting portion when the short fibers are used for the core material. Therefore, the sealing property is not degraded by the remaining fiber protruded when the core material 5 is inserted in the outer cover material 4 and sealed. Further, the non-woven cloth sheet of the organic fibers 2 is used for the core material 5, it is possible to provide the vacuum heat insulating material 7, 700, 750 or 760 of which the processability, handleability, heat insulating performance, and productivity are excellent, and the appliances having the vacuum heat insulating material 7, 700, 750 or 760 such as the heat insulating box, the automatic vending machine, the cool box, the refrigerator 100, the water heater, the refrigerating/air-conditioning apparatus, etc.

Further, in the present embodiment, since the organic fibers 2 are used for the core material 5 of the vacuum heat insulating material 7, compared with the conventional case where the hard and brittle glass fiber is used for the core material 5, it is possible to prevent flowing of powder dust and sticking to skin/mucous membranes of a worker to give stimulus at the time of manufacturing the vacuum heat insulating material 7, and thus the handleability and the workability are improved.

Further, in the present embodiment, when plural non-woven cloth sheets of the fiber assembly 1 are laminated and used for the core material 5, even if the number of laminated sheets is large and after vacuuming the sheets, the core material 5 becomes hard and is not easily folded, by providing the folding-processed portions 55 and 56 at the portion necessary to be folded, the sheets are made easily foldable. Accordingly, it is possible to fold only the portion which is desired to be folded, and prevent from deforming a portion which is not desired to be folded. Therefore, it is possible to obtain the highly reliable vacuum heat insulating material 7, 700, 750 or 760, and the appliances having the vacuum heat insulating material 7, 700, 750 or 760, such as the heat insulating box, the automatic vending machine, the cool box, the refrigerator 100, the water heater, the refrigerating/air-conditioning apparatus, etc.

Further, since the organic fibers 2 are used for the core material 5 of the vacuum heat insulating material 7, compared with the conventional case where the hard and brittle glass fiber is used as the core material, it is possible to prevent flowing of powder dust and sticking to skin/mucous membranes of a worker to give stimulus at the time of producing the vacuum heat insulating material 7, and thus the handleability and the workability are improved.

Further, in the present embodiment, plural non-woven cloth sheets of the fiber assembly 1 using the long fiber are laminated and used for the core material 5, even if the hole formation or the notch formation is provided on the vacuum heat insulating material 7, fiber fragments would not intrude nor be inserted in the sealing portion. Therefore, it is possible to provide the vacuum heat insulating material 7, 700, 750 or 760 for which is easy to carry out the hole formation or the notch formation and which has a good sealing property and an easy handleability for the core material 5, and appliances having the vacuum heat insulating material 7, 700, 750 or 760 such as the heat insulating box, the automatic vending machine, the cool box, the refrigerator 100, the water heater, the refrigerating/air-conditioning apparatus, etc.

Further, in the present embodiment, the core material 5 is provided with a concave groove having an almost similar shape to the piping shape (a concave groove having an almost circular cross section) by forming the concave groove in the vacuum heat insulating material 7 through treating the core material 5 with the heat roller or the laser processing, etc., and the piping is arranged to the concave groove. Further, by forming a concave portion (the first slit portion 57, the second slit portion 58, or the concave portion 760x) is formed in the vacuum heat insulating material 750 or 760 through arranging the fiber assemblies of the core material 550 or 560 via a predetermined clearance in the width direction, the piping is arranged in the concave portion. Accordingly, it is possible to obtain the vacuum heat insulating material 7, 700, 750 or 760 in which the heat leak from the piping is less, and the appliances having the vacuum heat insulating material 7, 700, 750 or 760 such as the heat insulating box, the automatic vending machine, the cool box, the refrigerator 100, the water heater, the refrigerating/air-conditioning apparatus, etc.

The vacuum heat insulating material of the present invention can be applied to the wall, the ceiling, or the floor surface, etc. of a housing or a store, etc. Since the glass material is not used for the core material 5 in the vacuum heat insulating material 7, 700, 750 or 760 of the present invention, at the time of constructing or demolishing the housing, it is possible to prevent flowing of powder dust of the glass fiber and sticking to skin/mucous membranes of a worker to give stimulus, and thus the handleability, the workability, the safeness, and the recyclability are improved. Further, it is possible to provide the vacuum heat insulating material opening portion 71, the vacuum heat insulating material can be easily provided or arranged at the pulling-out portion of the refrigerant piping or the lead wire for control, a ventilating opening portion, the pulling-out opening portion of the power source wire, the water supply piping, or the drainage piping of the refrigerating/air-conditioning apparatus such as the air-conditioner, etc., or the pulling-out opening portion of wiring for telephone or the Internet, and so on. Further, since the folding processing is easy, it is easy to apply to a curved surface or a bended portion.

From the above, the core material 5, 550 or 560 structured by the laminated structure of the fiber assembly 1, the continuous sheet-shaped fiber assembly 1J, the first (organic) fiber assembly 1K and the second (organic) fiber assembly 1H made by using the organic fibers, for example, for the fiber, and by forming the organic fibers 2 into a sheet shape, and having the end face 1a on which the end face is cut so as to obtain a predetermined length or width, the gas-barrier outer cover material 4 containing the core material 5, 550 or 560 inside, having a sealing portion having an area larger than the core material 5, 550 or 560 by the amount of the sealing length are included, and the (organic) fibers 2 are used for the (organic) fibers 2 continuous equal to or longer than the length or the width of the core material 5, 550 or 560, and the remaining organic fiber 2a generated by cutting is suppressed from protruding from the cutting portion. Accordingly, there is no possibility that the remaining organic fiber 2a protrudes from the cutting face (the end face 5a) of the end face of the sheet of the core material 5, 550 or 560 facing to the sealing portion 45, and the sealing failure, etc. would not occur. Thus, it is possible to obtain the high-performance and highly reliable vacuum heat insulating material 7, 700, 701, 750 or 760, of which the recyclability is good, and the heat insulating performance is hardly degraded.

In the present embodiment, the core material 5 (e.g., the core material 5, 550 or 560 structured by the laminated structure of the fiber assembly 1 that is made by forming the organic fibers 2 into a sheet shape, and by cutting the end face 1a to obtain the predetermined length, or the core material 5 structured by cutting the end face 5a to obtain the predetermined length (or the width) after laminating the fiber assembly 1 that is made by forming the organic fibers 2 into a sheet shape, etc.) which is made by using the organic fibers 2, for example, for the fiber 2, structured by the laminated structure of the fiber assembly 1 made by forming the organic fibers 2 into a sheet shape, and having the cutting portion (e.g., the end face 5a) on which the end face is cut so as to obtain the predetermined length, the gas-barrier outer cover material 4 for containing the core material 5 inside, having the sealing portion 45 for sealing the circumference of the outer shape including the cutting portion (e.g., the end face 5a) in a range larger than the size of the outer shape of the core material 5 (e.g., the length or the width when the core material is rectangular, or the diameter when the core material is circular) by the amount of the sealing length, and the vacuum heat insulating material 7, 700, 701, 750 or 760 wherein the inside of the outer cover material 4 is hermetically sealed in an approximately vacuum state by sealing the sealing portion 45 of the outer cover material 4 are included, and the long fiber with a length (or a width) equal to or longer than the length (or the width) of the core material 5, 550 or 560 (or the sheet of which the end face is cut) of which the end face is cut is used for the organic fibers 2. Accordingly, there is no possibility that the remaining organic fiber 2a protrudes from the cutting face (the end face 5a) of the sheet end face of the core material 5 at the sealing portion 45, and the sealing failure, etc. would not occur. Thus, it is possible to obtain the high-performance and highly reliable vacuum heat insulating material 7, 700, 701, 750 or 760, of which the recyclability is good, and the heat insulating performance is hardly degraded.

Further, the core material 5, 550 or 560 structured by the laminated structure of the fiber assembly 1 made by forming the organic fibers 2 into a sheet shape and cutting the end face 1a so as to become a predetermined length, or the core material 5, 550 or 560 structured by after laminating the fiber assembly 1 which is the organic fibers 2 formed into a sheet shape, cutting the end face 5a so as to become a predetermined length (or the width), and having the core material opening portion 51 provided with the opening portion such as the through hole 52 and the notch 53, etc. by cutting, the gas-barrier outer cover material 4 containing the core material 5 inside, having the sealing portion 45 or 78 for sealing the surrounding of the outer shape (e.g., the end face 5a or 1a) and the surrounding of the core material opening portion 51 of the core material 5, 550 or 560 (or the sheet-shaped fiber assembly 1), and hermetically sealing the inside in an almost vacuum state by sealing the sealing portion 78, and the outer cover material opening portion 41 which is the opening such as the through hole or the notch, etc. provided at the outer cover material 4 in a state in which the sealing portion 45 or 78 provided around the outer shape (e.g., the end face 5a or 1a) and around the core material opening portion 51 of the core material 5 (or the sheet-shaped fiber assembly 1), having the hole size (e.g., the diameter when the opening portion is circular) or the length (or the width) being smaller than the size of the core material opening portion 51 by the length of the sealing area 75 are included. Accordingly, since the long fiber having the length being the same or longer than the length (or the width) of the sheet of the core material 5, 550 or 560 of which the end face 5a or 1a is cut is used for the organic fibers 2, the long fiber (e.g., the continuous fiber or the fiber having the length being the same or longer than the length of the sheet) is used. Thus, if the core material opening portion 51 such as the through hole or the notch is provided by cutting (cutoff), fiber waste of a cut organic fiber 2b cut by cutting or the remaining organic fiber 2a on the remaining portion of the sheet does not protrude around the inner side of the cutting portion of the core material opening portion 51 such as the through hole or the notch, etc. Therefore, the sealing failure does not occur, and thus it is possible to obtain the vacuum heat insulating material 7, 700, 701, 750 or 760 of which recyclability is good and the heat insulating performance is not degraded, and the heat insulating box and the appliances, etc. using the vacuum heat insulating material 7, 700, 701, 750 or 760.

Further, when the fiber assembly is contained inside of the gas-barrier container (the outer cover material 4) in an approximately vacuum state (decompressed state), the thickness of the fiber assembly 1 is at least three times and no more than eighteen times of the fiber diameter of the organic fibers 2, and thus the heat insulating performance is improved compared with a case of using the cottonlike fiber for the core material. Further, since the productivity is also improved, it is possible to obtain the high-performance and highly reliable vacuum heat insulating material 7 at low cost.

Further, the organic fiber assembly, which is organic fibers formed into a sheet shape and whereon heat welding is applied, is used for the fiber assembly 1, the fiber assembly 1 is formed in a sheet-shape by applying heat welding on organic fibers 2, and an area of the heat welded portion is made no less than 3% and no more than 20% of the total area (sheet area). Accordingly, it is possible to suppress both deformation due to compressive strain and degradation of the heat insulating performance. That is, by making the dimension whereon heat welding is applied no less than 3% of the total area (sheet surface area), the fiber assembly 2 does not become ragged. Thus, the handling strength is increased, and the handleability of the fiber assembly 1 is improved. By making the proportion of the heat welding no more than 20% of the total area (sheet area), the compressive strain can be suppressed small, and further the heat conductivity can be lowered. Thus, it is possible to obtain the vacuum heat insulating material which is hardly deformed, and which can improve the heat insulating performance. Further, by using the organic fiber assembly for the fiber assembly 1, and making the fabric weight of the fiber assembly 1 no less than 85 [g/m²], the compressive strain can be further reduced, and by making the fiber weight of the fabric assembly 1 no more than 198 [g/m²], the heat insulating performance can be maintained. Accordingly, it is possible to obtain the vacuum heat insulating material 7, 700, 701, 750 or 760 which is hardly deformed and whereby necessary heat insulating performance can be obtained.

Further, the fiber assembly 1 or 1J is formed in a sheet-shape by applying heat welding on continuous organic fibers 2, for example, and the fabric weight of the non-woven cloth which is the fiber assembly 1 is at least 4.7 g/m² and no more than 70 g/m², or at least 140 g/m² and no more than 198 g/m², and the heat welded portion is made to penetrate from the front surface to the rear surface of the fiber assembly 1 in the thickness direction of the sheet. Accordingly, it is possible to obtain the non-woven cloth, the heat insulating material 7, 700, 750 or 760, the heat insulating box, and the appliances using the heat insulating material 7 such as the refrigerator 100, the water heater, the jar pot, etc., which secure necessary heat insulating performance, are easy to manufacture, and have excellent recyclability. Further, it is possible to obtain the heat insulating material 7 of which the core material 5 has a good handleability and has high heat insulating performance.

Further, the fiber assembly 1 is formed in a sheet-shape by applying heat welding on continuous organic fibers 2, and the fabric weight of the non-woven cloth which is the fiber assembly 1 is at least 4.7 g/m² and no more than 130 g/m², and the heat welded portion is made not to penetrate from the front surface to the rear surface of the fiber assembly 1 in the thickness direction. Accordingly, it is possible to obtain the non-woven cloth, the heat insulating material 7, 700, 750 or 760, the heat insulating box, and the appliances using the heat insulating material 7, 700, 750 or 760, such as the refrigerator 100, the water heater, the jar pot, etc., which secure necessary heat insulating performance, is easy to manufacture, and has excellent recyclability. Further, it is possible to obtain the heat insulating material 7, 700, 750 or 760 of which the core material 5 has a good handleability and has high heat insulating performance.

Further, the fabric weight of unwoven cloth being the fiber assembly 1 is made at least 85 g/m² and not more than 198 b/m² so as to suppress deformation of the fiber assembly 1 due to the temperature or compression force at the time of vacuum forming. Therefore, the thickness of one sheet becomes large enough to suppress strain, and thus the stiffness against the compression is obtained. Since deformation hardly occurs at the time of vacuum forming, shape defect, etc. due to the deformation does not occur, and the highly reliable vacuum heat insulating material 7 can be obtained.

Further, if the heat insulating performance is emphasized more (if the heat conductivity is desired to be no more than 0.002 [W/mK] which is equivalent to the conventional one using the glass fiber for the core material), the fabric weight of the non-woven cloth sheet (the fiber assembly 1) can be made at least 4.7 [g/m²] and no more than 26 [g/m²], and it is expected to improve the heat insulating performance. Further, if deformation (compressive strain) of the non-woven cloth sheet is desired to be suppressed, the fabric weight of the non-woven cloth sheet can be made at least 110 [g/m²] and no more than the fabric weight of the case in which the number of lamination is one (e.g., no more than 198 [g/m²]), and thus the vacuum heat insulating material with less deformation and good handleability can be obtained. Further, if it is desired to suppress the deformation (compressive strain) of the non-woven cloth sheet and further improve the heat insulating performance to some extent (if the heat conductivity is desired to be no more than 0.003 [W/mK] which is equivalent to the conventional one using the cottonlike fiber for the core material), the fabric weight of the non-woven cloth sheet is made at least 140 [g/m²] and no more than 198 [g/m²], and thus the vacuum heat insulating material can be obtained, of which deformation (compressive strain) is small, of which the core material has a good handleability, and has high heat insulating performance.

Further, the core material 5 structured by the laminated structure of the fiber assembly 1 made by forming the organic fiber into a sheet shape and applying heat welding, having the cutting portion on which the end face 5a is cut so as to be the predetermined length, the gas-barrier outer cover material 4 containing the core material 5 inside, having the sealing portion 78 for sealing surrounding of the outer shape including the cutting portion with a range being larger than the size of the outer shape of the core material 5 (e.g., the size of the length or the width when the core material is rectangular, or the size of the diameter when the core material is circular) having the cutting portion by the amount of the sealing length (the sealing area 75), the vacuum heat insulating material 7, 700, 701, 750 or 760 in which the inside of the outer cover material 4 is hermetically sealed in an approximately vacuum state by sealing the sealing portion 45 or 78 of the outer cover material 4 are included. The thickness of the fiber assembly 1 (the non-woven cloth sheet) is made at least 3 times and no more than 18 times of the average fiber diameter, the fabric weight of the fiber assembly 1 (the non-woven cloth sheet) is made at least 4.7 g/m² and no more than 70 g/m², and the range to which the heat welded portion is provided in the fiber assembly (the non-woven cloth sheet) is made no more than 20% of the sheet area (preferably, no more than 8%). Thus it is possible to obtain the non-woven cloth, the vacuum heat insulating material, of which the heat conductivity is small, the heat insulating performance is high, the productivity is good, easy to manufacture, the sheet handleability is good, and the recyclability is good, and the appliances using the vacuum heat insulating material such as the heat insulating box, the refrigerator, the water heater, the jar pot, the refrigerating/air-conditioning apparatus, the showcase, etc. Further, since the organic fibers 2 are heat-welded with each other, and the fiber assembly 1 hardly becomes ragged, the handleability is improved. Further, since appropriate pressure and heat welding are applied, it is possible to suppress the increase of the contacting area between the organic fibers 2, the heat conduction from the heat welded portion due to the increase of the heat transfer can be suppressed, and the degradation of the heat insulating performance can be suppressed. Further, in addition to the effect to improve the heat insulating performance, the productivity is improved, the production cost can be reduced, hence it is possible to obtain the low-cost, high performance, highly reliable vacuum heat insulating material, and the appliances using the vacuum heat insulating material such as the heat insulating box, the refrigerator, the water heater, the jar pot, the refrigerating/air-conditioning apparatus, the showcase, etc.

Further, if the thickness of the fiber assembly 1 (the non-woven cloth sheet) is made at least 3 times and no more than 18 times of the average fiber diameter, the fabric weight of the fiber assembly 1 (the non-woven cloth sheet) is made at least 98 [g/m²] (preferably, at least 140 [g/m²]) and no more than 198 [g/m²], and the range to which the heat welded portion is provided in the fiber assembly 1 (the non-woven cloth sheet) is made no less than 3% and no more than 20% of the sheet area (preferably, no more than 8%). Thus it is possible to obtain a predetermined heat insulating performance. Further it is possible to obtain the non-woven cloth and the vacuum heat insulating material, of which deformation hardly occurs, the productivity is good, which are easy to manufacture, of which the sheet handleability is good, the reliability is high, and the recyclability is good, and the appliances using the vacuum heat insulating material such as the heat insulating box, the refrigerator, the water heater, the jar pot, the refrigerating/air-conditioning apparatus, the showcase, etc. Further, since the organic fibers 2 are heat-welded with each other, and the fiber assembly 1 hardly becomes ragged, the handleability is improved. Further, since appropriate pressure and heat welding are applied, it is possible to suppress the increase of the contacting area between the organic fibers 2, the heat conduction from the heat welded portion due to the increase of the heat transfer can be suppressed, and the degradation of the heat insulating performance can be suppressed. Further, in addition to the effect to improve the heat insulating performance, the productivity is improved, the production cost can be reduced, hence it is possible to obtain the low-cost, high performance and highly reliable vacuum heat insulating material, and the appliances using the vacuum heat insulating material such as the heat insulating box, the refrigerator, the water heater, the jar pot, the refrigerating/air-conditioning apparatus, the showcase, etc.

Further, since the cross sectional shape of the fiber structuring the fiber assembly 1 is made a modified cross-sectional shape such as an approximately triangular shape, an approximately C shape or an approximately Y shape, etc., the cross sectional shape of the organic fiber 2 is made an almost triangular shape having almost the same cross section area as the fiber having an approximately circular cross section, and thereby compared with the fiber having the approximately circular cross section having almost the same cross sectional area, the second moment of area is large and the stiffness is improved, thus the deflection of the fiber is decreased at the time of receiving atmospheric pressure, and the heat insulating performance of the vacuum heat insulating material 7 is improved. Further, the similar effect can be obtained also in a case of making the cross sectional shape of the organic fiber 2 a modified cross-sectional shape such as an approximately C shape or an approximately Y shape, etc.

Further, if the cross section of the organic fiber 2 is the C shaped cross section, since the cross section is deformed to a pipe shape (an approximately circular shape with a hollow center part) when compressed by pressure at the time of shaping, the heat transfer becomes worse due to its pipe shape than in a case of using the fiber having an approximately circular cross section, and thus the heat insulating performance of the vacuum heat insulating material 7, 700, 701 or 750 is improved.

Further, since the core material 5, 550 or 560 is laminated with combining the core material 5 or 550 of a plurality of types of different fabric weights, compared with a case of laminating the core materials having the same thickness, if the thickness after lamination is the same, the strain can be reduced in the core material 5 totally. Further, compared with a case of laminating the core materials having a high fabric weight to be formed into the same thickness, the highly reliable vacuum heat insulating material 7, 700 or 750 which has better heat insulating performance, wherein deformation due to strain is less, can be obtained. Yet further, compared with a case of laminating the core materials having low fabric weight to be formed into the same thickness, necessary heat insulating performance can be secured, and further, since the predetermined stiffness can be obtained, it is possible to obtain the vacuum heat insulating material 7, 700, 701, 750 or 760 having a good heat insulating performance, with less deformation, high performance, and high reliability.

Further, the core material 5, 550 or 560 is formed by the laminated structure of the first (organic) fiber assembly 1K and the second (organic) fiber assembly 1H, and the first (organic) fiber assembly 1K and the second (organic) fiber assembly 1H are interfolded so as to mutually intersect, hence the intermediate part of the sheets becomes a point contact, which improves the heat insulating performance more. Further, when fabric weights of the first (organic) fiber assembly 1K and the second (organic) fiber assembly 1H are different, compared with a case of laminating the assemblies having the same thicknesses, if the thickness is the same, the strain can be reduced totally as the core material 5. In addition, since the thickness can be reduced compared with a case of laminating the same number of sheets of the fiber assembly of which the fabric weight is higher, it is possible to obtain the vacuum heat insulating material 7 with a good heat insulating performance, with less thickness in the lamination, less deformation by the strain, and high reliability. Yet further, compared with a case of laminating the same number of sheets having a low fabric weight, necessary heat insulating performance can be secured, and further, since the predetermined stiffness can be obtained, it is possible to obtain the vacuum heat insulating material 7, 700, 701, 750 or 760 having a good heat insulating performance, with less deformation, high performance, and high reliability.

Further, since the organic fiber 2 is continuous in the length or the width direction of the fiber assembly 1, it is possible to maintain the length of the remaining organic fiber 2a, which is generated on the cutting portion (e.g., the cutting portion of the sheet end face (the end face 1a or 5a), the cutting portion of the hole formation (the through hole 52), or the cutting portion of the notch formation (the notch 53), etc.) of the non-woven cloth sheet of the fiber assembly 1 by cutting, long. Accordingly, it is possible to suppress protrusion of the remaining organic fiber 2a from the end face of the cutting portion, that is, the protrusion, etc. of the remaining organic fiber 2a, which is generated on the cutting portion by cutting in a case of using the short fiber for the core material 5, does not occur. Therefore, the sealing property is not degraded by the remaining organic fiber 2a which protrudes when the core material 5, 550 or 560 is inserted into the outer cover material 4 and sealed.

Further, in the present invention, since the long fiber being continuous in the length or width direction of the fiber assembly 1 is used for the organic fibers 2, it is possible to maintain the length of the remaining organic fiber 2a, which is generated on the cutting portion (e.g., the cutting portion of the sheet end face (the end face 5a or 1a), the cutting portion of the hole formation (the through hole 52), or the cutting portion of the notch formation (the notch 53), etc. of the core material 5 or 550, or the fiber assembly 1) of the fiber assembly 1 (the non-woven cloth sheet) by cutting, long. Accordingly, it is possible to suppress protrusion, etc. of the remaining fiber generated on the cutting portion by cutting in a case of using the short fiber for the core material. It is unnecessary to make the sealing length long with considering the protrusion of the remaining fiber as in the conventional case of using the short fiber. Therefore, the sealing length of the sealing portion of the outer cover material 4 can be shortened, and thus the compact and low-cost vacuum heat insulating material can be obtained. Further, if the size of the outer cover material 4 is the same, compared with the conventional case of using the short fiber, the size of the core material 5, 550 or 560 (the length or the width of the sheet) can be increased by the amount of the protruded length (e.g., about 1 mm to 10 mm) of the remaining fiber, that is, a heat insulating area can be made large, and thus the heat insulating performance is improved.

Further, since the organic fiber 2s of the organic fiber assembly 1 is any of polyester, polystyrene, polypropylene, polylactate, aramid, and liquid polymer, the processability, the handleability, the heat insulating performance, and the productivity are excellent.

Further, the external box 9 and the internal box 10 arranged inside (inner side) of the external box 9 are included, the vacuum heat insulating material 7, 700, 750 or 760 of the above-discussed present embodiment is provided at the space between the external box 9 and the internal box 10. Therefore, it is possible to obtain the heat insulating box equipped with the vacuum heat insulating material 7 having good processability, handleability, heat insulating performance, and productivity and further with a good heat insulating performance, and the refrigerator 100 having the heat insulating box.

Further, since the spacer 8 is provided between the external box 9 and the vacuum heat insulating material 7, 700, 750 or 760, the heat ingression from the outside can be insulated by the vacuum heat insulating material 7, 700, 750 or 760 through the spacer 8, which improves the heat insulating efficiency. Further, the heat ingression into the internal box 10 is also through urethane, etc.; that is, after insulating heat by the vacuum heat insulating material 7, 700, 750 or 760, it is possible to insulate further using urethane, etc., the heat quantity invaded into the refrigerator can be reduced, and thus the heat insulating efficiency can be improved. Further, the strength of the box body can be secured by the external box 9, the internal box 10, the foam insulation 11 (urethane), and the spacer 8.

Further, the heat insulating wall between the machine room 601 containing the compressor 600 and the cooler room 640 containing the cooler 650 has a Z-shape folded at two points or a complex shape folded at least three points (e.g., W-shaped or curved-face shaped, etc.), and the core material 5 is provided with the vacuum heat insulating material 7, 700, 750 or 760 of the present embodiment, hence the vacuum heat insulating material at low cost, with good recyclability, and high heat insulating performance can be arranged even if it is applied to a zigzag shape such as in the heat insulating wall of the refrigerator 100.

Further, after completing the vacuum heat insulating material 700, 750 or 760, the vacuum heat insulating material 700, 750 or 760 can be folded easily at the folding-processed portions 55 and 56 of the core material 5, the first slit portion 57 and the second slit portion 58 of the core material 550, or the third slit portion 560K of the core material 560, at a necessary predetermined angle, hence it is possible to arrange the vacuum heat insulating material 700 or 750 which can be easily processed and has a good heat insulating performance, and thus the refrigerator 100 with high heat insulating performance can be provided at low cost.

Further, the long fiber of the organic fibers 2, having the length of at least the length (or the width) of the core material sheet in a state wherein the end face is cut, is used for the sheet-type core material 5 of which the end face 5a is cut so as to have a predetermined length (or the width), the vacuum heat insulating material 7, 700, 750 or 760 is provided with the vacuum heat insulating material opening portion 71 such as the through hole 72 or the notch 73, etc., and the vacuum heat insulating material 7, 700, 750 or 760 is arranged so that the piping connecting the compressor 600 and the cooler 650 passes through the vacuum heat insulating material opening portion 71 of the vacuum heat insulating material 7, 700, 750 or 760 through the vacuum heat insulating material opening portion 71 of the vacuum heat insulating material 7, 700, 750 or 760. Even if there is an obstacle for arranging the vacuum heat insulating material 7, 700, 750 or 760 such as a piping of the suction piping or the discharge piping, etc. or the lead wire for control or power source, etc., it is possible to arrange the vacuum heat insulating material 7, 700, 750 or 760 of which the opening portion such as the through hole 72 or the notch 73, etc. has easy processability, and thus it is possible to provide the refrigerator 100 which has high degrees of freedom in arrangement and high heat insulating performance at low cost.

Further, the refrigerating/air-conditioning apparatus such as the air-conditioner of the present embodiment includes the indoor unit placed indoor for conditioning indoor air, and the outdoor unit having the chassis having a shape of an approximately rectangular cube and the partition wall for partitioning the fan room containing the fan and the machine room containing the compressor inside of the chassis, and the vacuum heat insulating material 7, 700, 701, 750 or 760 of the present embodiment is provided at least a part of the inside (the partition wall inside of the machine room, the chassis, or around the compressor, etc.) or the outside (the chassis forming the machine room or the external wall of the partition wall, etc.) of the machine room structured by the chassis and the partition wall, hence the heat insulating of the machine room or the compressor can be carried out, the heating capacity can be improved, and thus it is possible to provide the refrigerating/air-conditioning apparatus or appliances having good energy efficiency.

In the appliances such as the refrigerator, the refrigerating/air-conditioning apparatus, the water heater, etc. provided with an approximately rectangular box body having at least two continuous wall surfaces of the top surface, the both side surfaces, the rear surface, the front surface and the bottom surface, the folding-processed portions 55 and 56 (concave portions, etc. formed by the laser processing, etc.), the first slit portion 57 and the second slit portion 58 between the adjacent fiber assemblies, or the third slit portion 560K between the adjacent fiber assemblies are/is provided in the core material 5, 550 or 560, and the vacuum heat insulating material 7, 700, 701, 750 or 760 is arranged on at least two continuous wall surfaces by bending the vacuum heat insulating material 7, 700, 701, 750 or 760 at a predetermined angle (e.g., approximately 90 degrees) at the folding-processed portions 55 and 56, the bent portion 59 or the concave portion 760x. Conventionally, it has been difficult to apply vacuum heat insulating material to two continuous wall surfaces since it has been difficult to bend the vacuum heat insulating material freely at a necessary predetermined angle. However, by using the vacuum heat insulating material 700, 750 or 760 of the present embodiment, the vacuum heat insulating material 700, 750 or 760 can be easily bent at a necessary part, hence the vacuum heat insulating material can be applied to two continuous wall surfaces having a predetermined angle, and appliances having high heat insulating performance can be obtained. In particular, it is unnecessary to apply any special processing for a concave portion, such as the laser processing, etc. in the case of bending at the predetermined angle at the bent portion 59 consisting of the first slit portion 57 and the second slit portion 58 which present the shape of concave portions formed between the adjacent fiber assemblies, or the concave portion 760x structured by the third slit portion 560K, hence the vacuum heat insulating material low in cost, for which facility investment is small, can be obtained.

Therefore, since the vacuum heat insulating material can be arranged at a corner between two continuous wall surfaces having a predetermined angle, a coverage factor of the vacuum heat insulating material relative to the outer surface area of the external box except a door part of the appliance, such as a refrigerator, etc., can be drastically increased. For example, in a case of the refrigerator, it is possible to make the coverage factor of the vacuum heat insulating material relative to the outer surface area of the external box over 80%, which has conventionally been difficult. Meanwhile, when the case is not limited to the refrigerator, it is possible to form a heat insulating box having a coverage factor of the vacuum heat insulating material relative to the surface area of an external box over 80%. In addition, by using processing of the through hole 72 or the notch 73, etc. in combination, even when a lead wire for control, a piping, etc. is provided so as to penetrate the wall surface, whereto it has been conventionally difficult to apply the vacuum heat insulating material, the lead wire for control, the piping, etc. can be avoided by the through hole 72 or the notch 73, hence it is possible to further increase the coverage factor of the vacuum heat insulating material.

Further, an approximately cylindrical container such as the compressor 600 or a tank, etc. is provided, and the above discussed vacuum heat insulating material of the present embodiment, in which the long fiber of the organic fibers 2 having at least the same length as the length of the core material sheet (or the fiber assembly 1) of which the end face is cut is used for the core material 5, is formed around the approximately cylindrical container, hence it is possible to obtain the appliance with a good heat insulating performance. Here, in a case of heat insulating a part which reaches a high temperature (no less than about 80° C.) such as the compressor, the hot water storage tank, etc., resin fiber (e.g., LCT or PPS) with high-temperature resistance can be used for the organic fibers 2. Meanwhile, it is also applicable that heat insulating material of another member, such as urethane foam, foamed polystyrene etc. with high-temperature resistance is arranged around the approximately cylindrical container, and the vacuum heat insulating material of the present embodiment is arranged on the outer side of the heat insulating material of the other member so as to surround the heat insulating material of the other member. In this way, it becomes possible to keep the high-temperature resistance by the heat insulating material of the other member and to keep the heat insulating performance by the vacuum heat insulating material. Thus, the appliances such as the compressor, water heater, etc. with high performance, and heat insulating performance can be obtained.

An approximately cylindrical container such as the compressor 600, the hot water storage tank, etc. is included, the folding-processed portions 55 and 56 (the concave portions, etc. by the laser processing), the bent portion 59 (the concave portion by the first slit portion 57 and the second slit portion 58), or the concave portion 760X (the concave portion by the third slit portion 560K) are/is provided in the core material 5, 550 or 569, and the vacuum heat insulating material 700, 701, 750 or 760 is arranged continuously on a peripheral wall in an approximately cylindrical shape by bending the vacuum heat insulating material 700, 701, 750 or 760 at a predetermined angle (e.g., approximately 30 degrees) at the folding-processed portions 55 and 56, the bent portion 59 or the concave portion 760x. Conventionally, it has been difficult to apply vacuum heat insulating material to a continuous peripheral wall with a circular cross section of a compressor, a tank, etc., since it has been difficult to bend the vacuum heat insulating material freely at a necessary predetermined angle. However, by using the vacuum heat insulating material 7, 700, 701, 750 or 760 of the present embodiment, the vacuum heat insulating material 7, 700, 701, 750 or 760 can be easily bent at a necessary part, hence the vacuum heat insulating material 7, 700, 701, 750 or 760 can be also applied to a continuous peripheral wall (around a container, or a wall surface) of a cylindrical container having a predetermined angle, and appliances with high heat insulating performance can be obtained.

Further, even if there is an obstacle at providing the vacuum heat insulating material, such as a piping like the suction pipe, the discharge pipe or the water heater piping, or lead wires for control or power source, etc., since the vacuum heat insulating material of which the opening portion such as the through hole 72 or the notch 73, etc. can be easily processed can be provided at low cost, the appliances of which the degree of freedom of arrangement is high, having a good recyclability and high heat insulating performance can be supplied at low cost.

According to the present embodiment, the method for manufacturing vacuum heat insulating material includes: the collecting step for extruding heat-welded organic resin such as polyester or polystyrene, etc. in a continuous state from a plurality of aligned nozzles in the predetermined width and collecting on the conveyer as a plurality of organic fibers (fibers having a fiber diameter of about at least 3 μm and no more than 15 μm); the reeling step for feeding the conveyer at the predetermined speed, and producing the fiber assembly 1 in a reeled sheet state by applying pressure with the roller and heat welding (e.g., embossing process) on a plurality of the organic fibers; the core material processing step for making the core material 5 having the predetermined size by cutting the end face of the fiber assembly 1 produced by the reeling step; the decompressing step for inserting the core material 5 into the outer cover material 4 from the insertion opening 4a and decompressing the inside to the approximately vacuum state; and the outer cover material sealing step for sealing the sealing portion 45 of the insertion opening 4a of the outer cover material 4 of which the inside is decompressed to the approximately vacuum state in the decompressing step. Accordingly, continuous formation of the organic fiber can be easily done, and it is easy to form the long-fibered fiber assembly 1 made of continuous organic fiber. Further, by controlling extrusion amount (discharge amount) of the molten resin and the speed of the conveyer, it is easy to manufacture the fiber assembly 1 having a different thickness or the fiber assembly 1 having a different fabric weight. Further, by changing the hole diameter of the nozzles, it is easy to change the fiber diameter of the organic fiber. Further, since the long-fibered organic fiber is used for the core material 5 or the fiber assembly 1, even if the end face is cut, the remaining organic fiber 2a does not protrude from or come out of the end face to the sealing portion 45 of the outer cover material 4. Thus, it is possible to obtain the highly reliable vacuum heat insulating material in which the sealing failure hardly occurs and the degree of vacuum hardly decreases.

Further, according to the present embodiment, the method for manufacturing the vacuum heat insulating material includes: the extruding step for continuously extruding heated and melted organic resin such as polyester or polystyrene, etc. in the predetermined width from a plurality of aligned nozzles; the fiber forming step for cooling the resin continuously extruded from the nozzles in the extruding step and then stretching the resin by compressed air to form fiber, or the fiber formation step for blowing high-temperature air at a temperature being almost equal to a melting temperature of the resin from neighborhood of holes of the nozzles (e.g., beside the extruding hole of the nozzles) to the resin extruded from the nozzles from the neighborhood of the holes of the nozzles (beside the holes) for fiber formation the resin, and the fiber collecting step for collecting a plurality of organic fibers (fibers having a fiber diameter of about at least 3 μm and no more than 15 μ) made into fiber in the fiber formation step on the conveyer. Accordingly, it is possible to manufacture continuous long fibered organic fiber from the molten resin by a simple structure. Further, by controlling the extrusion amount (discharge amount) of the molten resin and the speed of the conveyer, it is easy to manufacture the fiber assembly 1 having a different thickness or the fiber assembly 1 having a different fabric weight. Further, by changing the hole diameter of the nozzles, it is easy to change the fiber diameter of the organic fiber.

Further, according to the manufacturing method of the vacuum heat insulating material of the present embodiment, in the core material processing step, after laminating fiber assembly 1 into plural layers, the end face is cut so as to form the core material 5 with the predetermined size, and thus only by laminating the fiber assembly 1 into plural layers, it is possible to easily manufacture the fiber assembly 1 using continuous organic fiber with a predetermined size.

Further, according to the manufacturing method of the vacuum heat insulating material of the present embodiment, at the core material processing step, after the fiber assembly 1 is formed into a sheet shape in a tubular state of being wound about the approximately cylindrical roller, the end face is cut so as to form the core material with the predetermined size, and thus at the time of manufacturing the core material 5, only the tubular opening end face needs to be cut. Since the number of cutoff portions can be reduced, it is possible to obtain the vacuum heat insulating material which can improve the workability at low cost.

Further, according to the manufacturing method of the vacuum heat insulating material of the present embodiment, since a range of the area on which heat welding is applied is made no more than 20% (preferably, no more than 15%, and more preferably, no more than 8%) of the total area of the fiber assembly 1, the organic fibers 2 are heat-welded with each other, and the fiber assembly 1 is less likely to be ragged, of which handleability and handling strength are improved. Further, since appropriate pressure and heat welding are applied, it is possible to suppress the increase in the contacting area between the organic fibers 2, the heat conduction from the heat welded portion due to the increase in the heat transfer can be suppressed, and the degradation of the heat insulating performance can be suppressed.

Further, according to the manufacturing method of the vacuum heat insulating material of the present embodiment, since the core material is manufactured so that the fabric weight of the fiber assembly 1 is made at least 4.7 g/m$^2$ and no more than 26 g/m$^2$, it is possible to easily manufacture the fiber assembly 1 which is continuous organic fiber. Further, since the fabric weight is made at least 4.7 g/m$^2$, the organic fibers 2 would not tear even when the organic fibers 2 are wound about the roller, and thus it is possible to obtain the continuous long organic fiber having high reliability. Further, since the fabric weight is made no more than 26 g/m$^2$, the heat conductivity can be made equivalent to or no more than around 0.002 [W/mK] which is the heat conductivity of the conventional general-used vacuum heat insulating material 7 using the glass fiber for the core material 5, and thus it is possible to obtain the vacuum heat insulating material 7, 700, 750 or 760 with high heat insulating performance.

REFERENCE SIGNS LIST

1 Fiber assembly, 1a End face, 1J Continuous sheet-shaped fiber assembly, 1Je Winding-end end portion, 1K The first (organic) fiber assembly, 1Ka The first (organic) fiber assembly, 1Kb The first (organic) fiber assembly, 1Kc The first (organic) fiber assembly, 1Kd The first (organic) fiber assembly, 1H The second (organic) fiber assembly, 1Ha The second (organic) fiber assembly, 1Hb The second (organic) fiber assembly, 1Hc The second (organic) fiber assembly, 1Hd The second (organic) fiber assembly, 2 Organic fiber, 2a Remaining fiber, 2b Cutoff fiber, 2x Organic fiber, 2y Organic fiber, 3 Air layer, 4 Outer cover material, 5 Core material, 5a End face, 5g Flat portion, 5f Bending end portion, 5fa Bending end portion, 6 Adsorption agent, 7 Vacuum heat insulating material, 8 Spacer, 9 External box, 10 Internal box, 11 Foam insulation, 12 Heat insulating wall, 41 Outer cover material opening portion, 45 Sealing portion, 51 Core material opening portion, 52 Through hole, 53 Notch, 55 Folding-processed portion, 56 Folding-processed portion, 57 The first slit portion, 58 The second slit portion, 59 Bent portion, 71 Vacuum heat insulating material opening portion, 72 Through hole, 73 Notch, 75 Vacuum heat insulating material opening portion sealing area, 78 Vacuum heat insulating material opening portion sealing portion, 100 Refrigerator, 110 Embossing, 150 Refrigerating room, 160 Refrigerating room door, 200 Switching room, 201 Containing case, 210 Switching room door, 300 Freezing room, 301 Containing case, 310 Freezing room door, 400 Vegetable room, 401 Containing case, 410 Vegetable room door, 500 Ice making room, 510 Ice making room door, 550 Core material, 551f Bending portion, 551g Flat portion, 551Je Winding-end end portion, 560 Core material, 560K The third slit portion, 600 Compressor, 601 Machine room, 640 Cooler room, 650 Cooler, 660 Fan, 680 Cooling air passage, 690 Air passage, 700 Vacuum heat insulating material, 701 Vacuum heat insulating material, 750 Vacuum heat insulating material, 750a Thin-walled portion, 750b Thin-walled portion, 750c Predetermined thickness portion, 751 Concave portion, 752 Concave portion, 753 Protrusion portion, 760 Vacuum heat insulating material, 760x Concave portion, 760x1 Concave portion, 760x2 Concave portion, 760x3 Concave portion, 760x4 Concave portion, 900 Control board, 910 Control board containing room, 1301 Original fabric roller, 1301a Main body part A, 1301b Main body part B, 1301c Main body part C, 1301d Main body part D, 1305 The first original fabric roll, 1306 The second original fabric roller, 1311 Reel, 1312 Circumferential member, 1313 Clamping member installation part, 1315 Rotational shaft, 1316 Circumferential member supporting shaft, and 1320 Clamping member.

The invention claimed is:
1. A vacuum heat insulating material comprising:
a core material structured by a laminated structure wherein a fiber assembly that is a fiber formed into a sheet shape is wound from an inner side toward an outer side, having a cutting portion where an end face is cut so as to be in a predetermined length or a predetermined width; and
an outer cover material having a gas barrier property, which contains the core material inside, and has a sealing portion for sealing an area larger than a size of an outer shape of the core material by an amount of a length of a seal, for sealing an inside in a decompressed state,
wherein the fiber forming the fiber assembly is continuous for at least approximately as long as a length or a width of the core material for suppressing a protrusion of a remaining fiber that is generated by cutting the end face, wherein the fiber assembly is in a sheet shape continuous in a length direction, and the core material is in a plate shape having a flat portion formed of laminated layers of the fiber assembly, and two bending end portions respectively formed on both longitudinal sides of the flat portion, and wherein a winding end of the fiber assembly is placed to be adjacent to either of the two bending end portions.

2. The vacuum heat insulating material of claim 1, wherein an organic fiber is used for the fiber.

3. The vacuum heat insulating material of claim 1,
wherein, for the fiber assembly, an organic fiber assembly that is made by forming an organic fiber into a sheet-shape and applying heat welding on the organic fiber is used, wherein when a heat welded portion penetrates from a front surface to a rear surface of the fiber assembly, a fabric weight of a non-woven cloth which is the fiber assembly is at least 4.7 g/m$^2$ and no more than 70 g/m$^2$, or at least 140 g/m$^2$ and no more than 198 g/m$^2$, and wherein when the heat welded portion does not penetrate from the front surface to the rear surface of the fiber assembly, the fabric weight of the non-woven cloth which is the fiber assembly is a least 4.7 g/m$^2$ and no more than 130 g/m$^2$.

4. The vacuum heat insulating material of claim 1, wherein, for the fiber assembly, an organic fiber assembly that is made by forming an organic fiber into a sheet-shape and applying heat welding on the organic fiber is used, and a ratio of a heat welding is made at least 3% and no more than 20% of a total area (sheet area) of the organic fiber assembly for suppressing both of deformation due to a compression strain and decrease in a heat insulating performance.

5. The vacuum heat insulating material of claim 4,
wherein a fabric weight of the organic fiber assembly is at least 85 g/m$^2$ and no more than 198 g/m$^2$.

6. The vacuum heat insulating material of claim 1, wherein the core material is formed in a plate shape by winding a first fiber assembly wherein a plurality of sheeted fiber assemblies continuous in a length direction are adjacently arranged in a width direction, and a second fiber assembly that is placed so as to be lapped in an approximately orthogonal direction to the sheet surface of the first fiber assembly, wherein a plurality of sheeted fiber assemblies continuous in a length direction are adjacently arranged in a width direction, continuously from an inner side toward an outer side in a state wherein the first fiber assembly and the second fiber assembly are displaced by a predetermined amount Xb in a width direction.

7. The vacuum heat insulating material of claim 1, wherein the core material is formed in a plate shape by winding a third fiber assembly wherein a sheeted fiber assembly continuous in a length direction is continuous in a width direction, and a first fiber assembly that is placed so as to be lapped in an approximately orthogonal direction to the sheet surface of the third fiber assembly, wherein a plurality of sheeted fiber assemblies continuous in a length direction are arranged in a width direction via a predetermined space, continuously from an inner side toward an outer side in a state wherein the third fiber assembly and the first fiber assembly are lapped.

8. The vacuum heat insulating material of claim 6, wherein a slit portion between adjacent fiber assemblies in the first fiber assembly or the second fiber assembly in a state wherein the core material is inserted and decompressed inside the outer cover material is in a concave shape in a length direction on a front surface or a rear surface.

9. The vacuum heat insulating material of claim 6, wherein a decrease in a heat insulating performance is suppressed by preventing the core material from being disjointed, and a crease performance is increased by setting the predetermined amount Xb no less than 7 mm, and no more than three times of a thickness t of the core material in an approximately vacuum state inside the outer cover material.

10. The vacuum heat insulating material of claim 6, wherein an ear part fiber assembly whose edge line is not lined up is used for at least one of a plurality of fiber assemblies making up the first fiber assembly or the second fiber assembly.

11. The vacuum heat insulating material of claim 1, wherein a cross-sectional shape orthogonal to a width direction of an end portion in a length direction of the core material is an approximately triangle shape whose thickness is decreased toward an outer side in the length direction in a state wherein the core material is decompressed and sealed in the outer cover material.

12. The vacuum heat insulating material of claim 6, further comprising:
a thin-walled portion that is thinner, in a thickness direction, than a remaining portion of the vacuum heat insulating material that protrudes in an outer direction on at least one end side in a width direction.

13. A vacuum heat insulating material comprising:
a core material structured by a laminated structure wherein a fiber assembly that is a fiber formed into a sheet shape is wound from an inner side toward an outer side, having a cutting portion where an end face is cut so as to be in a predetermined length or a predetermined width; and
an outer cover material having a gas barrier property, which contains the core material inside, and has a sealing portion for sealing an area larger than a size of an outer shape of the core material by an amount of a length of a seal, for sealing an inside in a decompressed state,
wherein the fiber forming the fiber assembly is continuous for at least approximately as long as a length or a width of the core material for suppressing a protrusion of a remaining fiber that is generated by cutting the end face,
wherein, for the fiber assembly, an organic fiber assembly that is made by forming an organic fiber into a sheet-shape and applying heat welding on the organic fiber is used,
wherein when a heat welded portion penetrates from a front surface to a rear surface of the fiber assembly, a fabric weight of a non-woven cloth which is the fiber assembly is at least 4.7 g/m$^2$ and no more than 70 g/m$^2$, or at least 140 g/m$^2$ and no more than 198 g/m$^2$, and
wherein when the heat welded portion does not penetrate from the front surface to the rear surface of the fiber assembly, the fabric weight of the non-woven cloth which is the fiber assembly is at least 4.7 g/m$^2$ and no more than 130 g/m$^2$.

14. A vacuum heat insulating material comprising:
a core material structured by a laminated structure wherein a fiber assembly that is a fiber formed into a sheet shape is wound from an inner side toward an outer side, having a cutting portion where an end face is cut so as to be in a predetermined length or a predetermined width; and
an outer cover material having a gas barrier property, which contains the core material inside, and has a sealing portion for sealing an area larger than a size of an outer shape of the core material by an amount of a length of a seal, for sealing an inside in a decompressed state,
wherein the fiber forming the fiber assembly is continuous for at least approximately as long as a length or a width of the core material for suppressing a protrusion of a remaining fiber that is generated by cutting the end face, and wherein, for the fiber assembly, an organic fiber assembly that is made by forming an organic fiber into a sheet-shape and applying heat welding on the organic fiber is used, and a ratio of a heat welding is made at least 3% and no more than 20% of a total area (sheet area) of the organic fiber assembly for suppressing both of deformation due to a compression strain and decrease in a heat insulating performance.

15. The vacuum heat insulating material of claim 14, wherein a fabric weight of the organic fiber assembly is at least 85 g/m² and no more than 198 g/m².

16. A vacuum heat insulating material comprising:
a core material structured by a laminated structure wherein a fiber assembly that is a fiber formed into a sheet shape is wound from an inner side toward an outer side, having a cutting portion where an end face is cut so as to be in a predetermined length or a predetermined width; and
an outer cover material having a gas barrier property, which contains the core material inside, and has a sealing portion for sealing an area larger than a size of an outer shape of the core material by an amount of a length of a seal, for sealing an inside in a decompressed state,
wherein the fiber forming the fiber assembly is continuous for at least approximately as long as a length or a width of the core material for suppressing a protrusion of a remaining fiber that is generated by cutting the end face;
wherein the core material is formed in a plate shape by winding a first fiber assembly wherein a plurality of sheeted fiber assemblies continuous in a length direction are adjacently arranged in a width direction, and a second fiber assembly that is placed so as to be lapped in an approximately orthogonal direction to the sheet surface of the first fiber assembly, wherein a plurality of sheeted fiber assemblies continuous in a length direction are adjacently arranged in a width direction, continuously from an inner side toward an outer side in a state wherein the first fiber assembly and the second fiber assembly are displaced by a predetermined amount Xb in a width direction.

17. The vacuum heat insulating material of claim 16, wherein a slit portion between adjacent fiber assemblies in the first fiber assembly or the second fiber assembly in a state wherein the core material is inserted and decompressed inside the outer cover material is in a concave shape in a length direction on a front surface or a rear surface.

18. The vacuum heat insulating material of claim 16, wherein a decrease in a heat insulating performance is suppressed by preventing the core material from being disjointed, and a crease performance is increased by setting the predetermined amount Xb no less than 7 mm, and no more than three times of a thickness t of the core material in an approximately vacuum state inside the outer cover material.

19. The vacuum heat insulating material of claim 16, wherein an ear part fiber assembly whose edge line is not lined up is used for at least one of a plurality of fiber assemblies making up the first fiber assembly or the second fiber assembly.

20. The vacuum heat insulating material of claim 16, further comprising:
a thin-walled portion that is thinner, in a thickness direction, than a remaining portion of the vacuum heat insulating material that protrudes in an outer direction on at least one end side in a width direction.

21. A vacuum heat insulating material comprising:
a core material structured by a laminated structure wherein a fiber assembly that is a fiber formed into a sheet shape is wound from an inner side toward an outer side, having a cutting portion where an end face is cut so as to be in a predetermined length or a predetermined width; and
an outer cover material having a gas barrier property, which contains the core material inside, and has a sealing portion for sealing an area larger than a size of an outer shape of the core material by an amount of a length of a seal, for sealing an inside in a decompressed state,
wherein the fiber forming the fiber assembly is continuous for at least approximately as long as a length or a width of the core material for suppressing a protrusion of a remaining fiber that is generated by cutting the end face;
wherein the core material is formed in a plate shape by winding a third fiber assembly wherein a sheeted fiber assembly continuous in a length direction is continuous in a width direction, and a first fiber assembly that is placed so as to be lapped in an approximately orthogonal direction to the sheet surface of the third fiber assembly, wherein a plurality of sheeted fiber assemblies continuous in a length direction are arranged in a width direction via a predetermined space, continuously from an inner side toward an outer side in a state wherein the third fiber assembly and the first fiber assembly are lapped.

22. A vacuum heat insulating material comprising:
a core material structured by a laminated structure wherein a fiber assembly that is a fiber formed into a sheet shape is wound from an inner side toward an outer side, having a cutting portion where an end face is cut so as to be in a predetermined length or a predetermined width; and
an outer cover material having a gas barrier property, which contains the core material inside, and has a sealing portion for sealing an area larger than a size of an outer shape of the core material by an amount of a length of a seal, for sealing an inside in a decompressed state,
wherein the fiber forming the fiber assembly is continuous for at least approximately as long as a length or a width of the core material for suppressing a protrusion of a remaining fiber that is generated by cutting the end face, and
wherein a cross-sectional shape orthogonal to a width direction of an end portion in a length direction of the core material is an approximately triangle shape whose thickness is decreased toward an outer side in the length direction in a state wherein the core material is decompressed and sealed in the outer cover material.

23. A vacuum heat insulating material comprising:
a core material structured by a laminated structure wherein a fiber assembly that is a fiber formed into a sheet shape is wound from an inner side toward an outer side, having a cutting portion where an end face is cut so as to be in a predetermined length or a predetermined width; and
an outer cover material having a gas barrier property, which contains the core material inside, and has a sealing portion for sealing an area larger than a size of an outer shape of the core material by an amount of a length of a seal, for sealing an inside in a decompressed state,
wherein the fiber forming the fiber assembly is continuous and longer than or equal to an entire length or an entire width of the core material for suppressing a protrusion of a remaining fiber that is generated by cutting the end face.

* * * * *